US005689121A

United States Patent [19]

Kitagawa et al.

[11] Patent Number: 5,689,121

[45] Date of Patent: *Nov. 18, 1997

[54] INSULATED-GATE SEMICONDUCTOR DEVICE

[75] Inventors: Mitsuhiko Kitagawa, Tokyo; Ichiro Omura, Yokohama; Akio Nakagawa, Hiratsuka; Norio Yasuhara, Yokohama; Tomoki Inoue, Tokyo, all of Japan

[73] Assignee: Kabushiki Kaisha Toshiba, Kawasaki, Japan

[*] Notice: The term of this patent shall not extend beyond the expiration date of Pat. No. 5,448,083.

[21] Appl. No.: 480,389

[22] Filed: Jun. 7, 1995

Related U.S. Application Data

[63] Continuation of Ser. No. 261,384, Jun. 15, 1994, Pat. No. 5,448,083, which is a continuation-in-part of Ser. No. 925, 870, Aug. 7, 1992, Pat. No. 5,329,142.

[30] Foreign Application Priority Data

| | | | |
|---|---|---|---|
| Aug. 8, 1991 | [JP] | Japan | 3-199343 |
| Dec. 20, 1991 | [JP] | Japan | 3-354303 |
| Sep. 17, 1993 | [JP] | Japan | 5-231572 |
| Mar. 15, 1994 | [JP] | Japan | 6-070151 |

[51] Int. Cl.[6] .......... H01L 29/74; H01L 31/111

[52] U.S. Cl. .......... 257/139; 257/138; 257/137; 257/135; 257/141

[58] Field of Search .......... 257/139, 138, 257/137, 133, 135, 124, 141, 401

[56] References Cited

U.S. PATENT DOCUMENTS 5,448,083 9/1995 Kitagawa et al. .......... 257/139

*Primary Examiner*—Wael Fahmy
*Assistant Examiner*—Fetsum Abraham
*Attorney, Agent, or Firm*—Oblon, Spivak, McClelland, Maier & Neustadt, P.C.

[57] ABSTRACT

An insulated-gate semiconductor device comprises a P type emitter layer, an $N^-$ high-resistive base layer formed on the P type emitter layer, and a P type base layer contacting the $N^-$ high-resistive base layer. A plurality of trenches are formed having a depth to reach into the $N^-$ high-resistive base layer from the P type base layer. A gate electrode covered with a gate insulation film is buried in each trench. An N type source layer to be connected to a cathode electrode is formed in the surface of the P type base layer in a channel region between some trenches, thereby forming an N channel MOS transistor for turn-on operation. A P channel MOS transistor connected to the P base layer is formed in a channel region between other trenches so as to discharge the holes outside the device upon turn-off operation.

19 Claims, 93 Drawing Sheets

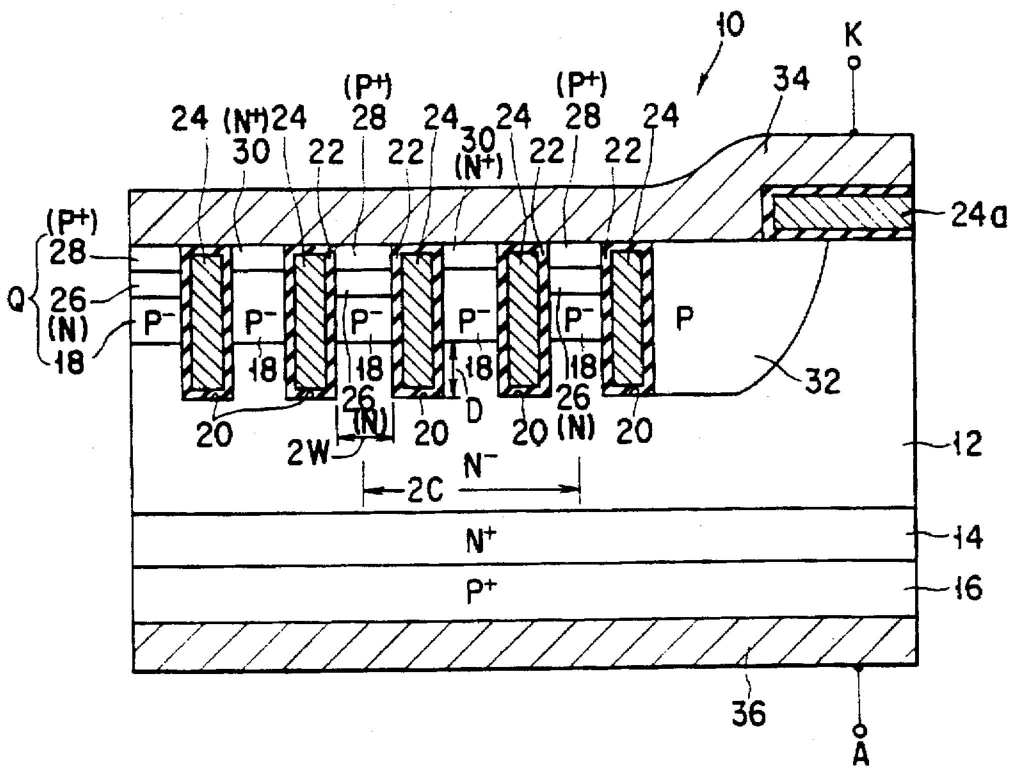
F I G. 2
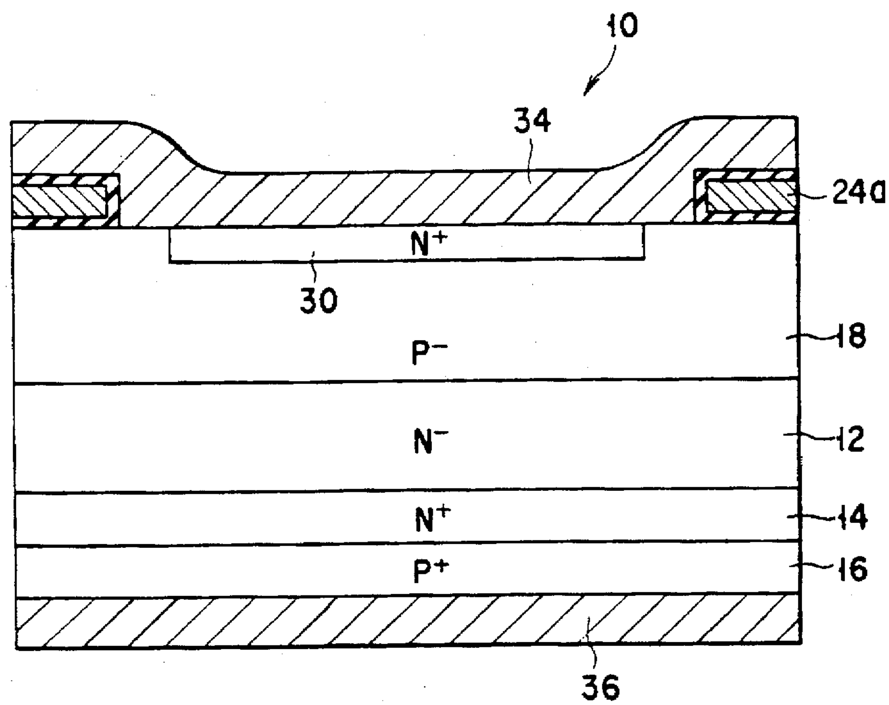
F I G. 3

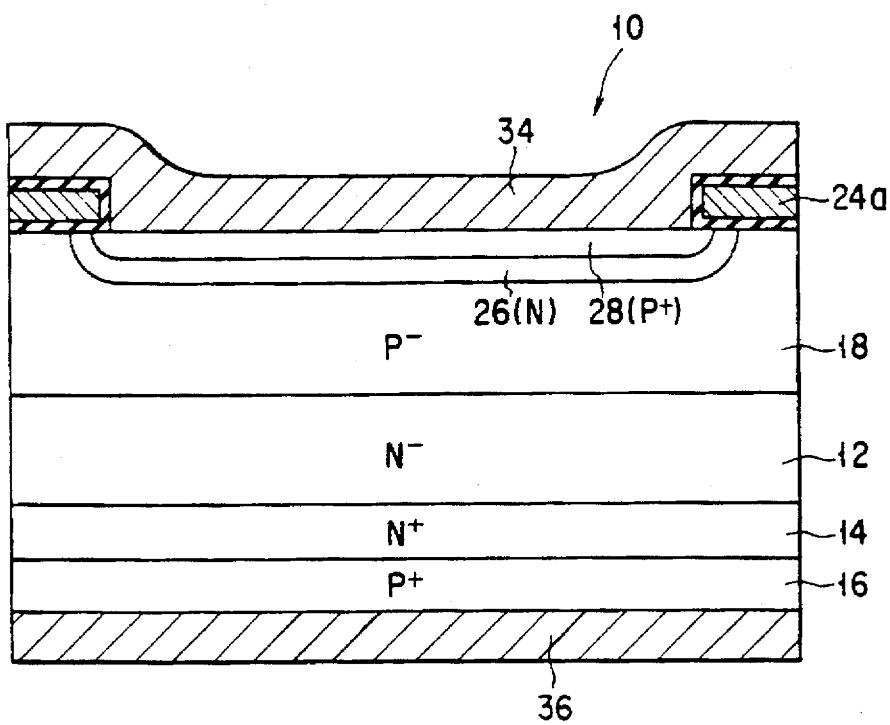
F I G. 4
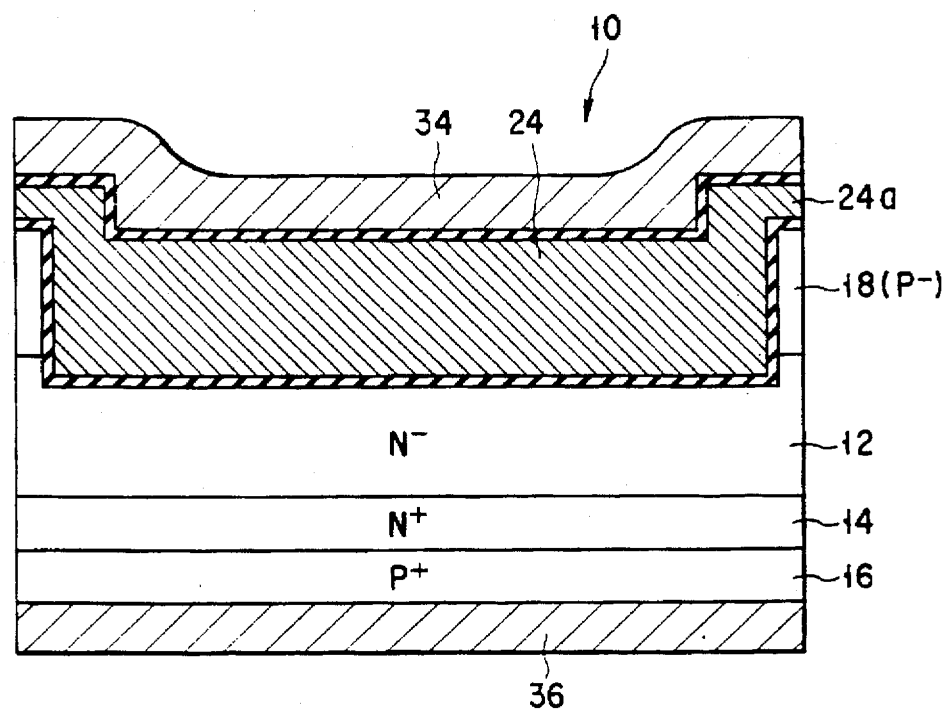
F I G. 5

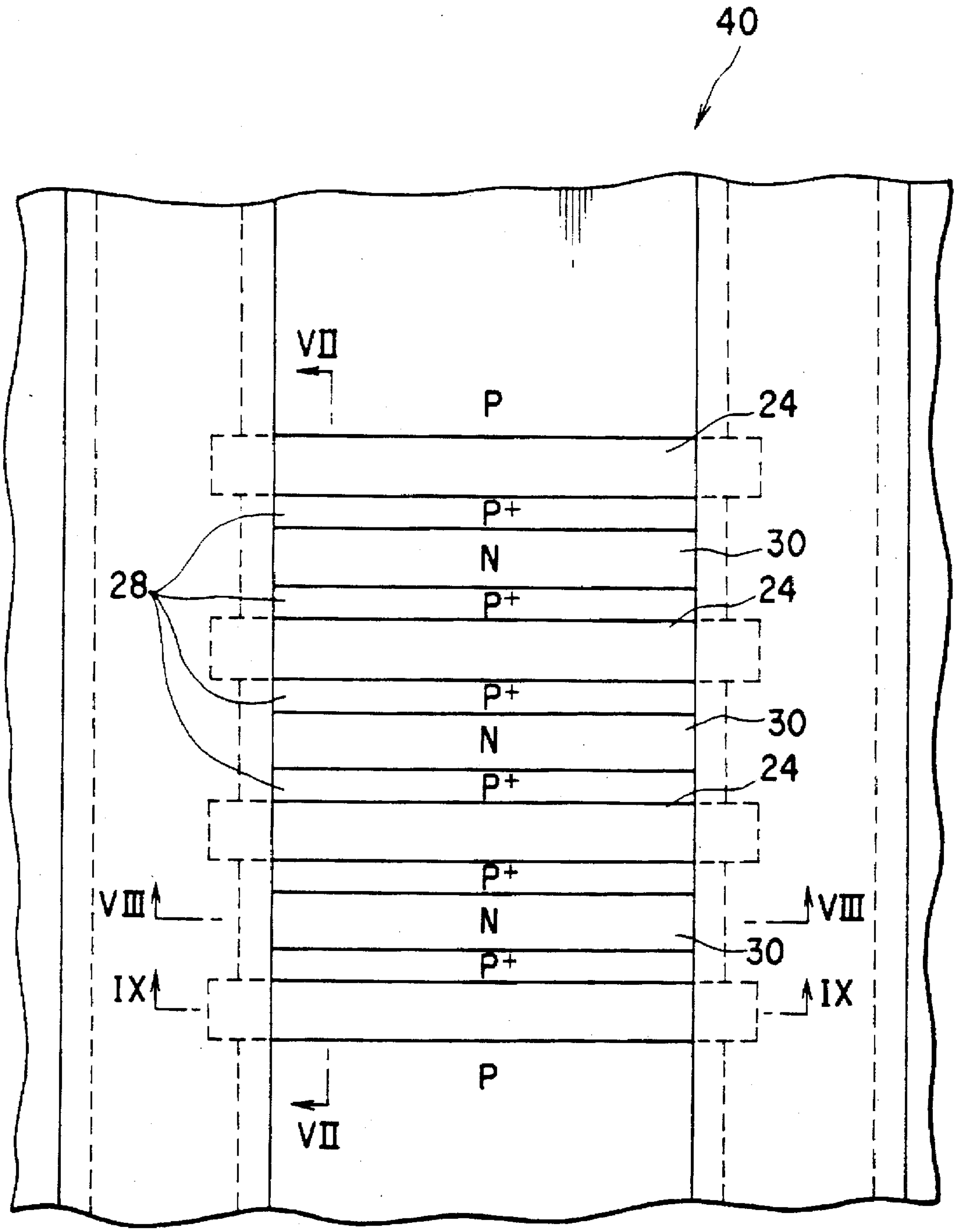
F I G. 6

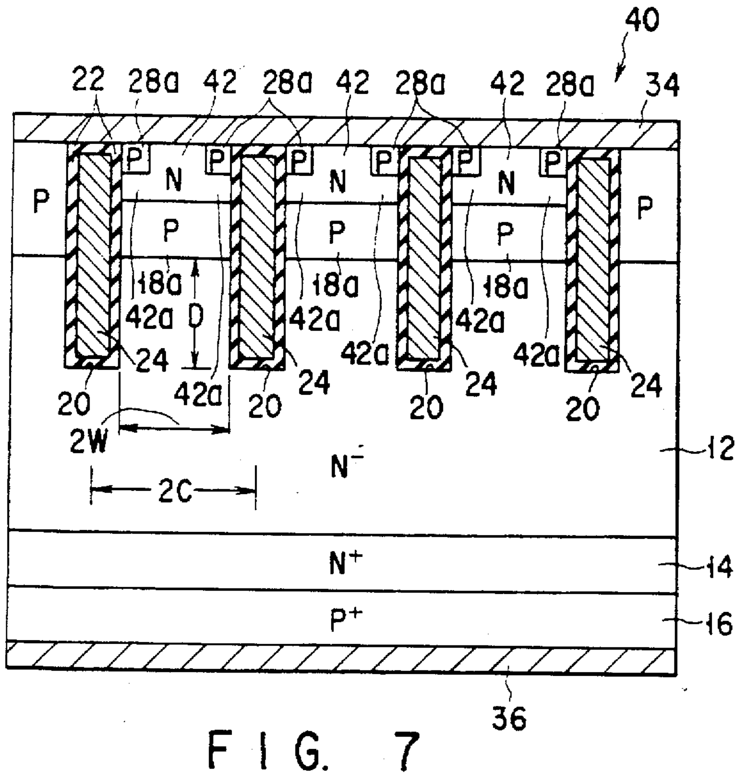
F I G. 7
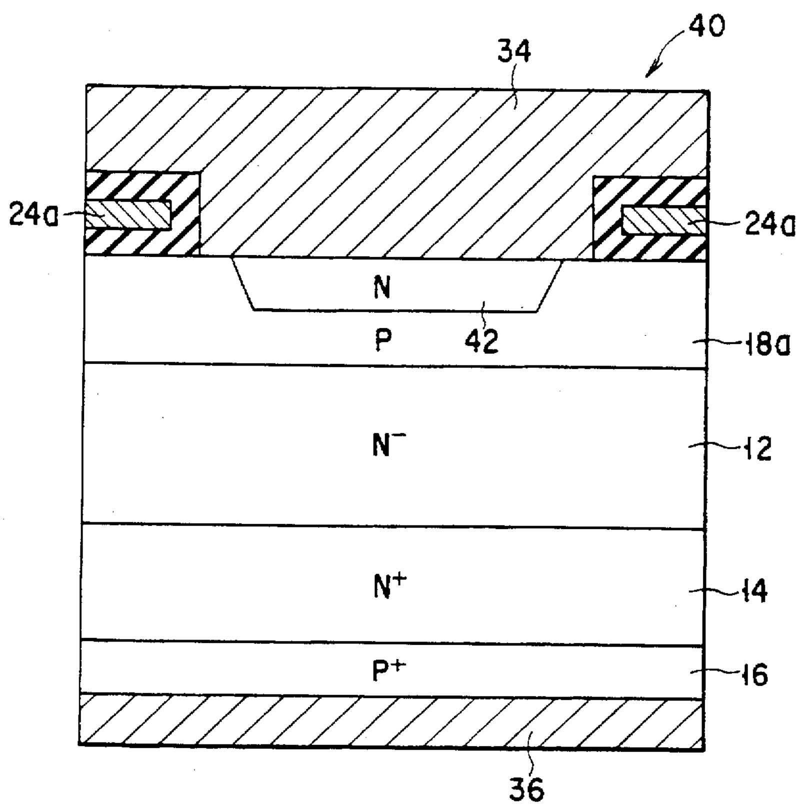
F I G. 8

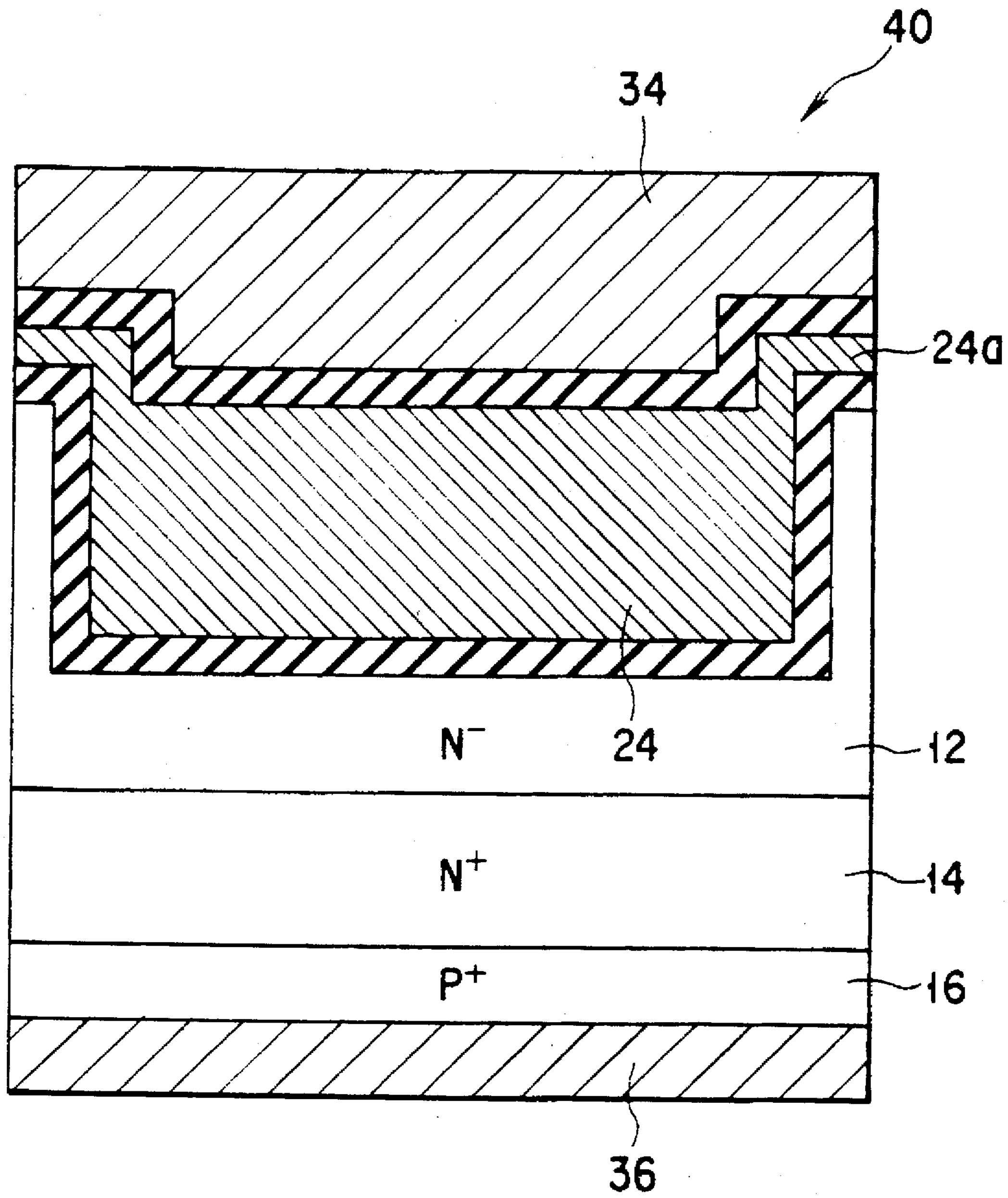
F I G. 9

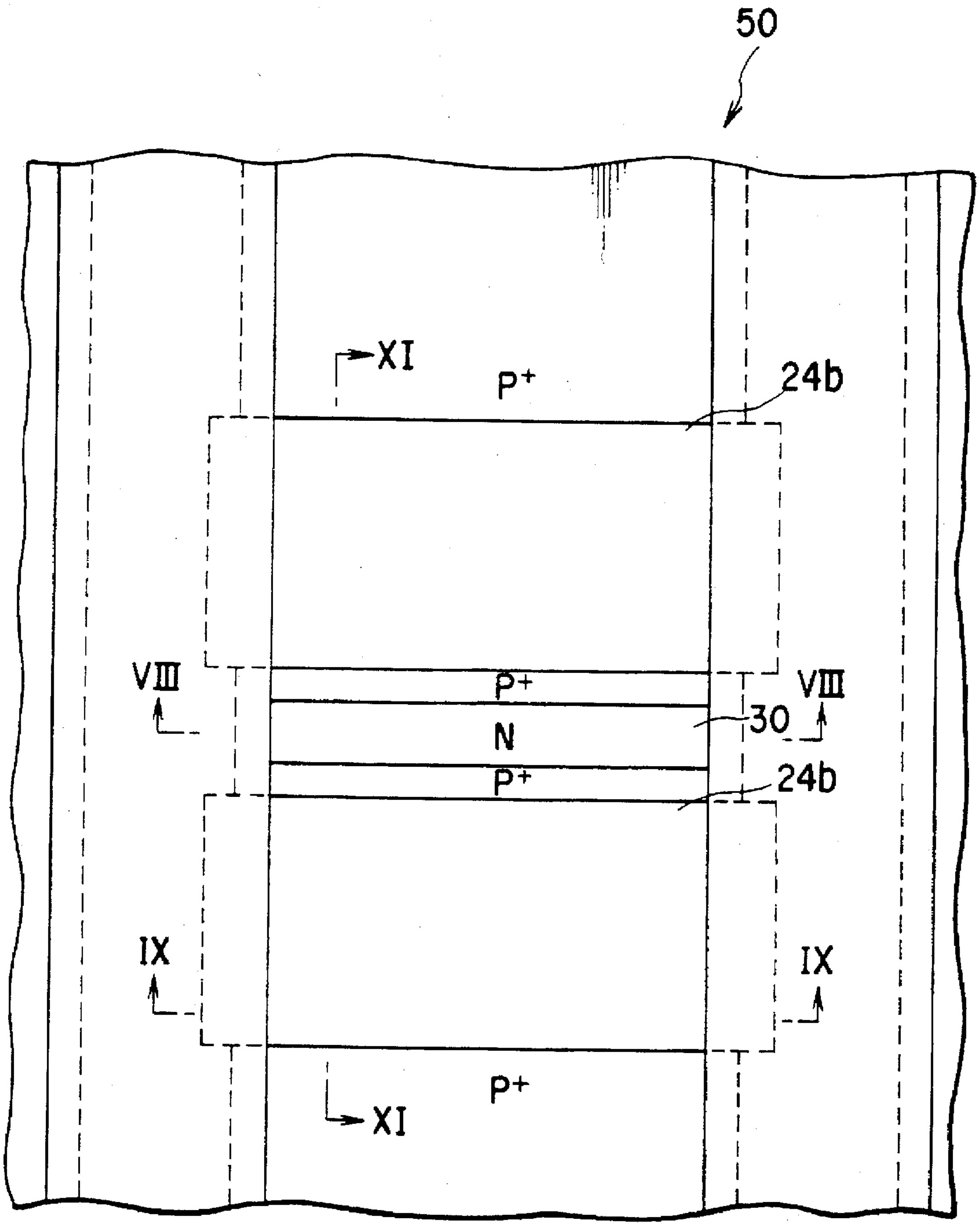
F I G. 10

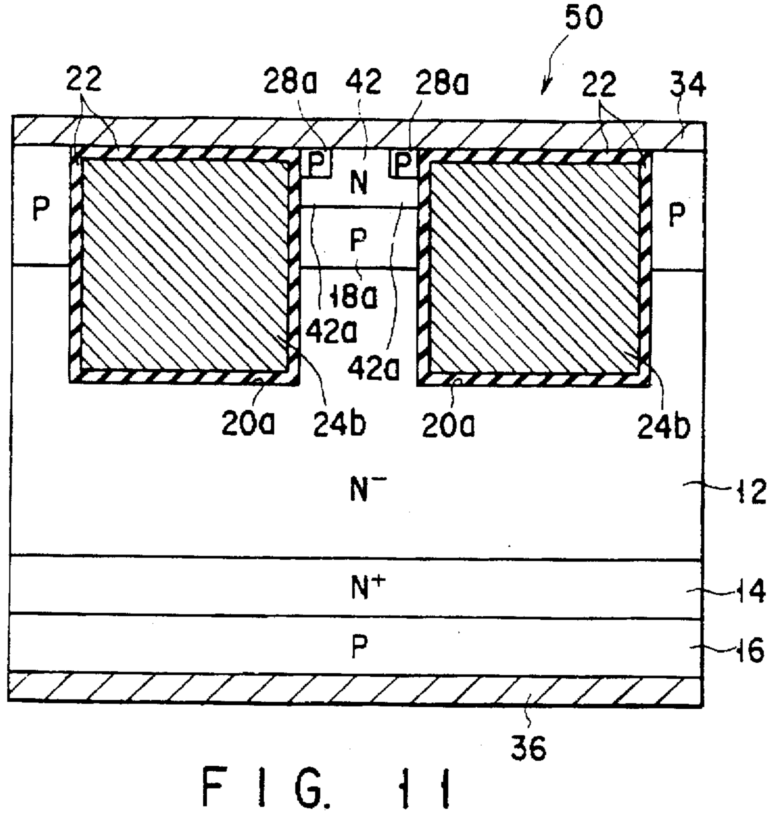
F I G. 11
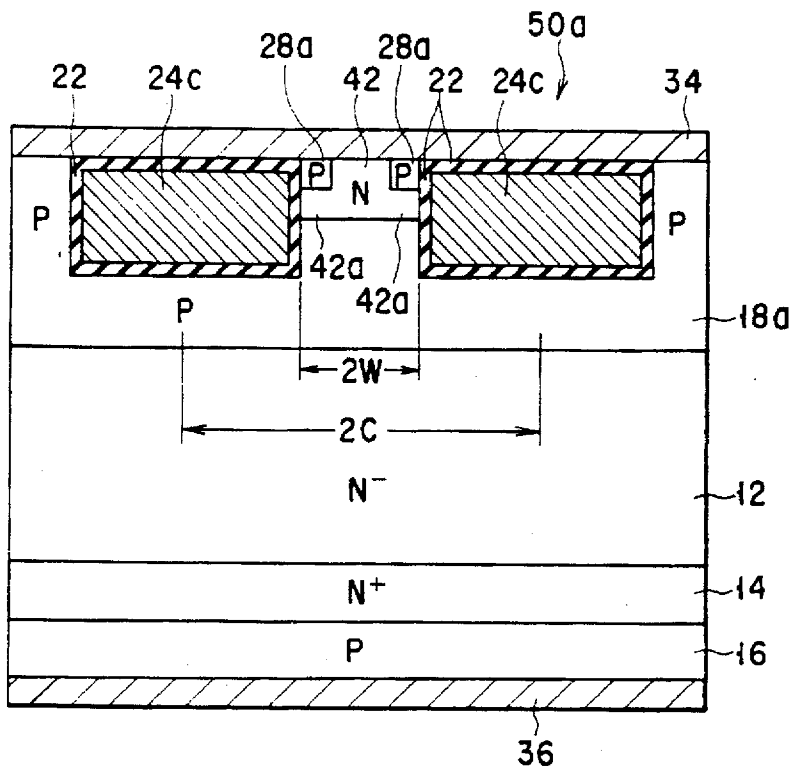
F I G. 12

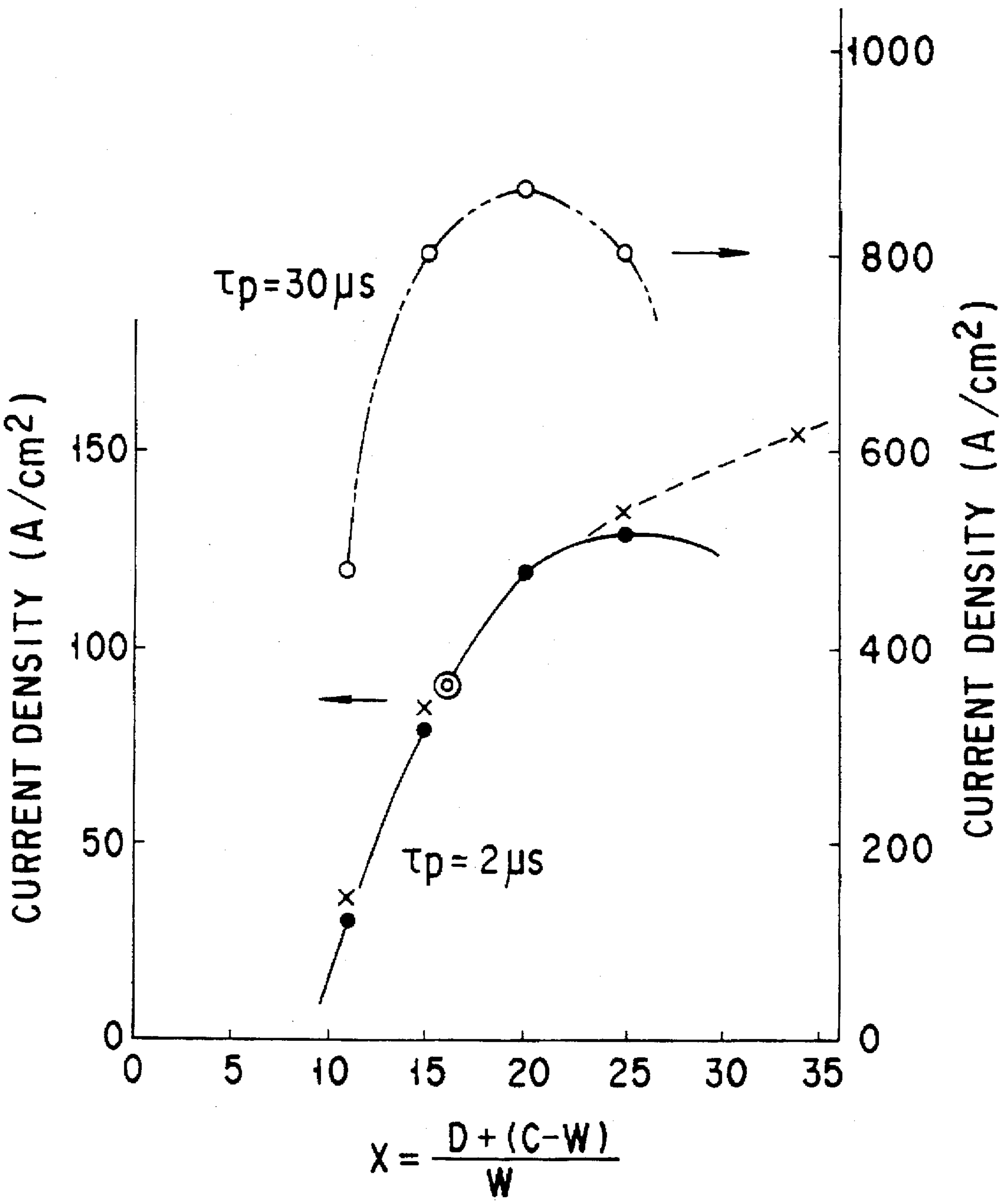
F I G. 24

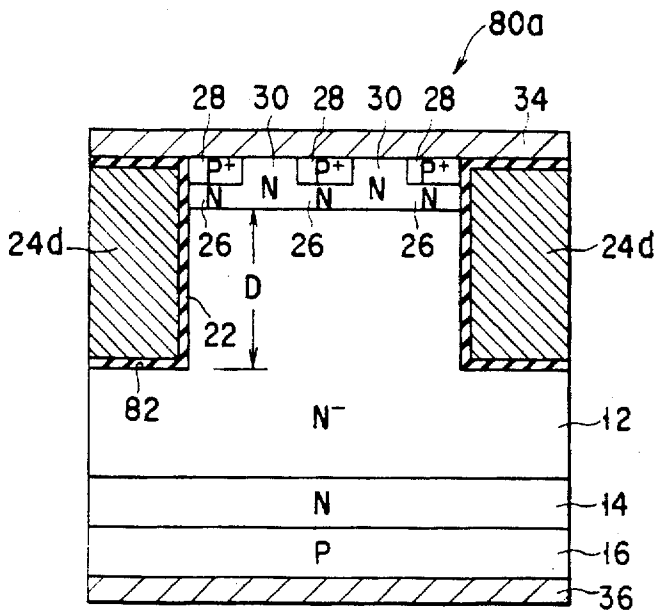
F I G. 31
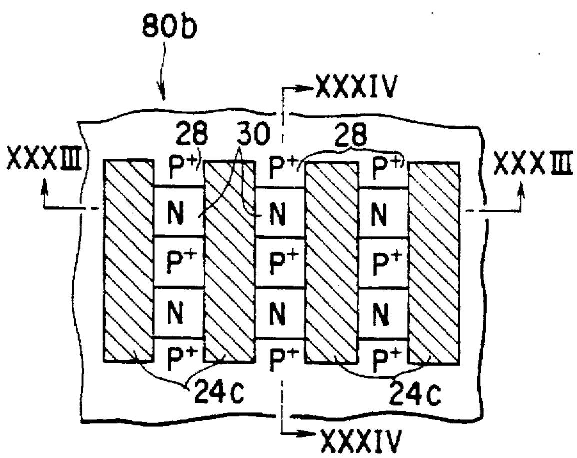
F I G. 32
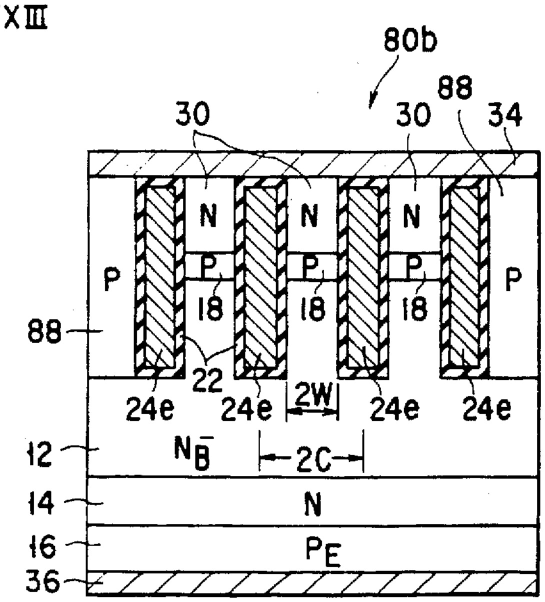
F I G. 33

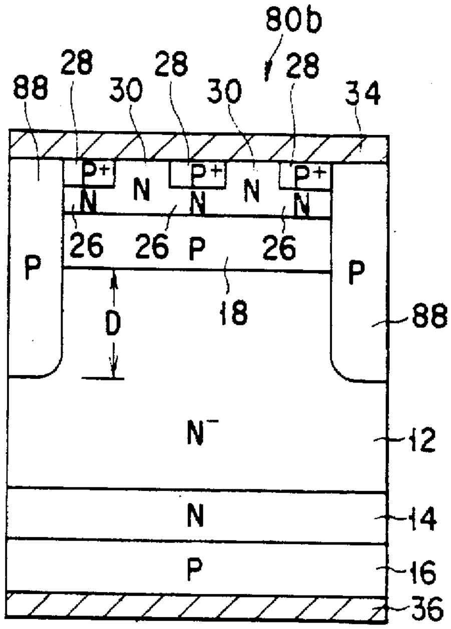
F I G. 34
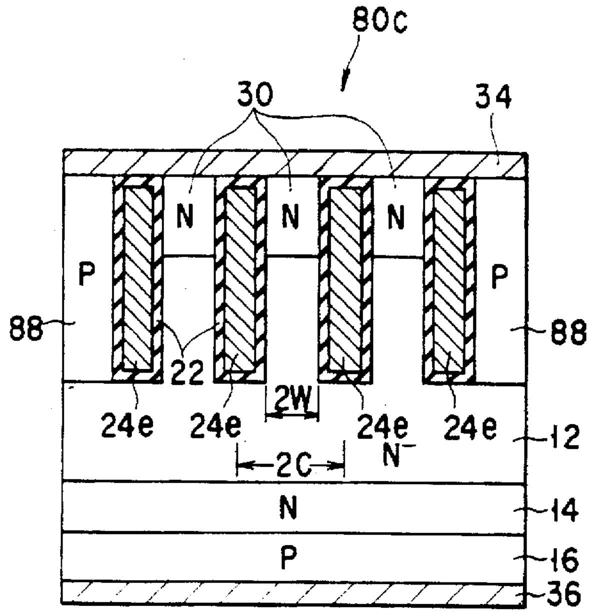
F I G. 35
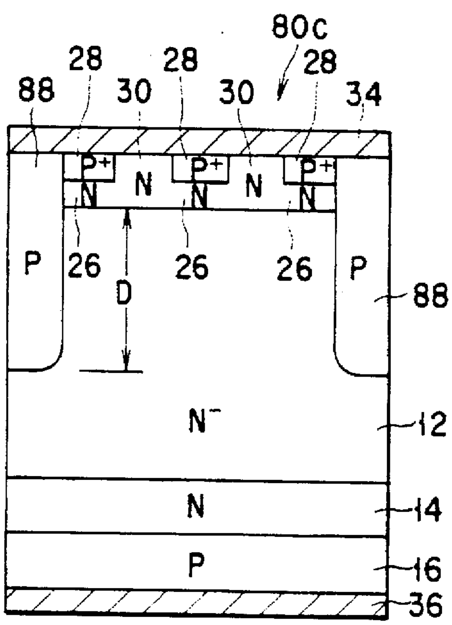
F I G. 36
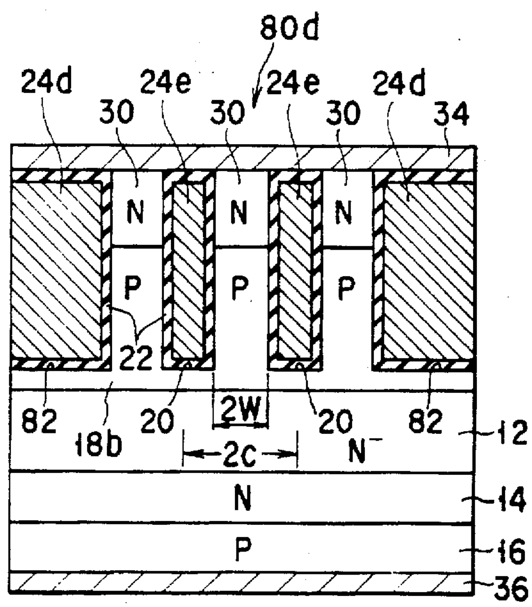
F I G. 37

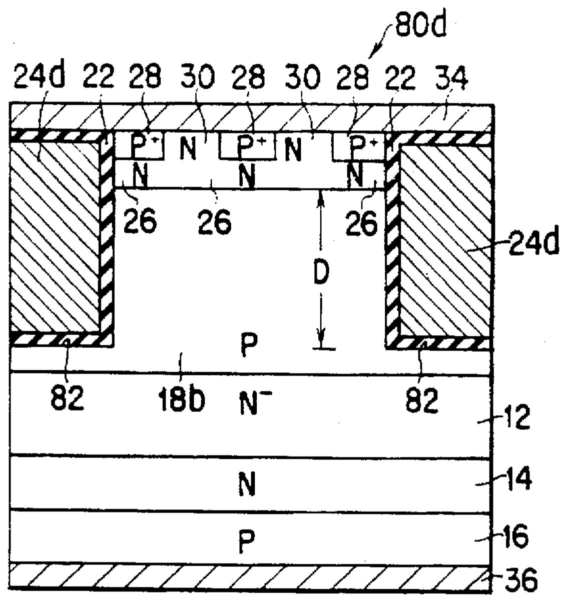
F I G. 38
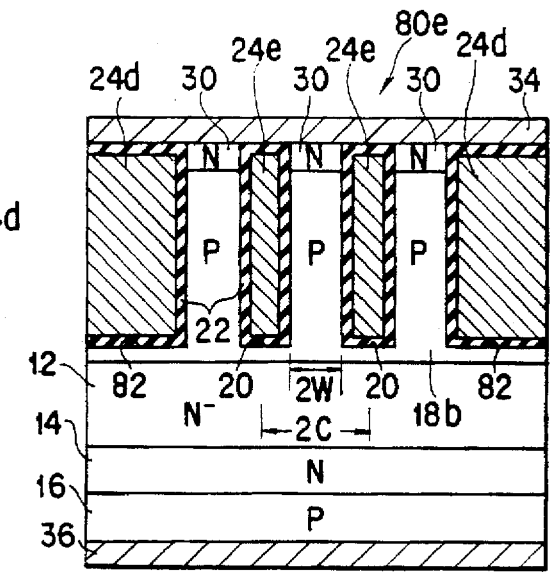
F I G. 39
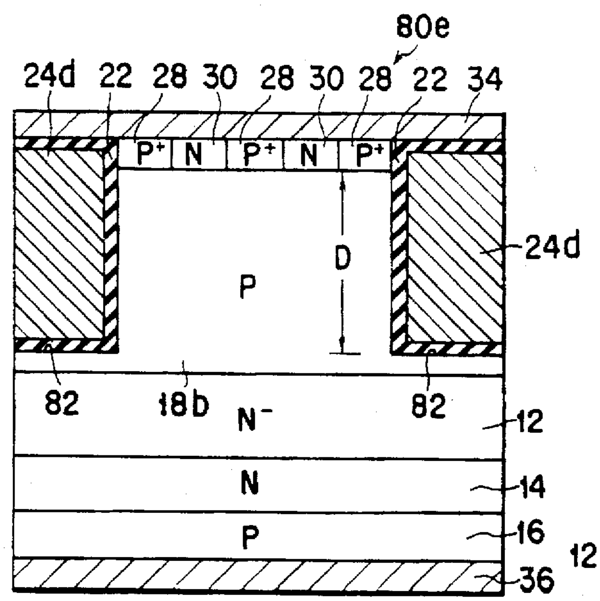
F I G. 40
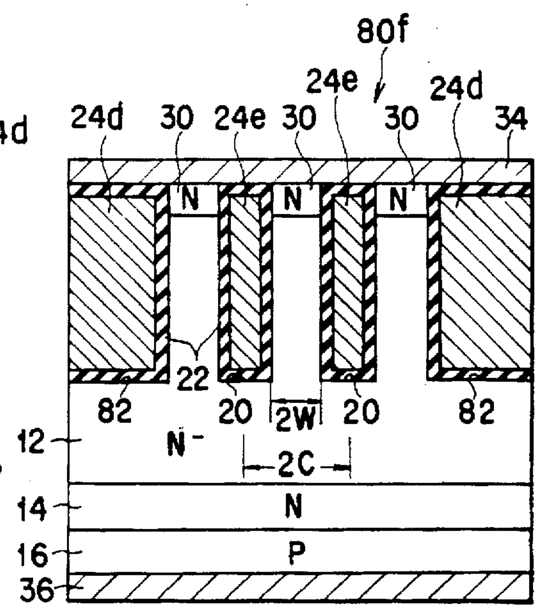
F I G. 41

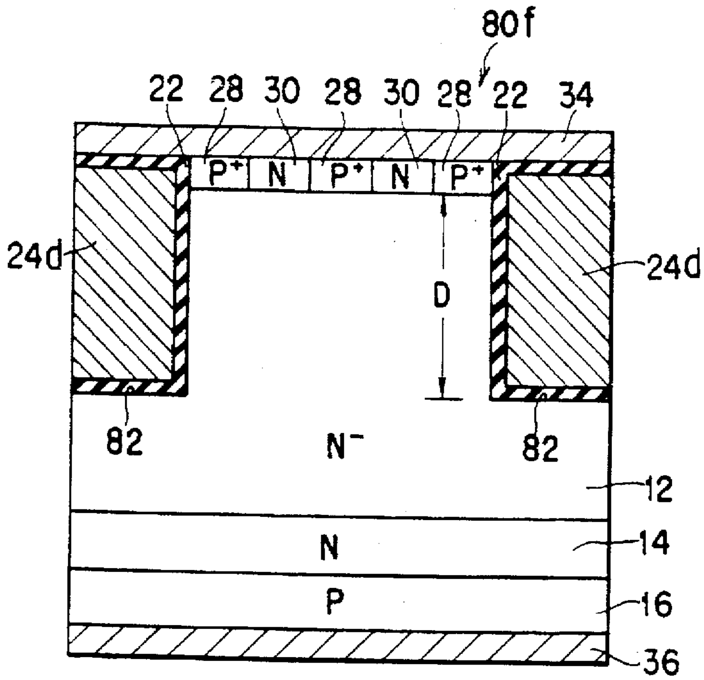
F I G. 42
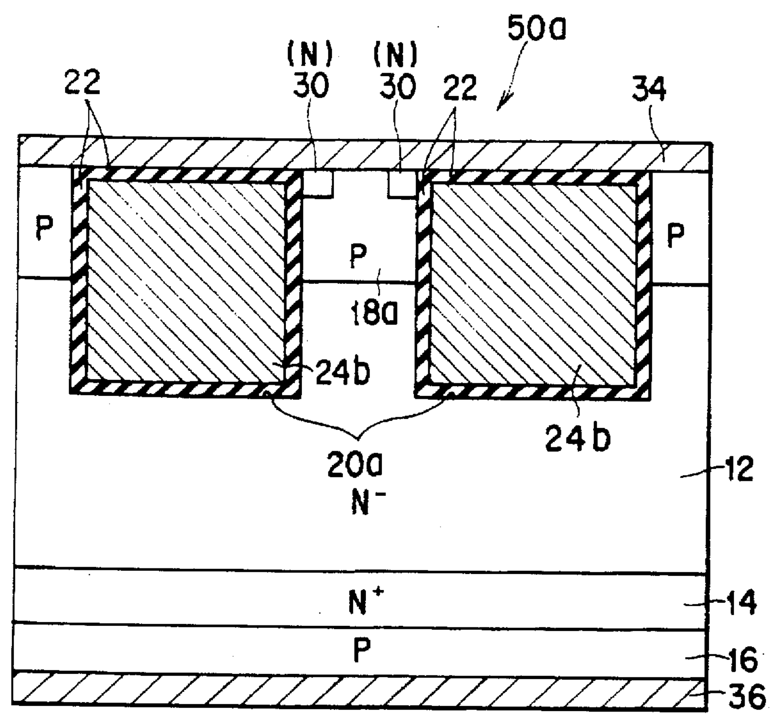
F I G. 43

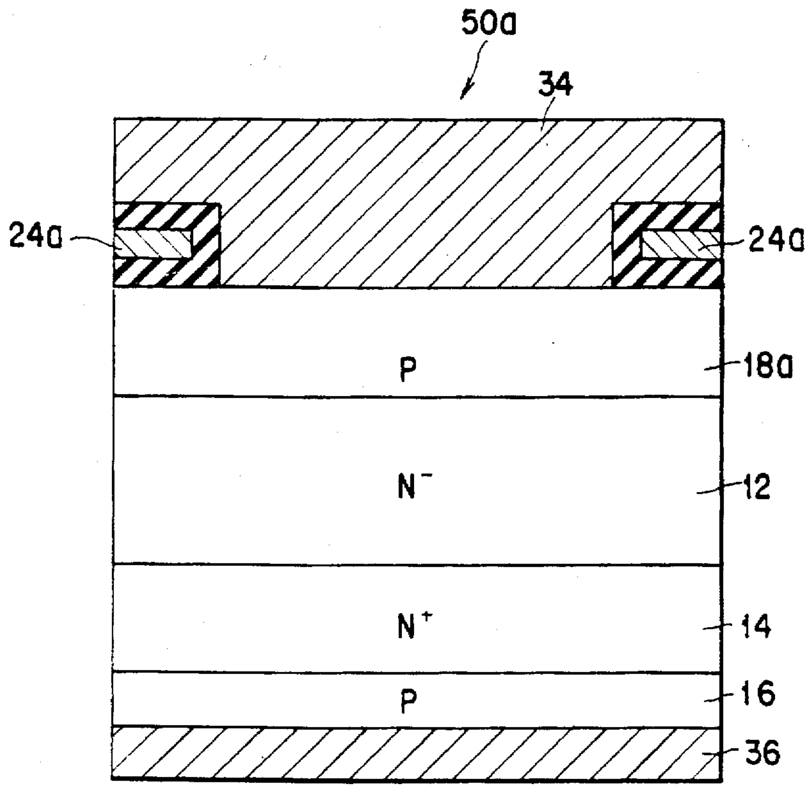
F I G. 44
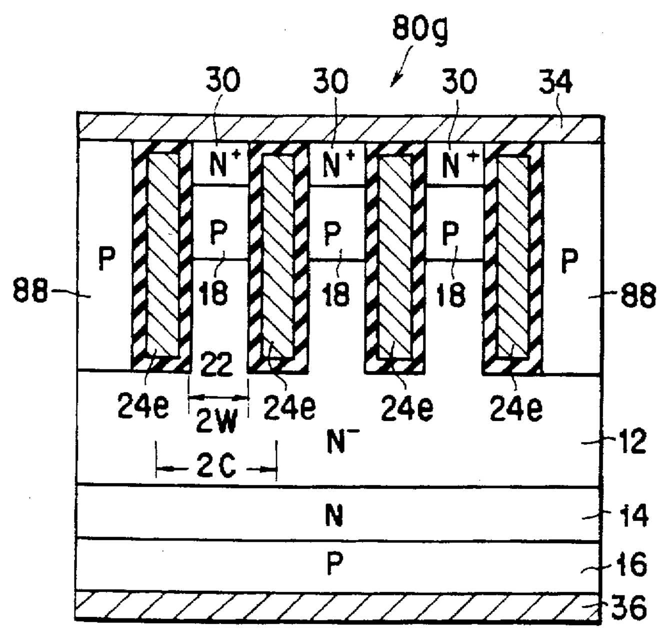
F I G. 45

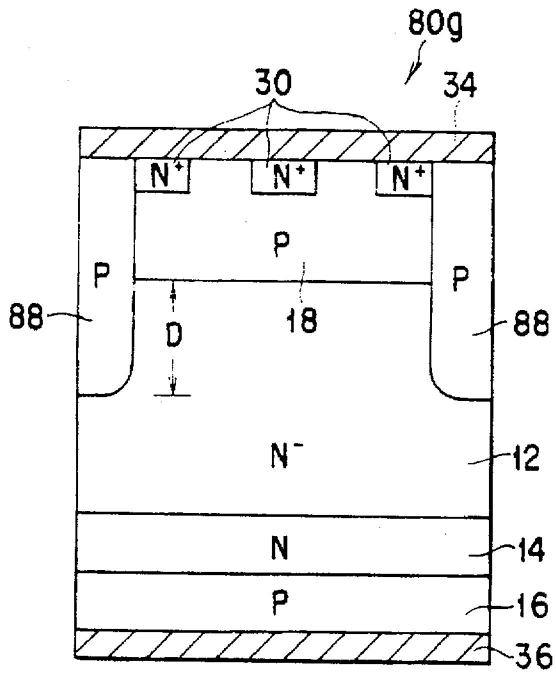
F I G. 46
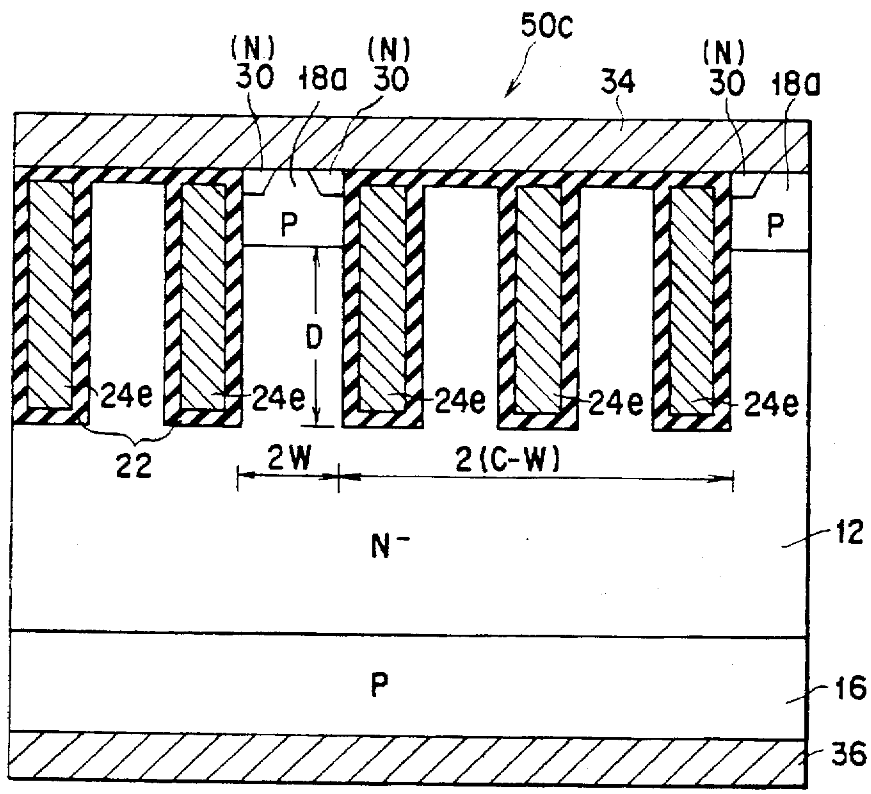
F I G. 47

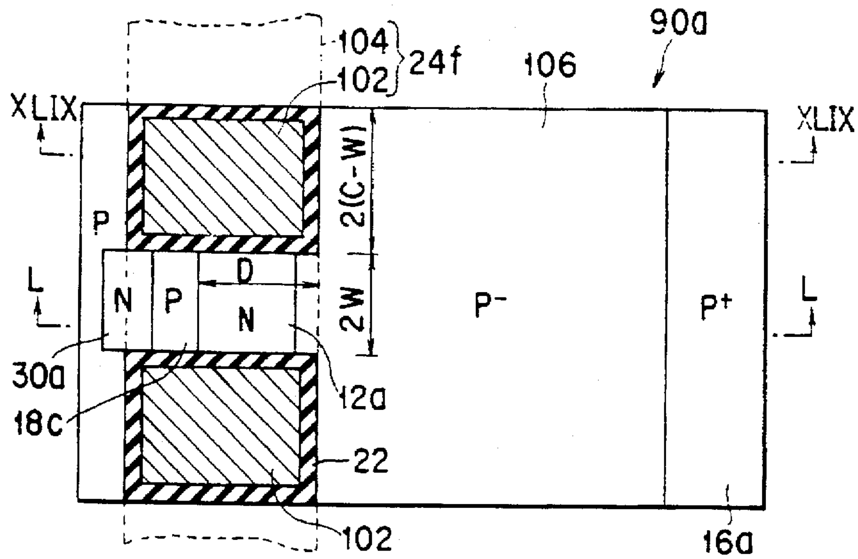
F I G. 48
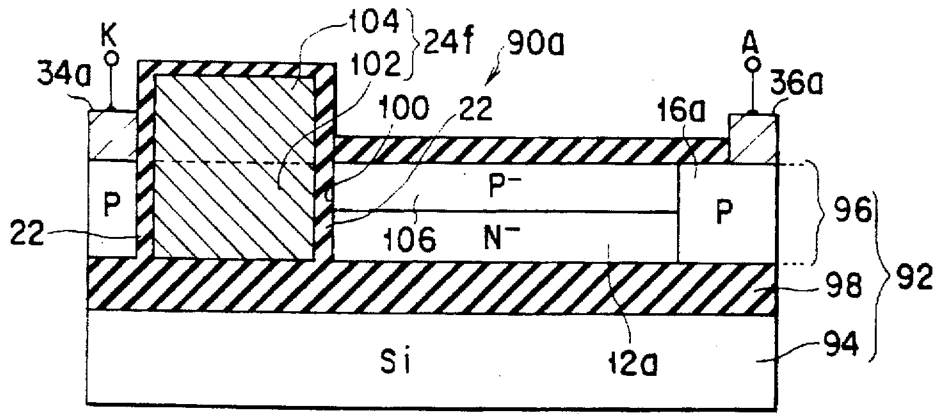
F I G. 49
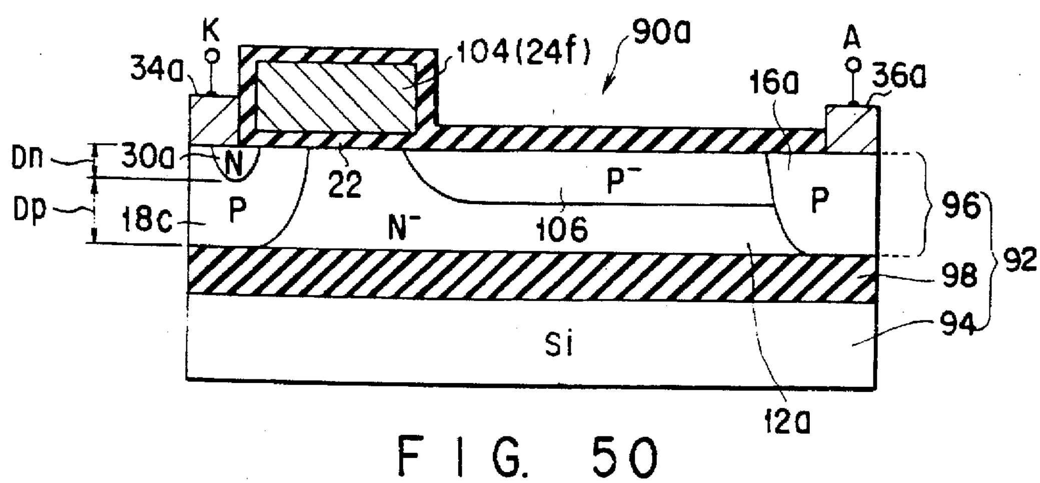
F I G. 50

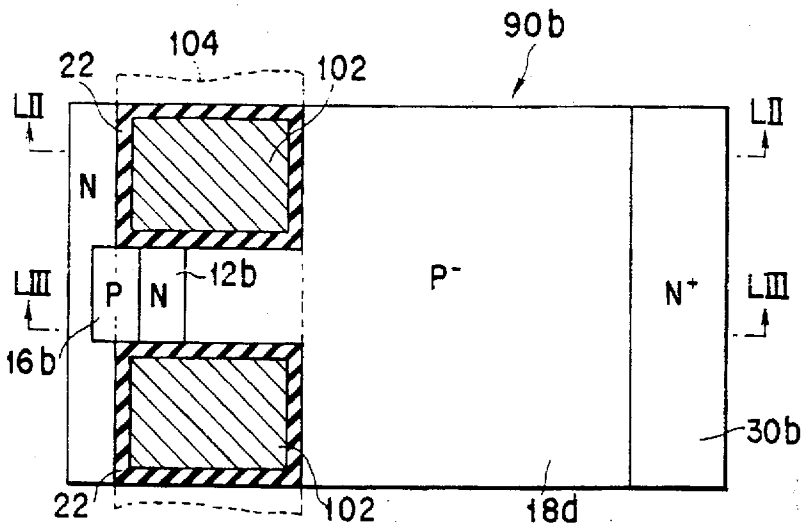
F I G. 51
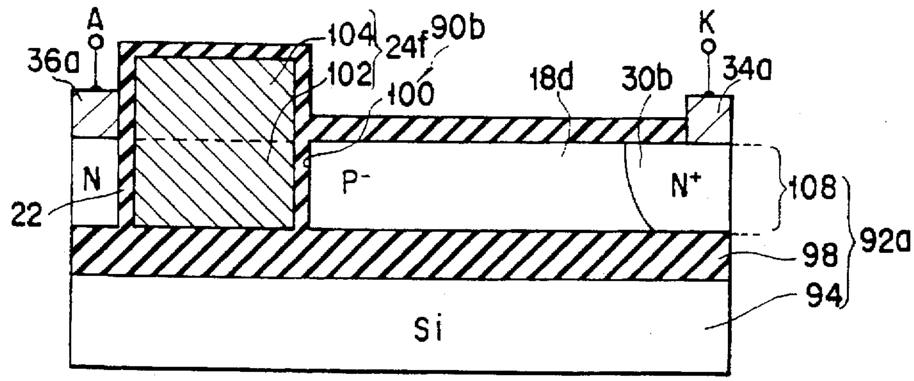
F I G. 52
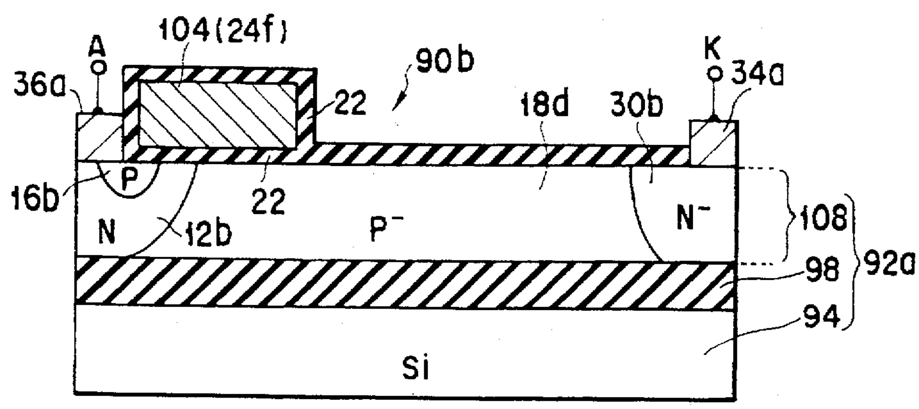
F I G. 53

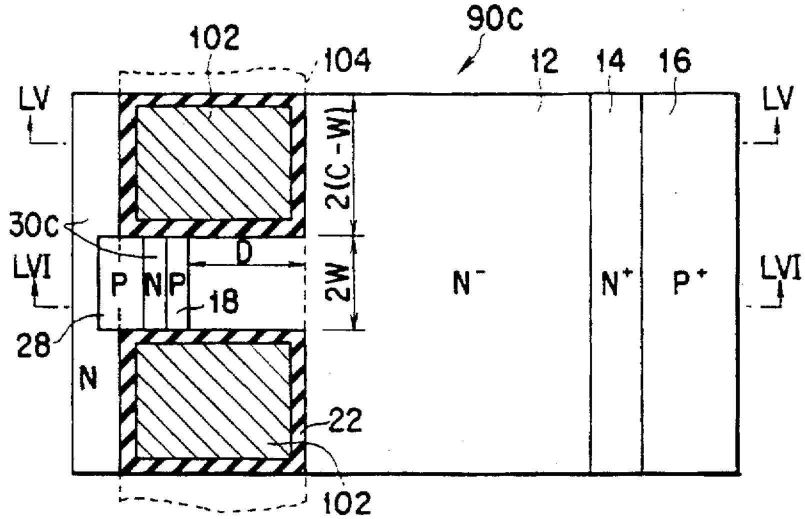
F I G. 54
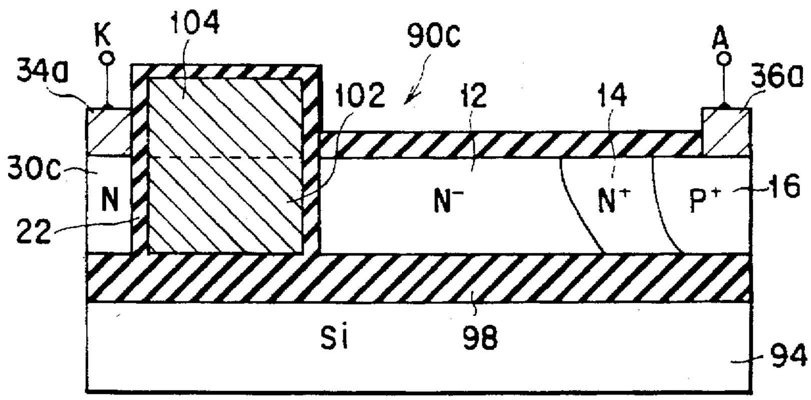
F I G. 55
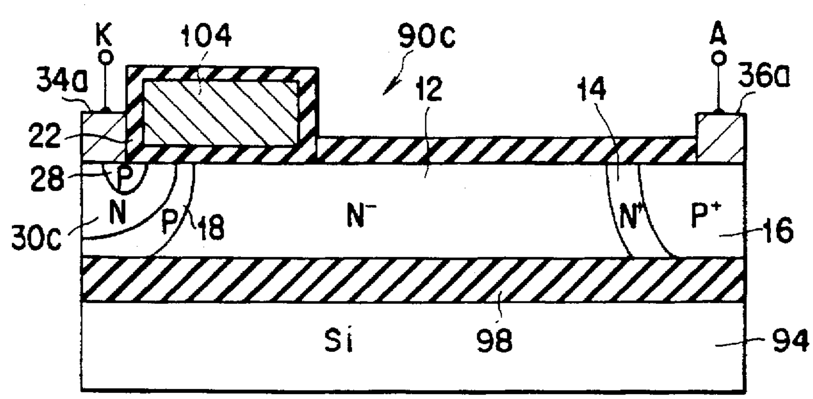
F I G. 56

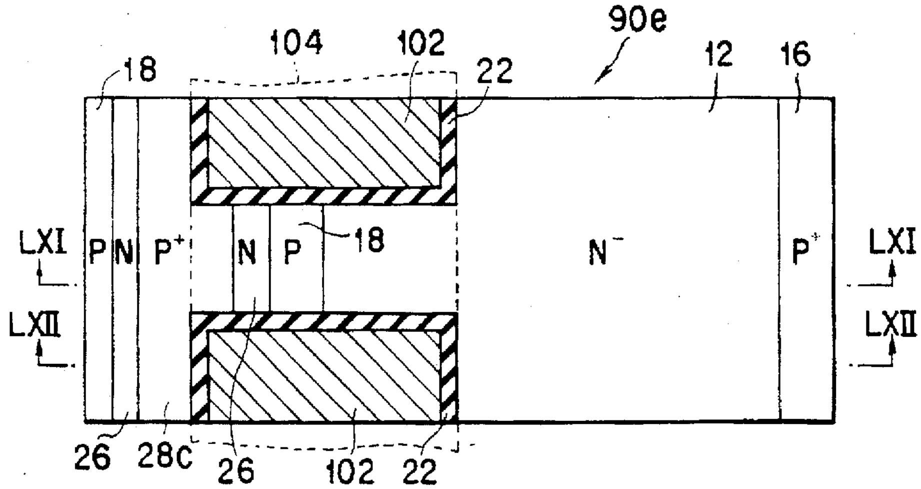
F I G. 60
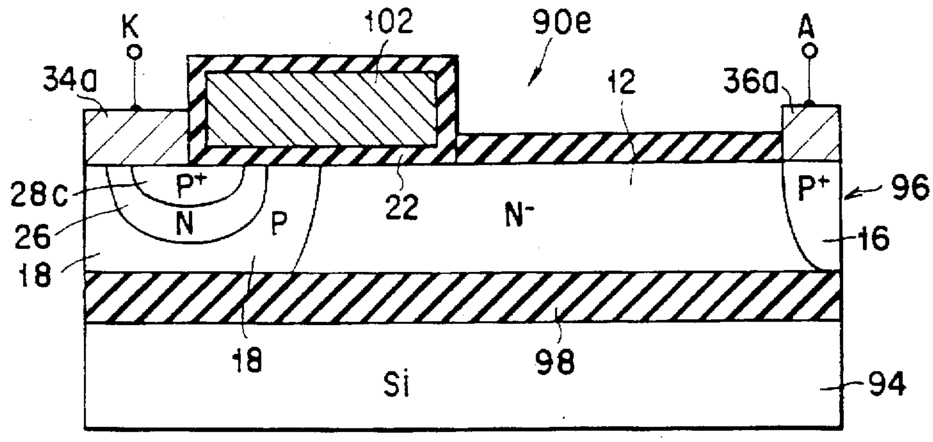
F I G. 61
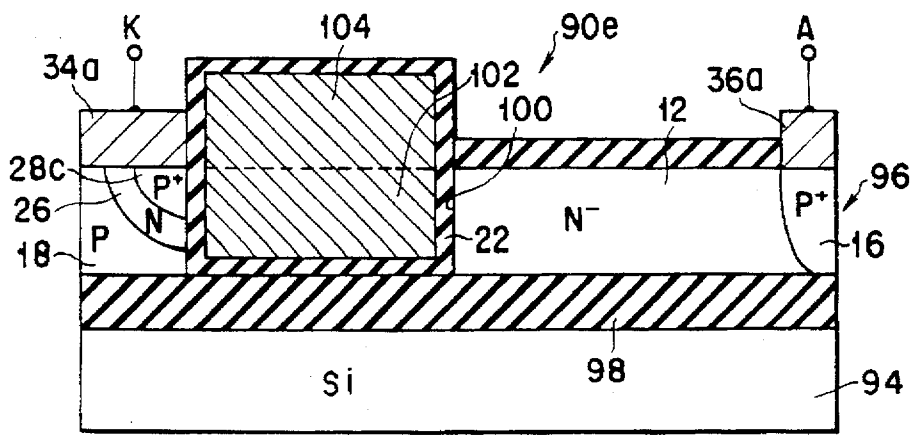
F I G. 62

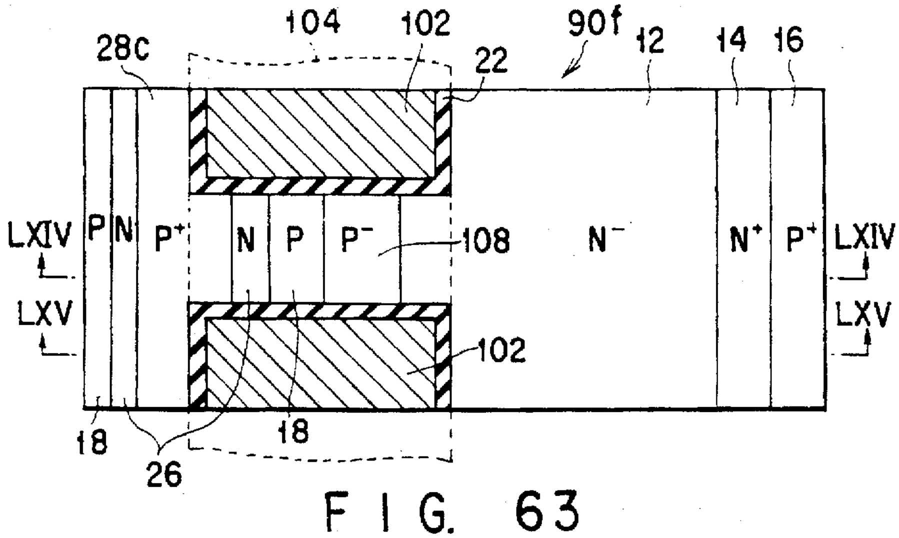
F I G. 63
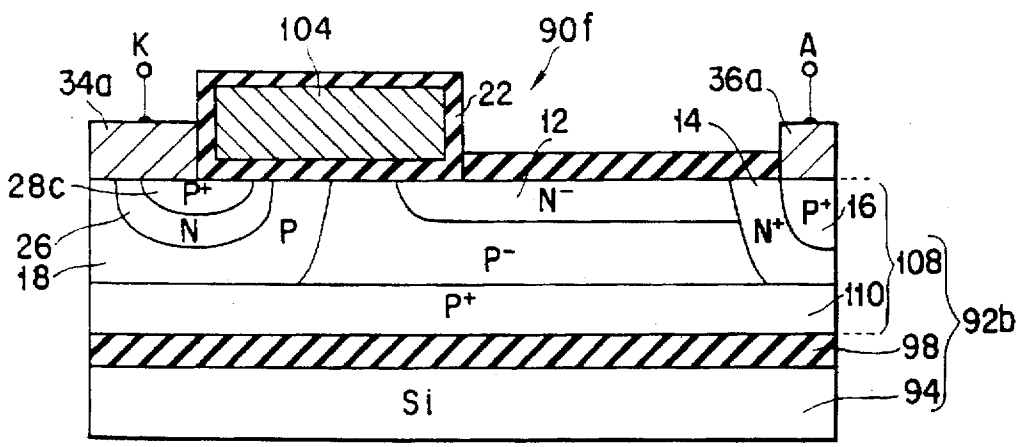
F I G. 64
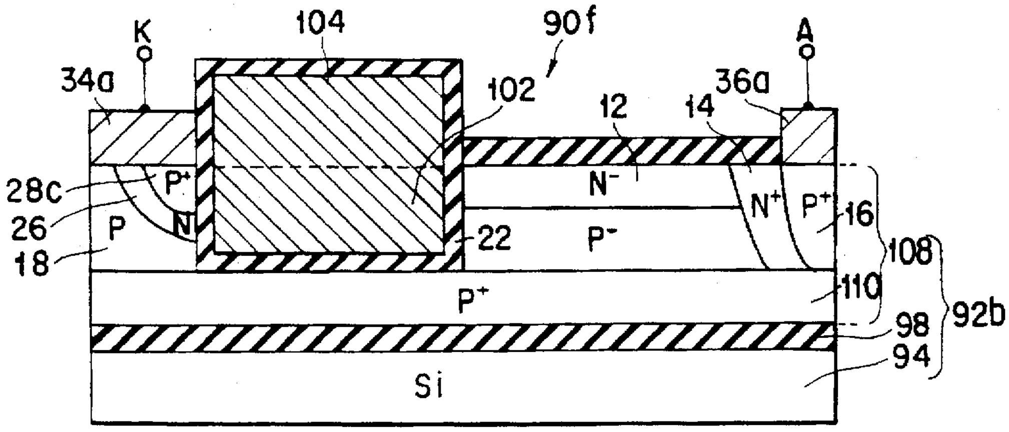
F I G. 65

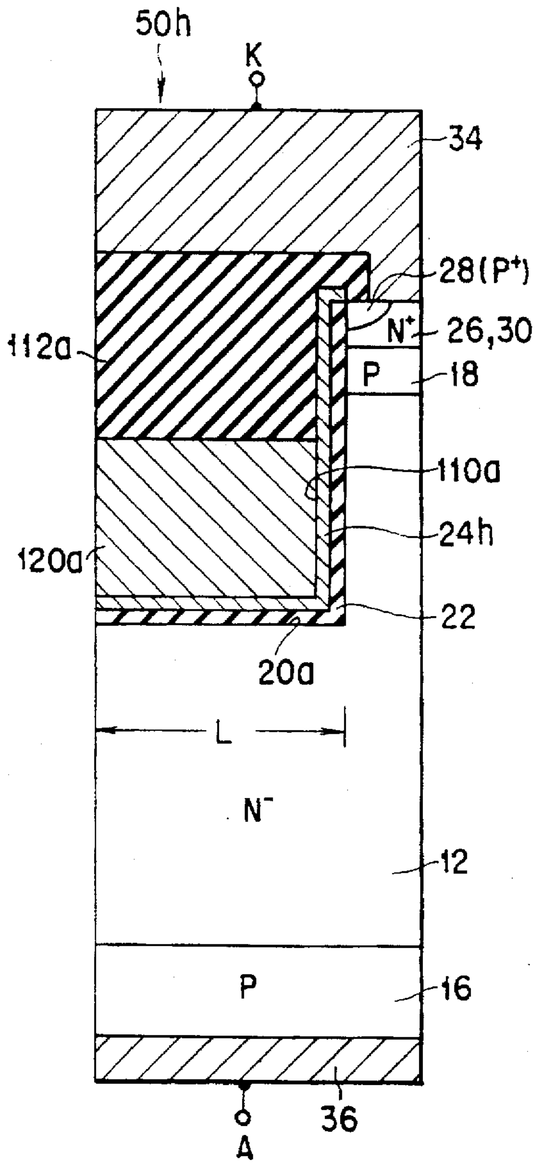
F I G. 73
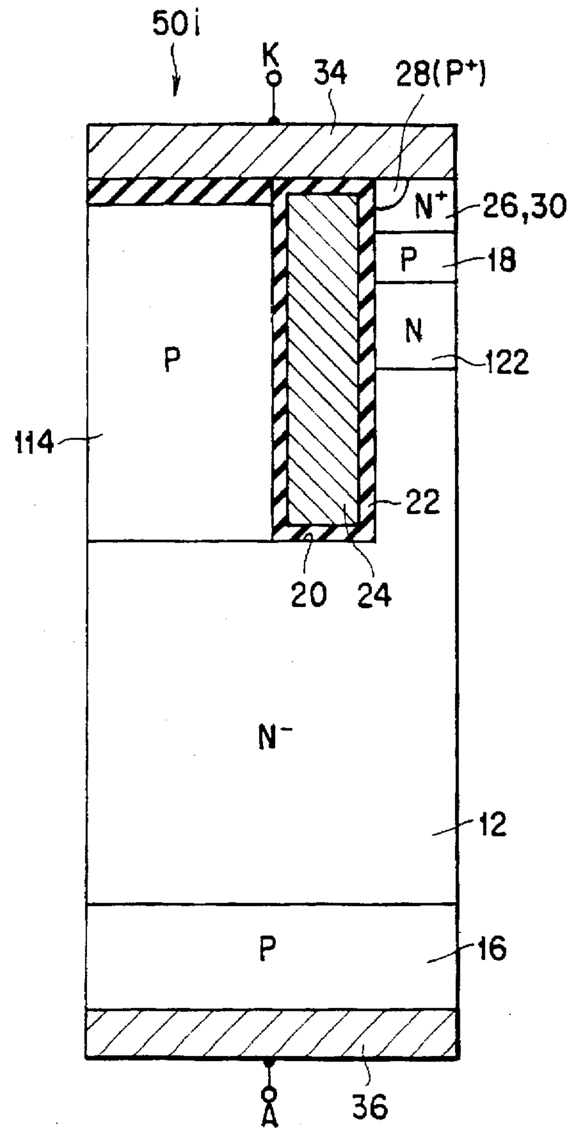
F I G. 74

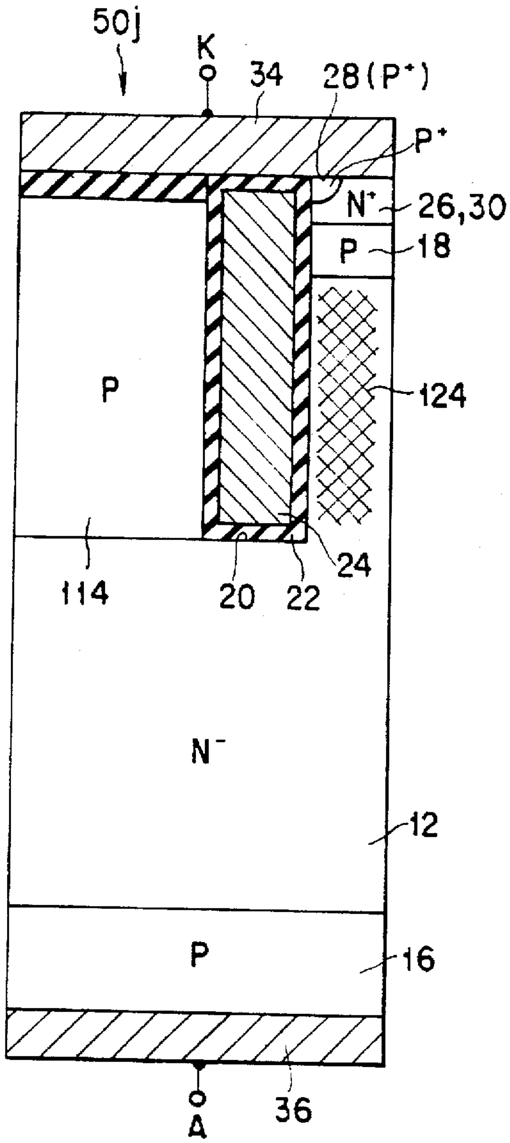
F I G. 75
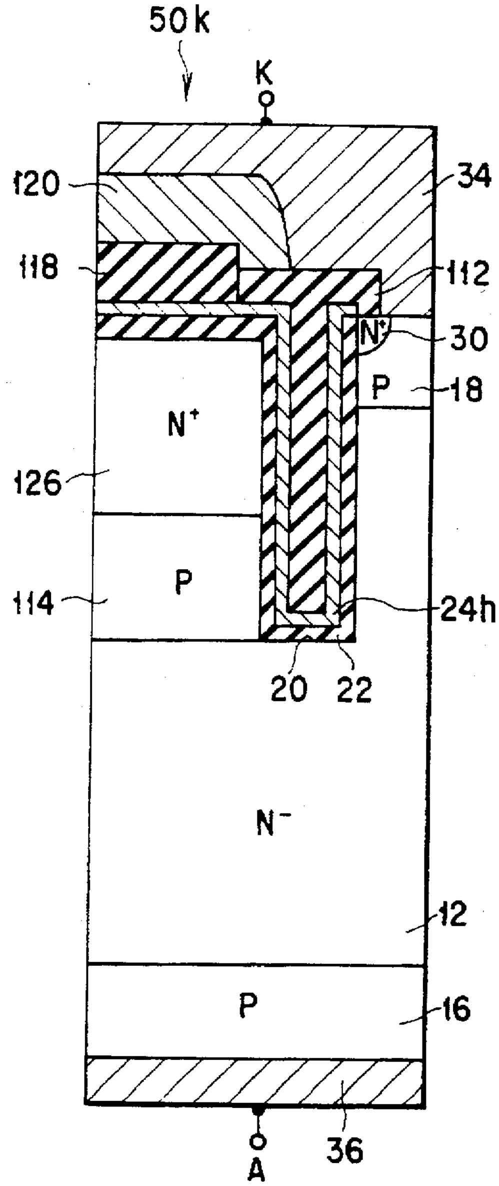
F I G. 76

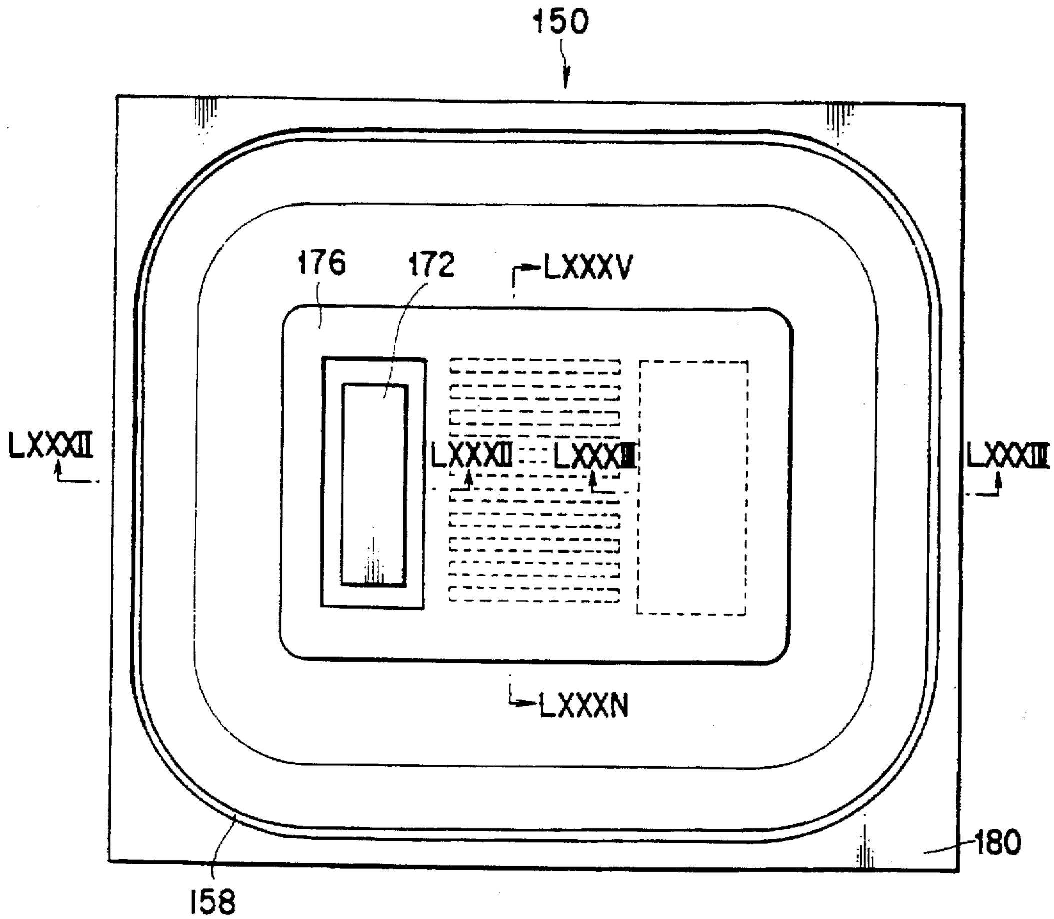
F I G. 8 1
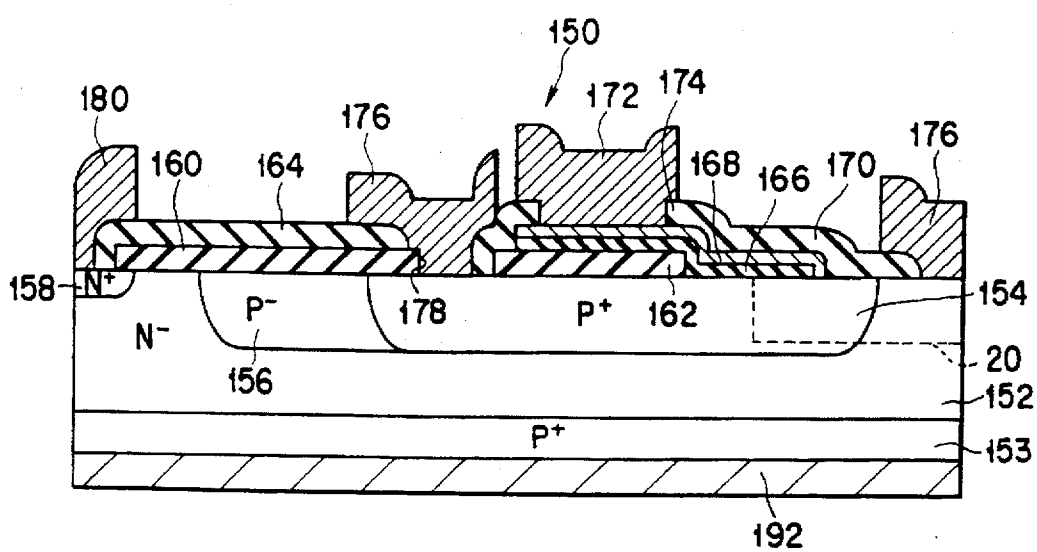
F I G. 8 2

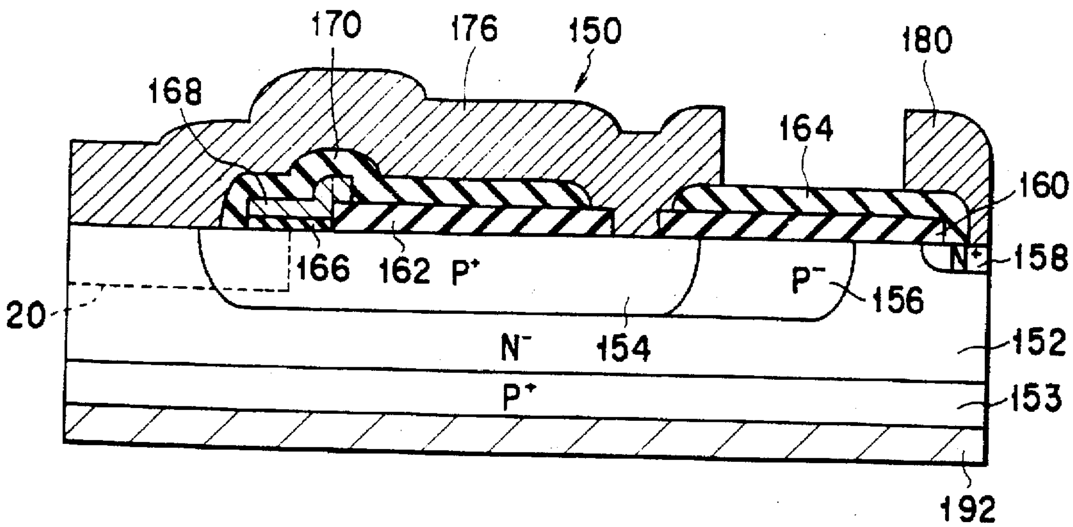
F I G. 83
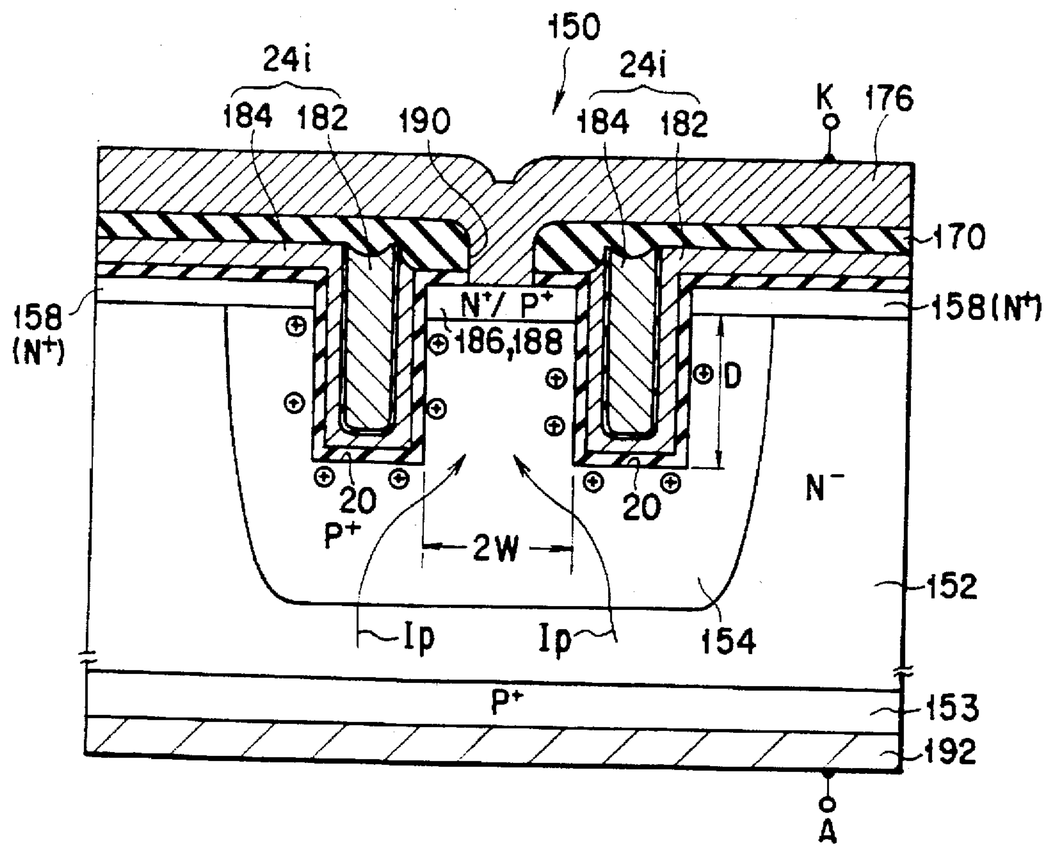
F I G. 84

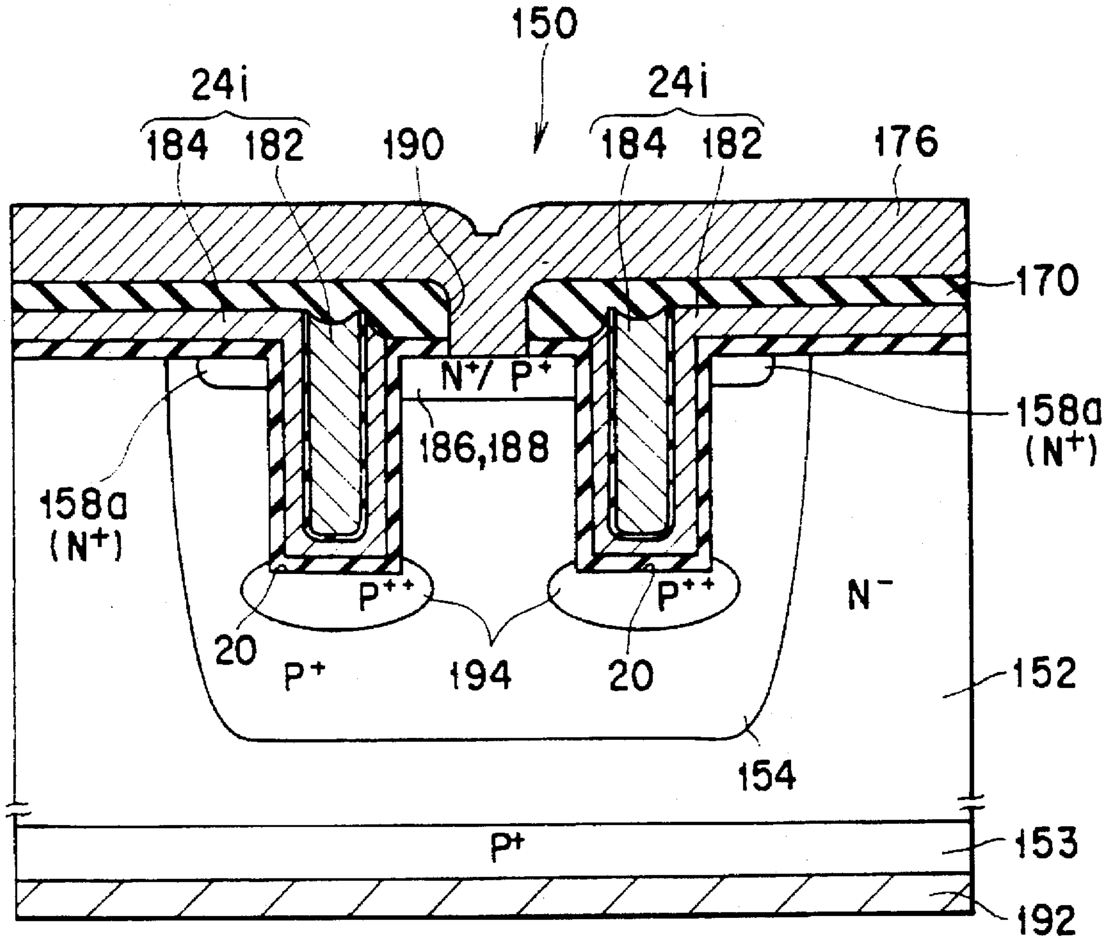
F I G. 85

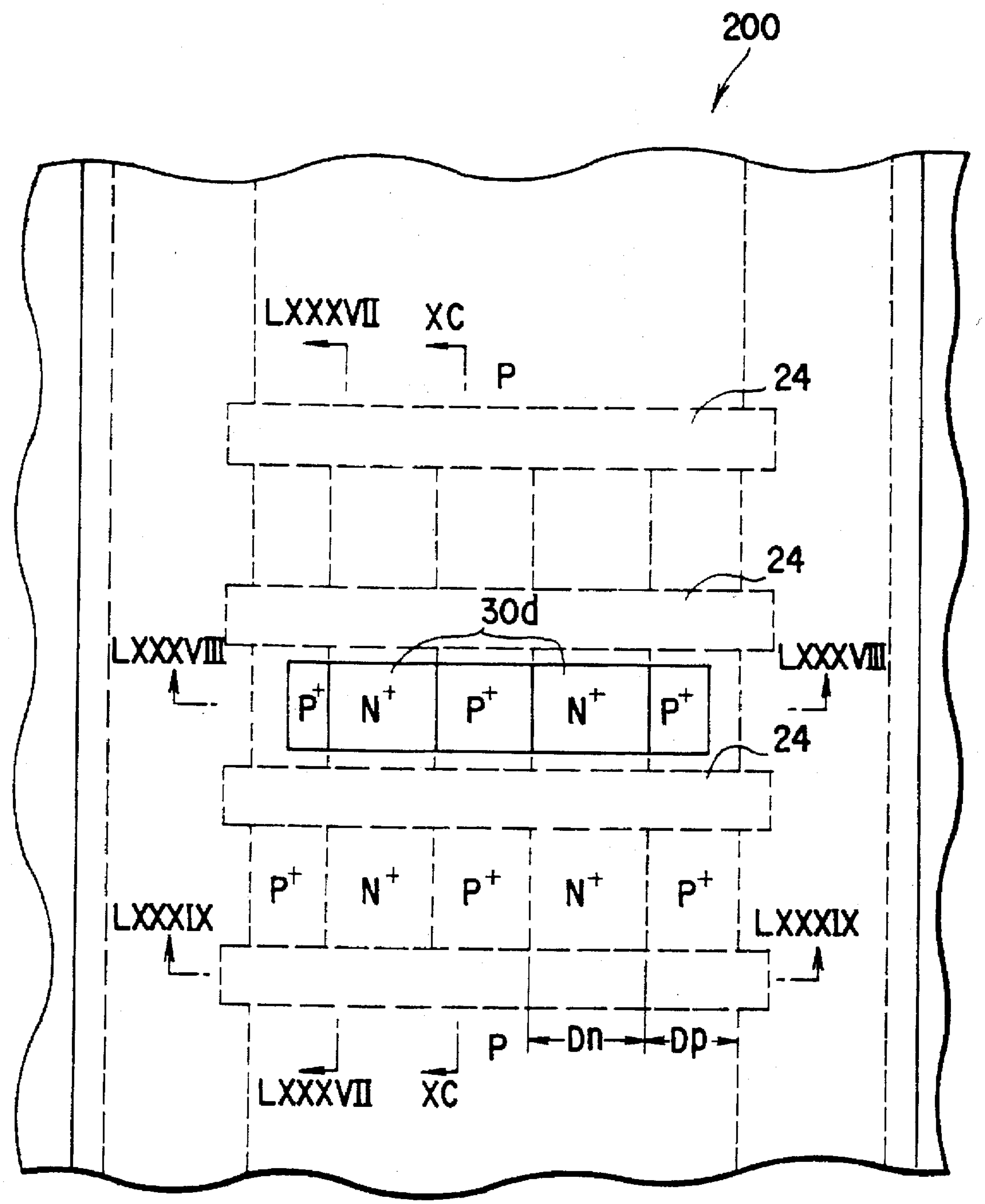
F I G. 86

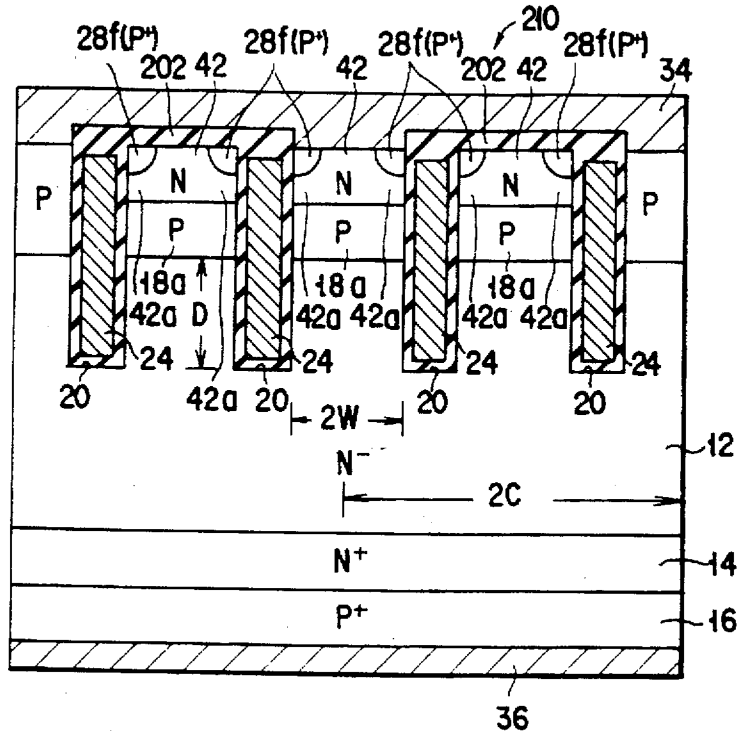
F I G. 93
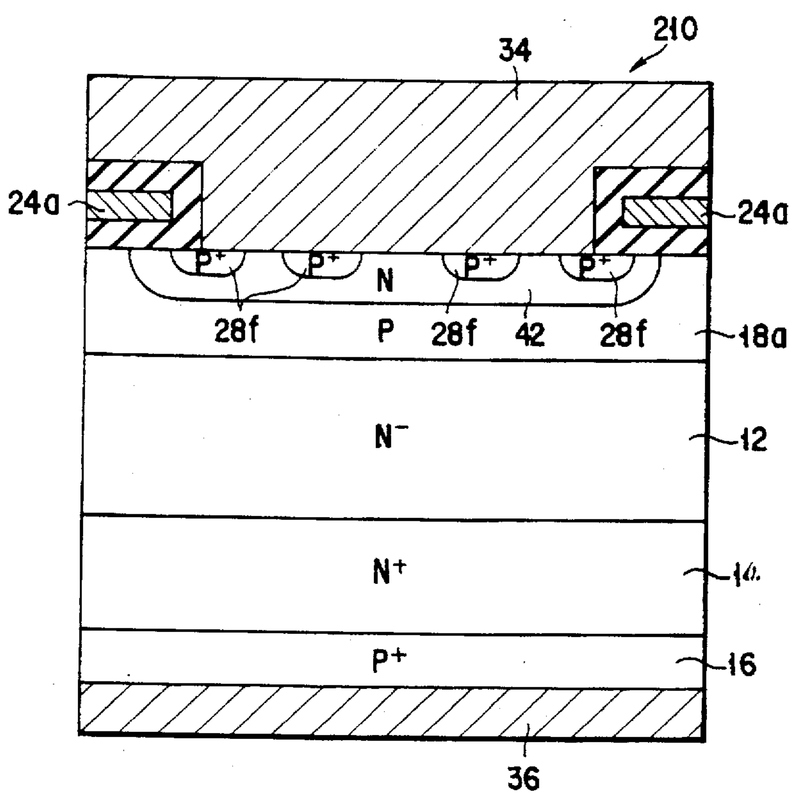
F I G. 94

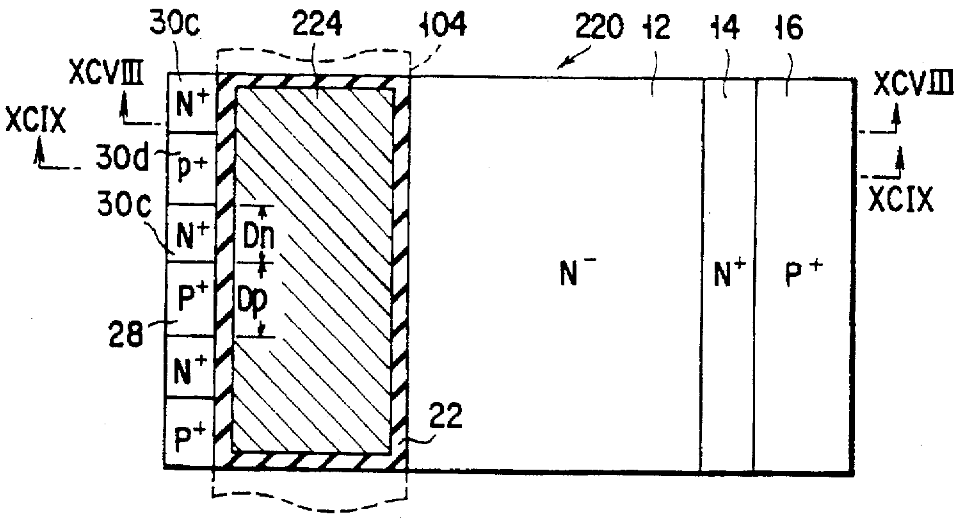
F I G. 97
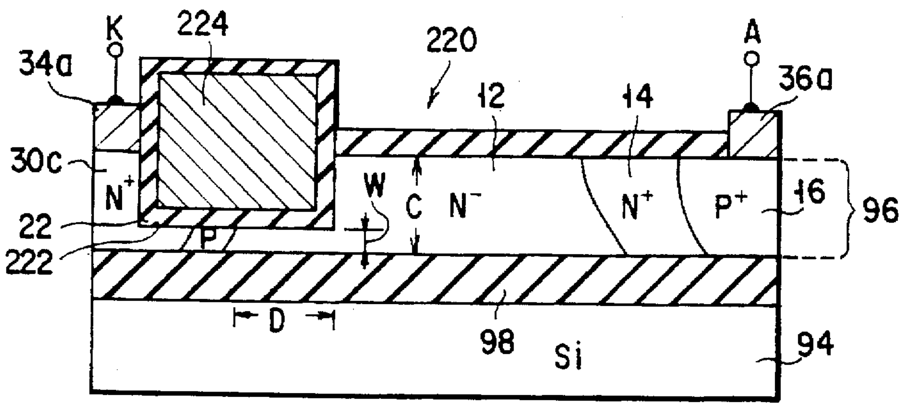
F I G. 98
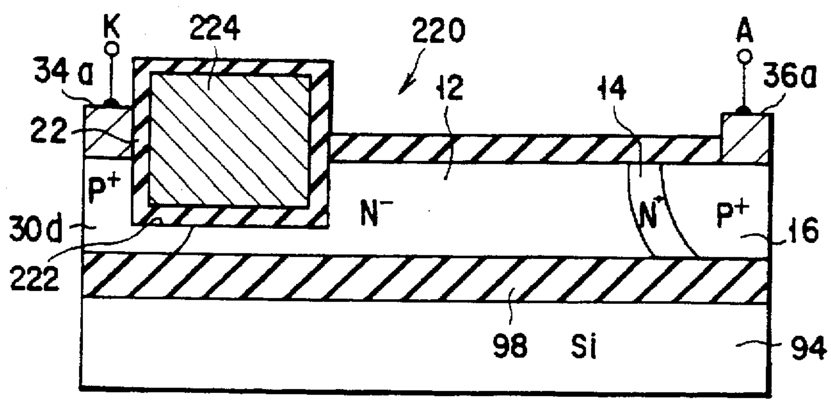
F I G. 99

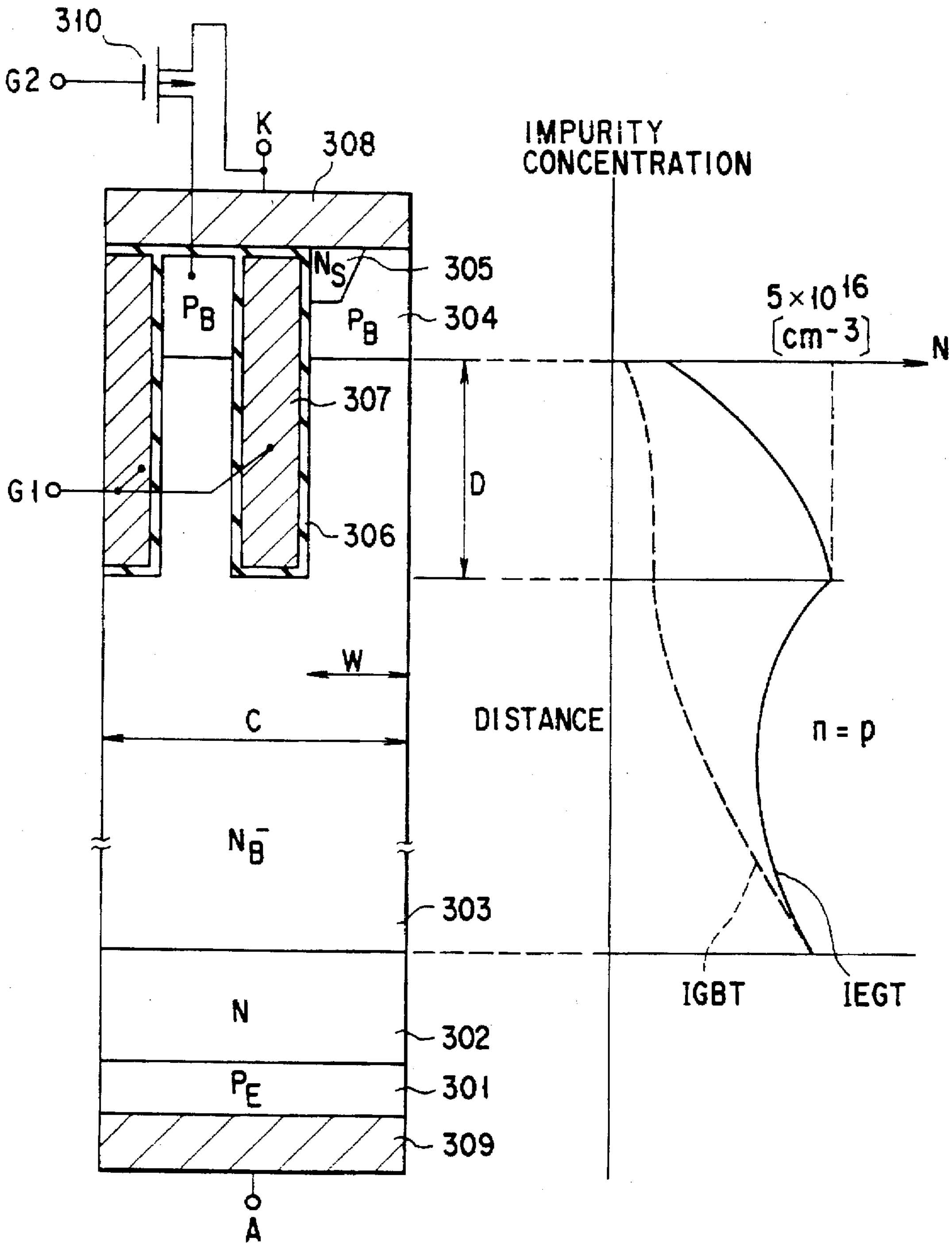
F I G. 103

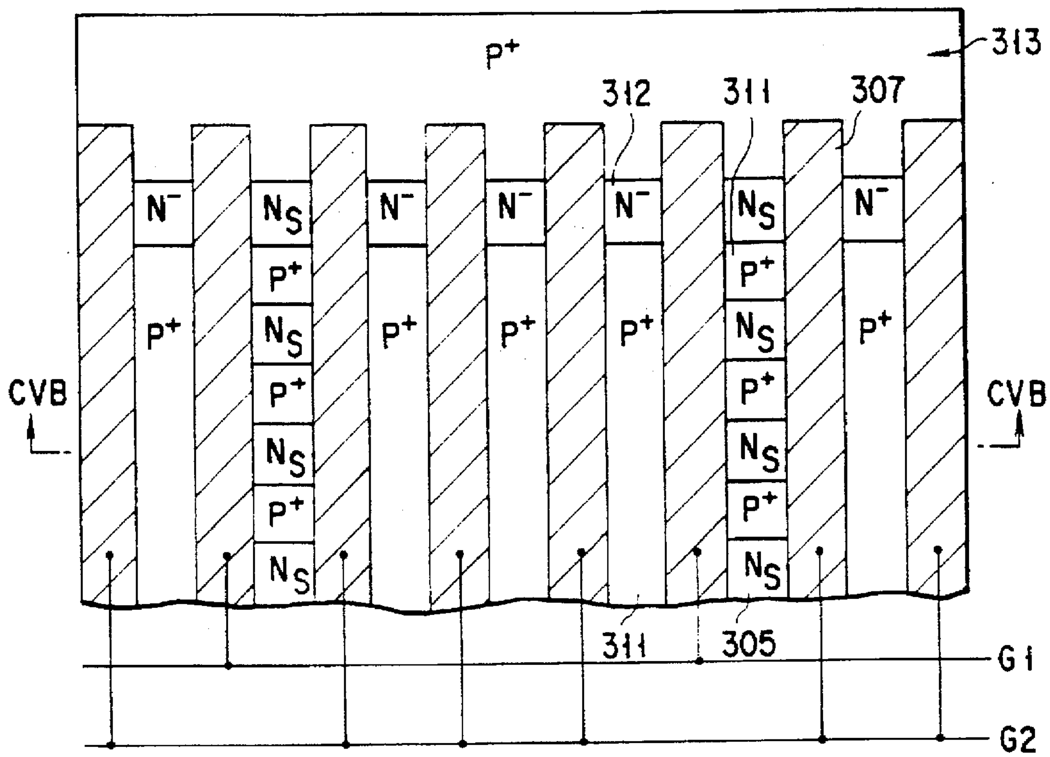
F I G. 105A
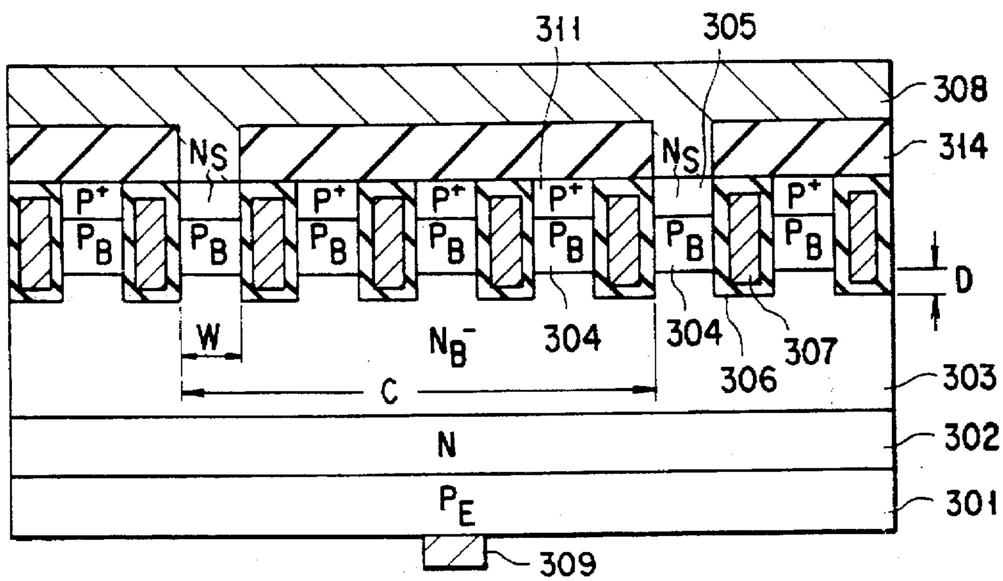
F I G. 105B

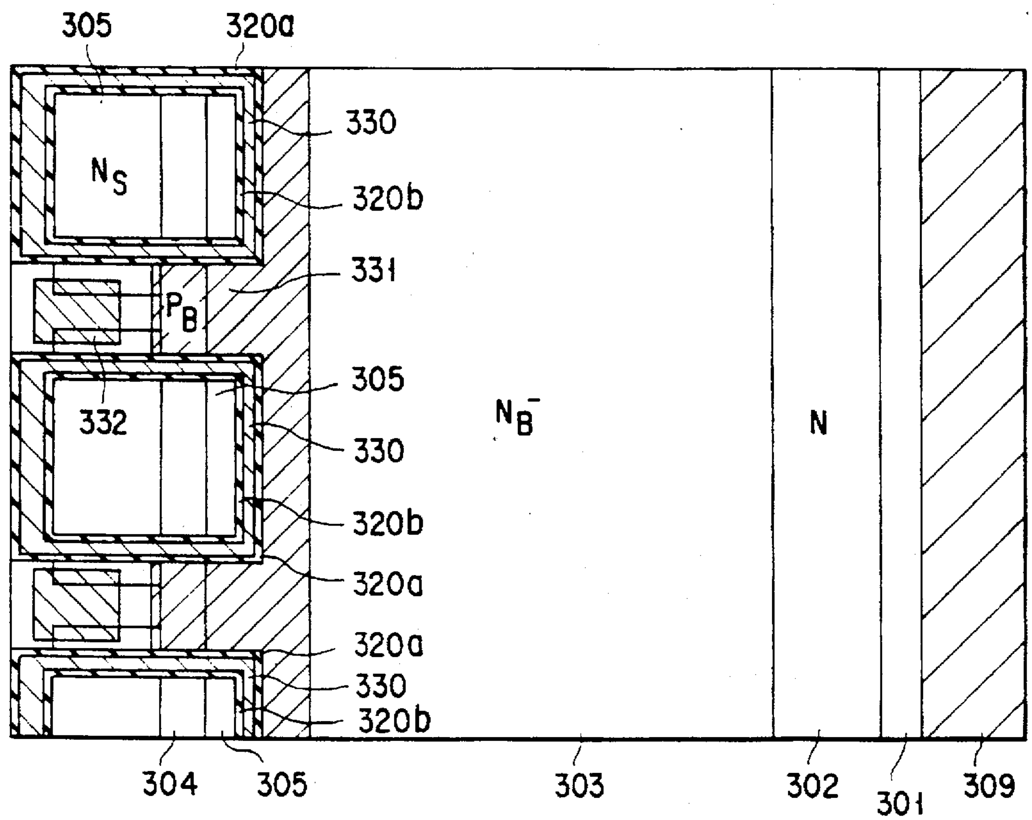
F I G. 109
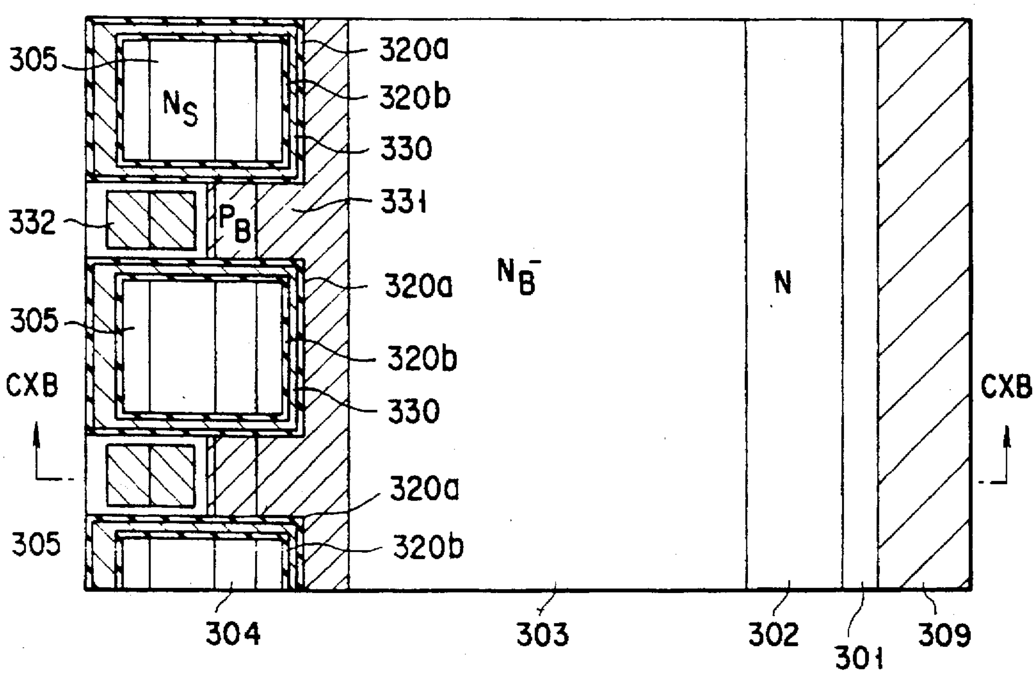
F I G. 110A

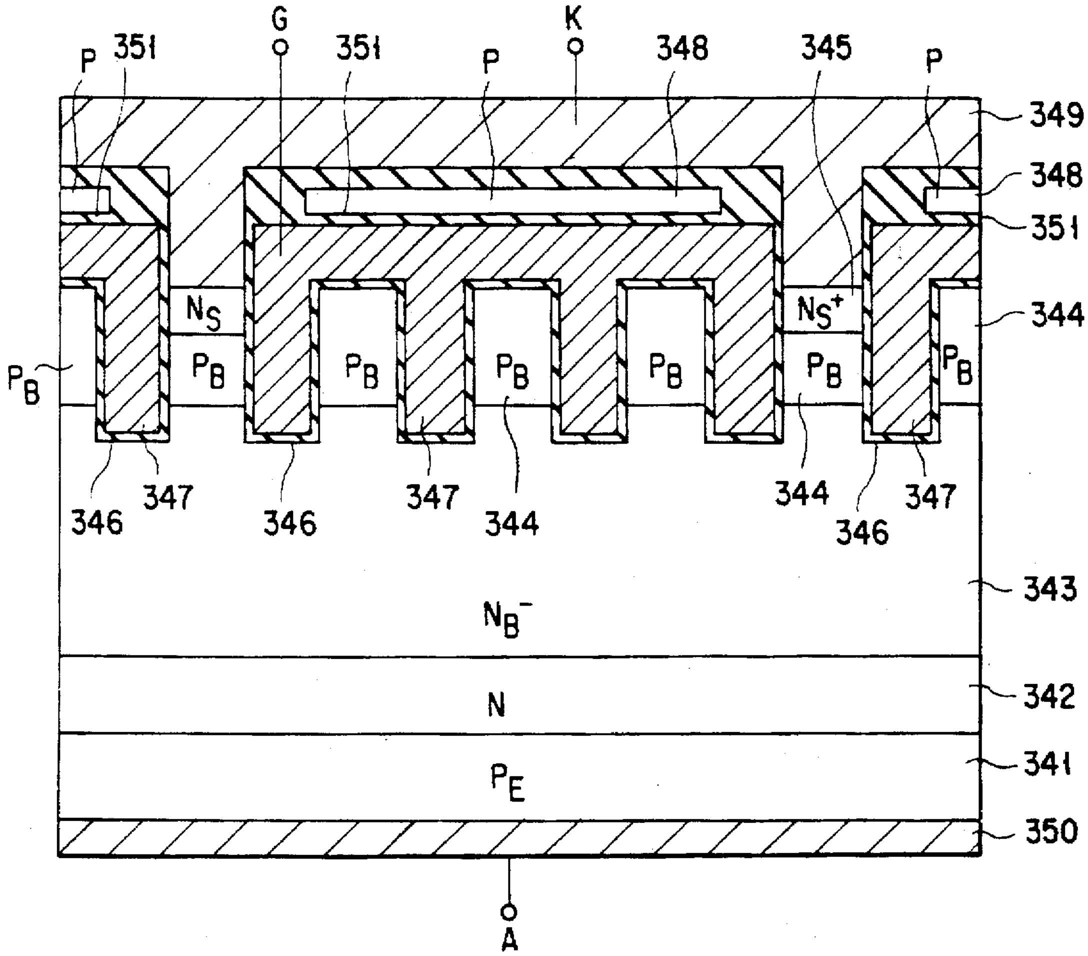
F I G. 114

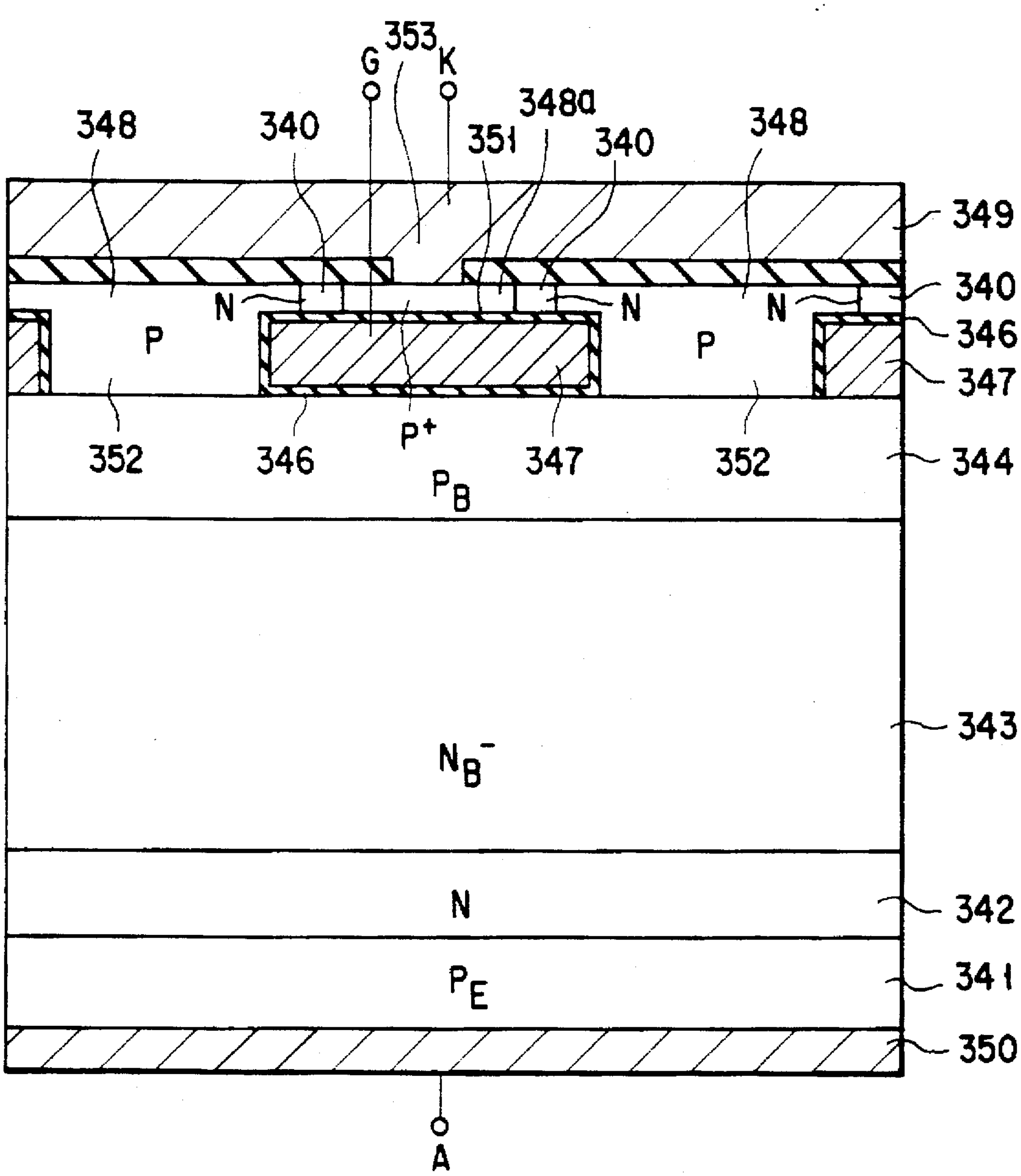
F I G. 115

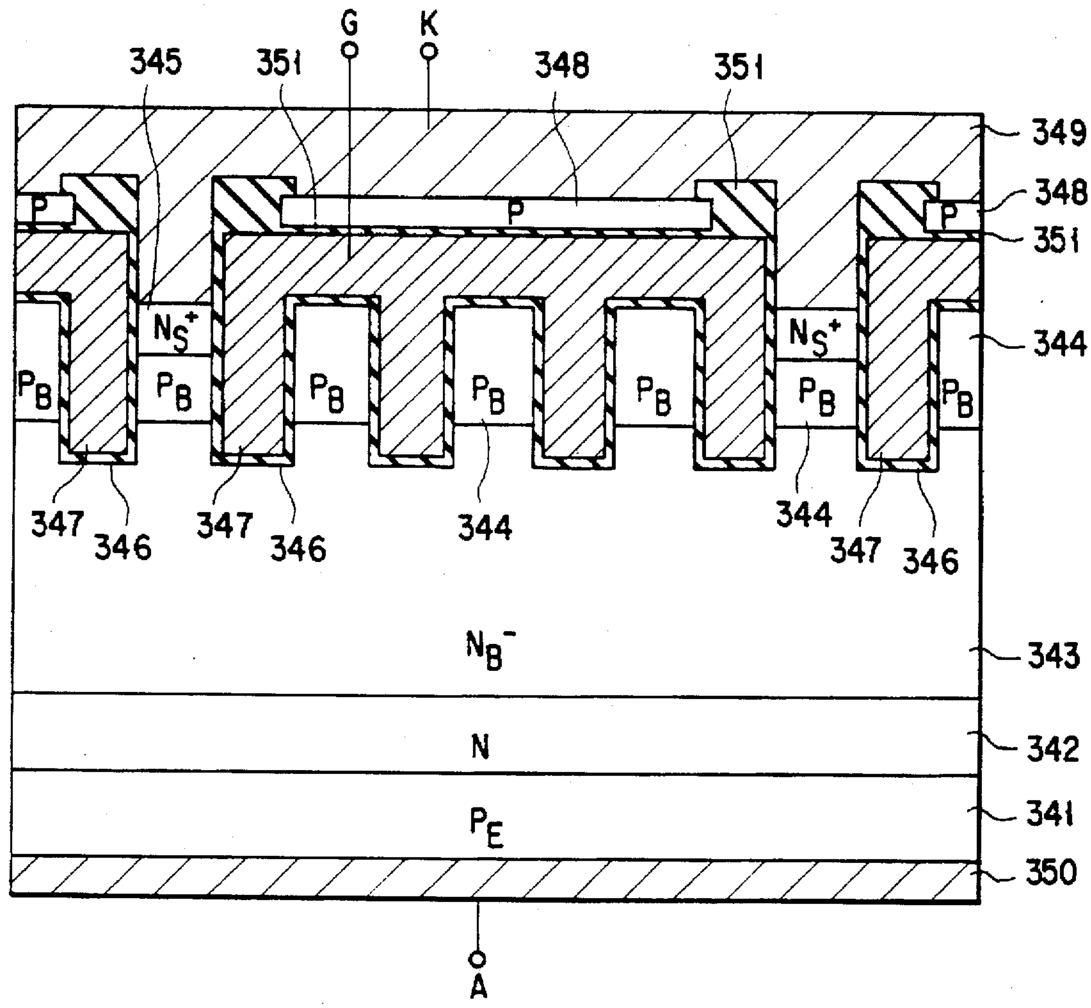
F I G. 117

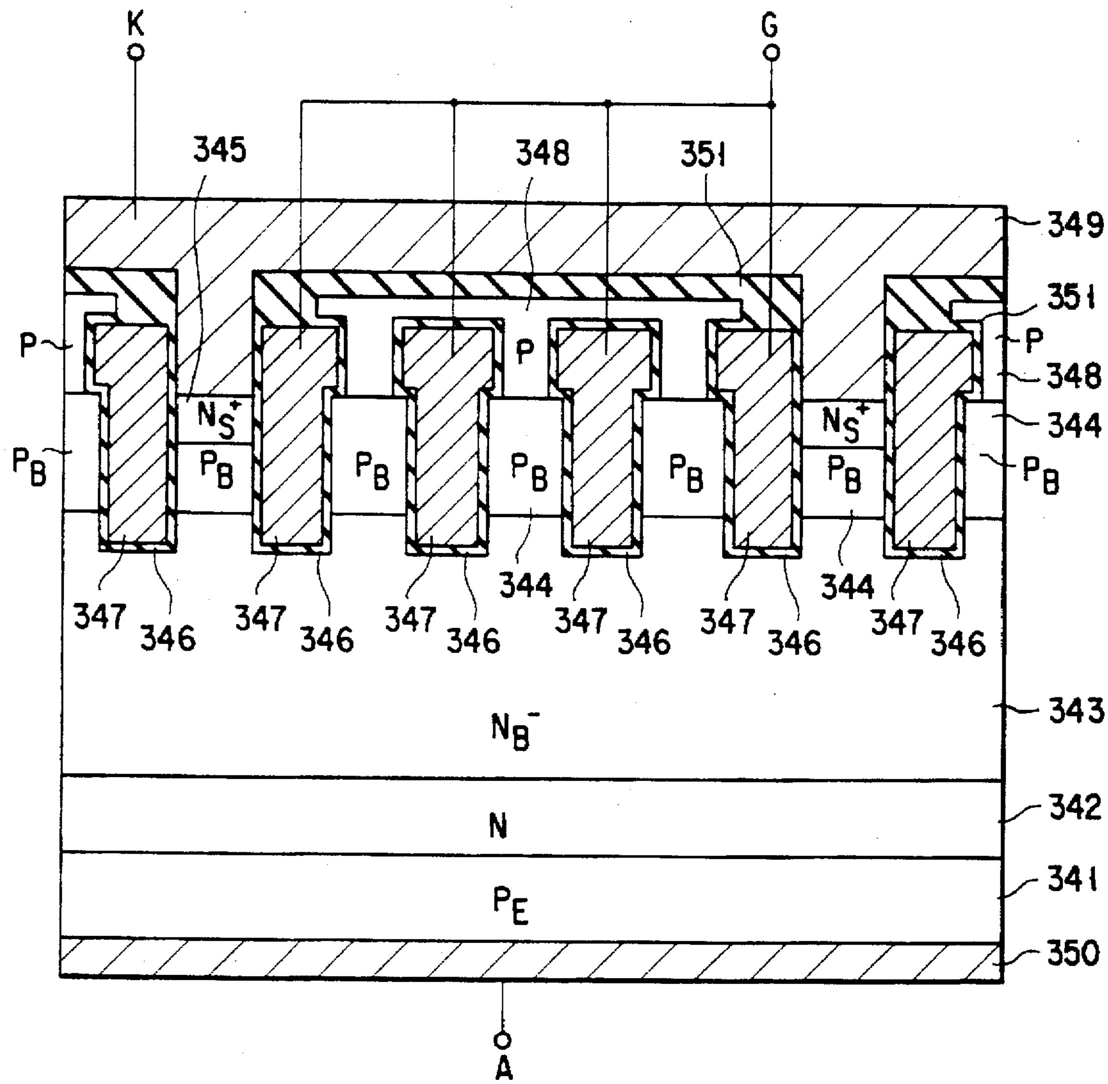
F I G. 118

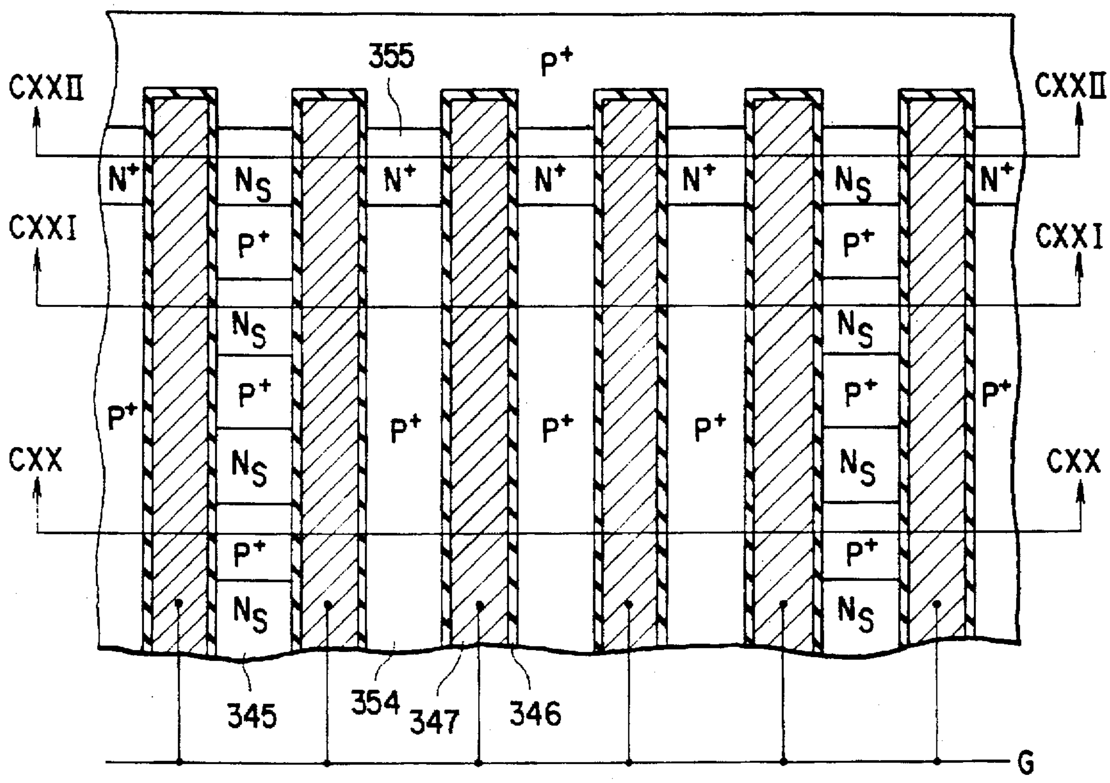
F I G. 119

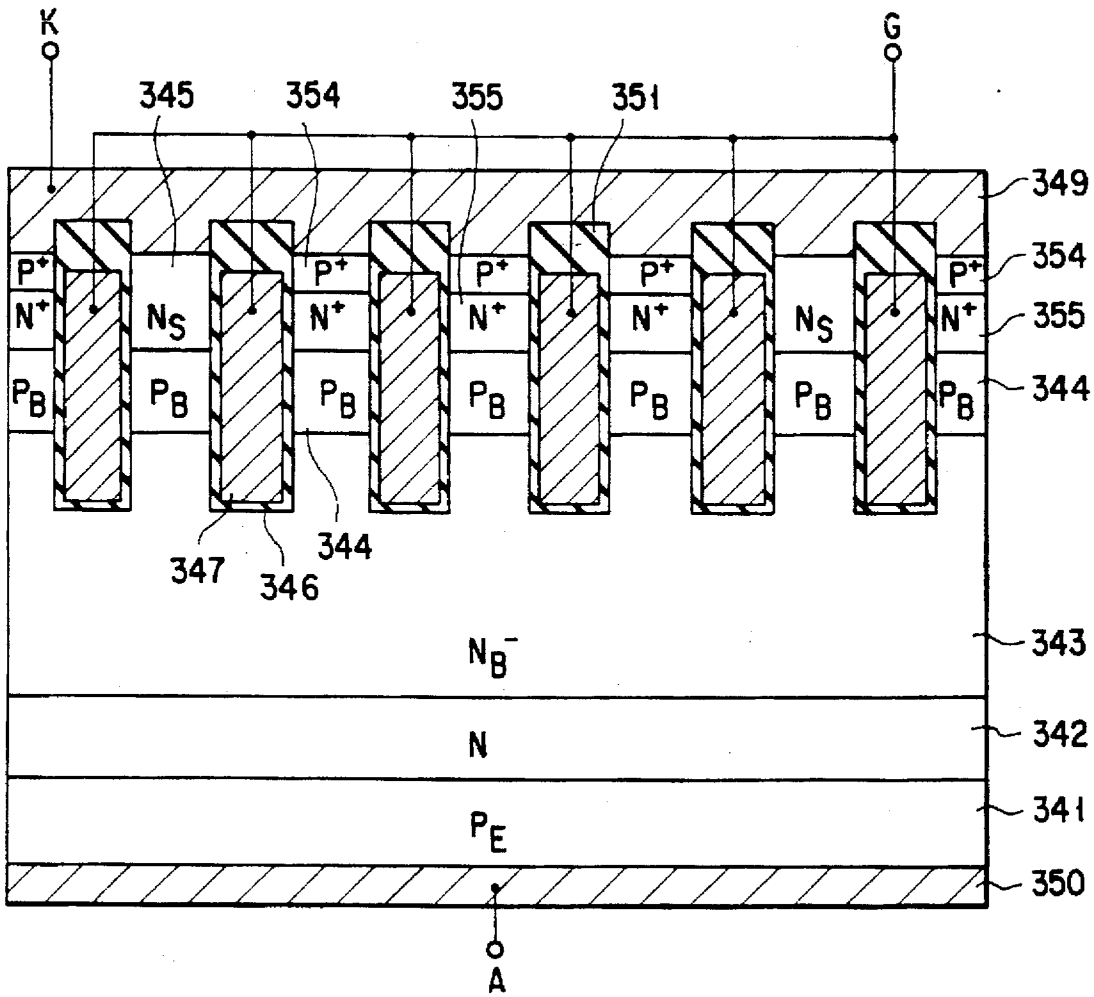
F I G. 120

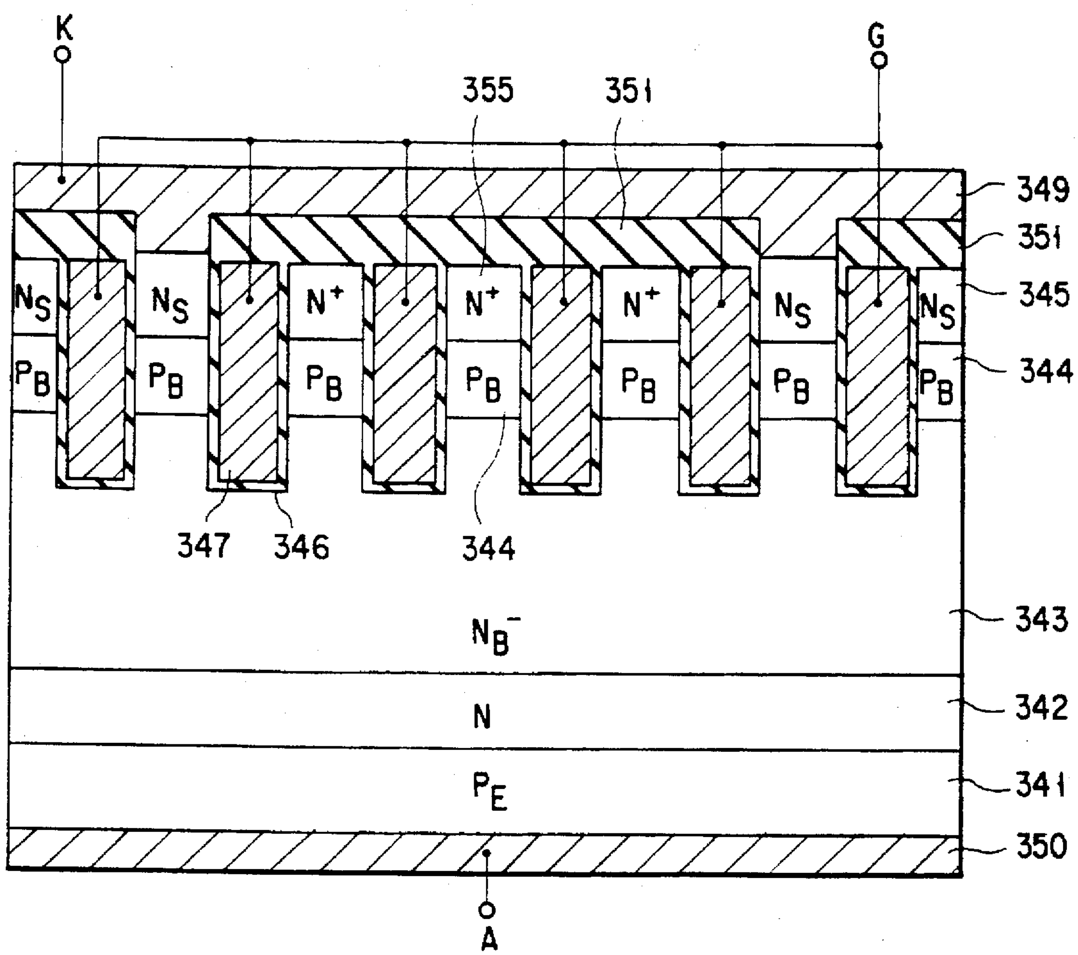
F I G. 122

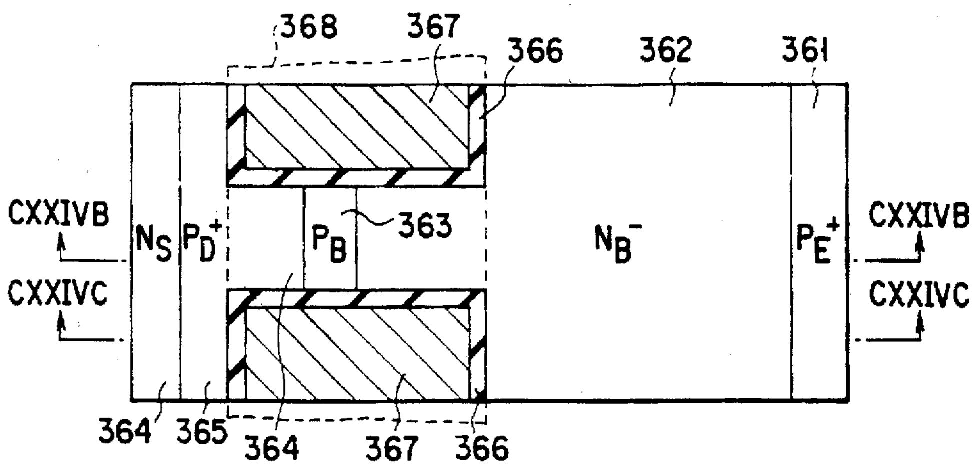
F I G. 124A
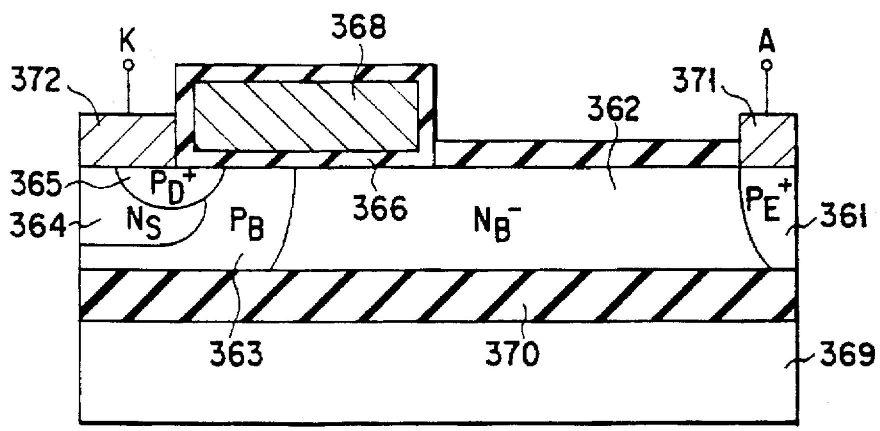
F I G. 124B
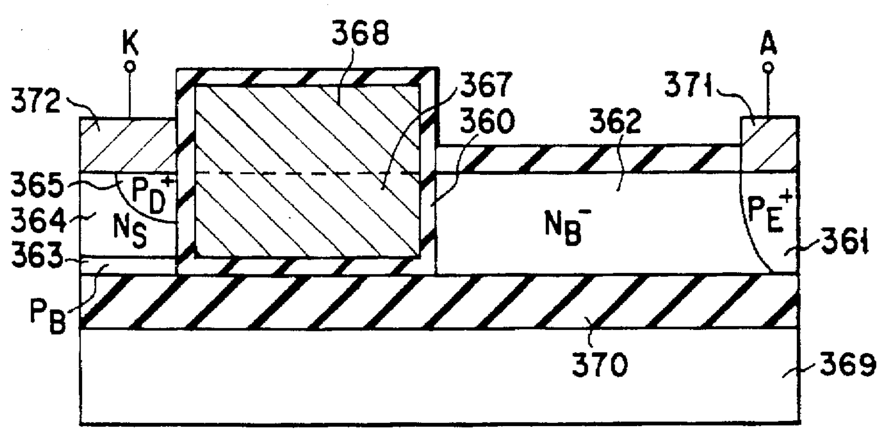
F I G. 124C

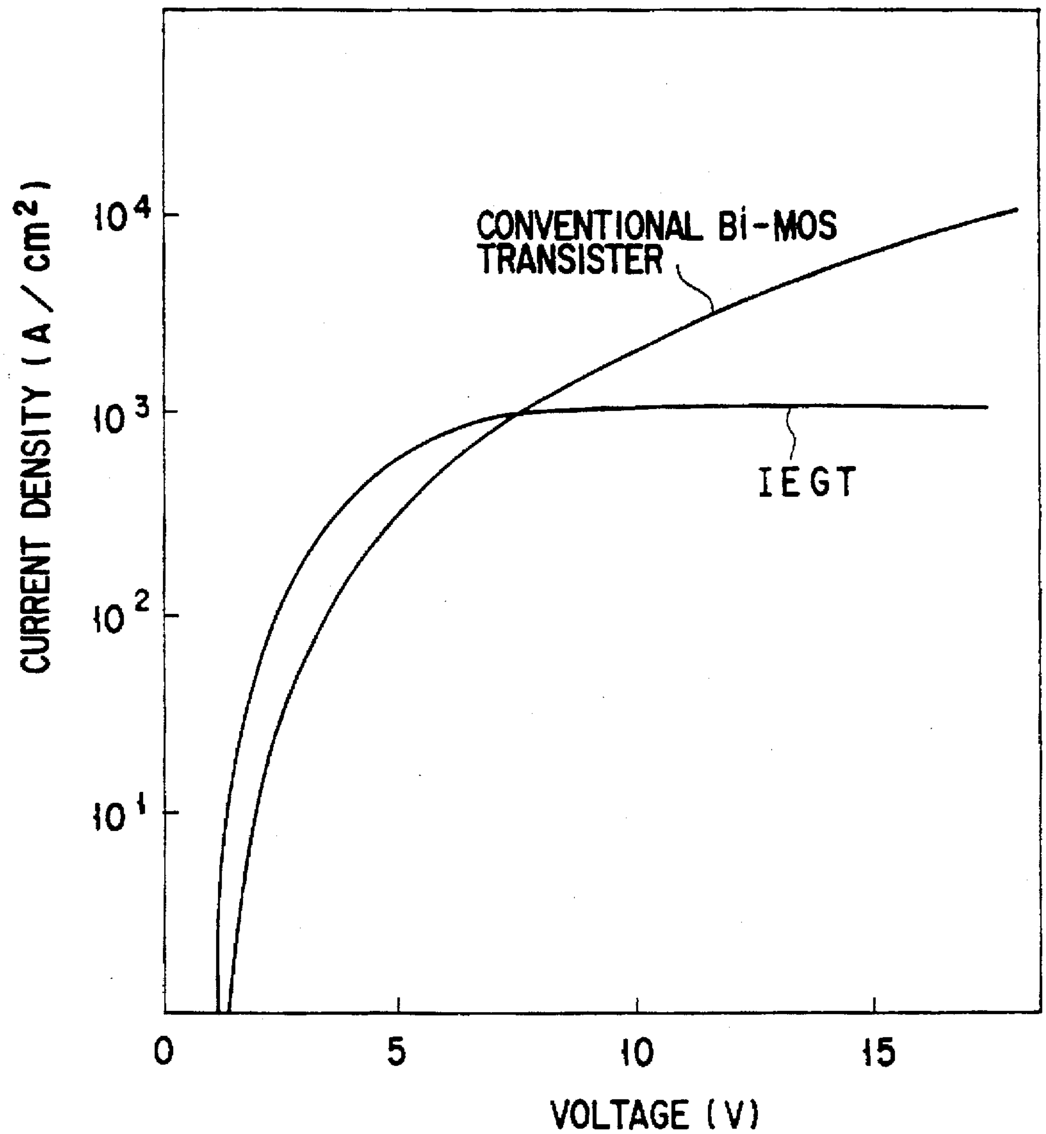
F I G. 145

INSULATED-GATE SEMICONDUCTOR DEVICE

CROSS-REFERENCE TO THE RELATED APPLICATION

This application is a continuation of Ser. No. 08/261,384 filed Jun. 15, 1994 now U.S. Pat. No. 5,448,083 which is a continuation-in-part of U.S. patent application Ser. No. 07/925,870 filed on Aug. 7, 1992, which is U.S. Pat. No. 5,329,142.

BACKGROUND OF THE INVENTION

1. Field of the Invention

The present invention relates generally to semiconductor devices and more particularly to a voltage-controlled self turn-off power semiconductor device with insulated-gate structure.

2. Description of the Related Art

Power semiconductor devices having higher withstanding or breakdown voltage characteristic are increasingly in demand in the recent manufacture of industrial-use equipment. For example, in the field of motor-controllers for railroad vehicles and industrial-use inverters, high-voltage strain switching devices with the withstanding voltage of more than several thousands volts in magnitude are required. Conventionally, self turn-off thyristors such as gate turn-off (GTO) thyristors are known as the semiconductor devices that fulfill such demand.

The self turn-off thyristor is principally one of the current-controlled switch devices. The thyristor will latch up when it turns on, and has an advantage of attaining a decreased "on-resistance" thereof. Decrease in the on-resistance potentially decreases the on-voltage of the thyristor, causing its on-characteristic to be improved. On the other hand, this type of thyristor remains inherently low in the maximum cut-off current density. In particular, a certain type of GTO thyristor that turns off using an insulated gate or metal-oxide-semiconductor (MOS) structure, such as a MOS-controlled thyristor (MCT), suffers from the poor current cut-off ability. This means that such type of thyristor should have a limit in its high-voltage strain characteristic. The breakdown voltage limit is a serious bar to the wide applicability of the GTO thyristor as power controller devices.

In the recent past, there has been proposed and developed a bipolar-type semiconductor device that includes a bipolar transistor section, which is driven to turn on and off by an insulated gate structure. This type of device is generally known as the "insulated-gate bipolar transistor (IGBT)". With a presently available IGBT, a MOS transistor having an insulated gate electrode is added to the base of the transistor section, thereby to enable switching operations to be performed by potentially changing the insulated gate electrode. This means that the IGBT is principally a voltage-controlled switch device. In this respect, the IGBT may be more suitable than the GTO thyristor in applicability as an industrial-use high-voltage strain switch device. Unfortunately, while the IGBT is high in the maximum cut-off current density achievable, it suffers from a serious disadvantage than the on-resistance stays high. This is due to the technical limitation that the IGBT device must be so designed that a latch-up will not occur in an internal thyristor structure, which is constituted by an alternate lamination (PNPN) structure of P- and N-type layers inherent within the IGBT.

The above analysis teaches that the presently available GTO thyristors or insulated-gate GTO thyristors are low in the maximum cut-off current density, whereas IGBTs are high in the on-resistance, and that each of the devices is disadvantageous in that they fail to meet the essential requirements for the high demand self turn-off power semiconductor devices. To date, a self turn-off power semiconductor device has not been achieved yet which can attain both a decreased on-resistance and an increased maximum cut-off current density (enhanced withstanding voltage characteristic).

SUMMARY OF THE INVENTION

It is therefore an object of the present invention to provide a new and improved self turn-off power semiconductor device.

It is another object of the invention to provide a new and improved voltage-controlled power semiconductor device which is low in its on-resistance and high in the current cut-off ability to attain an enhanced withstanding voltage characteristic.

In accordance with the above objects, the present invention is drawn to a specific power semiconductor device which comprises a lightly doped semiconductive base layer, a first semiconductive current-carrying layer which is coupled with the base layer and allows first type electrical carriers (holes) to be injected into the base layer, a semiconductive layer for defining a voltage-controlled channel region in the base layer, a second semiconductive current-carrying layer which allows second type electrical carriers (electrons) tò be injected into the base layer mostly through the channel region to cause a conduction modulation to occur therein, and a semiconductive carrier-drain layer that causes carriers stored in the base layer to drain away out of the base layer. The internal carrier injection is enhanced by locally controlling the flow of the first type carriers in the base layer (in a region excluding the second current-carrying layer) to increase the injection efficiency of the second type carriers toward the base layer. The injection enhancement is attained by at least one insulated gate electrode embedded in the base layer so that it at least partially faces the channel region. The gate electrode is arranged in a trench-like groove formed in the base layer. The flow of the first kind of carriers within the base layer is locally changed by controlling or optimizing the ratio of the amount of flow of the first type carriers due to the diffusion effect versus the whole current amount of the device. From a different point of view, the resistivity of the base layer with respect to the internal flow of the first type carriers in a region other than the second current-carrying layer is locally changed so as to limit the carrier flow, so that the injection of the second type carriers is enhanced relatively.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIGS. 2 to 5 are diagrams showing respective cross-sectional views of the device of the preceding figure along lines II—II, III—III, IV—IV and V—V shown in FIG. 1, respectively;

FIG. 6 is a plan view of a power semiconductor device in accordance with another embodiment of the invention, and FIGS. 7 to 9 are cross-sectional views of the device of FIG. 6 along lines VII—VII, VIII—VIII and IX—IX of FIG. 6 respectively;

FIG. 10 is a pan view of a power semiconductor device in accordance with still another embodiment of the invention, and FIG. 11 illustrates a cross-sectional view of the device of FIG. 10 along line XI—XI shown therein;

FIG. 12 is a diagram showing a modification of the cross-sectional structure of FIG. 11;

FIGS. 16 through 26 are diagrams showing the computer-simulation results demonstrating the performance of the power semiconductor devices of the invention, the diagrams including cross-sectional structure models and characteristic graphs;

FIGS. 30 and 31 illustrate cross-sectional views of modifications of the devices shown in FIGS. 28 and 29;

FIG. 32 shows a plan view of the main part of a power semiconductor device in accordance with a still further embodiment of the invention, and FIGS. 33 and 34 are cross-sectional view of the device of FIG. 32 along lines XXXIII—XXXIII, XXXIV—XXXIV, respectively;

FIGS. 35 to 42 are diagrams showing cross-sectional views of some modified devices of the above embodiments;

FIGS. 43 and 44 are cross-sectional views of a structural example wherein the embodiment of FIGS. 10 and 11 is applied to an insulated-gate bipolar transistor (IGBT);

FIGS. 45 and 46 are cross-sectional views of an exemplary device wherein the embodiment of FIGS. 33 and 34 is applied to an IGBT;

FIG. 47 is a cross-sectional view of a device wherein the structure of FIG. 43 is applied to an IGBT;

FIGS. 48 to 68 show seven structural examples which are obtained by applying the power semiconductor device of the invention to lateral-type IGBTs, with every plan view being accompanied by two different cross-sectional views;

FIGS. 69 to 80 show the cross-sectional views of a half-unit cell section of vertical-type IGBTs in accordance with the invention;

FIG. 81 illustrates the main plan view of a power semiconductor device in accordance with a still further embodiment of the invention, and FIGS. 82 to 84 are cross-sectional views of the device of the preceding figure along lines LXXXII—LXXXII, LXXXIII—LXXXIII, LXXXIV—LXXXIV, respectively;

FIG. 85 is a diagram showing a modification of the cross-sectional structure shown in FIG. 84;

FIG. 86 shows a plan view of a power semiconductor device in accordance with an embodiment of the invention.

FIGS. 93 to 96 show respective cross-sectional views of the device of FIG. 92 along lines XCIII—XCIII, XCIV—XCIV, XCV—XCV and XCVI—XCVI shown in FIG. 92, respectively;

FIGS. 97 to 102 show two additional embodiments of the IGBTs of FIGS. 48 through 68;

FIG. 103 is a schematic diagram showing an insulated-gate semiconductor device in accordance with still another embodiment of the present invention;

FIG. 105A is a plan view showing the specific arrangement of an insulated-gate semiconductor device in accordance with still another embodiment of the present invention, and FIG. 105B is a cross-sectional view along a line CVB—CVB of FIG. 105A;

FIG. 109 is a plan view of a lateral-type insulated-gate semiconductor device in accordance with still another embodiment of the present invention;

FIG. 110A is a plan view showing a lateral-type insulated-gate semiconductor device in accordance with still another embodiment of the present invention.

FIGS. 114 to 118 are cross-sectional views along lines CXIV—CXIV, CXV—CXV, CXVI—CXVI, CXVII—CXVII, and CXVIII—CXVIII of FIG. 113, respectively;

FIG. 119 is a plan view showing an insulated-gate semiconductor device in accordance with still another embodiment of the present invention;

FIGS. 120 to 122 are cross-sectional views along lines CXX—CXX, CXXI—CXXI, and CXXII—CXXII of FIG. 119, respectively;

FIG. 124A is a plan view showing an insulated-gate semiconductor device in accordance with still another embodiment of the present invention, and FIGS. 124B and 124C are cross-sectional views along lines CXXIVB—CXXIVB and CXXIVC—CXXIVC of FIG. 124A, respectively;

FIG. 38A is a plan view showing an insulated-gate semiconductor device in accordance with still another embodiment of the present invention.

FIG. 145 is a graph showing the voltage-current characteristic of an IEGT in accordance with the present invention in comparison with that of a conventional Bi-MOS transistor;

DETAILED DESCRIPTION OF THE PREFERRED EMBODIMENTS

Before explaining several types of embodiments based on a single inventive concept, attention should be directed to the fact that the description is developed by first presenting some embodiments which are based on the intermediate-level concept of the present invention regarding the injection-enhanced power semiconductor device. The specific devices that are believed to generically embody the principle of the invention will be described later in the description with reference to FIGS. 86 to 96.

Figure 1:
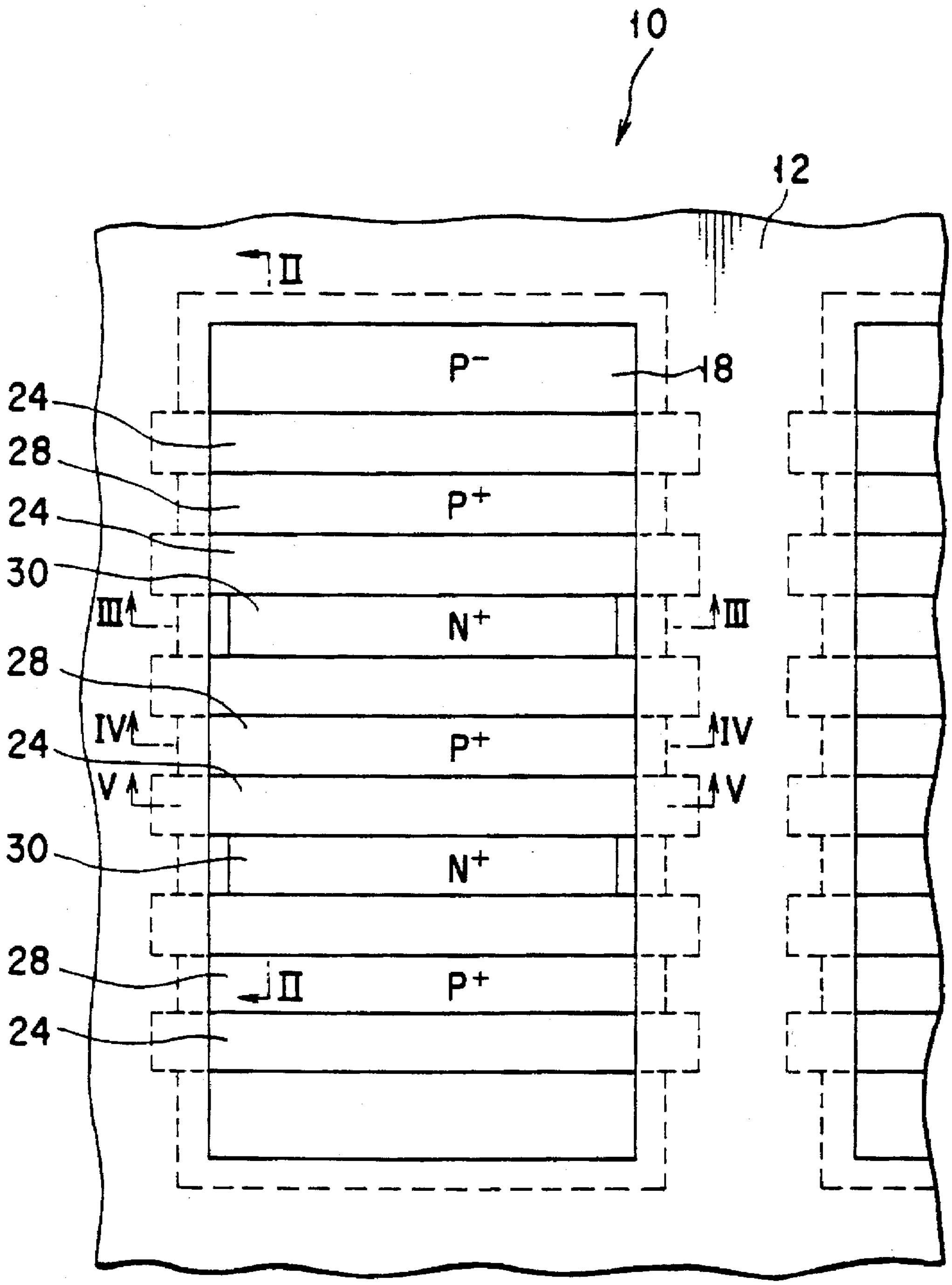
FIG. 1 is a diagram showing the plan view of a power semiconductor device in accordance with one preferred embodiment of the present invention.

Referring now to FIG. 1, an insulated-gate power semiconductor device in accordance with one preferred embodiment of the invention is generally designated by the numeral 10. The insulated-gate semiconductor device 10 has a semiconductive substrate 12 of a preselected type of conductivity. Substrate 12 may be a lightly-doped N (N–) type silicon wafer.

As shown in FIG. 2, a heavily-doped N (N+) type silicon layer 14 and a P type silicon layer 16 are sequentially formed on the bottom surface of N– type layer 12. This layer 12 is an N type base. N+ type layer 14 is a buffer layer; layer 16 is a P type emitter. A lightly-doped P (P–) type silicon layer 18 is formed by diffusion on the top surface of N type base layer 12 to have a predetermined depth.

A plurality of straight, deep and narrow grooves 20 are formed in the top surface of the N type base layer 12. These grooves are arranged in parallel with one another at a preselected constant interval or distance, thereby to provide a planer stripe pattern. Each groove 20 has an elongated rectangular profile across the thickness of N type base layer 12 as shown in FIG. 2. A gate insulation thin film 22 is formed on the inner surface of each groove 20. A conductive layer 24 is insulatively buried in each groove 20 so that layer 24 is electrically insulated by gate insulation film 22 from N type base layer 12. N type layers 26 of intermediate depth are alternately formed among grooves 20. More specifically, one N type layer 26 is present between every pair of two adjacent ones of grooves 20. This layer will be called the "turn-off channel layer" hereinafter. A shallow P+ type layer 28 is formed in the surface of each turn-off channel layer 26. Layer 28 will be called the "P type drain layer". Each lamination of layers 18, 26 and 28 constitutes, within N type base layer 12, a vertical-type P-channel metal oxide semiconductor field effect transistor (MOSFET) Q, which is voltage-controlled by a corresponding insulated gate electrode 24 associated therewith. The grooves 20 will be referred to as "trenches"; insulated gate electrodes 24 buried in the trenches will be called "trench-gate electrodes" or "trench gates".

At the remaining portions other than the regions among trenches 20, N+ type diffusion layers 30 are formed which are as shallow as the P type drain layer 28. Each N+ type layer 30 is present between adjacent pairs of trenches 20. Each N+ type layer 30 is shallow enough to prevent a parasitic thyristor internally inherent inside device 10, which thyristor is comprised of a PNPN lamination structure consisting of itself (N type source layer 30), P type base layer 18. N type base layer 12 and P type emitter layer 16, from rushing into a latch-up condition. Alternatively, layer 30 may be deep enough to facilitate a latch-up to take place, if required.

As is apparent from FIG. 2, a P type silicon layer 32 is formed in the N type base layer 12 so that it contacts with the side wall of one of the trenches 20 which is positioned at the periphery of the series array of trenches 20. A gate electrode 24a is insulatively disposed above layer 12. A first main electrode 34 insulatively overlies grooves 20 and gate electrode 24a. A second main electrode 36 is formed on P type emitter layer 16. Layer 34 is a cathode electrode of device 10; layer 36 is an anode electrode thereof. The profile of N type source layer 30 within layer 18 is shown in FIG. 3. The cross-section of each turn-off channel layer 26 and that of P type drain layer 28 are illustrated in FIG. 4. Insulated-gate electrode 24a on the substrate surface is electrically coupled to the plurality of trench gates 24 buried in trenches 20 as shown in FIG. 5.

The power semiconductor device 10 with trench-gate structure may be designed in size to measure as follows: The thickness of an N type silicon wafer to be used as N type base layer 12 in device 10 may be 450 micrometers. N type buffer layer 14 is formed to a thickness of 15 micrometers. The thickness of P type base layer 18 is 2 micrometers. Trenches, each of which is formed to a width of 1 micrometer and a depth of 5 micrometers, are arrayed at a 1-micrometer interval. Trench-gate insulation film 22 may be a thermal oxide film or an ONO oxide film having a thickness of 0.1 micrometer or less. N type turn-off channel layer 26 measures 0.5 micrometers in its effective channel length as a result of the formation of P type drain layer 28 in the top surface region of layer 26. N type source layer 20 is formed by a known impurity diffusion process to a depth of approximately 4 micrometers.

The operation of the device 10 is as follows. When a voltage of positive polarity is applied to the trench gate electrodes 24 with respect to the cathode electrode 34, a turn-on channel at the peripheral position of P type base layer 18 is rendered conductive. Electrons are then injected from N type source layer 30 into N type base layer 12, causing a conduction modulation to occur therein. The internal parasitic thyristor previously described turns on by an IGBT action.

When a voltage of negative polarity is applied to the trench gates 24 with respect to cathode electrode 34, an inversion layer is formed at a side edge portion of each turn-off channel layer 26 (N type layer of MOSFET Q) facing a corresponding trench 20, i.e.. trench-side side wall portion of layer 26, in the trench gate section. Due to known P-channel MOS transistor action, charge carriers that reside within p type base layer 18 are drained to cathode electrode 34 through p type drain layer 28. Device 10 thus turns off. This embodiment is specifically arranged so that the parasitic thyristor consisting of N type source layer 30, P type base layer 18, N type base layer 12 and P type emitter layer 16 is prevented from being latched up even under the ON state of device 10. When the on-channel is closed, the injection of electrons is forced to stop immediately.

In the device 10, a "unit cell" section is defined by a certain trench gate 24, P type drain layer 28 and N type layer 10 which are positioned at both sides of trench gate 24, and another trench gate 24 adjacent to the certain trench gate. Since these four components are designed to a width of 1 micrometer as previously described, the unit cell section measures 4 micrometers in size. By suitably arranging the depth and interval (placement distance) of the plurality of trench-gate electrodes 24 in the way as described above while having the unit cell kept miniaturized, it becomes possible to attain a sufficiently reduced "on-resistance" while forcing device 10 to maintain out of a thyristor action. The fact that the turn-off channel is closed while device 10 turns on may also contribute to achievement of a reduced on-resistance. Furthermore, with this embodiment, the parasitic thyristor will not latch up under the ON state. When device 10 turns off, the turn off channel opens to provide a bypassing path for the flow of holes. The embodiment can thus be much enhanced in its maximum cut-off current ability than the existing GTO thyristors, which are conventionally designed to turn off after it is latched up.

With the device 10, by optimizing the width, depth and mutual distance of the miniaturized trench gate electrodes 24, the on-resistance can be reduced to the extent that the existing GTO thyristors offer, with the parasitic thyristor structure inside device 10 being prevented from latching up. The reason for this is as follows: principally, the hole bypass resistance is increased due to the formation of deep and narrow trench gates 24 at increased interval or placement distance between adjacent ones thereof, so that the injection efficiency of electrons can be improved. More specifically, assuming that, in the cross-sectional structure of FIG. 2, a certain trench gate 24 and two layers (P type drain layer 28 and N type source layer 30) being positioned on both sides of this gate 24 are broadly defined as an "emitter region", the emitter injection efficiency can be increased as required by causing a Rp-to-Rn resistance ratio to be 4 or more, where Rp is a resistance against the flow of holes in the "broad defined" emitter region, and Rn is a resistance against the electron flow in the turn-on channel to be formed at the side-wall of trench. Fortunately, the experiments performed by the present inventors have demonstrated that such setting of hole-to-electron resistance ratio (Rp/Rn) can be attained by optimizing the width, depth and placement distance of the trench gates 24.

A power semiconductor device 40 with a multiple trench-gate structure shown in FIGS. 6–9 in accordance with a second embodiment of the invention is similar to that of FIGS. 1–5 with the trench gates 24 being modified in size as will be described below. As shown in FIG. 7, a normally doped P type base layer 18*a* is formed in the N type base layer 12. The plurality of trench-like grooves 20 for insulated gate electrodes 24 are so deep that a distance D between the bottoms of trenches 20 and of P type base layer 18*a* is greater than that of the cross-sectional structure shown in FIG. 2. Typically, the depth of layer 18*a* measures 3 micrometers, and that of trench 20 is 6 micrometers. Distance D is 3 micrometers, In addition, with device 40, the distance between adjacent ones of trenches 20 is 2 micrometers, which is approximately twice as much as that of the embodiment shown in FIG. 2. A normally-doped N type silicon layer 42 is formed between adjacent ones of trenches 20. This layer 42 functions as both N type turn-off channel layer 26 and N type source layer 30 of FIG. 2. N type drain layers 28*a* are formed in the surface of layer 42 such that two P type drain layers 28*a* are in contact with each trench 20 at both side edges thereof, with the peripheral trenches at the two ends of trench array being excluded. Certain layer portions 42*a* of N type layer 42, which are positioned just beneath the two P type drain layers 28*a*, are equivalent in function to the N type turn-off channel layer 26 of FIG. 2. The central region of N type layer 42 corresponds in function to the N type source layer 30 of FIG. 2. Accordingly, the N N type source layer of this embodiment is spatially separated from the corresponding two adjacent trenches 20 (trench gate section).

According to the second embodiment device 40, the trench-contact side wall section of P type base layer 18*a* just below the N type turn-off channel layer 42*a* may serve as a turn-off channel region. This means that each of the plurality of trench gates 24 may function as both the turn-on and turn-off driving electrodes for device 40. In other words, a turn-off controlling P-channel MOSFET and a turn-on N-channel MOSFET are stacked on each other inside device 40. When trench gates 24 are applied with a positive voltage, an N type channel is formed at each trench-contact side-wall section of P type base layer 12, causing device 40 to turn on. At this time, electrons are injected from each N type source layer 42 into N type base layer 12 through a corresponding N type turn-off channel layer 42*a* and an N type channel appearing due to formation of an inversion layer. The turn-off operation of device 40 is carried out by applying a negative voltage to trench gates 24 in substantially the same manner as in the previous embodiment. Also with device 40, similar advantages to those of device 10 can be obtained.

The injection efficiency λ of a "broader defined" emitter region (to be explained in detail later) including the trench gate electrode in device 40 may be acquired as follows. Note here that the following discussion will be developed under an assumption that the current flowing between the grooves is divided into an electron current component Ich (ampere) flowing the MOS on-channel and the other current density component JT (A/cm$^2$). The current density is considered with respect to a unit depth of 1 centimeter from the device surface. Given that the current density flowing in the unit cell is J (A/cm$^2$), the groove distance is 2W (cm), the size of the unit cell is 2C (cm), and a virtual injection efficiency in the groove is λT, then the efficiency λ is represented by:

$$\gamma=(Ich+\gamma T\times JT\times W\times 1)/(Ich+JT\times W\times 1) \tag{1}$$

where, $$C\cdot J=JT\times W\times 1+Ich, \tag{2}$$

$$Ich=\Delta\phi/Rch. \tag{3}$$

Rch is the on-resistance of the MOS channel. Δϕ is the potential difference between the both ends of the MOS channel (potential difference across both ends at the depth D), which is acquired from the following equations of current continuity in the grooves:

$$\begin{aligned} Jp &= (1-\gamma T)JT \\ &= -kT\mu_p(dn/dx)-q\mu_p\cdot n(d\phi/dx), \end{aligned} \tag{4}$$

$$\begin{aligned} Jn &= \gamma T\times JT \\ &= kT\mu_n(dn/dx)-q\mu_n\cdot n(d\phi/dx). \end{aligned} \tag{5}$$

Using Equations 5 and 6, Δϕ is given as follows:

$$\begin{aligned} \Delta\phi &= (kT/q)\times \\ &\quad \{\mu_n(1-\gamma T)+\mu_p\gamma T\}/\{\mu_n(1-\gamma T)-\mu_p\gamma T\}\times \\ &\quad [\log(n)-\log\{n-(dn/dx)D\}], \end{aligned} \tag{6}$$

$$dn/dx=-(JT/2kT)\{(1-\gamma T)/\mu_p-\gamma T/\mu_n\}. \tag{7}$$

Equations 2 to 7, the injection efficiency of Equation 1 may be acquired. Optimizing the values of W, D and C can improve the injection efficiency in the broader-defined emitter region without increasing the injection efficiency of the cathode-side emitter (or source) layer. The carriers to be accumulated in the high-resistive base layer while device 40 turns on can be increased. By applying the above-mentioned "carrier injection enhancement" concept of the invention to a bipolar transistor or an IGBT, which is low in the carrier accumulation amount under the ON state (small in conduction modulation), it becomes possible to cause the on voltage of such device to he as low as thyristors.

A power semiconductor device 50 shown in FIGS. 10–11 is similar to that of FIGS. 6–9 with the ratio of the trench-gate width to the width of a layer region between adjacent trench gates being increased. Note that, in the plan view of FIG. 10, the cross-sectional structure crossing N type source layer 30 is the same as that shown in FIG. 8, and "VIII—VIII" is used to the corresponding cutting line to eliminate illustrative redundancy. This is also the case with the cross-section of each trench gate electrode in the transverse direction. This illustrative rule will be applied to the following embodiments to be described later.

As shown in FIG. 11, each trench gate electrode 24b is expanded in width to replace two adjacent ones of the trench gate electrodes 24 shown in FIG. 7. In other words, each trench gate 24b is wider than layers 18a. 42 being positioned between itself and a gate electrode 24b adjacent thereto. Practically, when the thickness of the wafer being employed therein as N type base layer 12 is 450 micrometers, the thickness of N type buffer layer 14 (doping depth) is 15 micrometers, and that of P type base layer 18a is 2 micrometers. Each trench gate 24b measures 5 micrometers in width, 5 micrometers in depth, and 1 micrometer in the placement distance (tench-to-trench distance). Gate insulation film 22 in each trench is 0.1 micrometer thick. Each N type turn-off channel layer 42a has a net channel length of 0.5 micrometers as a result of the formation of two P type drain layers 28a in its top surface region. The thickness of N type source layer 42 is 4 micrometers or less. P type emitter layer 16 is formed to a thickness of approximately 6 micrometers.

The operation of the device 50 is essentially similar to the device 40 shown in FIGS. 6–9. With device 50, the occupation area of each wide trench gate 24b is greater than the area of a layer portion positioned between this gate and its neighboring trench gate; as a result, the resistivity to holes increases in the broad-defined emitter region including trench gate 24b, causing the electron injection efficiency to increase therein. This implies that, regardless of the enlarged area of N type source layer 42 being wider than the area of trench gate 24b, the electron injection efficiency can be equivalently increased due to the difference between the resistivity to electron current and that to hole current. Such increased electron injection efficiency leads to a decrease in the on-resistance. Since the actual electron injection efficiency of N type source layer 42 itself remains low, the resultant turn-off ability of device 50 can be enhanced to be as high as that of the existing IGBTs. The cross-sectional structure of FIG. 11 may be modified as shown in FIG. 12, wherein each trench gate electrode 24c is shallower than the P type base layer 18a.

Figure 13:
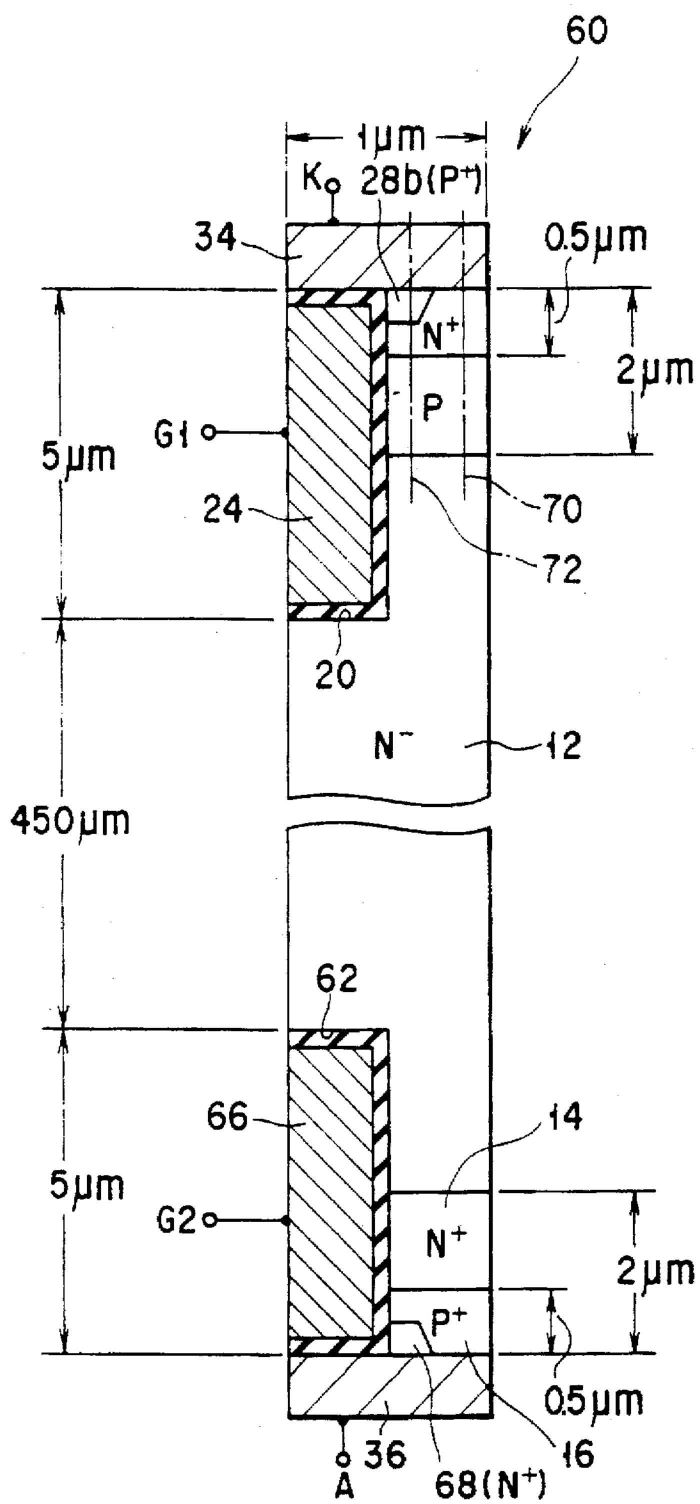
FIG. 13 is a diagram showing the cross-sectional structure of a unit cell section of a power semiconductor device in accordance with a further embodiment of the invention.
Figure 14:
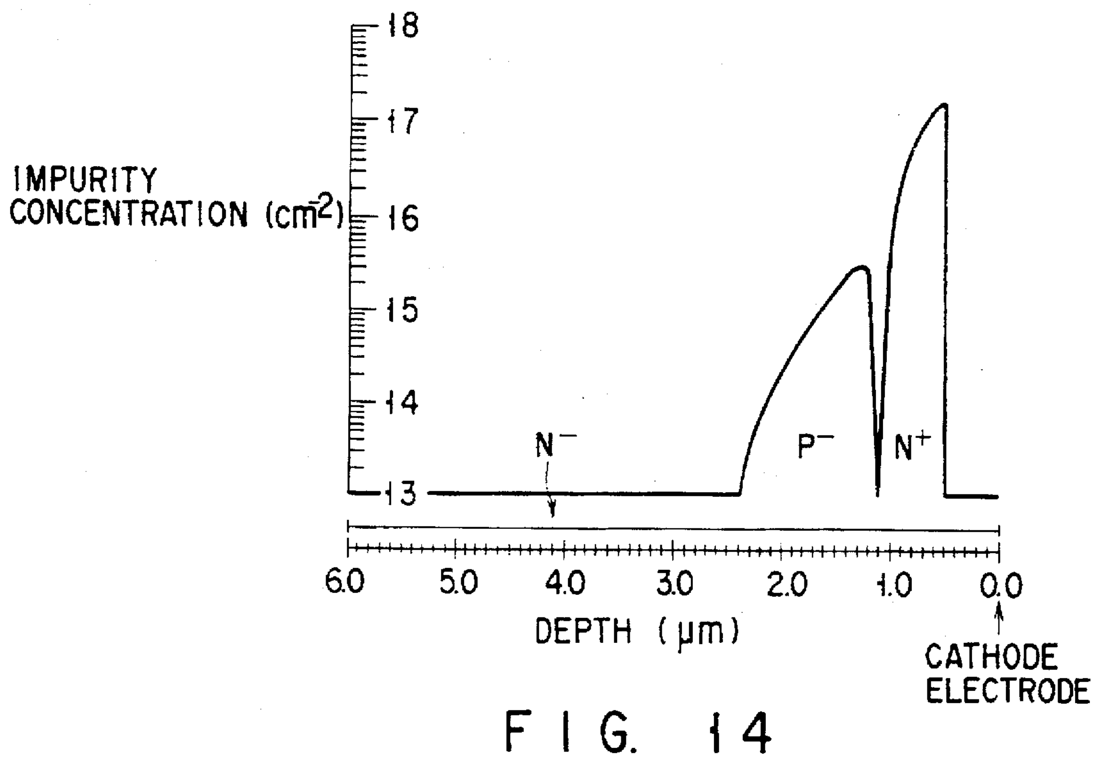
FIGS. 14 and 15 are graphs showing the impurity concentration along two typical cross-sections of the device shown in the preceding figure.
Figure 15:
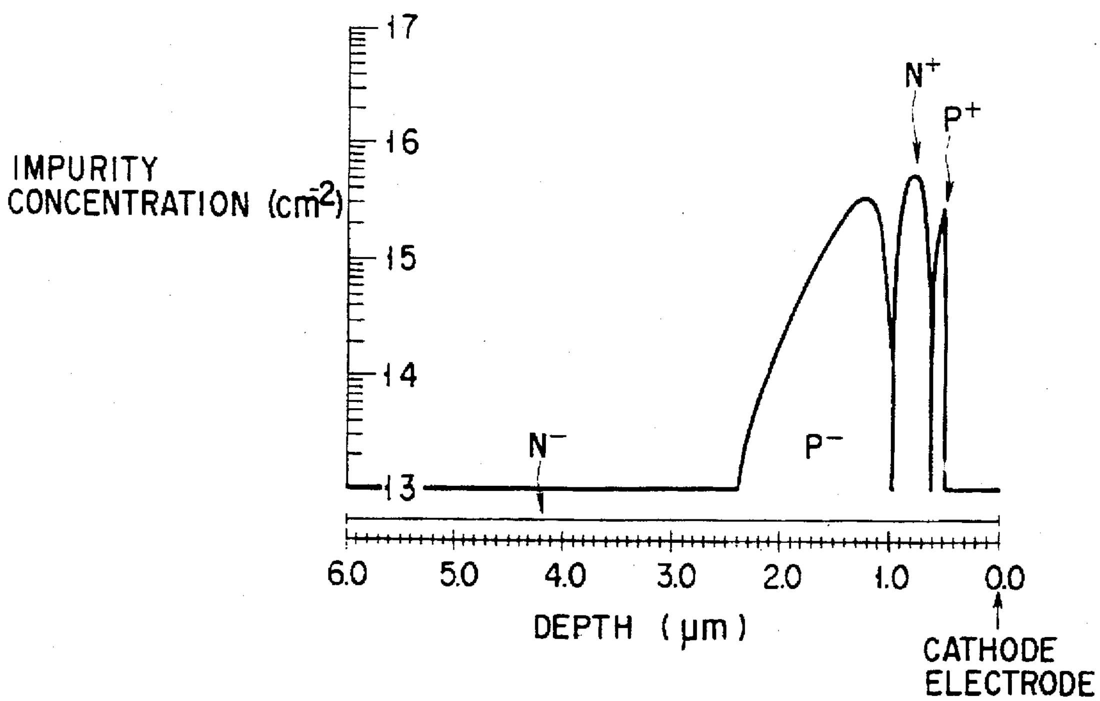

The cross-sectional structure of one of a plurality of unit cell sections of a power semiconductor device 60 shown in FIG. 13 is similar to that of FIG. 7 with a trench gate electrode section being added to the anode side of the device 60. More specifically, an additional trench 62 being equal in shape to the trench 20 is formed in the opposite surface section of the wafer substrate being used as N type base layer 12. A gate electrode 66 is insulatively buried in this trench 62 in the same manner as the gate electrode 24. A P type drain layer 28b on the cathode side consists of a P+ type layer. An N+ type layer 68 is formed in the surface section of P type emitter 16 on the anode side so as to contact with trench 62. Layer 68 is equivalent in function to drain layer 28b. A recomended size of each component of this embodiment is as shown in FIG. 13. The dopant density distribution in two typical profiles 70, 72 in the cathode region are illustrated in FIGS. 14 and 15 respectively. To turn on device 60, a negative voltage is applied to a second terminal G2, which is connected to the anode-side trench gate electrode 66, with a first terminal G1 being applied with a positive voltage. Device 60 turns off either by applying a zero-volt voltage to the cathode-side trench gate 24, or by applying a positive voltage to the anode electrode 36.

There will be described in detail, with reference to simulation data, the reason why the insulated trench-gate power semiconductor device of the invention can attain a reduced on resistance as low as that of a thyristor, while employing a PNPN structure which does not effect a thyristor action even in a large-current region.

Figure 16:
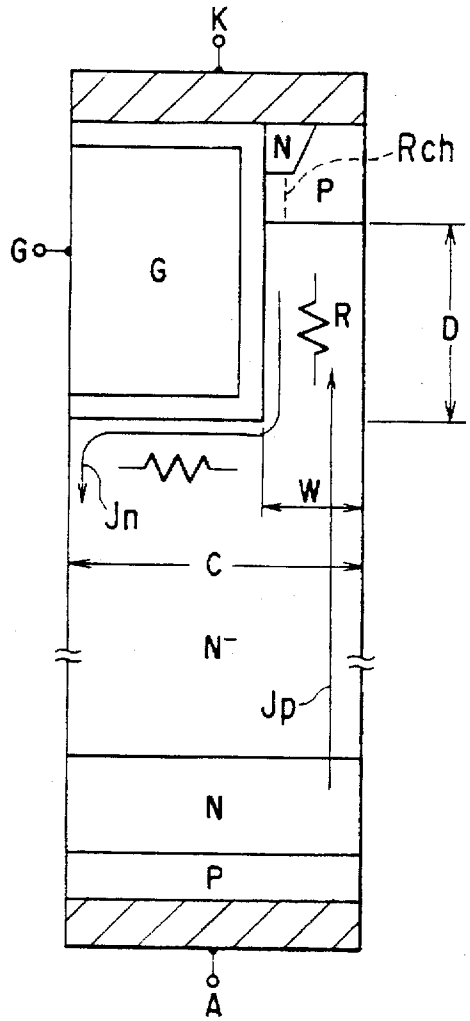
Figure 17:
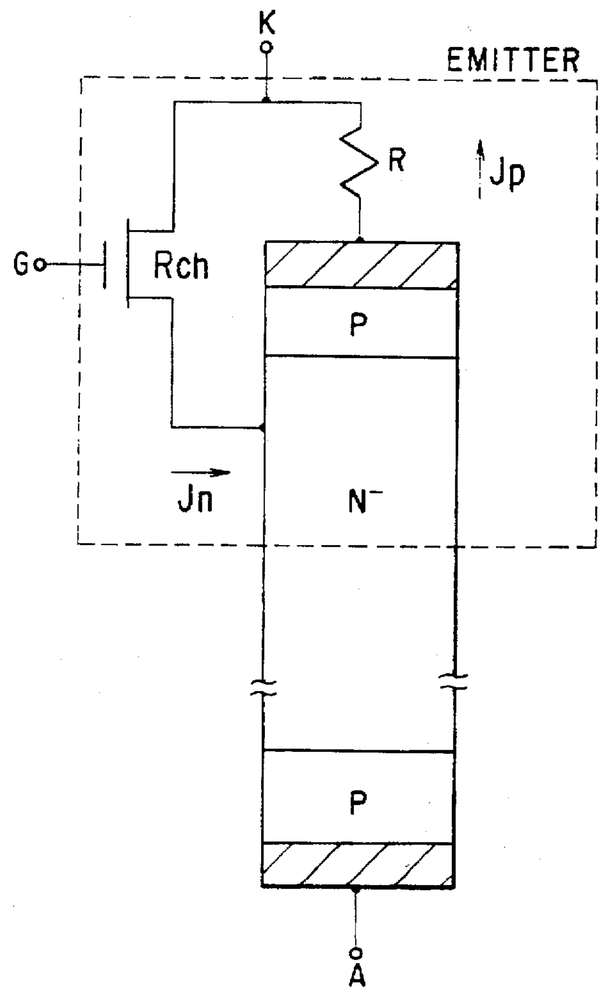

FIG. 16 illustrates a cross-sectional view of a ½ cell of a model that was used in the computation, and FIG. 17 is a diagram for explaining the principle of the emitter structure. As the structure of FIG. 16 is basically an IGBT, there is no N type emitter as provided in an ordinary thyristor. The electron injection on the cathode side is performed by the MOS channel, and the hole current bypass resistance is rendered small enough to prevent the parasitic thyristor from being latched up with the N type drain layer constituting this MOSFET being as an N type emitter. To reduce the hole current bypass resistance is equivalent to reducing the injection efficiency of the N type emitter in the structure of FIG. 16 as compared with the thyristor (or diode), resulting in an increase in the on-voltage of the device.

This may be apparent from viewing the illustration of FIG. 17. In the device of the invention having the source layer and buried gate of a miniaturized MOS section, the injection efficiency will be discussed under an assumption that the whole region containing the source layer and the buried gate portion of the MOS section is considered as a "broad defined" emitter region. The broad defined emitter region is represented by a region encircled by the broken line in FIG. 17. The injection efficiency λ is represented by:

$$\lambda = Jn/(jn+Jp) = (Rp/Rn)/\{1+(Rp/Rn)\}, \qquad (8)$$

where, Rp is the hole current resistance, Rn is the electron current resistance. Note here that Equation 8 is developed under an assumption that there is no horizontal potential distribution at the end of the broader defined emitter region. If Rp/Rn=3, then λ=0.75. If Rp/Rn=4, λ=0.8.

In consideration of the fact that the emitter injection efficiency of an ordinary thyristor or diode is 0.7 or more, it may be deduced that even the IGBT of FIG. 16 having the trench-gate structure can attain a reduced on-resistance which is as low as that of the thyristor.

According to a presently available IGBT having a planar gate structure, Rp/Rn is about 3, and its latch-up durability will decrease if Rp/Rn>4. There are several reasons for this; for example, from a structural point of view, it is difficult to provide a difference between the horizontal electron current resistance and hole current resistance in such planar-gate type IGBT. The IGBT maintains a low resistance in the lateral direction; this is due to the fact that charge carriers of about $1\times10^{16}/cm^3$ exist under the supply of power at the current density of 100 $A/cm^2$, with the lateral hole resistance of the P type base layer being decreased. Attempting to obtain a desired value of hole current resistance by using the lateral resistance results in that the number of MOS on channels per a unit area decreases, which leads to an increase in the electron current resistance. The injection efficiency is thus reduced in the broad-defined emitter region. In the case of an EST, while the cell size is enlarged to attain an increased hole current resistance, such method reduces the number of on-channels per unit area, so that the electron current resistance increases before the hole current resistance increases sufficiently. The injection efficiency of the emitter region of broader sense will not rise, making it difficult to reduce the on-resistance of the device. In addition, when the conductance or flow rate of the hole current is simply decreased to increase the hole current resistance, a resultant latch-up durability will decrease undesirably.

Therefore, it becomes necessary to provide a specific structure which can attain an increased hole current resistance that is four times as great as the electron current resistance without dropping the flow rate of the hole current, while increasing the number of MOS channels per unit area. The present inventors have discovered that the accomplishment of such structure is possible by optimizing the width, the depth and the placement distance (trench-to-trench distance) of the buried gate structure.

To demonstrate the workability, several computer simulation results are presented here. An IGBT structure used in the computation is shown in FIG. 16, which is a power device having a forward breakdown voltage of 4,500 volts. The device parameters are as follows. An N type high-resistive silicon substrate is used with a thickness of 450 micrometers and an impurity concentration of $1\times10^{13}/cm^3$. An N type buffer layer, which is 15 micrometers deep with a surface concentration of $1\times10^{16}/cm^3$, and a P type emitter layer, which is 4 micrometers deep with a surface concentration of $1\times10^{19}/cm^3$, are formed on the anode side. On the cathode side are formed a P type base layer, which is 2 micrometers deep with a surface concentration of $1\times10^{17}/cm^3$, and a P type source layer, which is 0.2 micrometer deep with a surface concentration of $1\times10^{19}/cm^3$. Each gate electrode in the buried gate section on the cathode side is electrically isolated by a silicon oxide film (or ONO film) of 0.05 micrometers in thickness.

As shown in FIG. 16, the depth of the buried gate portion (that portion which extends into the N type base layer from the P type base layer) is D, the cell size is 2C, and the emitter width is 2 W. The ratio of the trench gate width to the emitter width is W/(C-W). With C, W, D and the hole life time $\tau_p$ being used as parameters, the effect of the buried gate electrode structure on the on-voltage of the device was studied. The results are shown in FIGS. 18 through 23.

Figure 18:
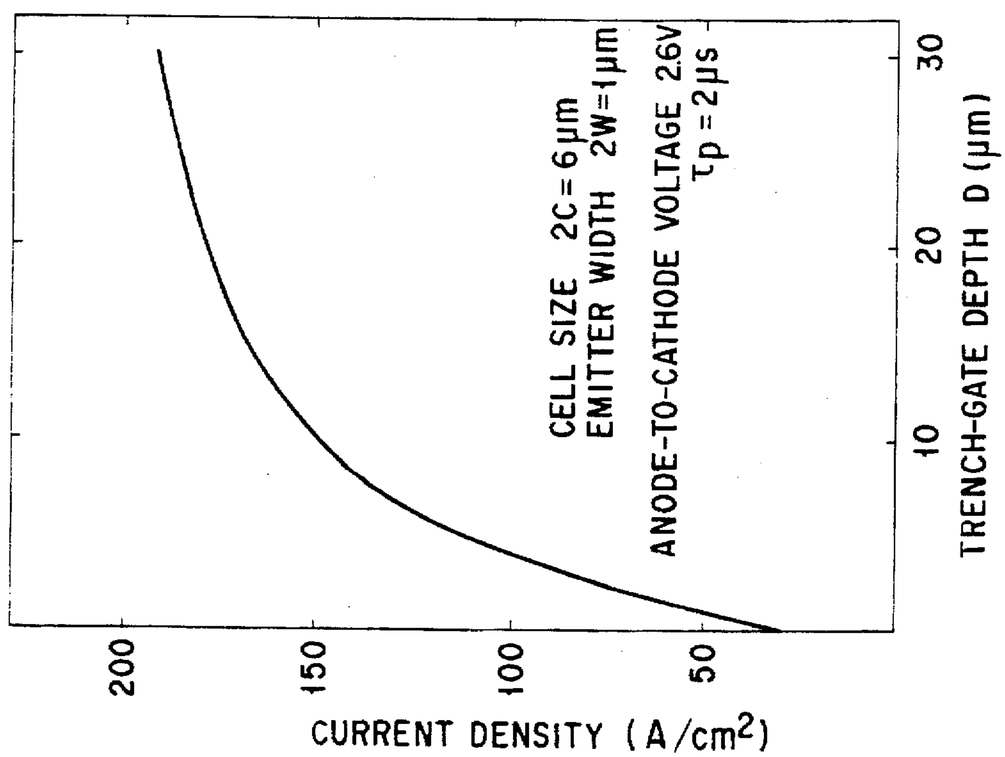

FIG. 18 shows the results of acquiring the current density with an anode-cathode voltage of 2.6 V when the buried gate depth D is varied in a model which has a cell size 2C of 6 micrometers, the emitter width 2 W of 1 micrometer, the buried gate width 2(C-W) of 5 micrometer, the hole life time $\tau_p$ ($=\tau_n$) is 2.0 microseconds. The gate applied voltage is +15 V, which is commonly used in every computation of on-voltage.

Figure 19:
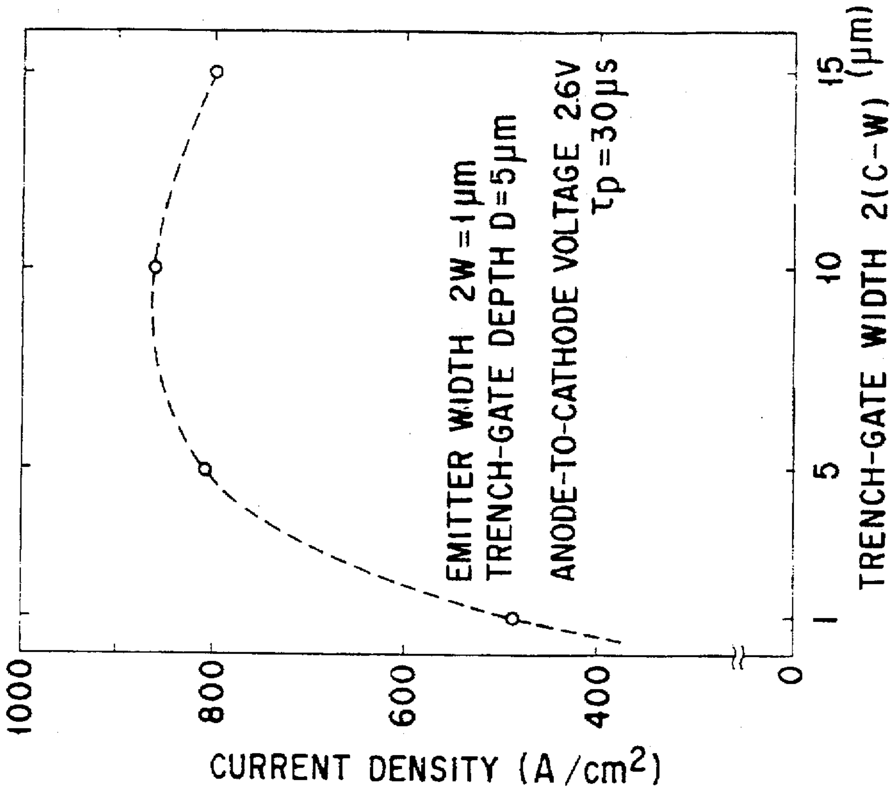

FIG. 19 shows the results of acquiring the current density with an anode-cathode voltage of 2.6 V when the buried gate width C-W is varied in another model which has an emitter width 2 W of 1 micrometer, a buried gate width D of 5 micrometers, and a hole life time $\tau_p$ of 30 microseconds.

As apparent from FIG. 19, the device current drastically increases as the buried gate width increases with the buried gate width being ranged from 1 to 5 micrometers. The current is saturated when the gate width is 10 micrometers. When the gate width is 15 micrometers, the current begins to decrease. This phenomenon can be explained as follows. When the buried gate width becomes greater than the emitter width, the hole current density near the side wall of a trench beneath the emitter increases, raising the potential at the side wall of the lower portion of the trench. As a result, while the MOS channel remains unsaturated, the ratio of the electron current to the hole current increases. The injection efficiency of the broad defined emitter region is thus increased, causing the total current density to increase. However, if the buried gate width becomes much greater, the MOS channel will become saturated and the number of MOS channels per unit area is reduced to increase the electron current resistance of MOS channel. This restricts the electron current flowing in the device, thereby dropping the emitter injection efficiency and reducing the device current as a consequence.

Now assume the contact between the P type base layer and N type emitter layer is defined as the short-circuit of cathode. An increase in the buried gate width produces substantially the same effect as an increase in the lateral resistance of the short-circuited cathode (with regard to the injection efficiency, it is equivalent to a reduction of the cathode short-circuit rate in the broad defined emitter region). As a result, the injection efficiency increases to decrease the on-voltage. If the buried gate width becomes too wide, however, the number of on-channels per unit area decreases, causing the electron current resistance to increase with the result that the injection efficiency is reduced and the on-voltage is raised.

Figure 20:
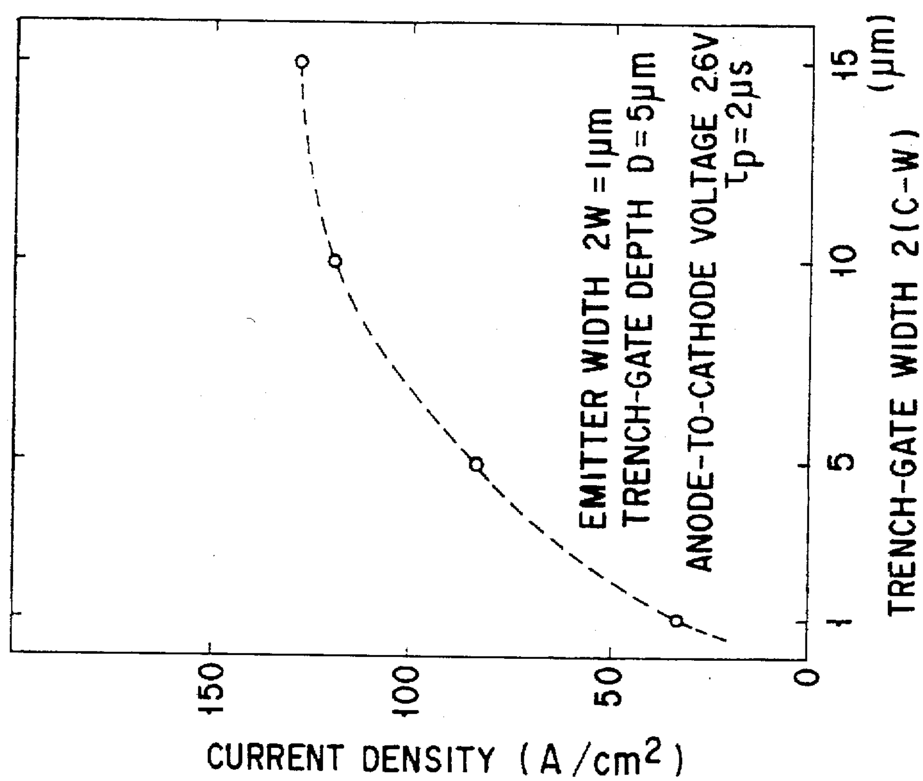

FIG. 20 shows the results of acquiring the device current density with an anode-cathode voltage of 2.6 V when the buried gate width C-W is changed in a model which has an emitter width 2 W of 1 micrometer, a depth of the buried gate portion D of 5 micrometers, and a hole life time $\tau_n$ of 2.0 microseconds. It is apparent from FIG. 20 that the device current drastically increases as the buried gate width increases from 1 to 10 micrometers, and is saturated when the gate width ranges 10 to 15 micrometers. The large range of the width for the buried gate which achieves current saturation as compared with the case of $\tau_p$=30 microseconds is due to the fact that the absolute value of current flowing through the device is small (about 1/10).

Figure 21:
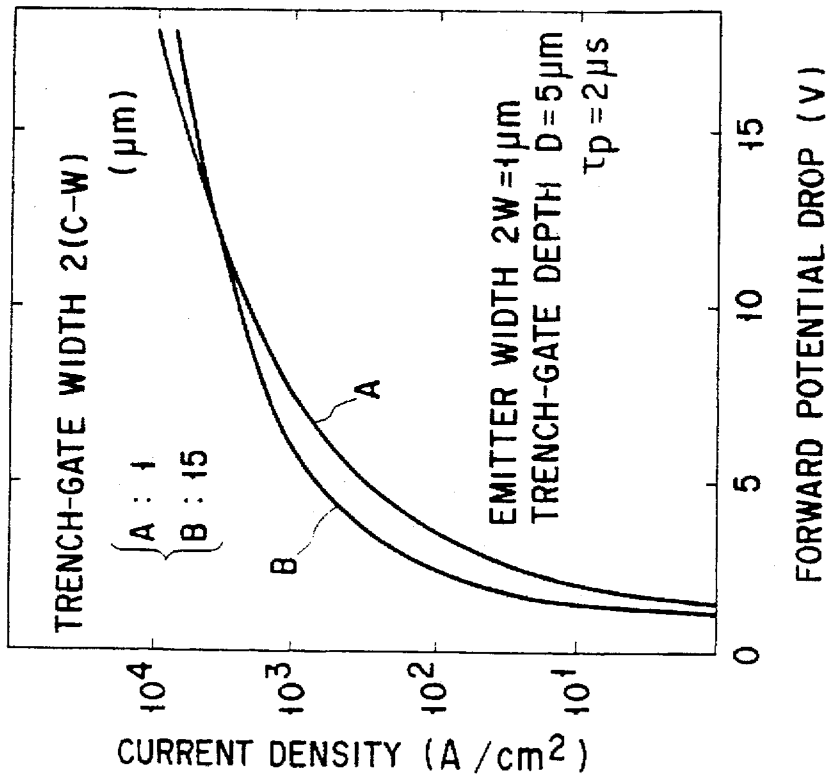

FIG. 21 is a graph plotting a current characteristic when the anode-to-cathode forward voltage varies in a mode having an emitter width 2 W of 1 micrometer, a buried gate depth D of 5 micrometers, and a hole life time $\tau_p$ of 2 microseconds, in the case of the buried gate width 2(C-W) of 1 micrometer (curve A in FIG. 21) and 2(C-W) of 15 micrometers (curve B).

As apparent from FIG. 21, the two current characteristic curves A, B cross each other at a point at the anode-to-cathode voltage of 13 volts. When the anode-to-cathode voltage is less than 13 volts, the model of 15-micrometer gate width is greater in current value than the other model; in particular, the former is ten times greater than the latter in the magnitude of current. When the anode-to-cathode voltage is less than 13 volts, the relation of the current values is reversed between the two codes.

Figure 22:
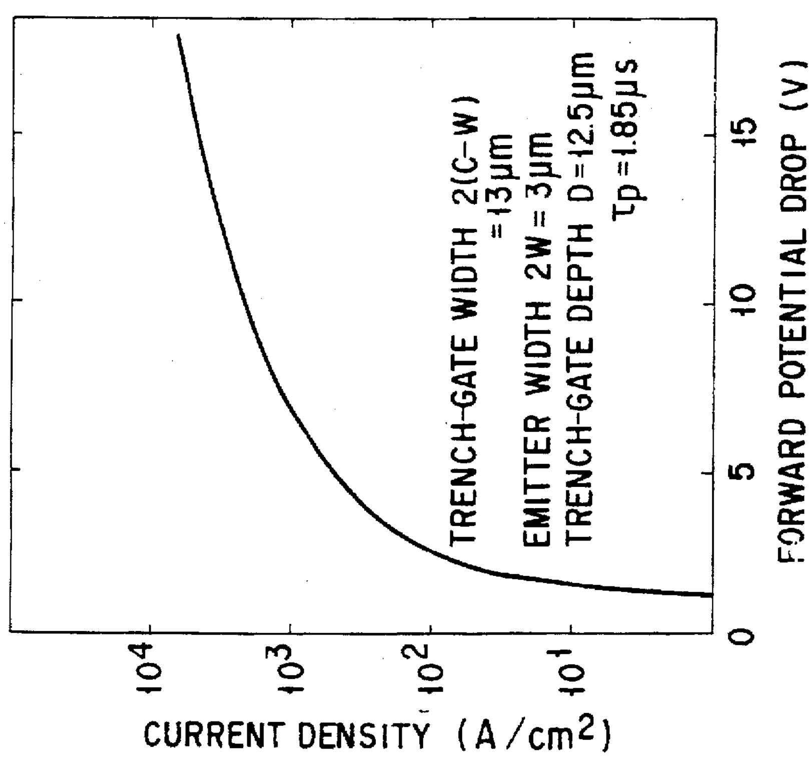
Figure 26:
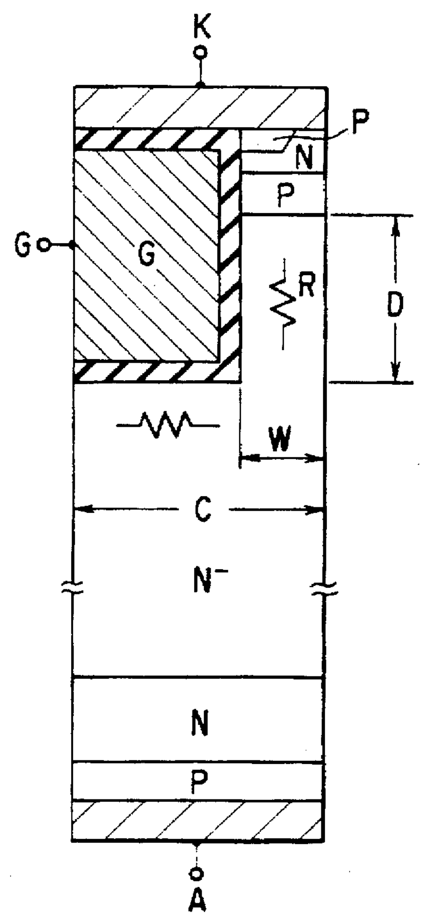

FIG. 22 shows the current-to-voltage characteristic in the case where the IGBT device model of FIG. 16 is changed to a model shown in FIG. 26 having the device configuration of the second embodiment shown in FIGS. 6 to 9, with an emitter width 2 W of 3 micrometers, a buried gate width (C-W) of 13 micrometers, a buried gate depth D of 12.5 micrometers. a P type base depth of 2.5 micrometers, an N type source depth of 1 micrometer, a P type drain depth of 0.5 micrometers, and a hole life time $\tau_p$ of 1.85 microseconds. $\tau_p$ is selected so that the device current is 100 $A/cm^2$ when the anode-cathode voltage is 2.6 V.

Figure 23:
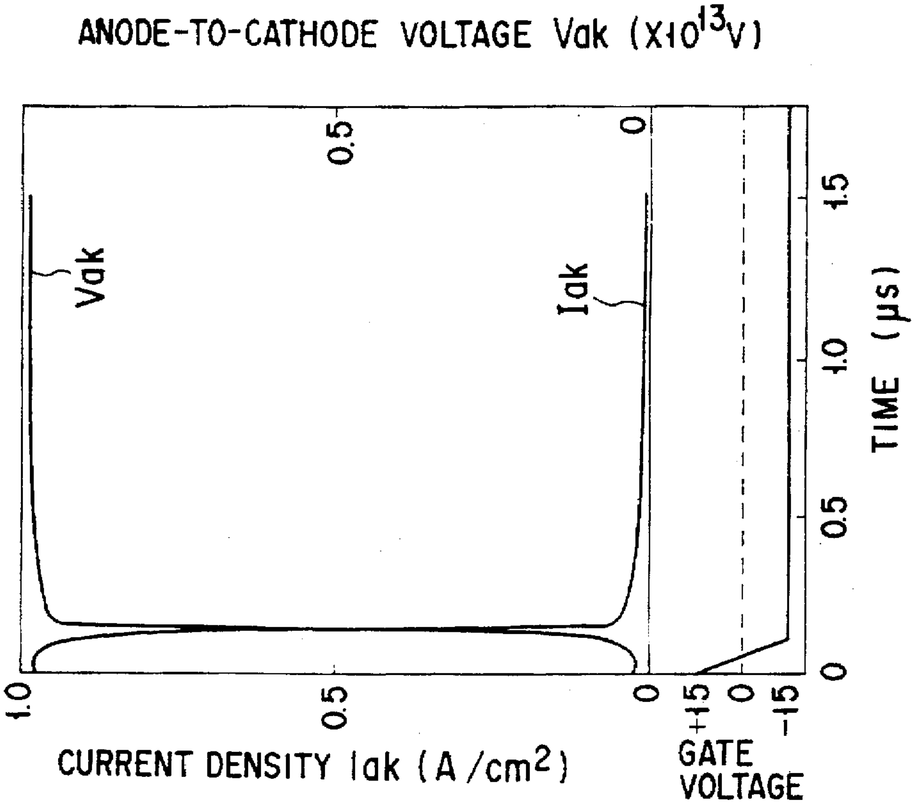

FIG. 23 shows a turn-off waveform at a resistive load of the model of FIG. 26, wherein the waveform begins from the current density Iak of 5223 ($A/cm^2$) and the anode-cathode voltage Vak is 25 V. The gate voltage was changed from +15 to −15 volts at the gate voltage rise factor dVG/dt is −30 volts per microseconds. Assume that the carrier concentration directly below the emitter region is $1\times10^{16}/cm^3$ on average, when Iak is 100 $A/cm^2$. When the emitter width W is 1.5 micrometers, and the buried gate depth D is 12.5 micrometers, the hole current resistance is given as follows:

$$
\begin{aligned}
Rp &= (0.5\times12.5\times10^{-4})/(1.5\times10^{-4}) \qquad (9)\\
&= 4.2\ \text{(ohms)}.
\end{aligned}
$$

Assuming that the electron current resistance Rn is 1 ohm, the injection efficiency $\lambda$ is 0.81. The above results indicate that it is possible, without operating the thyristor, to attain a reduced on-resistance being as low as that of the thyristor by optimizing the size and shape of the broad-defined emitter region including the buried insulated gate portion.

According to the present invention, the cathode-side P-base short-circuit resistance tends to be proportional to the distance "2D+2(C-W)" over the neighboring buried gate sections, and inversely proportional to the emitter width 2 W. In this respect, the following specific parameter "X" is now introduced.

$$X = \{2D+2(C-W)\}/2W = (D+(C-W)\}/W. \quad (10)$$

The parameter X represents how far the hole bypasses on the cathode side or the drain layers are apart from each other. The smaller the parameter X, the smaller the hole discharging resistance (flow rate resistance) on the cathode side becomes.

FIG. 24 shows the density of current flowing in the device when the carrier life time $\tau_p$ and the aforementioned parameters D, C, W are varied with the parameter X being taken on the horizontal scale. The marks "●" show a change in C when $\tau_p$ is 2 micrometers. The marks "○" indicate a change in C when $\tau_p$ is 30 microseconds, W is 0.5 micrometer, and D is 5 micrometers; marks "X" show a change in D when $\tau_n$ is 2 microseconds, W is 0.5 micrometer, and C is 1 micrometer. A mark "◎" is the point of current density at $\tau_p$=2 microseconds, W=1.5 micrometers, C=8 micrometers, and D=15 micrometers.

To attain an increased current capacity of 100 A/cm$^2$ with a 4500-V power semiconductor device, the parameter X is required to meet the following condition:

$$X \geqq 5, \quad (11)$$

which is defined under an assumption that W is 0.5 micrometers, D is 2 micrometers, and C is 1 micrometer. Further, as is apparent from the data given in FIGS. 18 to 24, X=11 when W is 0.5 micrometer, D is 5 micrometers, and C is 1 micrometer X=13 when W is 1.5 micrometers, D is 13.5 micrometers, and C is 8 micrometers. That is, the device characteristic is apparently improved by setting X>8 or X>10, more preferably X>13.

Figure 25:
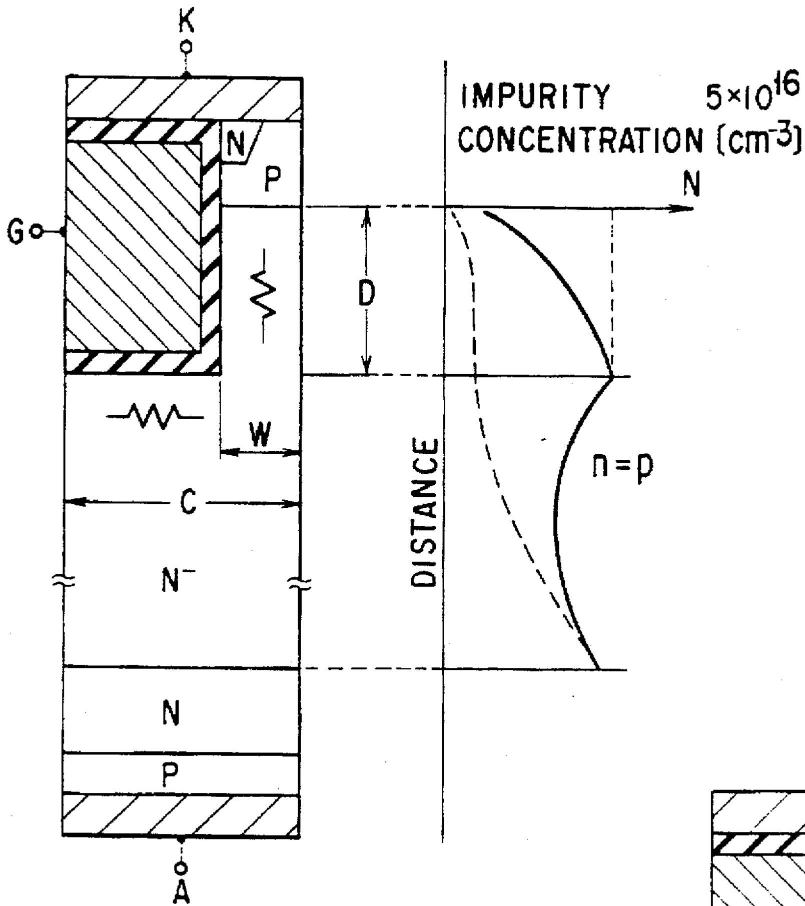

FIG. 25 shows the carrier concentration distribution under the ON-state of the device, together with the associated cross section thereof. The solid line appearing on the right-hand side of the graph is the carrier concentration distribution of the present invention, whereas the broken line is that of the prior art. As compared with the IGBT structure, the feature of the present invention lies in that the carrier concentration distribution has a peak on the cathode side of the N-type base layer. In the ON-state, the carrier concentration of the N− type base layer is designed to be $10^{11}$ to $10^{18}$ cm$^{-3}$, more preferably $1\times10^{15}$ to $5\times10^{17}$ cm$^{-3}$.

Regarding W, D and C, as W becomes smaller, the parameter X becomes greater, thus improving the actual device characteristics. When D becomes larger, however, the resistance of the carriers injected into the high-resistive base layer through the on-channel will also increase in addition to the increase in the hole resistance. For instance, when D is 500 micrometers, the potential drop by the carrier injection resistance is equal to the potential drop by the hole drain resistance, causing the total on-voltage to increase.

As C increases, the current density in the range of W rises to increase the injection efficiency of the broad defined emitter region; on the other hand, such increasing C reduces the number of on-channels per unit area. If C increases excessively, the substantial on-channel resistance increases. As apparent from FIG. 24, such tendency appears above X>30. It is therefore preferable to set C equal to 500 micrometers or below.

Figure 27:
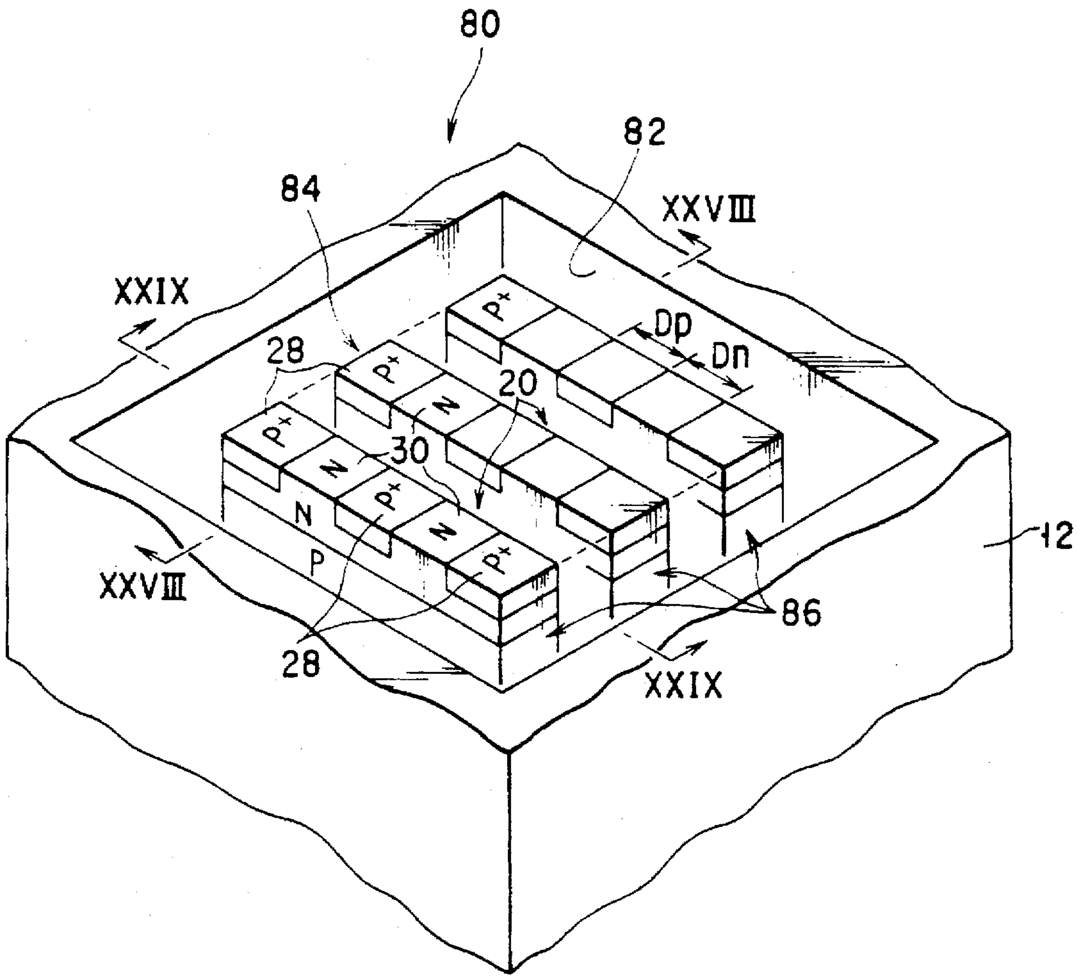
FIG. 27 is a perspective view of the main part of a power semiconductor device in accordance with a further embodiment of the invention.
Figure 28:
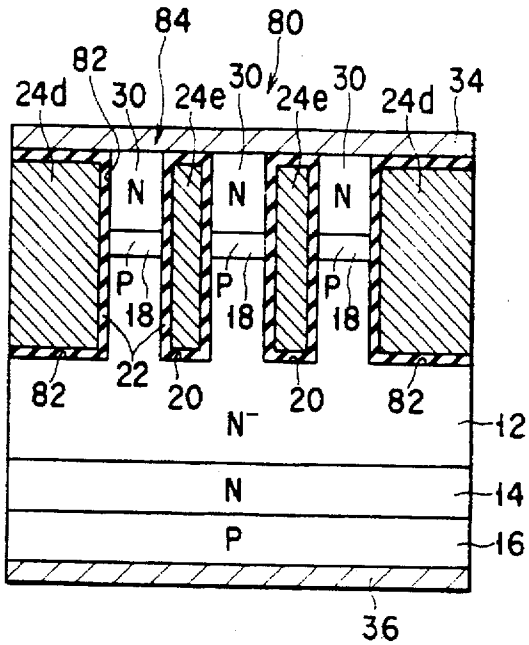
FIGS. 28 and 29 show cross-sectional views of the device of the preceding figure along lines XXVIII—XXVIII, XXIX—XXIX, respectively.
Figure 29:
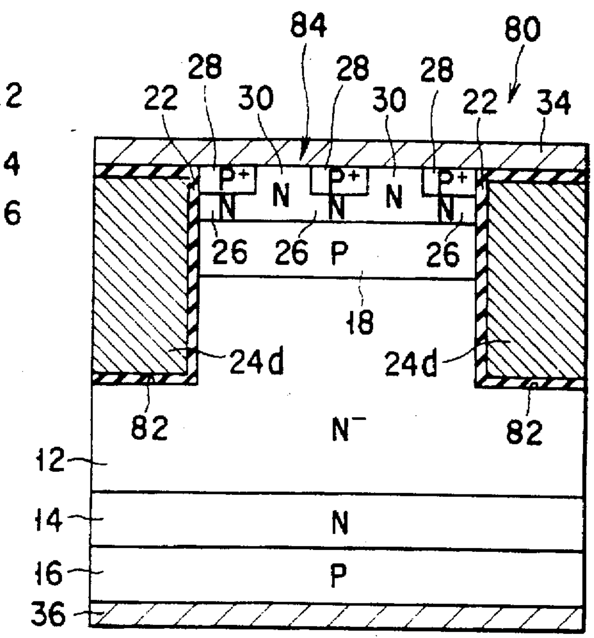

Referring to FIGS. 27–29, a trench-gate power semiconductor device 80 in accordance with another embodiment of the invention is shown at the main parts thereof. As shown in FIG. 27, a deep square groove 82 is formed as a peripheral groove in N type base layer 12. The formation of such peripheral groove 82 defines a substantially square island region in the top surface section of N type base layer 12. For purposes of explanation, two trenches 20 are assumed to be formed in the island region with a constant distance being defined therebetween. Each trench is coupled with a peripheral groove 82 at its both ends, thereby defining three "wall portions" within island region 84. Gate electrodes 24*d*, 24*e* (not shown in FIG. 27 for purposes of illustration only) are insulatively buried in peripheral groove 82 and trenches 20 in the same manner as shown in FIGS. 28 and 29. P+ type drain layers 28 and N+ type source layers 30 are alternately arranged in the top surface of each wall portion 86. In FIG. 27, "Dp" designates the width of each drain layer 28, whereas "Dn" denotes that of each source layer 30.

As shown in FIG. 28, the peripheral groove 82 and trenches 20 are equal in depth to each other, and the bottoms thereof reach nearly the central region of N type base layer 12. In each wall portion 84, P type base layer 18 is sandwiched between N type base layer 12 and N type source layer 30. As shown in FIG. 29, N type turn-off channel layers 26 underlying three P type drain layers 28 and N type source layer 30 are actually the same N type diffusion layer.

With this embodiment, a turn-on channel is formed in the trench-facing side portion of P type base layer 18 underlying N type source layer 30 of FIG. 28. A turn-off channel is formed in the trench-facing side portion of turn-off channel layer 26 positioned beneath each P type drain layer 28 of FIG. 29. This means that trench gates 24*d*, 24*e* may serve as turn-on and off driving electrodes. To turn on device 80, a positive voltage is applied to trench gates 24*d*, 24*e*. At this time, an N type channel region is formed at each trench-contact side portions of P type base layer 18, causing device 80 to turn on. When a negative voltage is applied to trench gates 24*d*, 24*e*, a P type channel region is formed at the trench-contact side portion of N type turn-off channel layer 26. Then, device 80 turns off in a similar manner to that of the previous embodiment. Note that, while width Dp of P type drain layer 28 and Dn of N type source layer 30 are equal to each other in the above embodiment, the relation between Dp and Dn may be modified as required. If Dp<Dn, then the on-characteristic will be enhanced: if Dp>Dn, the off-characteristic will be enhanced.

According to this embodiment, in addition to the aforementioned advantages, the following advantage may be expected. The maintenance of the high withstanding or breakdown of device 80 is shared by a plurality of trench gates 24*d*, 24*e*. This allows the impurity concentration of P type base layer 18 to remain lower. For example, the peak impurity concentration of P type base layer 18 may be decreased to approximately $1\times10^{17}$ cm$^{-3}$. Accordingly, that of N type turn-off channel layer 26 may be decreased approximately to $1\times10^{17}$ cm$^{-3}$. As a result, the voltage required to form a P type channel at the trench-contact side portion of N type turn-off channel layer 26 (threshold voltage) may decrease down to 5 volts. Obviously, this is equivalent to a decrease in the gate voltage for turn-off drive, which will lead to low power drivability of the device.

Figure 30:
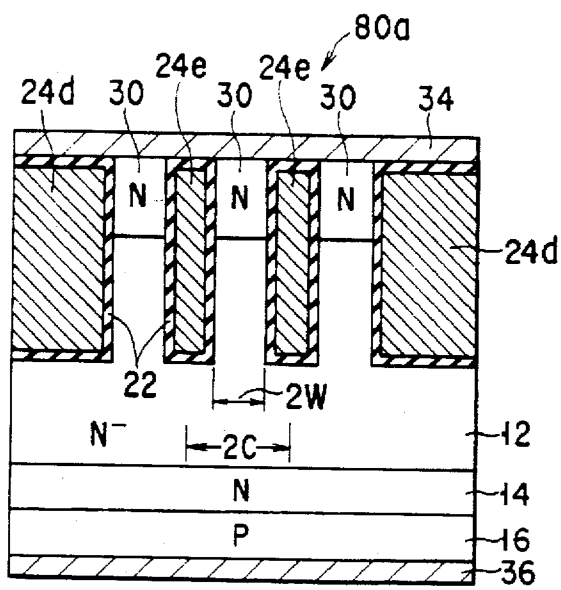

A cross-sectional structure shown in FIG. 30 is similar to that of FIG. 28 with the P type base layer 18 being deleted.

This is also true with a structure of FIG. 31, which corresponds to that shown in FIG. 29. With the impurity concentration of N type base layer 12, the trench width and the width of wall portion 84 being suitably selected, the voltage potential at a portion of N type base layer 12 being positioned between trenches 20 can be controlled by a corresponding one of trench gate electrodes 24d, 24e.

The operation of the device 80a is as follows. When a positive voltage is applied to trench gate electrodes 24d, 24e, the portion of N type base layer 12 between neighboring trenches 20 rises potentially. Electrons are then injected from N type source layer 30, causing device 80a to turn on. Alternatively, when a negative voltage is applied to trench gates 24d, 24e, a P type channel region is formed at the trench-contact side portion of N type turn-off channel layer 26. Carriers are then drained from N type base layer 12 to cathode electrode 34 through P type drain layer 28. Device 80a thus turns off. A power semiconductor device 80b shown in FIGS. 32–34 is similar to that of FIGS. 27–29 with the peripheral groove 82 being omitted. P type base layer 12 is provided with a plurality of (four, for example) independent trenches 20. An insulated gate electrode is buried in each trench. A deep P type diffusion layer 88 surrounds trenches 20. Layer 88 acts as the P type base layer.

The above embodiment may be modified variously as will be described below. The cross-sectional structure of FIGS. 33 and 34 may be modified as shown in FIGS. 35 and 36, wherein a power semiconductor device 80c eliminates the P type base layer 18 as in that of FIGS. 30 and 31. A device 80d of FIGS. 37 and 38 is similar to that shown in FIGS. 28 and 29 with the p type base layer 18 being replaced by a P type diffusion layer 18b, which is deeper than the bottom of peripheral groove 82 and those of trenches 20. A device 80e of FIGS. 39 and 40 is similar to that of FIGS. 37 and 38 with the N type turn-off channel layer 26 being omitted. A device 80f shown in FIGS. 41 and 42 is similar to that of FIGS. 39 and 40 with the deep P type base layer 18b being eliminated. In the modifications 80c to 80f, it is possible to increase the electron injection efficiency in the broad-defined emitter region by suitably determining the shapes and sizes of every component, (in particular, the width and placement distance of trench gate electrodes 24d, 24c) in accordance with the concept of the invention described previously, thereby attaining a reduced on-resistance.

A cross-sectional structure of a semiconductor device 50a shown in FIG. 43 is similar to that of the second embodiment device 50 of FIG. 11 with (1) the N type source layer 42 being removed from the region between neighboring trench gate electrodes 24b, and (2) two P type drain layers 28a being replaced with two N type source layers 30. N type source layers 30 contact cathode electrode 34. FIG. 44 illustrates the cross-section of a region between N type source layers 30 of FIG. 43 which is cut along the direction transverse to that of FIG. 43, which corresponds to the line VIII—VIII of FIG. 10). The structure 50a of FIGS. 43 and 44 has an IGBT structure, which may provide substantially the same advantages as indicated earlier.

A cross-sectional structure 80g shown in FIGS. 45 and 46 is an exemplary structure which is obtained by applying the structure of FIGS. 33 and 34 to an IGBT, wherein the source layer 30 consists of an N+ type diffusion layer. A device structure 50c of FIG. 47 is similar to that of FIG. 43 with the buffer layer 14 being removed, and each wide trench gate 24b being replaced by a plurality of (three, for example) narrow trench gate electrodes 24e. P type base layer 18a and N type source layer 30 are not formed in the top surface region of N type base layer 12 being positioned among three neighboring trench gates 24e. This IGBT structure 50c is free from the problem of poor groove-formation precision raised due to the fact that the emitter width 2 W is greater than the width "2(C-W)" of the wide trench gate 24h (see FIG. 43).

Turning now to FIGS. 48 to 68, there are shown several devices that are lateral-type IGBTs 90a to 90g employing the above-mentioned on-resistance reduction concept of the invention. In the first place, a lateral-type IGBT 90a shown in FIGS. 48–50 has a laminated substrate body 92 as illustrated in FIG. 49 or 50. This body consists of a first silicon substrate 94 and a second silicon substrate of P− type conductivity that is laminated by wafer-adhesion on substrate 94 with a silicon oxide layer 98 being sandwiched therebetween. The underlying silicon substrate 94 is a support layer; the overlying silicon substrate 96 is formed to a predetermined thickness and is used as an element-formation region. Substrate 96 serves as an N type base layer 12a.

As shown in FIG. 49, the substrate 96 is provided with a plurality of trench-like grooves 100, which reach an intermediate silicon oxide layer 98 positioned at the trench bottom portion. The distance between adjacent ones of trenches 100 is 2 W: the width of each trench is 2(C-W). A conductive layer 102 is insulatively buried in each trench 100 so that it is electrically separated from gate insulation film 22. A second conductive layer 104 insulatively overlies the top surface of substrate 96 such that it contacts the buried conductive layers 102 in neighboring trenches 100. As shown in FIG. 48, second conductive layer 104 elongates to cover trenches 100. The conductive layers 102,104 constitute a trench gate electrode 24f. The upper conductive layer 104 will be called "surface gate electrode" hereinafter.

As shown in FIG. 48, a P type base layer 18c and an N type source layer 30a are in contact with each other in each region of N type base layer 12a being positioned between neighboring trenches 100. The profile of layers 18c, 30a is shown in FIG. 50. The elongate surface gate electrode 104 overlies layers 12a, 18c, 30a. A P− type layer 106 is formed in a selected region of the upper-half surface section of substrate 96. P− type layer 106 has one end being in contact with each trench 100 as shown in FIG. 49. A P− type diffusion layer 16a contacts the other end of P− type layer 106 in substrate 96. Layer 16a has a bottom reaching intermediate silicon oxide layer 98, and acts as the P− type emitter layer. P− type layer 106 is a "resurf" layer. A cathode electrode 34a contacts with P type base layer 18c and N type source layer 30a on substrate 96 as shown in FIG. 50. An anode electrode 36a contacts P type emitter layer 16a on substrate 96.

With the lateral-type IGBT 90a, its turn-off control electrode has a MOS-controlled thyristor (MCT) structure. As in the embodiments of FIGS. 27 to 29, P type drain width Dp and N type source width Dn are Dp<Dn, then the on characteristic can be improved; if Dp>Dn, the off characteristic will be enhanced. A desired on/off characteristic can be easily attained by modifying the relation between Dp and Dn. To increase the maximum controllable current of IGBT 90a, it is desirable that width Dn is equal to or less than the carrier diffusion length. To decrease the on-voltage, it is recommendable to increase Dn within the range that can assure the minimum controllable current limit. The advantage of device 90a is as follows: A voltage-controlled power switch device that is reduced in the on-voltage to the extent that the existing GTO thyristors exhibit, while attaining a suppressed occurrence of latch-up, can be accomplished by the combination of the "narrow-width/wide-distance hole current path" structure, wherein narrow (2 W) hole current paths each of which is defined between deep trench gate section and a trench gate electrode 24f adjacent thereto are arranged at an expanded distance, and the cathode-emitter structure having its injection efficiency reduced.

A lateral-type IGBT 90b shown in FIGS. 51 to 53 is featured in that the trench gates 24f are arranged on the anode side, rather than on the cathode side. The upper substrate 96 of the laminated substrate body 92 of FIGS. 48–50 is replaced with a wafer of the opposite type conductivity, i.e., P− type. Trench gates 24f are formed in P− type substrate 108 in the same manner as described previously. Substrate 108 functions as a P type base layer 18d. An N type base layer 12b and a P type layer 16b serving as P type drain are formed in a region of substrate 108 positioned between neighboring trenches 100, as shown in FIGS. 51 and 52. N type source layer 30b is positioned at the edge of P type base layer 18d, which is distant from trench gates 24f. An anode electrode 36a contacts layers 12b, 16b on substrate 108. A cathode electrode 34a contacts layer 30b on the same substrate 108.

A lateral-type IGBT 90c shown in FIGS. 54 to 56 is an exemplary device obtained by employing the trench-gate structure of the first embodiment device 10 of FIGS. 1–5 to IGBT 90a of FIGS. 48–50. FIGS. 54–56 uses the reference numerals as used in FIGS. 1–5 without adding any suffixes thereto in order to clarify the structural correlation between this embodiment and device 10. An N type diffusion layer 30c is the N type source layer formed in layer 18 as shown in FIG. 56.

Figure 57:
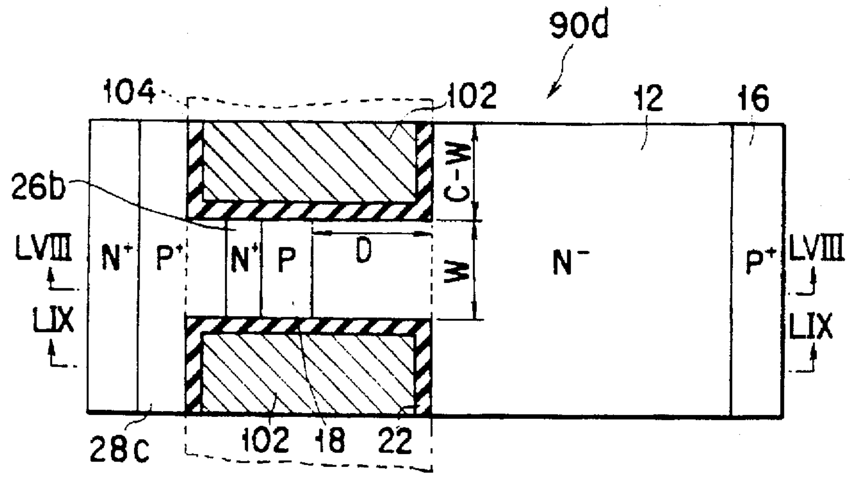
Figure 58:
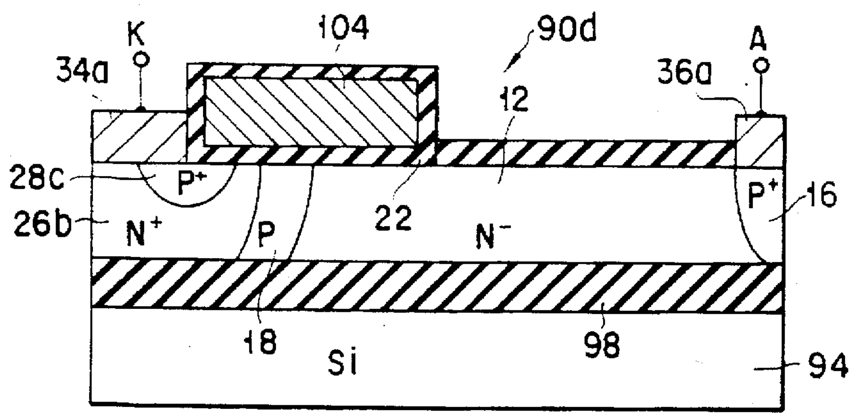
Figure 59:
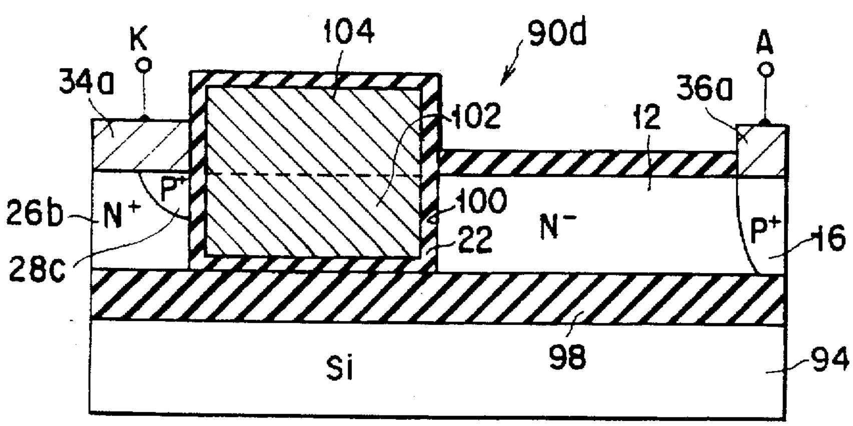
Figure 66:
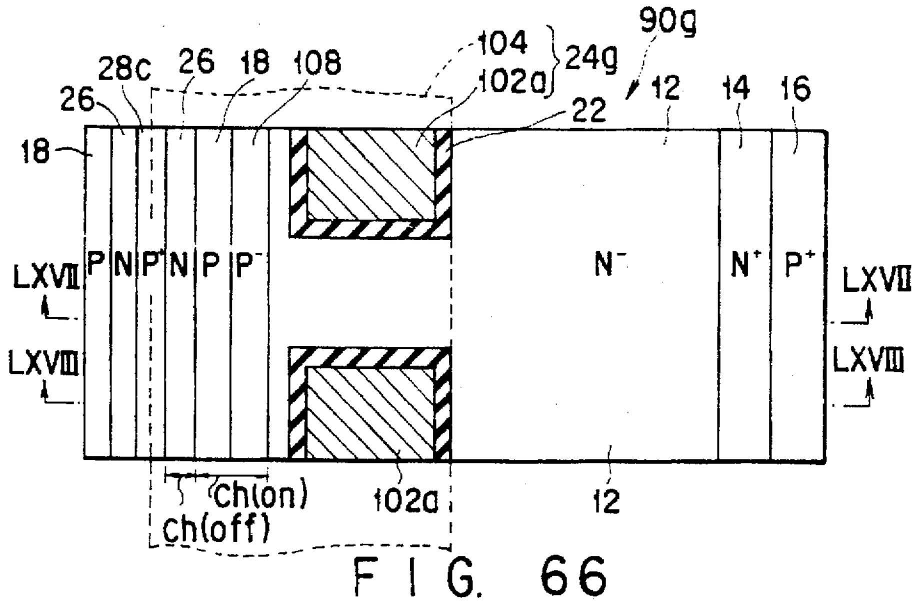
Figure 67:
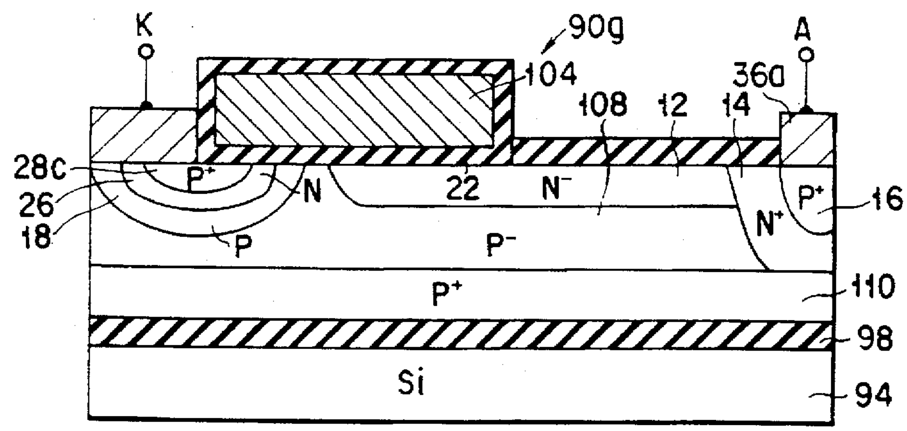
Figure 68:
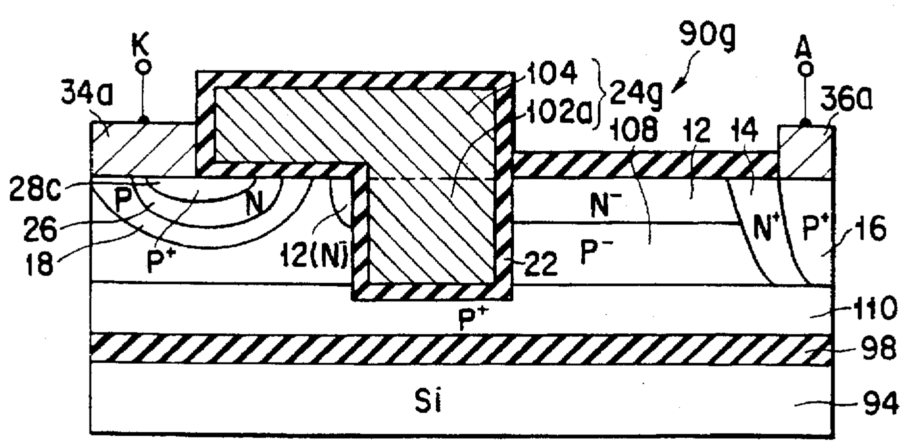

A lateral-type IGBT 90d shown in FIGS. 57 to 59 is a modification of IGBT 90c of FIGS. 54–56. A P+ type diffusion layer 28c serving as the P type drain is expanded beyond the substrate region between trenches 100 to run along one side edge of the elongate surface gate electrode 104. A lateral-type IGBT 90e shown in FIGS. 60–62 is a modification of IGBT 90d of FIGS. 57–59, wherein N type emitter layer 26 is shallow so that it does not reach the intermediate silicon oxide layer 98 sandwiched between the upper and lower substrates 96, 94. A lateral-type IGBT 90f shown in FIGS. 63–65 is similar to IGBT 90e of FIGS. 60–62 with (1) the upper substrate of body 92b being replaced with the P− type silicon wafer 108, (2) a P+ type layer 110 being formed uniformly at the bottom portion of upper substrate 108, and (3) N type base layer 12 being formed in the surface region of P− type silicon wafer 108. A lateral-type IGBT 90g shown in FIGS. 66–68 is a modification of IGBT 90f of FIGS. 63–65, wherein a stacked trench-gate electrode structure 24g includes insulated trench-gate electrodes 102a each of which is arranged so that its side length along the width of elongate surface electrode 104 is approximately half the width of electrode 104. As a result, each trench-gate electrode structure has a reverse L-shaped profile as shown in FIG. 68. The reverse L-shaped profile may also be achieved by casing elongate surface electrode 104 to increase in width. In one side portion of electrode 104 near the cathode, a portion of N type layer 26 positioned just below electrode 104 forms an N type turn off channel Ch(off), and the surface portions of both substrate 108 and P type layer 26 being positioned beneath electrode 104 form a turn-on channel section Ch(on), as shown in FIG. 66.

Each of FIGS. 69 to 80 illustrates the cross-sectional view of a half portion of a unit cell section of a vertical-type power semiconductor device in accordance with an embodiment of the invention. In a semiconductor device 50d of FIG. 69, unlike the embodiment 50c of FIG. 47, no trench gates are provided in the surface section (denoted by "L" in FIG. 69) of N type base layer 12 excluding the layer portion designated by "W" in FIG. 69 wherein a long electron-injection channel region is to be formed. With a device 50e of FIG. 70, one thin conductive layer 24h is formed to be insulatively adhered to the inner surfaces of a plurality of trenches 20. This layer 24h is a trench gate electrode, which defines a recess 111 in each trench 20. A dielectric layer 112 is deposited by chemical vapor deposition (CVD) to cause a plurality of recesses 111 to be buried therein. The CVD dielectric layer 112 has a flat top surface.

Figure 69:
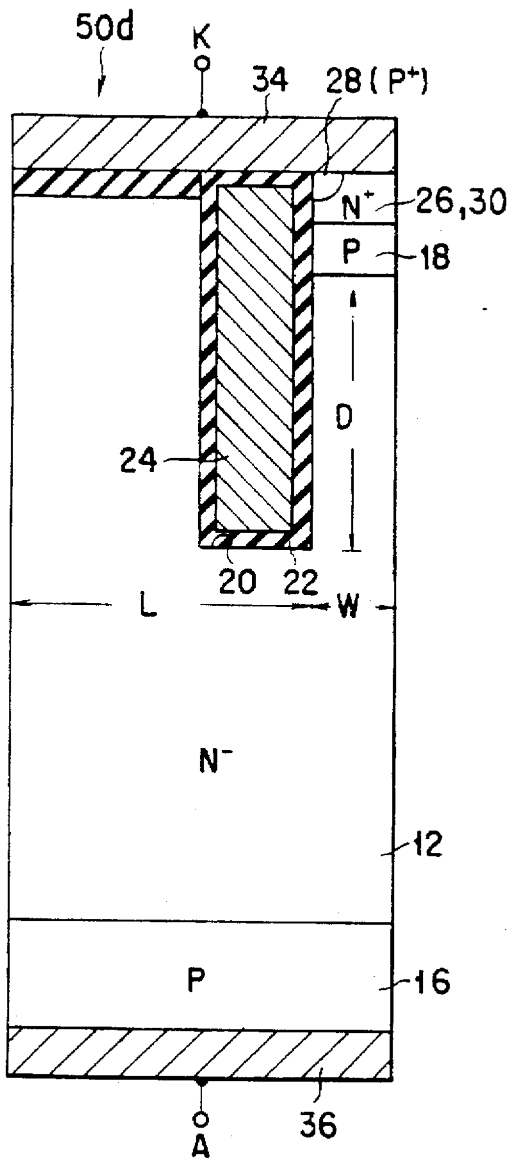
Figure 70:
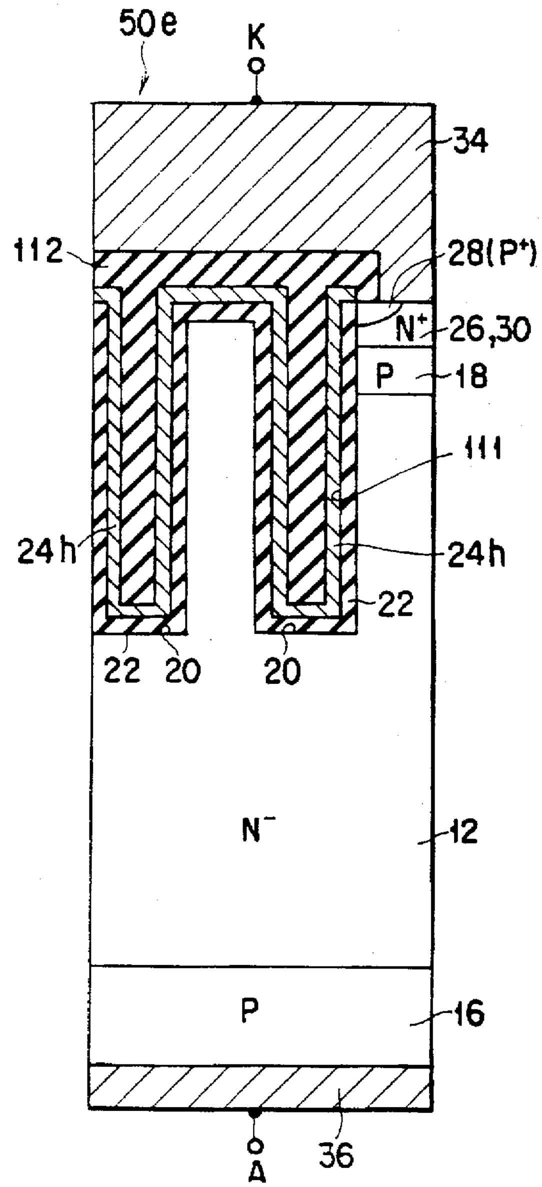
Figure 71:
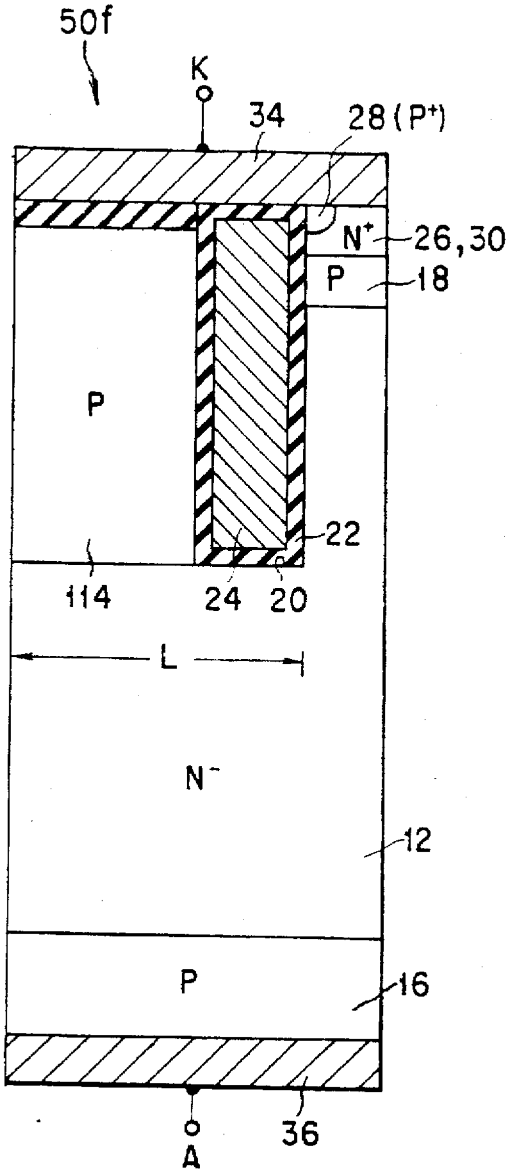
Figure 72:
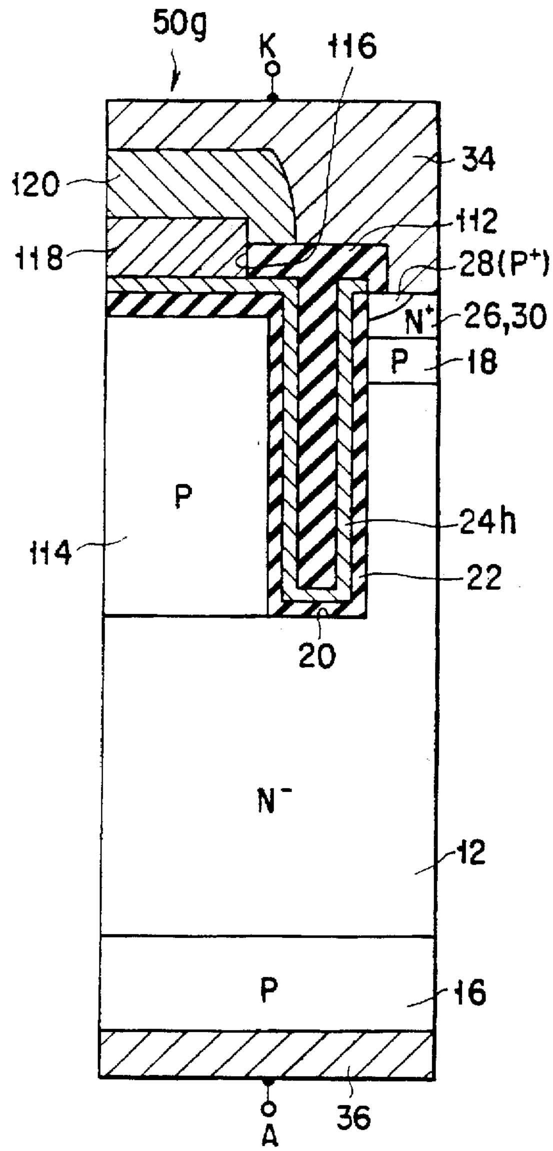

A semiconductor device 50f of FIG. 71 is similar to that of FIG. 69 with a type layer 114 being added to the region L of N type base layer 12 with no trench gate electrodes, which region is other than the electron-injecting channel formation region). Adding such layer 114 increases the breakdown voltage between the cathode electrode 34 and N type base layer 12 in region L. A semiconductor device 50g of FIG. 72 is similar to device 50f of FIG. 71 with (1) the trench gate 24 being replaced with the trench gate 24h of FIG. 70, (2) the CVD dielectric layer 112 having an opening 116 above P type layer 114, and (3) a low-resistance metallic layer 118 and an organic dielectric film 120 staked thereon being disposed in opening 116. Metallic layer 118 may be made from aluminum, titanium or molybdenum. Dielectric film 120 may be made from polyimide.

A semiconductor device 50f of FIG. 73 has an expanded trench 20a, which entirely occupies the region of N type base layer 12. The insulated thin gate electrode 24h in trench 20a is made from polycrystalline silicon. Trench gate 24h has an expanded recess 110a, in which a low resistance metal layer 120a and a CVD dielectric layer 112a are formed in this order.

A semiconductor device 50i of FIG. 74 is similar to the device 50f of FIG. 71 with an N type layer 122 being added as a low carrier life-time layer. This layer 122 contacts the bottom of P type base layer 18. The addition of such payer 122 may increase the hole current bypass resistance at each channel region positioned between adjacent ones of trench gate electrodes 24. A semiconductor device 50j of FIG. 75 is similar to the device 50i of FIG. 74 with the low carrier like-time layer 122 being replaced by a crystal defect region 124 which is formed in a portion of N type base layer 12 beneath the bottom of P type base base layer 18. This region 124 is same in function as the low carrier lifetime layer 122.

Figure 77:
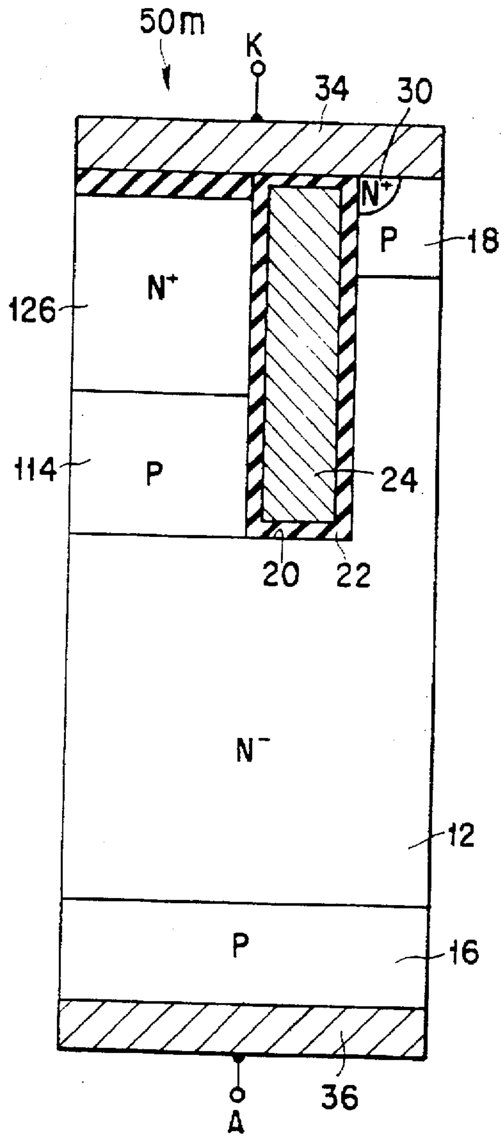

A semiconductor device 50k shown in FIG. 76 is similar to the device 50g of FIG. 72 with (1) an N+ type emitter layer 126 being formed above P type layer 114, and (2) the P type drain layer 28 being removed from the electron injection section of this device. N type emitter layer 126 is electrically floating with respect to the remaining layers. Device 50k has an IGBT structure since the P type drain layer 28 is not present in the electron injection section of device 50k. When a positive voltage is applied to trench gate 24, a channel region is then formed between N type source layer 30 and N+ type emitter layer 126 along trench 20. At this time, the floating layer 126 is electrically coupled to the cathode electrode 34. A semiconductor device 50m of FIG. 77 is obtained by modifying the device 50f of FIG. 71 in the same manner as shown in FIG. 76.

Figure 78:
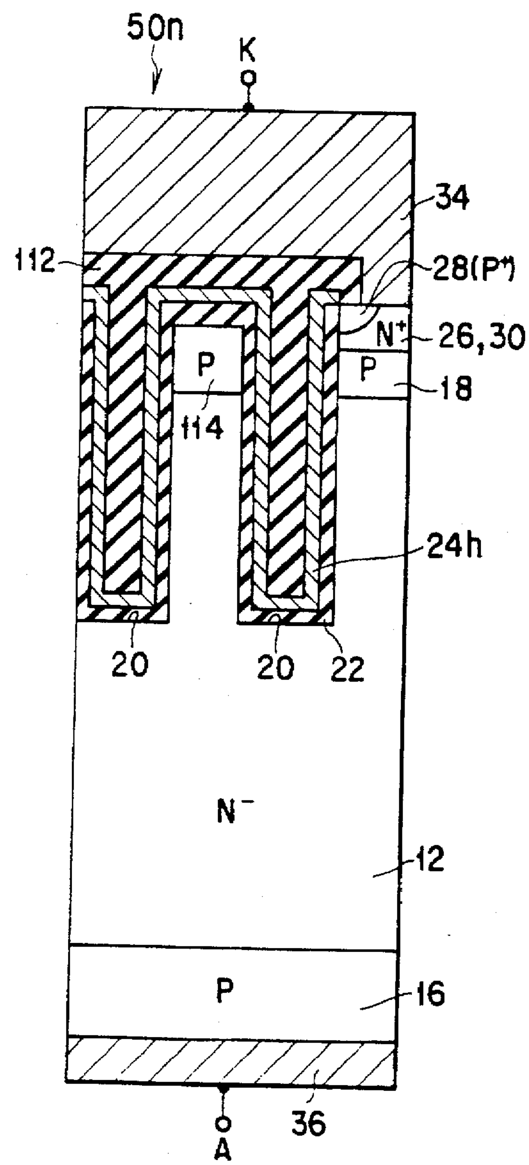
Figure 79:
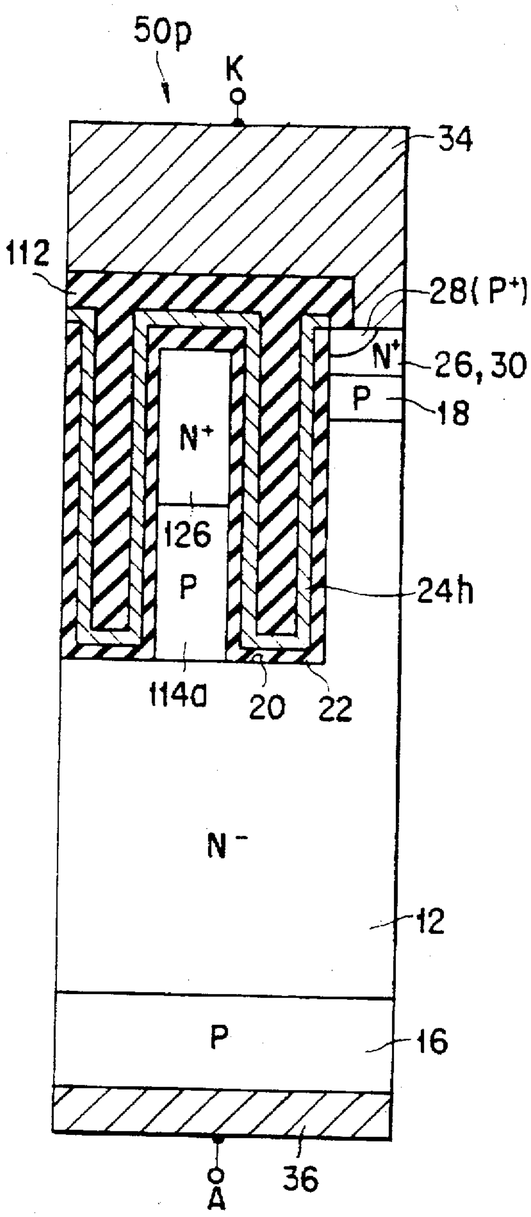
Figure 80:
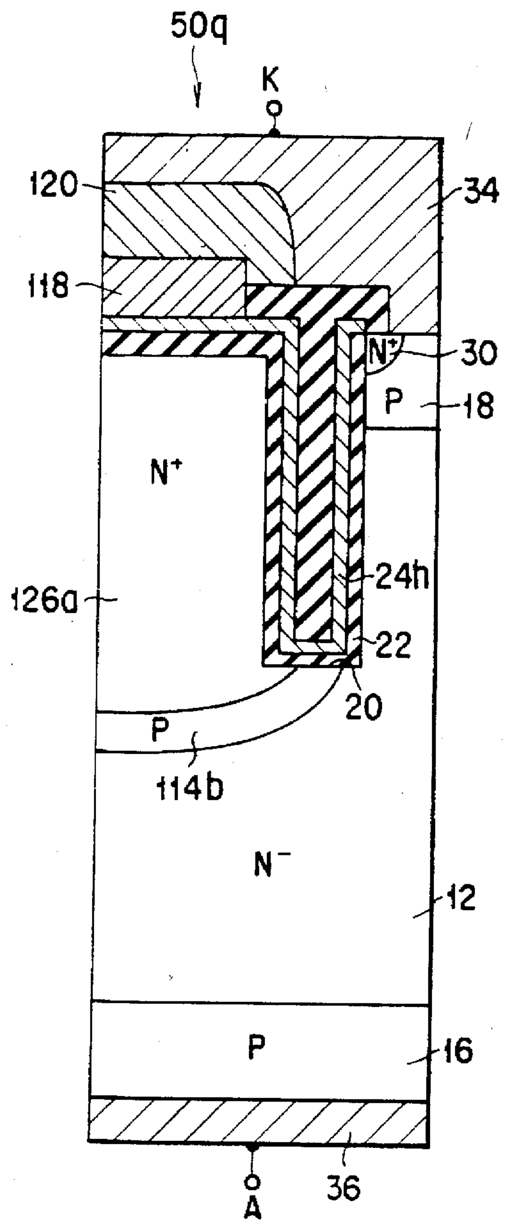

A semiconductor device 50n of FIG. 78 is similar to the device 50e of FIG. 70 with the P type layer 114 being added to the top surface region of a portion of N type base layer 12 that is positioned between neighboring trenches 20. A semiconductor device 50p of FIG. 79 is similar to the device 50n of FIG. 78 with (1) the P type layer 114 being replaced with a P type layer 114a deep enough to cause its bottom to be aligned with the bottoms of trenches 20, and (2) N type floating emitter layer 126 being arranged in the top surface portion of P type layer 114a. A semiconductor device 50q of FIG. 80 is similar to the device 50k of FIG. 76 with the layers 114, 126 being replaced by a P type layer deeper than the trench bottom and an N type floating emitter layer 126b respectively. Employing the deep layer 114b, 126a results in the turn-off channel, which is controlled by trench gate 24h, being decreased in length.

An IGBT 150 shown in FIGS. 81 to 84 make use of an N− type silicon substrate 152 as its support layer. This substrate functions as the N type base layer of device 150. The N type base layer 152 contacts a P− type emitter layer 153. A P+ type layer 154 and a P− type layer 156 are arranged in N type base layer 152 as shown in FIG. 82 and 83. The two layers have a ring-shaped planar shape; cross-sectionally, these layers overlap each other as shown in FIG. 82 or 83. A ring-shaped N+ type layer 158 surrounds layers 154, 156 in N type base layer 152. Silicon oxide ($SiO_2$) films 160, 162 are selectively formed on N type base layer 152 as illustrated in FIG. 82 or 83. A CVD dielectric film 164 is stacked on silicon oxide film 160. As shown in FIG. 82, another silicon oxide film 166 overlies film 162 on N type base layer 154. A polycrystalline silicon layer 168 is laminated on silicon oxide film 166. A CVD dielectric layer 170 covers layers 162, 166, 168. A metal (aluminum) layer 172 contacts layer 168 through an opening 174 of CVD film 170. An aluminum layer 176 contacts with P+ type layer 154 through an opening 178. An aluminum layer 180 is formed on N type base layer 12 and overlies N+ type layer 158.

As shown in FIG. 84, a plurality of trenches 20 are formed in P type base layer 154. In FIG. 84, only a pair of neighboring trenches 20 are shown for the sake of illustration convenience. A first and a second polycrystalline silicon layer 182, 184 are insulatively stacked on each other in each trench 20 as shown in FIG. 84. These layers 182,184 constitutes a trench gate electrode 24i. An N+ type source layer 186 and a P type drain layer 188 are formed in a portion positioned between neighboring trenches 20 in the top surface of N type base layer 152. Metal layer 176 contacts layers 186, 188 through an opening 190 of CVD dielectric layer 176. A metal layer 192 is electrically coupled to P type emitter layer 153. Layer 176 constitutes a cathode electrode; layer 192 forms anode electrode. An index X is now introduced under assumption that the distance between a pair of trenches 20 is 2 W, and that the distance between (i) P type drain layer 188 positioned between this pair of trenches and (ii) another P type drain layer neighboring to the trench pair is 2C, the index X is represented by:

$$X=\{D+(C-W)\}/W$$

where, D is the trench depth. The size of every component of the device is carefully determined to cause the value of X satisfies X>5.

By specifically arranging the array of trench gates 24i to meet the above condition, it becomes possible to optimize the flow path of hole current (designated by an arrow in FIG. 84) toward the cathode electrode, thus enabling the storage or accumulation of charge carriers (holes) in the N type base layer to increase so as to reduce the on-voltage of device 150.

A cross-sectional structure of FIG. 85 is similar to that of FIG. 84 with (1) the layer 158 being modified in planar shape to be included in P type base layer 154, and (2) an extra highly-doped P (P++) type diffusion region 194 being added so as to surround the bottom of each trench 20. Adding such layer 194 can further improve the accumulation of carriers within the p type base layer.

Many embodiments as previously described are based on the single inventive contribution that the hole-bypass resistivity is increased by the specifically arranged trench-gate structure to increase the electron injection efficiency, causing the on-resistance of the device to be reduced. The important fact to which careful attention should be paid is that, according to the present invention, the achievement of reduced on-resistance results from increased hole-bypass resistivity only. This is because the enhancement in the carrier injection is based on a generic concept of increasing the ratio of diffusion hole current to the electron current, which theoretically includes the idea of increasing the hole-bypass resistivity. More generically, the increased hole-bypass resistivity is a secondary phenomenon of the principle of enlarging the hole diffusion current to electron current ratio. The following description will be devoted to an explanation of the upper-level embodiment devices, which may be named "carrier injection enhanced gate bipolar transistors (IEGTs).

Figure 87:
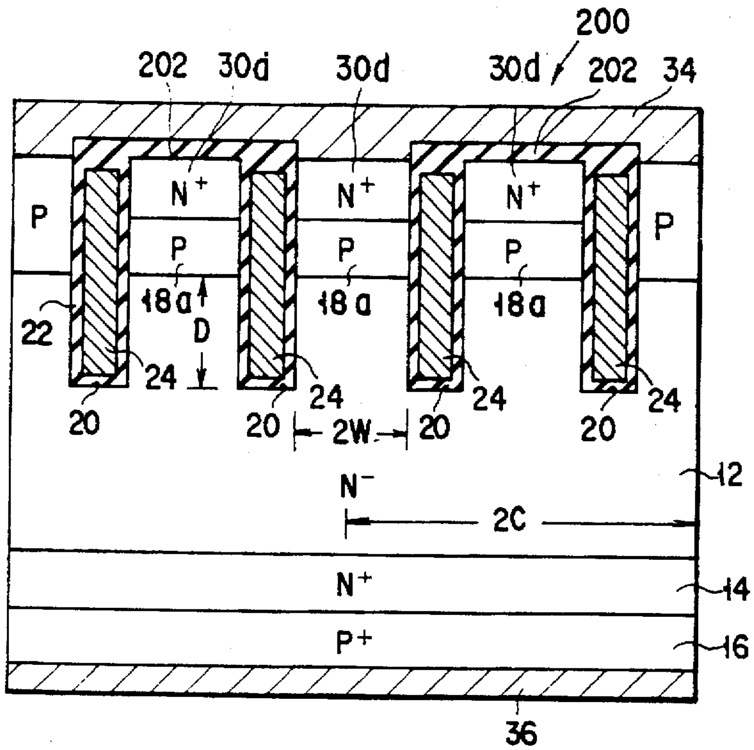
FIGS. 87 to 90 illustrate respective cross-sectional views of the device of FIG. 86 along lines LXXXVII—LXXXVII, LXXXVIII—LXXXVIII, LXXXIX—LXXXIX and XC—XC shown in FIG. 86, respectively.

Referring to FIGS. 86 to 90, an injection-enhanced gate bipolar transistor (IEGT) embodying the inventive concept is generally designated by the numeral 200. In these figures, the same reference numerals are used to designate the same or similar components to those of the embodiment shown in FIGS. 6–9. The N type source layer of IEGT is constituted by an N+ type semiconductor regions 30d. These source layers 30d extend transversely to parallel trench gates 24 in the surface of P type drain layer 18a, as shown in FIG. 86. The profile of these source layers 30d relating to trench gates 24 is illustrated in FIG. 87. Alternate ones of N+ type layers 30d, each of which is positioned between every pair of adjacent ones of trench-gates 24, are electrically insulated by a surface insulation layer 202 from the first main (cathode) electrode 34.

Figure 88:
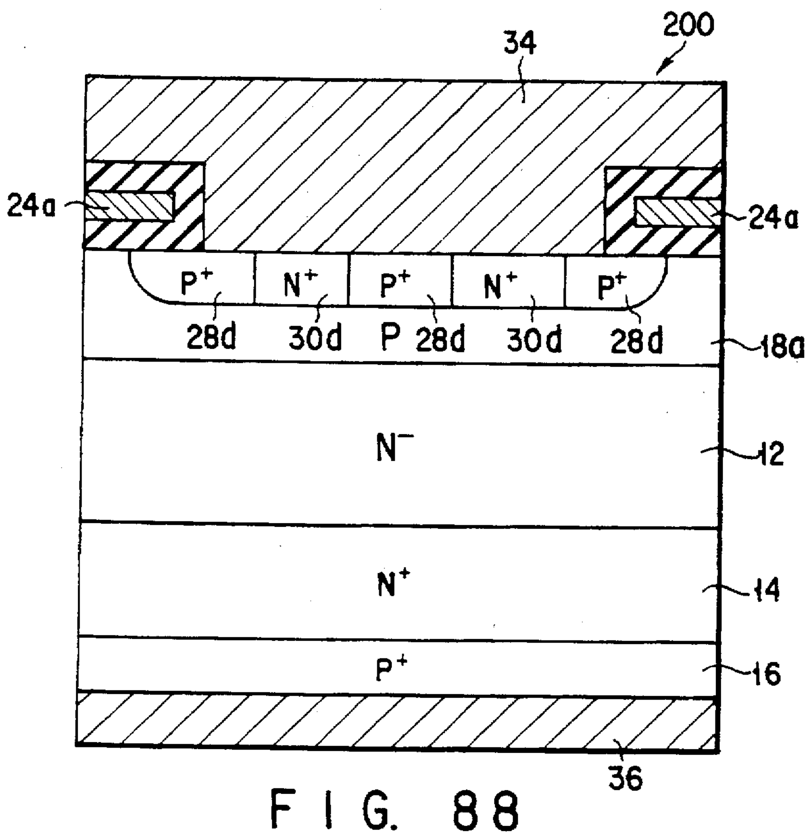
Figure 89:
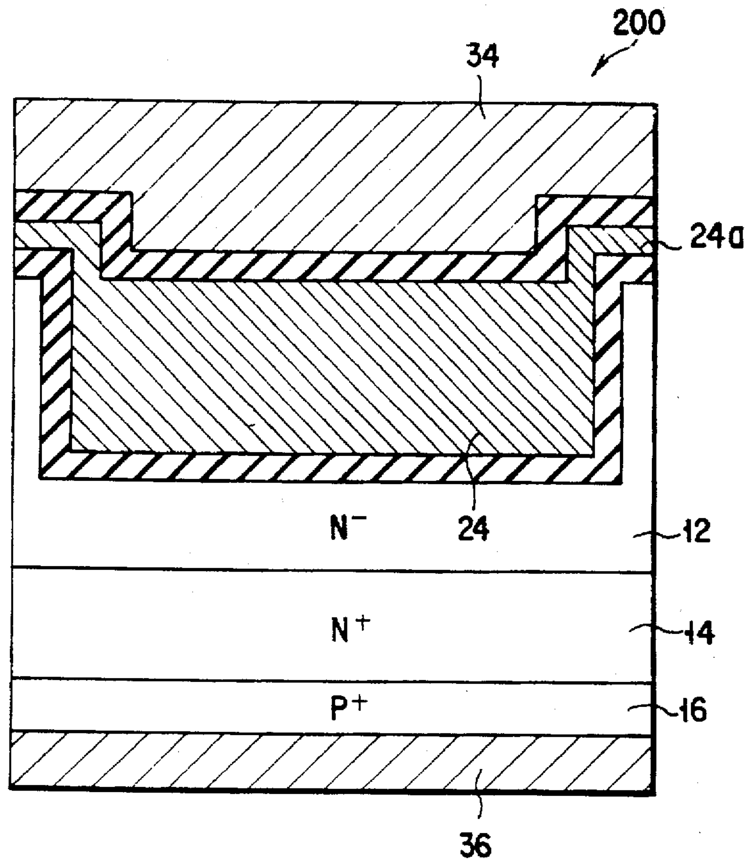
Figure 90:
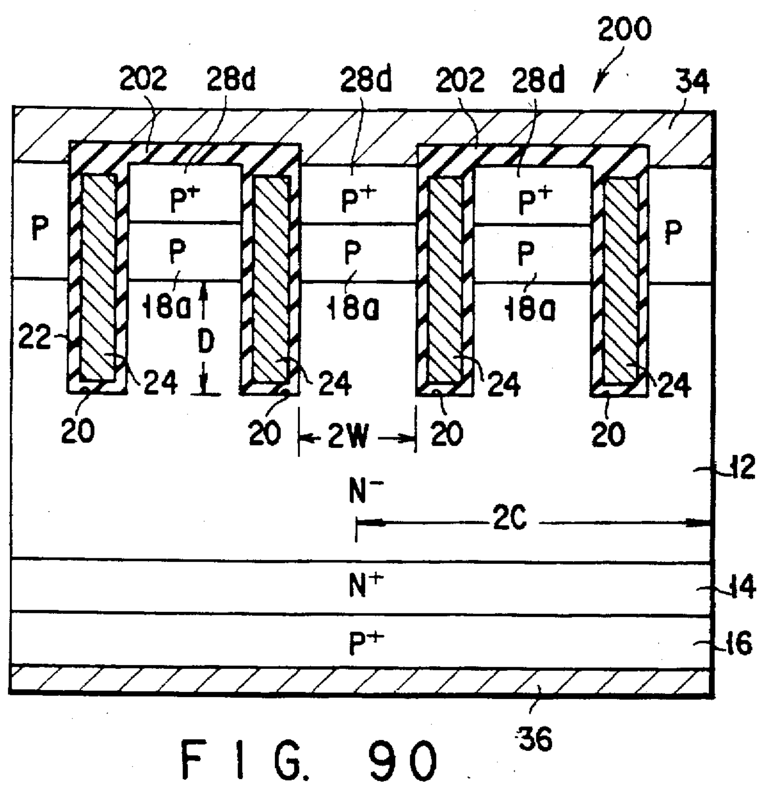

As shown in FIG. 88, the source layers 30d and P+ type semiconductor regions 28d serving as the P type drain are alternately arranged between neighboring ones of the trench-gate electrodes 24. The cross-sectional view of each trench-gate 24 shown in FIG. 89 is the same as that of FIG. 9. The cross-sectional view of P+ type drain regions 28d in a direction transverse to trench-gates 24 is shown in FIG. 90, wherein P+ type drain region 28d, which is positioned between each pair of two neighboring trench gates 24, is electrically insulated by the surface insulation layer 202 from the first main (cathode) electrode 34 in a similar manner as in the layers 30d shown in FIG. 87. The practical size arrangement of this transistor structure may be the same as that of the device 10 shown in FIGS. 1–5.

The operation of the IEGT 200 is as follows. When a positive voltage is applied to the trench-gate electrodes 24 with respect to the cathode electrode 34, a turn-on channel positioned at the periphery of P type base layer 18 is rendered conductive. Electrons are then injected from N type source layer 30 into N type base layer 12, causing a conduction modulation to take place therein. IEGT 200 turns on by an IGBT triggering action.

When a negative voltage is applied to the gate electrodes 24 with respect to cathode electrode 34, the injection of electrons from the turn-on channel region is forced to stop. An inversion layer is formed at a side face portion (groove-side wall portion) facing the trench 20 in the trench gate section. The residual carriers in P type base layer 18 are drained away toward cathode electrode 34 through P type drain layer 28, due to a known P-channel MOS transistor action. The device 200 thus turns off. In this case, the parasitic thyristor, which is constituted by N type source 30, P type base 18, N type base 12 and P type emitter 16, is specifically arranged so that it will not be latched up even when device 200 turns on. When the on-channel closes, the electron injection from N type source 30 stops instantly.

With the IEGT 200, a unit cell is formed by a certain pair of trench gates 24, P+ type drain layer 28*d* positioned between these gates and electrically insulated from cathode electrode 34, and another P+ type drain layer 28*d* that is adjacent to the insulated P+ type drain layer with a corresponding trench gate being positioned therebetween and is connected to cathode electrode 34. By suitably arranging the depth and the distance of trench-gate electrodes 24 (the practical example has been already described), it is possible to attain a reduced on-resistance while IEGT 200 is prevented from performing a thyristor action. The "thinned-out" contact of cathode electrode 34 with P type drain 28*d* leads to decrease in the hole bypass current, i.e., achievement of a decreased on-resistance. Furthermore, with this embodiment, a parasitic thyristor will not be latched up while IEGT 200 turns on; when IEGT 200 turns off, a turn-off channel opens to form a bypassing path for the flow of holes therethrough. Therefore, the maximum current cut-off ability can be improved compared to that of an existing GTO thyristor, which is arranged to turn off once after it is latched up.

An explanation will now be given of the fact that the increased electron injection efficiency can be obtained by varying the ratio of hole diffusion current to the whole current.

In the case where the impurity concentration of the "broad defined" emitter region (shown by the block in dotted line in FIG. 17) is relatively low due to inclusion of a certain portion whereat a conduction modulation occurs within the broad-defined emitter region, for example, the injection efficiency of this emitter region can be increased to attain a reduced on-resistance, by adding to the emitter region a specific structure that increases the ratio between the hole diffusion current Ip and electron current In (=I-Ip, where I is the whole current). Note that the hole diffusion current Ip is particularly a vertical diffusion current that flows in parallel with the anode-to-cathode direction of the device 200.

Assuming that the hole current Jp flowing in the broad-defined emitter region consists of a vertical carrier diffusion current, current Jp may be represented as below:

$$Jp=2\cdot\mu_p kTWn/CD\ (\mathrm{A/cm^2}), \tag{12}$$

where, $\mu_p$ is the hole mobility, k is the Boltzmann constant, n ($\mathrm{cm^{-3}}$) is the emitter-side carrier density of N− type base near the emitter region. The hole injection efficiency $\gamma_p$ is determined by $$\begin{aligned}\gamma_p = Jp/J &= Jp/(Jn+Jp) \\ &= 2\mu_p kTWn/CDJ.\end{aligned} \tag{13}$$

Now, a new parameter Y is defined as $$Y=W/CD. \tag{14}$$

Then, efficiency yp is represented by $$\gamma_p=2(\mu_p kTWn/J)Y \tag{15}$$

If $\mu_p$ is 500, kT is $4.14\times10^{-21}$, J is 100 ($\mathrm{A/cm^2}$), and n is $1\times10^{16}$ ($\mathrm{cm^{-3}}$), then $$\gamma_p=(4.14\times10^{-4})Y. \tag{16}$$

While the injection efficiency remains lower, $\gamma_p$ will be about 0.3. It can be said that the injection efficiency of the emitter region is large when $$\gamma_p<0.3. \tag{17}$$

To satisfy this, from equations 16 and 17, the parameter Y should be $$Y<0.3/4.14\times10^{-4}=7.25\times10^2\ (\mathrm{cm^{-1}}). \tag{18}$$

When the on-voltage is relatively high, and when n is $7\times10^{15}$, then $$Y<1.0\times10^3\ (\mathrm{cm^{-1}}). \tag{19}$$

This reveals that, even if the injection efficiency of an impurity diffusion layer being in contact with cathode electrode 34 is lower, the injection efficiency of the broad-defined emitter region can be increased by carefully determining the value of Y to meet the above condition, whereby the carrier storage amount in the high resistive base layer 12 under the ON condition can be increased to reduce the on-resistance of the device.

With such an arrangement, the cathode diffusion layer that is inherently low in carrier injection efficiency can provide high current controllability and high-speed switching operations. Additionally, increasing the injection efficiency of the broad-defined emitter region can attain a device of reduced on-resistance.

Note that when the broad defined emitter region has the trench-gate structure as shown in FIG. 16, the value of Y may be determined by suitably selecting the values of D, C and W as previously explained. Alternatively, when the broad-defined emitter region includes a high impurity concentration region (wherein current Jp flows due to its resistance) and low impurity concentration region, the total injection efficiency thereof may be determined depending upon both parameters X and Y.

Figure 91:
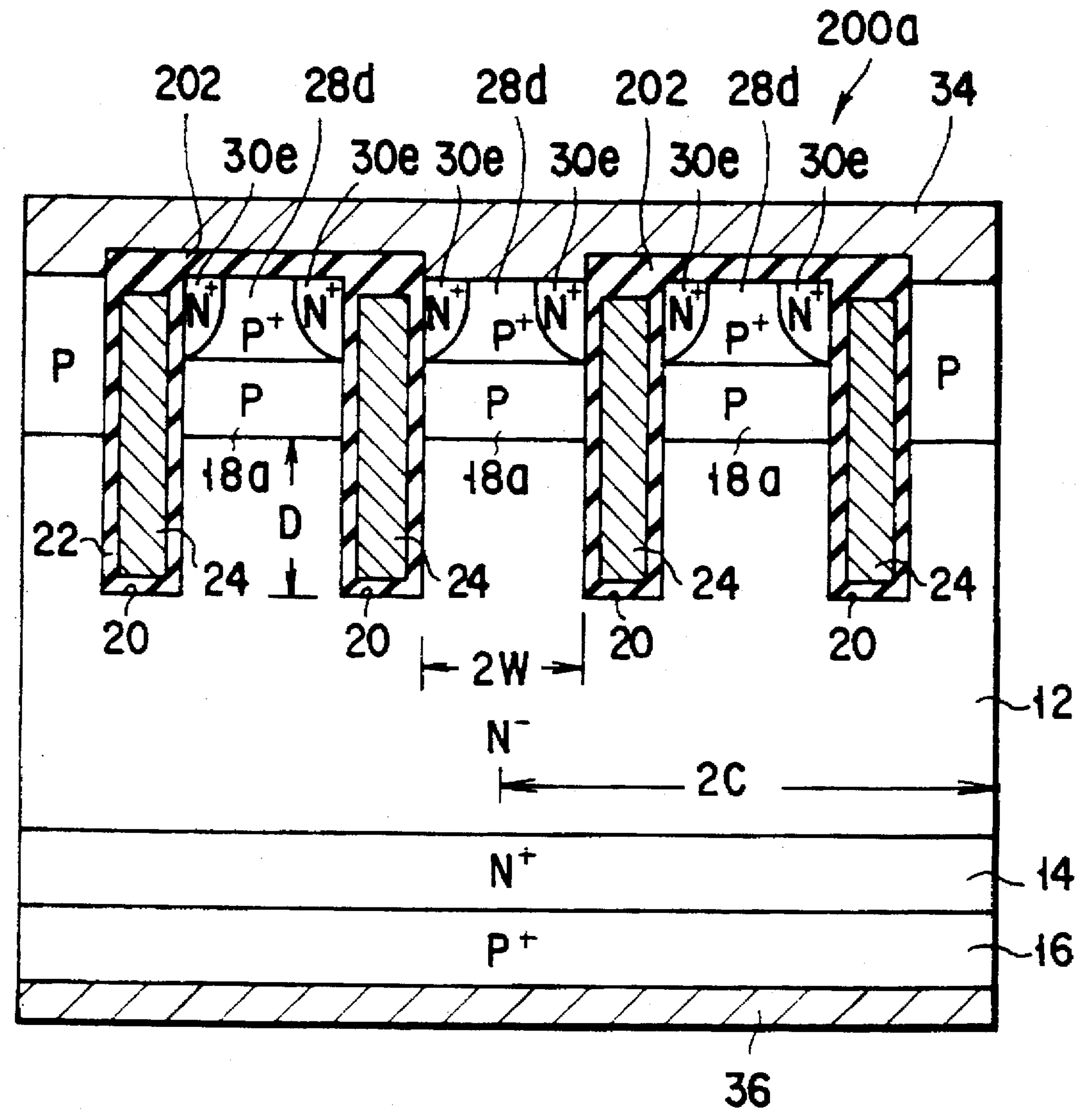
FIG. 91 shows a cross-sectional view of a modification of that shown in FIG. 90.

The cross-sectional structure of FIG. 90 any be modified as shown in FIG. 91, wherein an N+ type source layer 30*e* extends so that it contacts with the both side wall edges of each of trenches 20 in which insulated gate electrodes 24 are buried.

Figure 92:
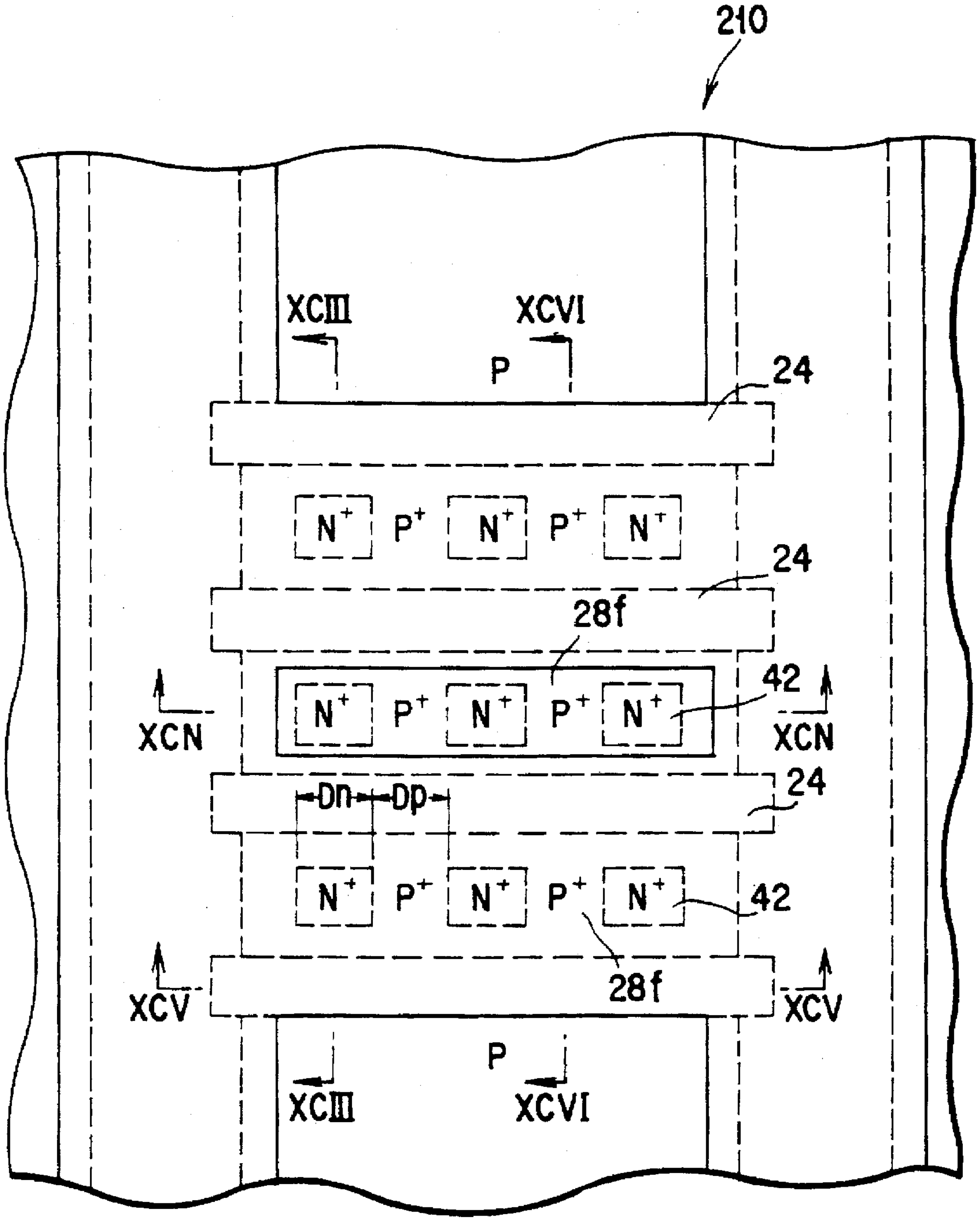
FIG. 92 shows a plan view of a power semiconductor device in accordance with another embodiment of the invention.

An IEGT 210 shown in FIGS. 92 to 96 is basically a combination of the device 200 of FIGS. 86–90 and that of FIGS. 6–9. In other words, IEGT 210 characteristically differs from that of FIGS. 86–90 in that each P+ type drain layer 28*f* has a "ladder-like plan shape". More specifically, the N type source layer 42 as previously described with reference to FIG. 7 is formed in the surface of P+ type drain layers 18*a*. In N type source layer 42, P+ type drain layer 28*f* is arranged so as to contact with the both side wall edges of each trench 20. Layer 28*f* is smaller in depth than N type source layer 42. A portion of N type source layer 42 being sandwiched between the bottom of P+ type drain layer 28*f* and P type base layer 16*a* acts as the N type turn-off channel layer 42*a* shown in FIG. 7. The central region of N type source layer between two adjacent ones of trench gates 24 pay correspond to the N type source layer 30 of FIG. 2. On the substrate surface, P type drain layer 28*f* planarly surrounds N type source layer 42 between two adjacent ones of trench gates 24, thereby to exhibit the ladder-like planar shape as shown in FIG. 92.

Figure 95:
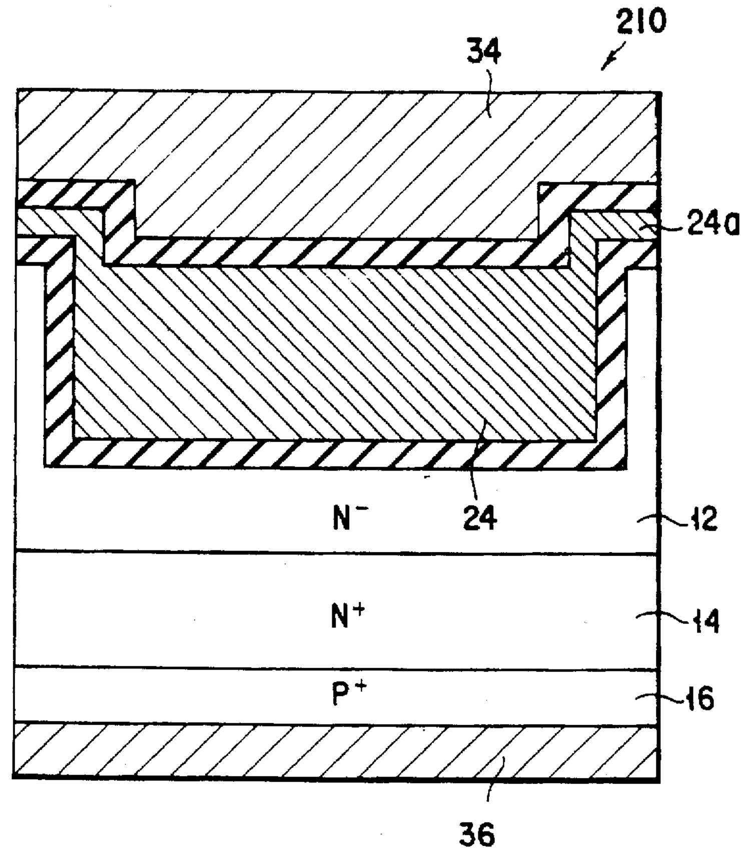
Figure 96:
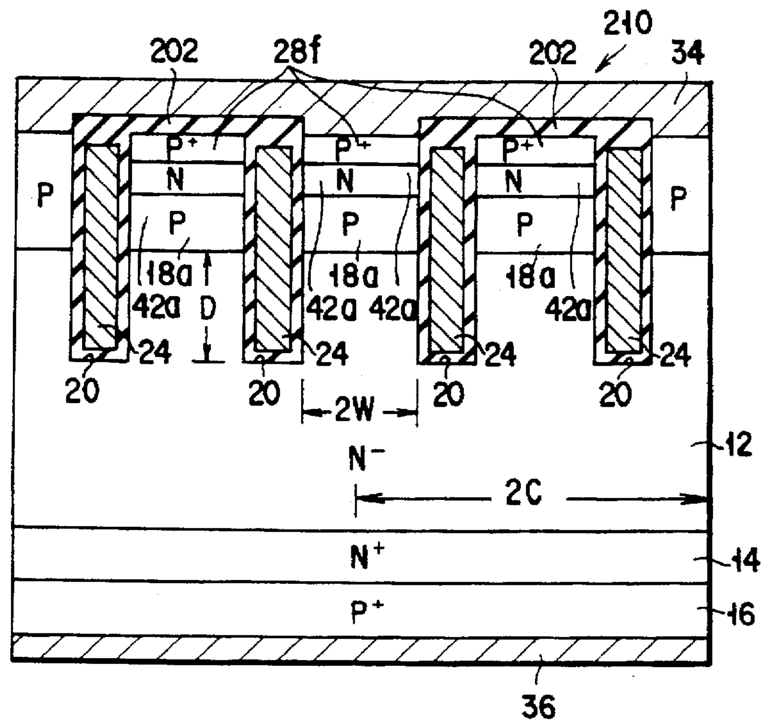

As shown in FIG. 94, N type source layer 42 is shallower than P+ type drain layer 28*f*; therefore, looking at the cross-section shown therein, N type source layer 42 surrounds P+ type drain layer 28*f*. A profile of trench gate 24 shown in FIG. 95 is the same as that of FIG. 89. As shown in FIG. 96, P+ type drain layer 28*f* contact cathode electrode 34 at a decreased number of contact points defined by the surface insulation layer 202.

With the IEGT 210, each trench-contact side-edge portion of P type base layer 18*a* being positioned just below N type turn-off channel layer 42*a* serves as a turn-off channel region. It can thus be said that each of trench gates 24 may function as the turn-on and off driving electrodes for device 210. The structure may also be considered such that a turn-off controlling P-channel MOSFET and a turn off controlling N-channel MOSFET are stacked on each other within device 210. When a positive voltage is applied to trench gates 24, an N-type channel is formed at each trench-contact side edge portion of P type base layer 18*a*, causing device 210 to turn on. At this time, electrons are injected from each source layer 42 into N type base layer 12 through a corresponding N type turn-off channel layer 42*a* and an N type channel appearing due to formation of an inversion layer. The turn-off operation is performed by applying a negative voltage to trench gates 24 in the same manner as in the above embodiment 200. IEGT 210 can provide the same advantages as those of device 200.

The present invention is not limited to the above-described specific embodiments and may be practiced or embodied in still other ways without departing from the spirit or essential character thereof.

Figure 100:
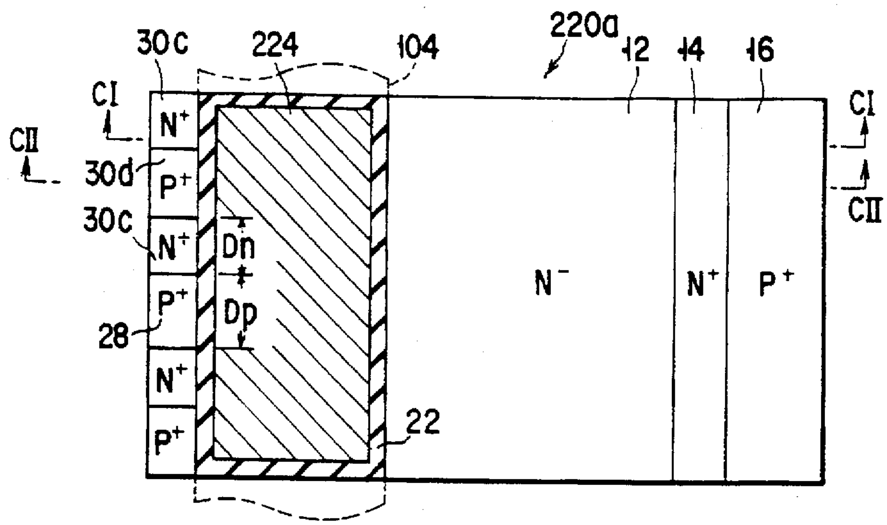
Figure 101:
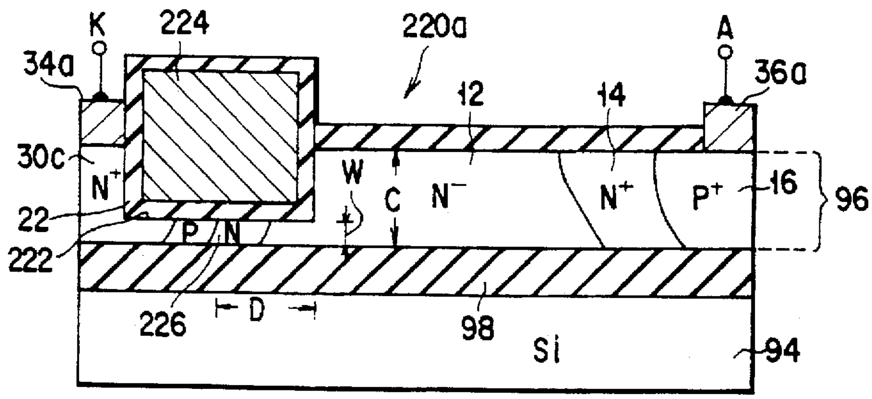

Two possible modifications of the lateral-type IGBTs 90 to 90*g* of FIGS. 48–68 are shown in FIGS. 97–102. The characteristic difference of lateral type IGBT 220 of FIGS. 97–99 and that 220*a* of FIGS. 100–102 from IGBTs 90–90*g* is that the differentiation of the cell structure parameters C and W is made across the thickness of the substrate as shown in FIG. 98 or 101.

As shown in FIGS. 98 and 99, a trench 222 having a uniform rectangular profile is formed in the top surface of the N− type upper substrate 96 on intermediate insulation layer 98. A conductive layer 224 is insulatively buried in trench 222. The thickness of layer 224 is greater than the depth of trench 222 so that the upper half of layer 224 is projected from the top surface of upper substrate 96 as shown in FIGS. 98 and 99. Layer 224 acts as a trench-pate electrode. The thickness of upper substrate 96 is C. The thickness of a trench section of substrate 96, i.e., the thickness of an active layer sandwitched between the bottom of trench 222 and intermediate insulation layer 98, is W as shown in FIG. 98. A channel region for injection of electrons or for a turn-off drive will be formed at a portion contacting with the bottom of trench gate 224.

With lateral-type IGBT 220, its turn-off controlling electrode has a MOS-controlled thyristor (MCT) structure. By arranging the P-drain width Dp and N-source width Dn so that Dp<Dn as in the case of embodiment of FIGS. 27 to 29, the turn-on characteristic can be enhanced; alternatively, when these are determined so that Dp>Dn, the turn-off characteristic can be improved. This means that the on/off characteristics of IGBT 220 can be easily changed as required by suitably modifying the relation between width values Dp and Dn. To increase the maximum controllable current of IGBT 220, it is desirable that Dn is equal to or less than the carrier diffusion length. To reduce the on-resistance, it is recommendable to increase Dn as much as possible within a range that the minimum level of the maximum controllable current is guaranteed. Combination of (1) the trench-gate structure, wherein the narrow (=W) hole current paths being positioned between trench gates 224 and intermediate layer 98 are arranged at expanded distance, and (2) the cathode-emitter structure suppressed in its injection efficiency can lead to achievement of a voltage-controlled power switch device having a decreased on-voltage being same as that of the existing GTO thyristor while attaining a suppressed latch-up occurrence.

Figure 102:
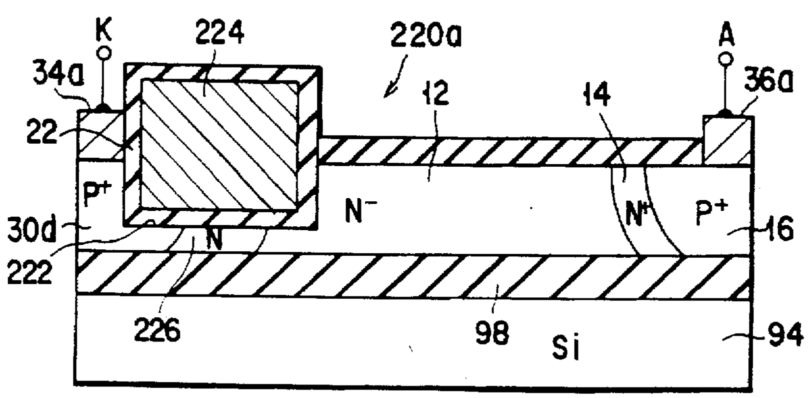

A lateral-type IGBT 220*a* shown in FIGS. 100–102 is similar to that of FIGS. 97–99 with an N type hole-bypass resistance layer 226 being added. The hole-bypass resistance layer 226 is formed at the bottom portion of trench-gate electrode 224 so that it contacts N+ type layer 30*d* as shown in FIG. 102. The impurity concentration of layer 226 may be determined in accordance with practical requirements. When layer 226 is greater in impurity concentration ($10^{16}$ to $10^{21}$ $cm^{-3}$, for example), the on-characteristic of IGBT 220*a* can be improved. If the impurity concentration of layer 226 is lower at $10^{13}$ to $10^{18}$ $cm^{-3}$, the off-characteristic of IGBT 220*a* can be enhanced without degrading the on-characteristic performance.

FIG. 103 is a schematic diagram showing the arrangement (a ½ cell) of an IEGT (Injection Enhanced Gate Bipolar Transistor) as an insulated-gate semiconductor device in accordance with still another embodiment of the present invention.

Referring to FIG. 103, reference numeral 301 denotes a P type emitter layer. An $N^+$ type high-resistive base layer 303 is provided on the P type emitter layer 301 through an N type buffer layer 302. A P type base layer 304 is formed on the $N^-$ type high-resistive base layer 303, and a plurality of trenches having a depth to reach into the $N^-$ type high-resistive base layer 303 are provided in the P type base layer 304. A gate electrode 307 is buried in each trench through a gate insulation film 306.

An N type source layer 305 in contact with the side wall of the above trench is formed in the surface of the P type base layer 304. A first N type MOS transistor is constituted by the N type source layer 305, the $N^-$ type high-resistive base layer 303, the P type base layer 304, the gate insulation film 306, and the gate electrode 307.

The P type high-resistive base layer 304 in a region wherein the N type source layer 305 is formed contacts a cathode electrode 308 together with the N type source layer 305. An anode electrode 309 is provided on the P type emitter layer 301.

A second P type MOS transistor 310 is provided between the cathode electrode 308 and the $N^-$ type high-resistive base layer 303 on the opposite side wherein the N type source layer 305 is not formed.

The insulated-gate semiconductor device with the above arrangement operates as follow.

More specifically, when a positive voltage is applied to the gate electrode 307 in relation to the cathode electrode 308, an N type channel is formed in the P type base layer 304, and electrons are injected from the N type source layer 305 into the $N^-$ type high-resistive base layer 303 to turn on the device. At this time, a positive or a zero-volt voltage is applied to the gate of the second P type MOS transistor 310 to turn off the transistor 310, thereby preventing holes in the device from being discharged. This allows the holes to be stored in the device, thereby obtaining a low on-resistance.

In order to turn off the device, a negative or a zero-volt voltage is applied to the gate electrode 307 to cause the above channel to disappear, and simultaneously, a negative voltage is applied to the gate of the P type MOS transistor 310 to turn it on. As a result, the supply of electrons to the $N^-$ type high-resistive base layer 303 is stopped and the holes in the device are also discharged outside the device through the P type MOS transistor 310, thereby turning off the device.

At this time, since holes are discharged through the second P type MOS transistor 310, the amount of holes discharged through the $N^-$ type high-rèsistive base layer 303, the P type base layer 304, and the cathode electrode 308 is decreased, thereby preventing latch-up of a thyristor constituted by the P type emitter layer 301, the $N^-$ type high-resistive base layer 303, the P type base layer 304, and the N type source layer 305.

In addition, by changing the magnitudes and timings of voltages to be applied to the first N type MOS transistor and the second P type MOS transistor, e.g., turning off the second MOS transistor about several μs to several tens μs before the first MOS transistor is turned off, carriers in the $N^-$ type high-resistive base layer 303 under the $ON^-$ state, and more particularly, carriers at the cathode side can be decreased. By optimizing a profile of the carrier concentration in the $N^-$ type high-resistive base layer 303 under the $ON^-$ state, a turn-off loss can be further reduced and the maximum controllable current can be increased.

The injection efficiency of a broad-defined emitter region (the broad-defined emitter region represents a MOS structure constituted by the N type source layer 305, the P type base layer 304, the $N^-$ type high-resistive base layer 303, the gate insulation film 306, and the gate electrode 307), a depth D of the trench in the base layer 303, and an emitter width W, shown in FIG. 103, are suitably designed as follows, thereby obtaining the on-resistance as low as that of a thyristor.

In the case where the impurity concentration of the broad-defined emitter region is relatively low, e.g., due to presence of a portion wherein an n-p conductivity modulation occurs within the broad-defined emitter region, the injection efficiency of the broad-defined emitter region can be increased to decrease the on-resistance of the device by adding to the broad-defined emitter region a structure which increases the ratio of the hole diffusion current $I_p$ to the electron current $I_n$ (=I−$I_p$, where I is the whole current). Note that the hole diffusion current $I_p$ is particularly in a vertical direction (diffusion current flowing parallel with the anode-to-cathode direction of the device).

Assuming that the hole current flowing through the broad-defined emitter region is $J_p$ (A/cm$^2$), and a carrier concentration of the N type high-resistive base layer 303 at the broad-defined emitter region side is n. If the hole current $J_p$ flowing through the broad-defined emitter region is only the vertical carrier diffusion current, the current $J_p$ is represented below:

$$J_p=2\cdot\mu_p\cdot k\cdot T\cdot W\cdot n/(C\cdot D)$$

where, $\mu_p$ is the hole mobility, k is the Boltzmann constant, T is the temperature, and C is the ½ size.

The hole injection efficiency $\gamma_p$ in a region at the cathode side is determined by $$\begin{aligned}\gamma_p &= J_p/J\\ &= J_p/(J_n+J_p)\\ &= 2\cdot\mu_p\cdot k\cdot T\cdot W\cdot n/(C\cdot D\cdot J)\end{aligned}$$

Now, a new parameter Y is defined as $$Y=W/(C\cdot D)$$

Then, the efficiency $\gamma_p$ is represented by $$\gamma_p=2(\mu_p\cdot k\cdot T\cdot n/J)\cdot Y$$

If μp is 500, kT is $4.14\times10^{-21}$, and J is 100 A/cm$^2$, the efficiency $\gamma_p$ is represented by $$\begin{aligned}\gamma_p &= 2\times(500\times4.14\times10^{-21}/100)\times1\times10^{16}\times Y\\ &= 4.14\times10^{-4}\cdot Y\end{aligned}$$

When the injection efficiency is sufficiently low, the efficiency $\gamma_p$ is represented by $$\begin{aligned}\gamma_p &= J_p/(J_n+J_p)\\ &= \mu_p/(\mu_n+\mu_p)\sim\\ &\quad 0.3\end{aligned}$$

where $\mu_n$ is the electron mobility, and ~ is the approximate symbol.

More specifically, when the injection efficiency at the cathode side is large, the efficiency $\gamma_p$ is represented by $$\gamma_p<0.3$$

To satisfy this, the parameter Y should be $$4.14\times10^{-4}\cdot Y<0.3$$

$$Y<0.3/4.14\times10^{-4}$$

$$Y<7.25\times10^{2}\ (\mathrm{cm}^{-1})$$

When the on-voltage is relatively high, and when n is $7\times10^{15}$, then $$Y=1.0\times10^{-3}\ (\mathrm{cm}^{1})$$

This reveals that, even if the injection efficiency of an impurity diffusion layer being in contact with the cathode electrode 308 is lower, the injection efficiency in a region at the cathode side can be increased by setting the parameter Y to fall within the above range. Therefore, the carrier storage in the $N^-$ type high-resistive base layer 303 under the $ON^-$ state can be increased to decrease the on-resistance of the device That is, in the device in accordance with the present invention, the structure at the cathode side except for the N type emitter layer (i.e., trench structure) prevents the holes injected from the anode side from being discharged to the cathode electrode. In this manner, the number of electrons injected from the cathode electrode increases to be in a high injection state at the cathode side of the $N^-$ type high-resistive base layer 303, thereby decreasing the on-resistance of the device.

FIG. 103 shows the carrier concentration distribution under the $ON^-$state. As compared with the IGBT structure, the feature of the present invention lies in that the carrier concentration distribution has the peak on the cathode side of the $N^-$ type base layer.

Figure 104:
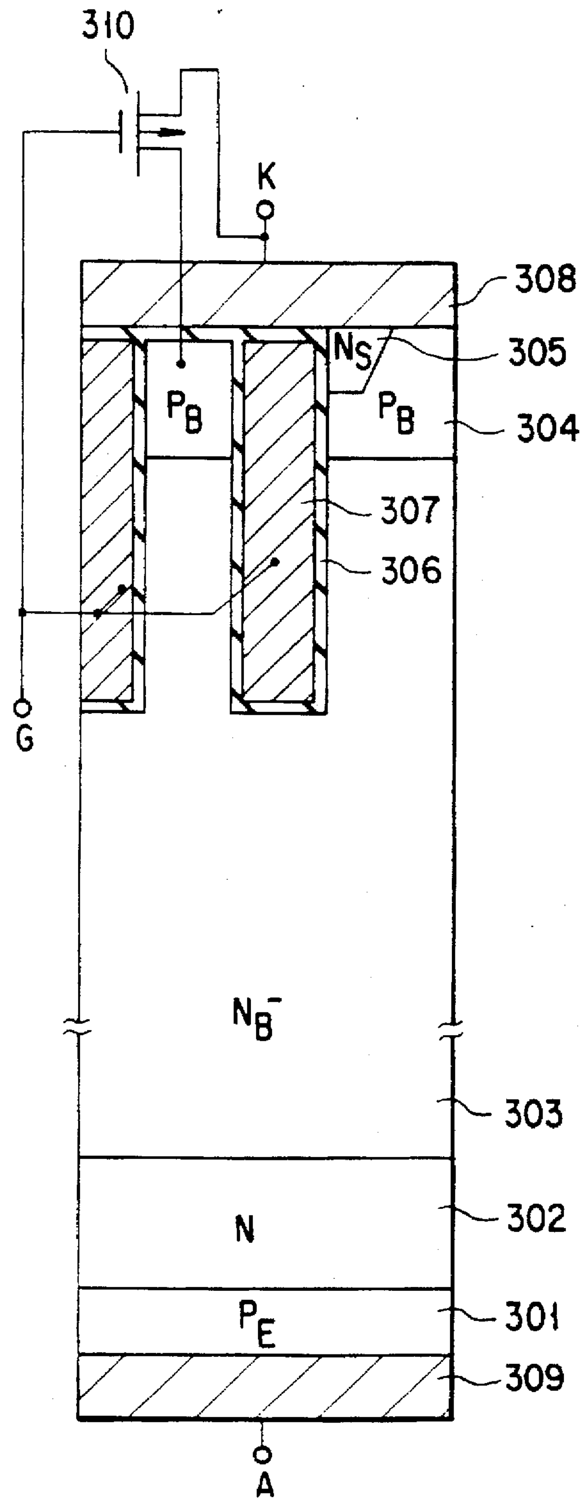
FIG. 104 is a schematic diagram showing an insulated-gate semiconductor device in accordance with still another embodiment of the present invention.
Figure 106:
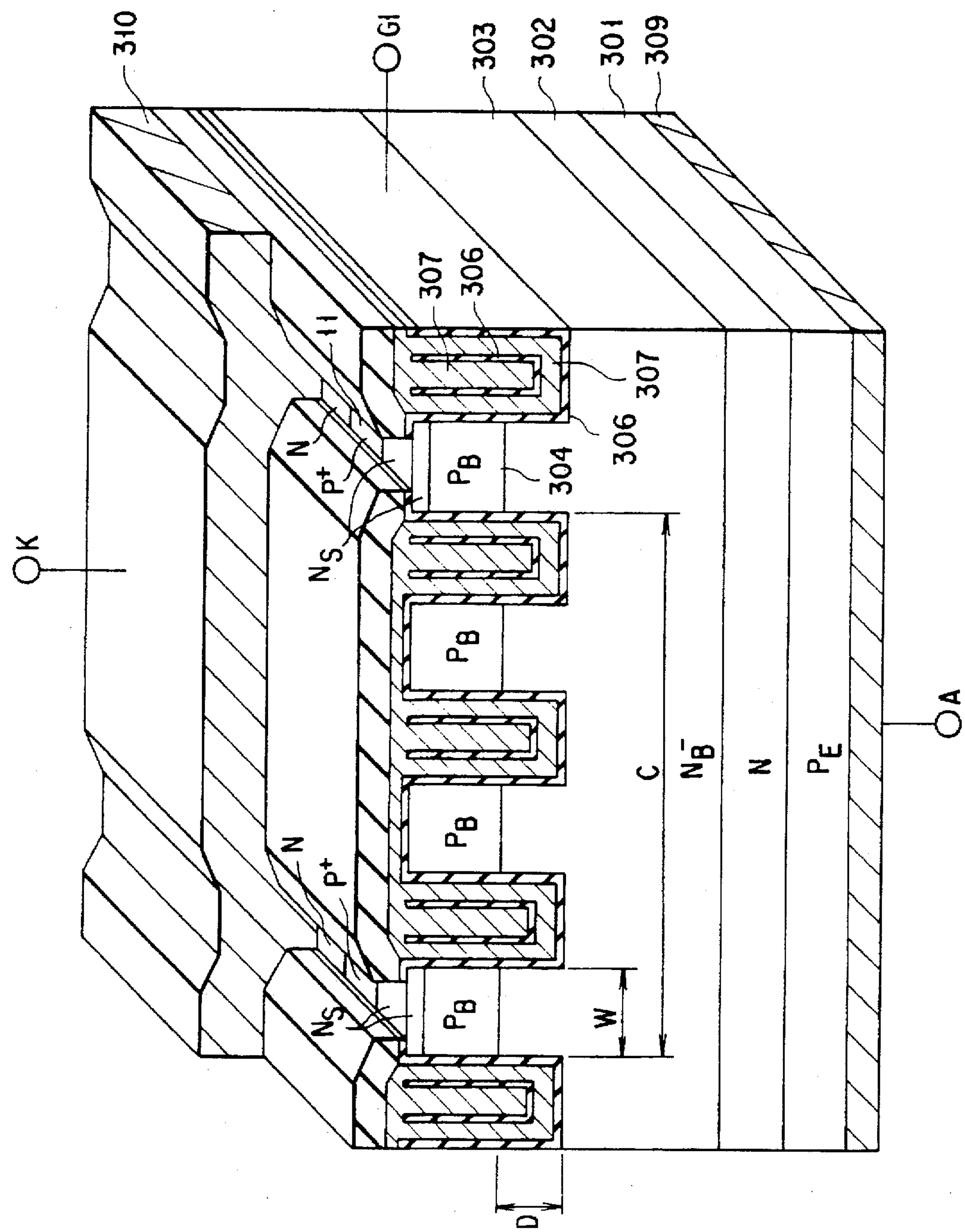
FIG. 106 is a perspective cross-sectional view showing the specific arrangement of an insulated-gate semiconductor device in accordance with still another embodiment of the present invention.

FIG. 104 is a schematic diagram showing an insulated-gate semiconductor device in accordance with still another embodiment of the present invention.

The insulated-gate semiconductor device of this embodiment is the same as that in the previous embodiment except that a first MOS transistor and a second MOS transistor share a common gate terminal. In this case, since the first MOS transistor and the second MOS transistor are not independently controlled, it is not expected that a profile of the carrier concentration in an $N^-$ type high-resistive base layer 303 is optimized to reduce the turn-off loss upon turn-off operation. However, this embodiment can obtain the same other effects as in the previous embodiment.

FIG. 105A is a plan view showing the specific arrangement of an insulated-gate semiconductor device in accordance with still another embodiment of the present invention, and FIG. 105B is a cross-sectional view of the device of the preceding figure.

In this embodiment, a second MOS transistor is constituted by a $P^+$ type drain layer 311 provided in a P type base layer 304 and insulated from a cathode electrode 308 by an insulating interlayer 314, an $N^-$ type well layer 312, and a $P^+$ type source layer 313 in contact with the cathode electrode 308.

In this embodiment, three second P type MOS transistors are formed between two N type source layers 305 contacting the cathode electrode 308. In this manner, the plurality of second P type MOS transistors constituted by the $P^+$ type drain layer 311 insulated from the cathode electrode 308 are formed to obtain the same effect as that using a trench having a large width, without forming a trench having a large width (2 C–2 W) which is technically difficult. The "thinned-out" connection of the cathode electrode 308 to the P type base layer 304 contributes to a decrease in hole bypass current, i.e., achievement of a decreased on-resistance.

FIG. 206 is a respective cross-sectional view showing the specific arrangement of an insulated-gate semiconductor device in accordance with still another embodiment of the present invention. Second MOS transistors have the same arrangement as in the previous embodiment, and a gate portion having a double structure is formed in each trench.

Figure 107:
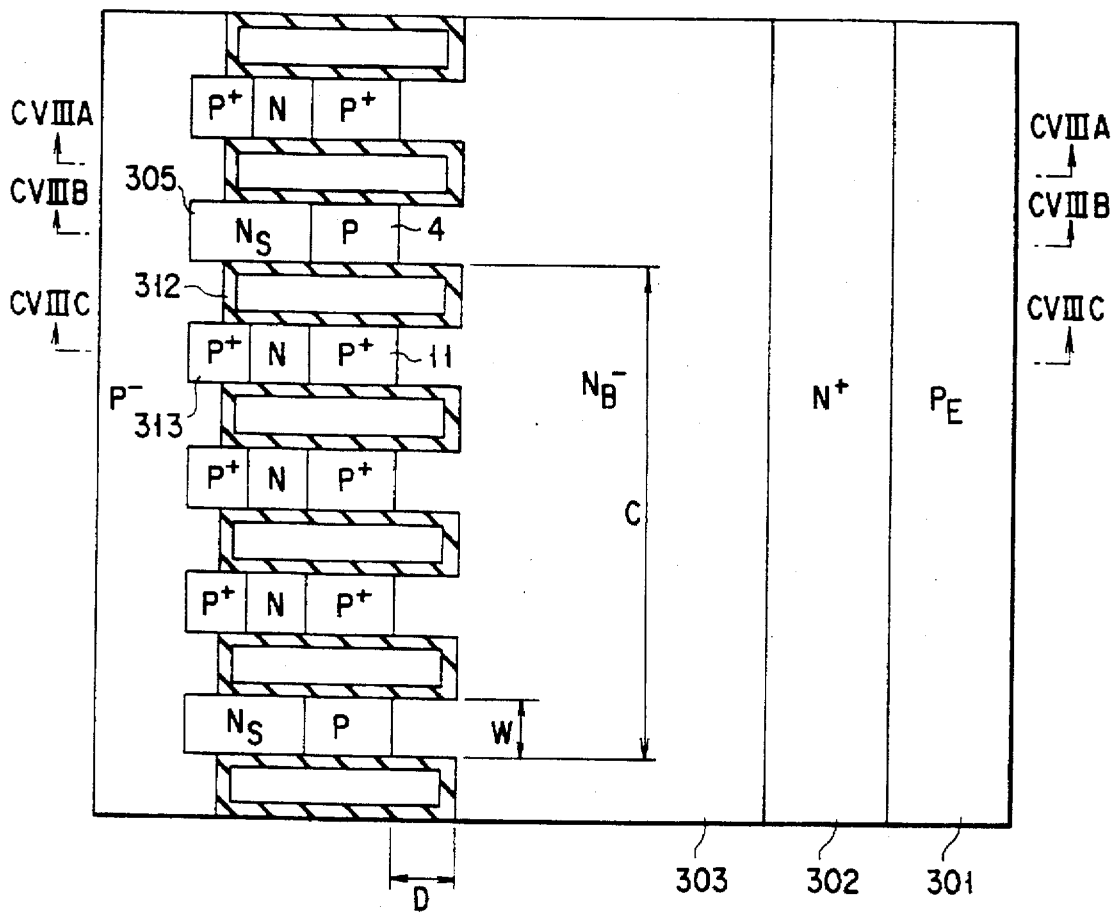
FIG. 107 is a plan view showing the specific arrangement of an insulated-gate semiconductor device in accordance with still another embodiment of the present invention.
Figure 108A:
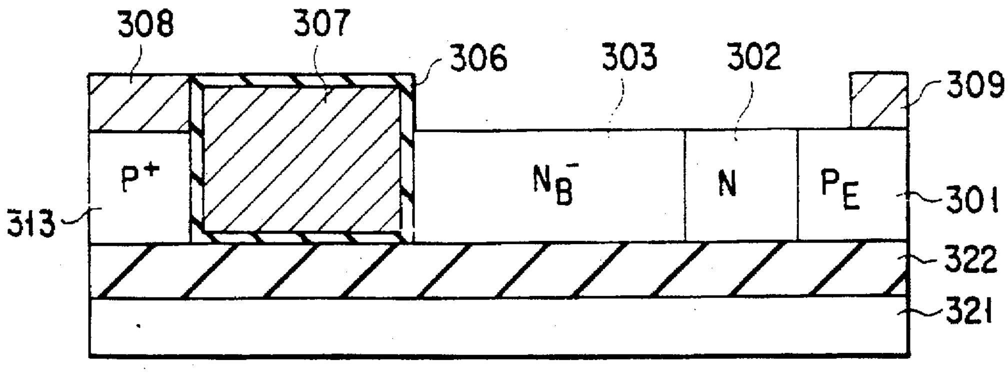
FIGS. 108A to 108C are cross-sectional views along lines CVIIIA—CVIIIA, CVIIIB—CVIIIB, and CVIIIC—CVIIIC of FIG. 107, respectively.
Figure 108B:
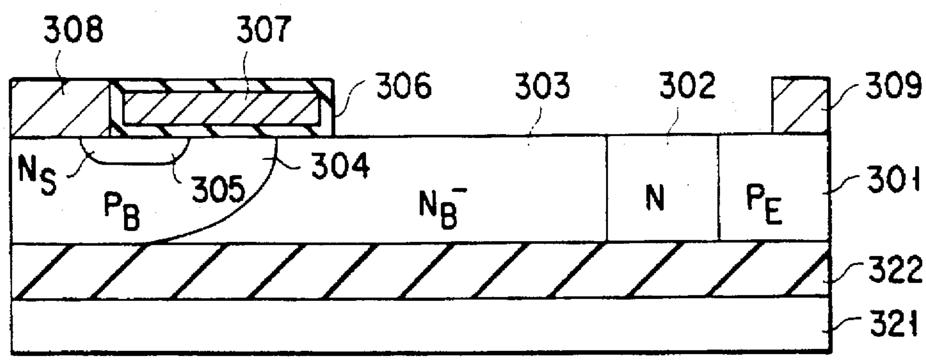
Figure 108C:
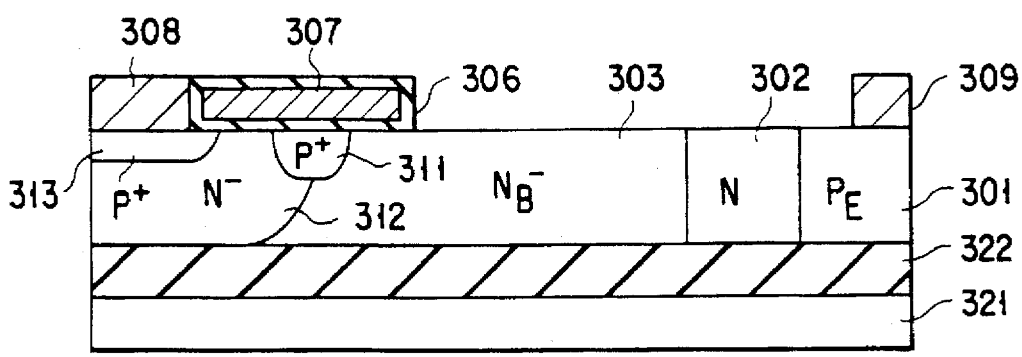

FIG. 107 is a plan view showing the specific arrangement of an insulated-gate semiconductor device in accordance with still another embodiment of the present invention, and FIGS. 108A to 108C are cross-sectional views thereof.

This embodiment exemplifies a lateral-type insulated-gate semiconductor device. The main body of the same insulated-gate semiconductor device as in the previous embodiment is formed on a silicon substrate 321 through an $SiO_2$ film 322.

FIG. 109 is a plan view of a lateral-type insulated-gate semiconductor device in accordance with still another embodiment of the present invention.

In this lateral-type insulated-gate semiconductor device formed on an SOI substrate, a P type base layer 304 is divided into stripes by trenches 330 reaching buried oxide films. Each trench 330 is filled with a gate electrode.

The trench 330 is not rectangular, but has a shape to surround the side surface of the rectangle. By using such a trench 330, the hole current which flows into a source electrode 332 can be decreased. On the other hand, the electron current flows through a channel formed by a polysilicon gate electrode 331 on the surface and a channel formed in the side surface of the trench 330 so as to reduce a decrease in electron current.

Therefore, since the ratio of the electron current to the whole current increases to increase carrier storage at the source side, the on-voltage is lowered.

Note that reference numerals 320*a* and 320*b* denote oxide films in FIG. 109.

Figure 110B:
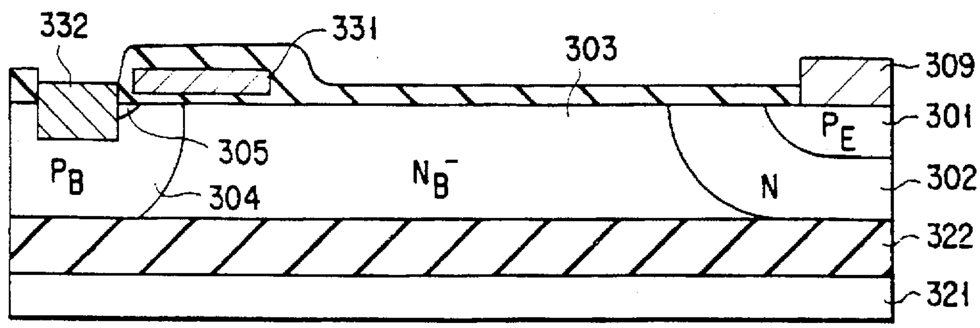
FIG. 110B is a cross-sectional view along a line CXB—CXB of FIG. 110A.

FIG. 110A is a plan view showing a lateral-type insulated-gate semiconductor device in accordance with still another embodiment of the present invention, and FIG. 110B is a cross-sectional view thereof. Note that, in FIGS. 110A and 110B, an insulation film for insulating a gate electrode 331 and a source electrode 332 from each other is not illustrated.

The lateral-type insulated-gate semiconductor device of this embodiment is the same as that in FIG. 109 except that a part of the source electrode 332 is buried in a P type base layer 304. As a result, the resistance of a path through which holes pass up to the source electrode 332 decreases, thereby increasing the latch-up current.

Figure 111A:
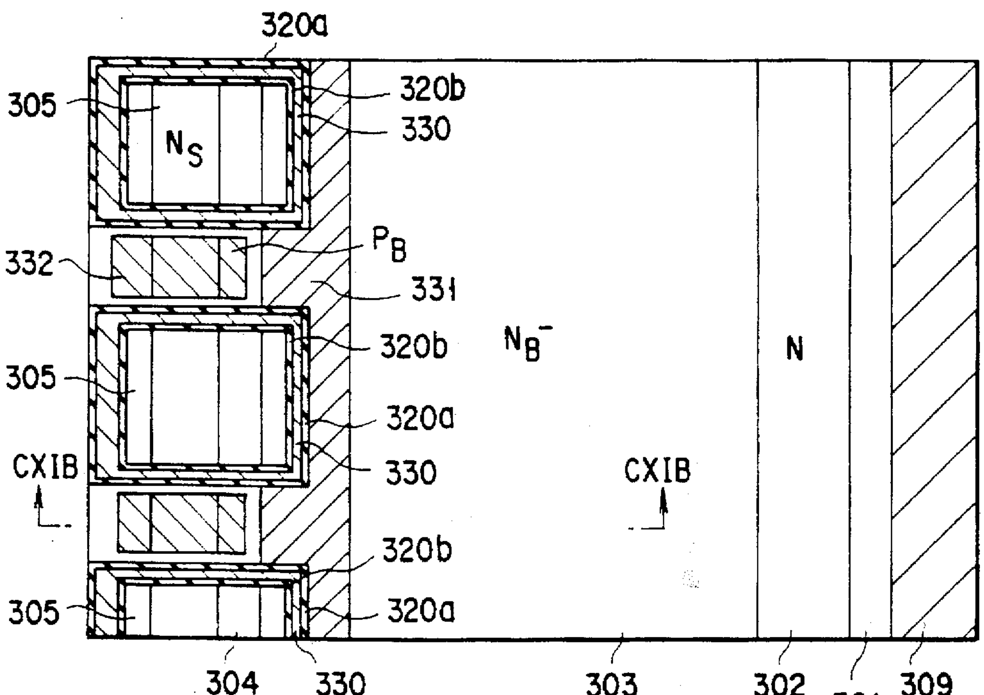
FIG. 111A is a plan view showing a lateral-type insulated-gate semiconductor device in accordance with still another embodiment of the present invention.
Figure 111B:
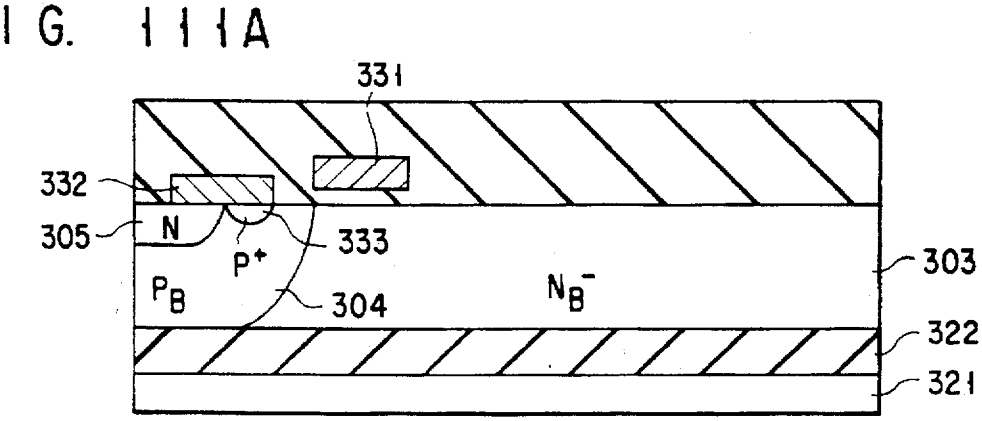
FIG. 111B is a cross-sectional view along a line CXIB—CXIB of FIG. 111A.

FIG. 111A is a plan view showing a lateral-type insulated-gate semiconductor device in accordance with still another embodiment of the present invention, and FIG. 111B is a cross-sectional view thereof. Note that, in FIGS. 111A and 111B, an insulation film for insulating a gate electrode 331 and a source electrode 332 from each other is not illustrated.

The lateral-type insulated-gate semiconductor device of this embodiment is the same as that in FIG. 109 except that a $P^+$ type diffusion layer 333 is formed in the surface of a p type base layer 304, and the source electrode 332 extends to the $P^+$ type diffusion layer 333. With this arrangement, the holes flow directly to the source electrode 332 without going through the lower portion of an N type source layer 305 to prevent the injection of electrons from the N type source layer 305 to an $N^-$ type high-resistive base layer 303. As a result, latch-up of a transistor constituted by the N type source layer 305, the P type base layer 304, and the $N^-$ type high-resistive base layer 303 can be suppressed.

Figure 112A:
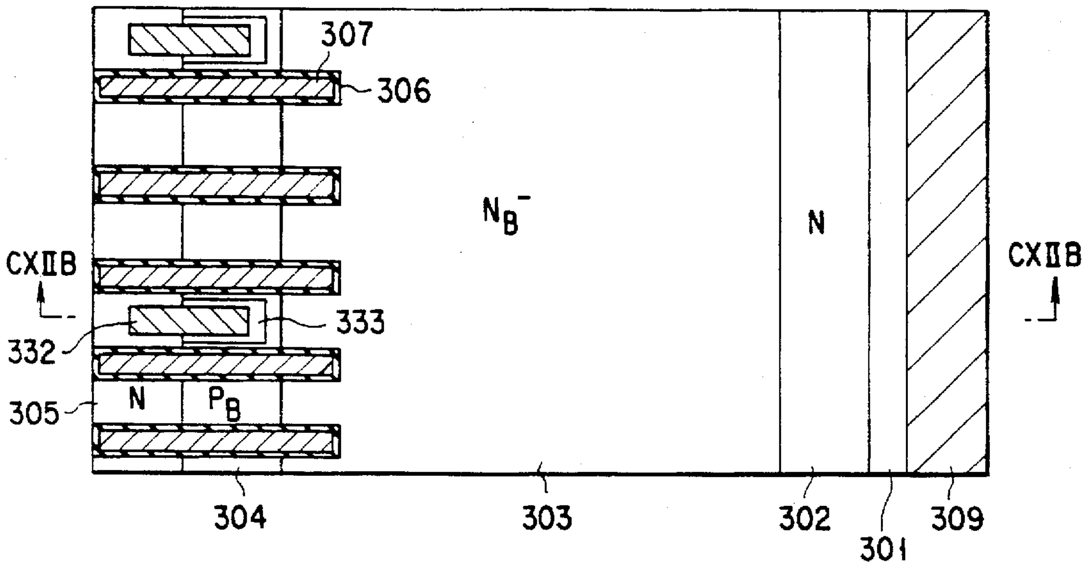
FIG. 112A is a plan view showing a lateral-type insulated-gate semiconductor device in accordance with still another embodiment of the present invention.
Figure 112B:
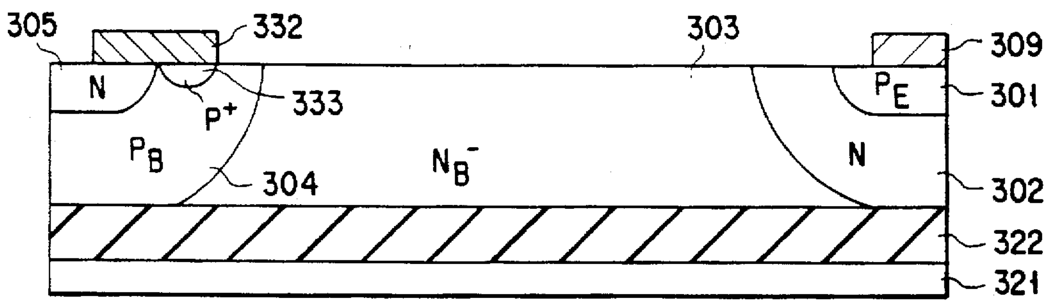
FIG. 112B is a cross-sectional view along a line CXIIB—CXIIB of FIG. 112A.

FIG. 112A is a plan view showing a lateral-type insulated-gate semiconductor device in accordance with still another embodiment of the present invention, and FIG. 112B is a cross-sectional view thereof.

This embodiment exemplifies a lateral-type insulated-gate semiconductor device which employs the technique of the embodiment shown in FIGS. 111A and 111B. A plurality of trench-gate electrodes 307, constituting an SOI structure and reaching an oxide film 322 are provided in parallel to each other to divide a P type base layer 304 and an N type source layer 305 into stripes. Source electrodes 332 are provided to some of the resultant stripe portions, and a $P^+$ type diffusion layer 333 is also formed on the surface of the P type base layer 304 contacting the source electrode 332.

Figure 113:
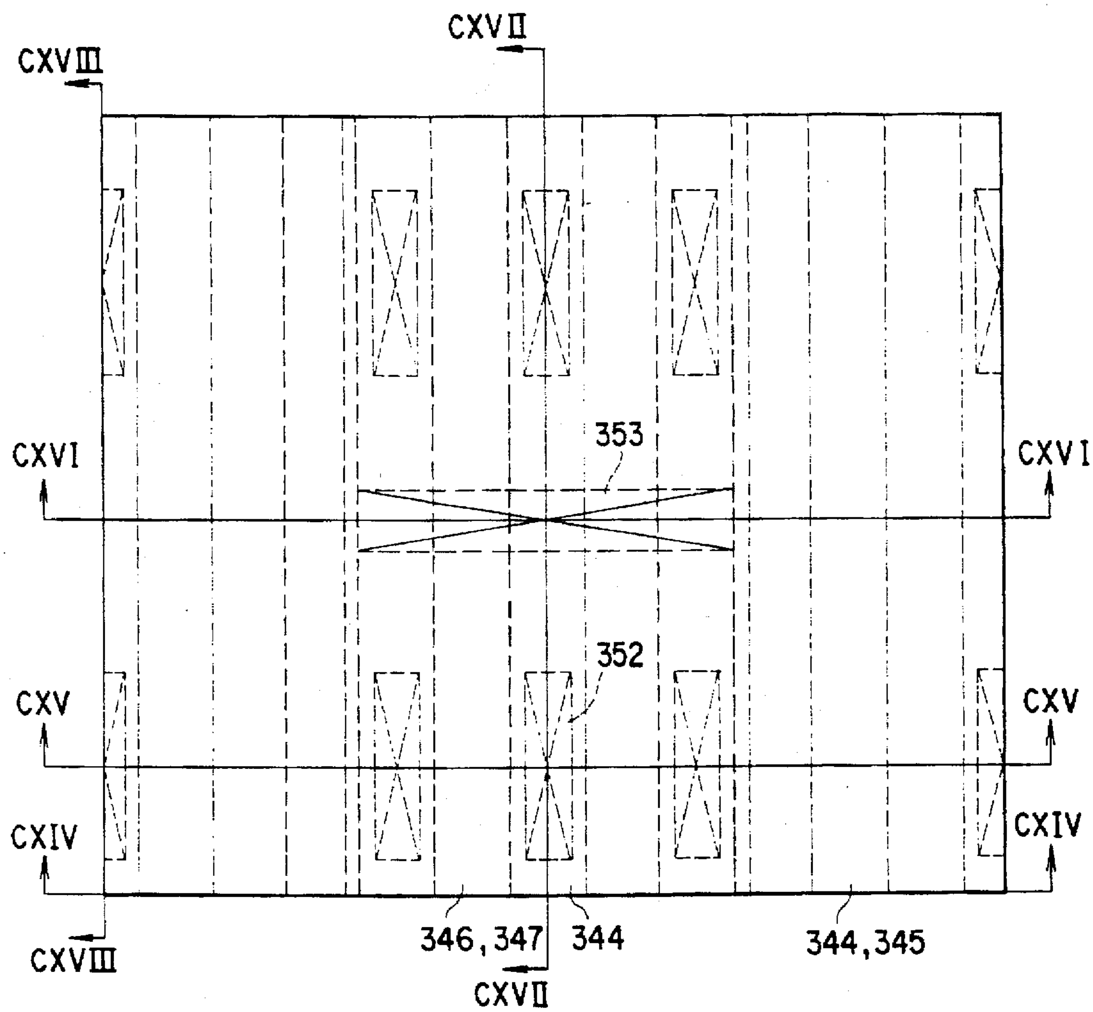
FIG. 113 is a plan view showing an insulated-gate semiconductor device in accordance with still another embodiment of the present invention.
Figure 116:
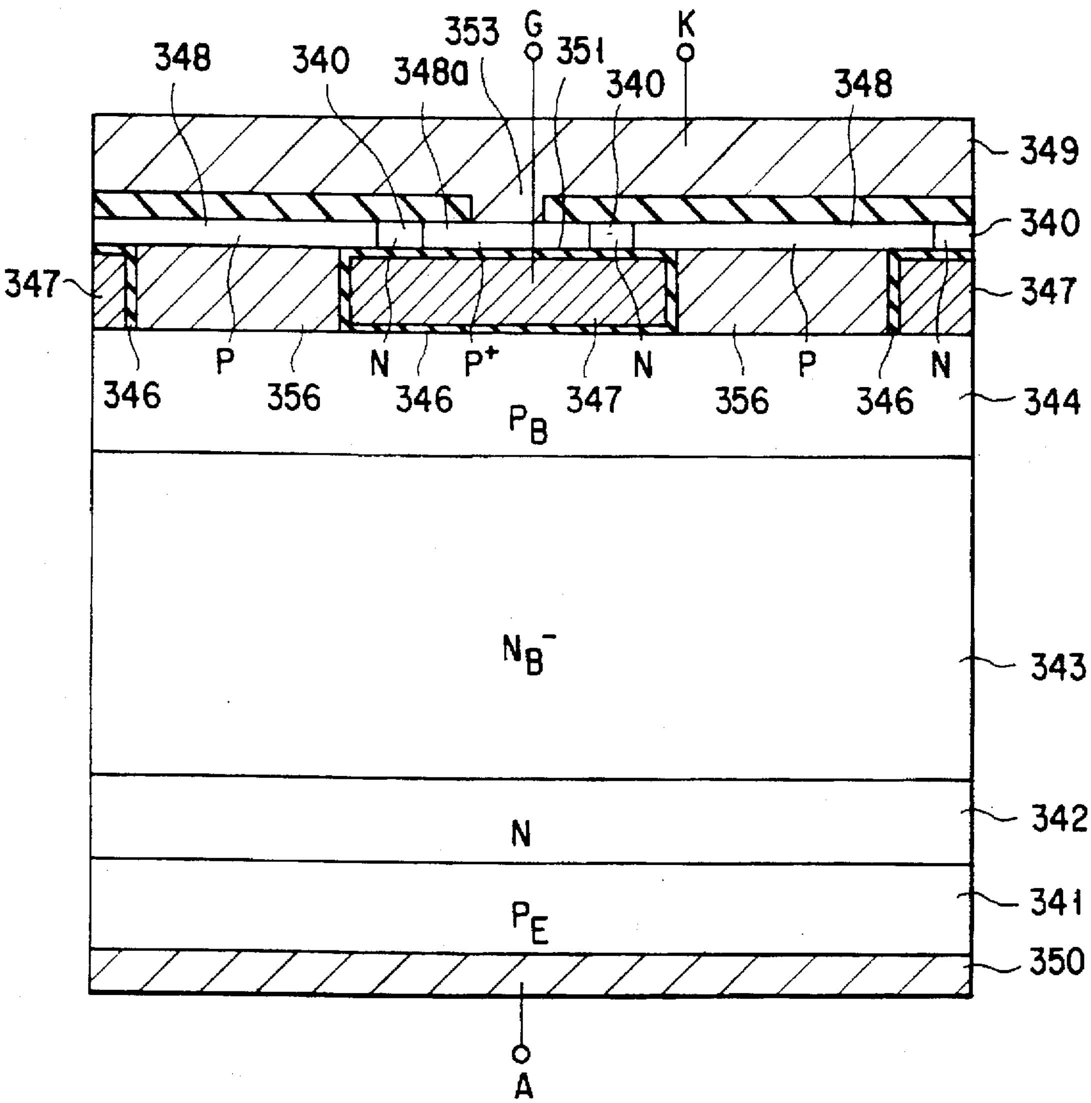

FIG. 113 is a plan view showing an insulated-gate semiconductor device in accordance with still another embodiment of the present invention, and FIGS. 114, 115, 116, 117, and 118 are cross-sectional views of the respective portions thereof.

Referring to FIGS. 113 to 118, reference numeral 341 denotes a P type emitter layer. An $N^-$ type base layer 343 is formed on the P type emitter layer 341 through an N type buffer layer 342, and a P type base layer 344 is formed on the surface of the $N^-$ type base layer 343. A plurality of trenches having a depth to reach into the $N^-$ type base layer 343 are formed in the P type base layer 344, and a gate electrode 347 is buried in each trench through a first gate insulation film 346.

An $N^+$ type source layer 345 is selectively formed in the surface of the P type base layer 344 so as to contact the side wall of the trench. A first MOS transistor is constituted by the $N^+$ type source layer 345, the P type base layer 344, the $N^-$ type base layer 343, the first gate insulation film 346, and the gate electrode 347.

A P type polysilicon layer 348 is provided on the gate electrode 347 through a second gate insulation film 351, and selectively contacts the P type base layer 344 through a first contact hole 352.

An N type polysilicon layer 340 reaching the second gate insulation film 351 is selectively formed from the surface of the P type polysilicon layer 348. The P type polysilicon layer 348 is divided into a P type polysilicon layer 348*a* contacting a cathode electrode 349 through a second contact hole 353, and a portion wherein the P type polysilicon layer 348 does not contact the cathode electrode 349, but the P type base layer 344. A second MOSFET for discharging the holes outside the device upon turn-off operation is constituted by the P type polysilicon layers 348 and 348*a*, the N type polysilicon layer 340, the gate electrode 347, and the second gate insulation film 351.

The cathode electrode 349 contacts the $N^+$ type source layer 345 in addition to the P type polysilicon layer 348*a*. An anode electrode 350 is provided on the p type emitter layer 341. Referring to the drawings, reference numeral 356 denotes a contact portion between the P type polysilicon layer 348 and the P type base layer 344, and the material thereof is desirably metal, e.g., Al, W, or Ti, to realize a low resistance.

In accordance with the insulated-gate semiconductor device of this embodiment, since the first MOS transistor and the second MOS transistor share the common gate electrode 347, the structure can be simplified.

Figure 121:
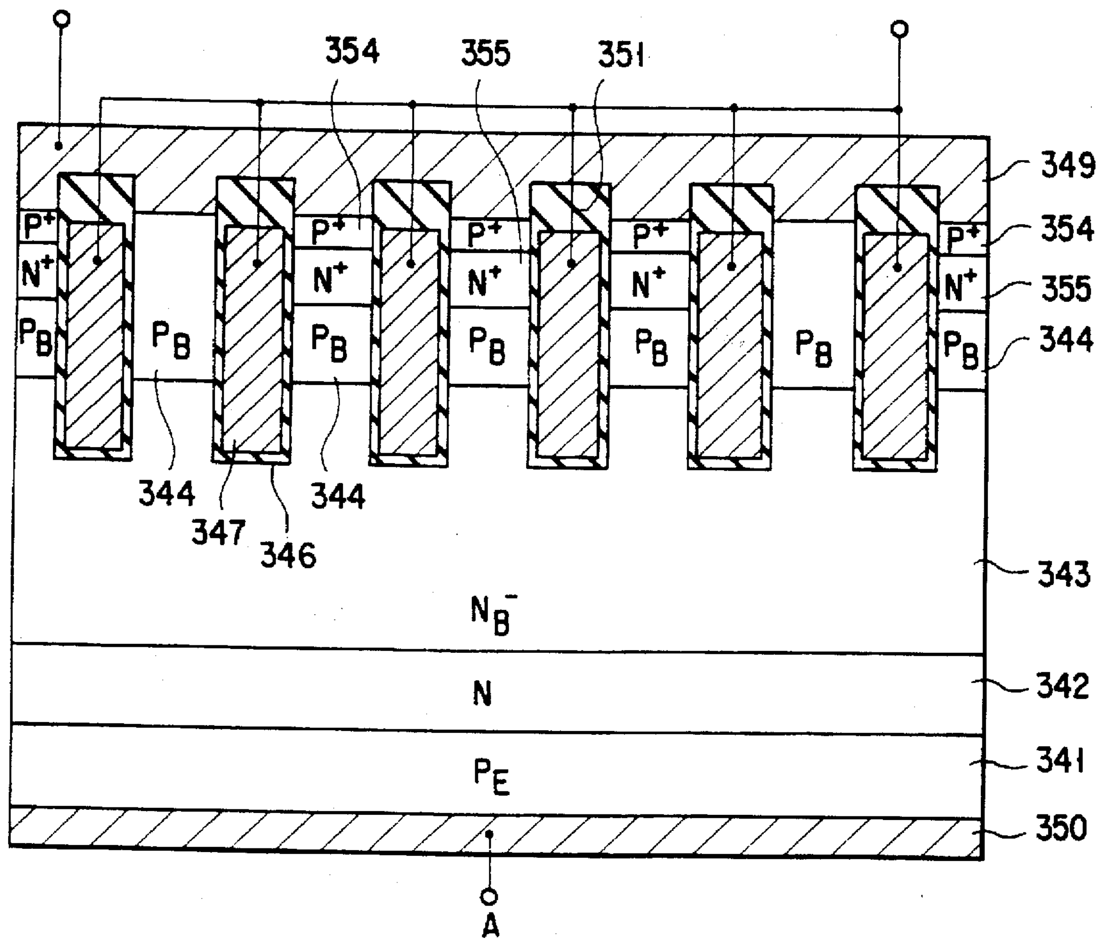

FIG. 119 is a plan view showing an insulated-gate semiconductor device in accordance with still another embodiment of the present invention, and FIGS. 120 to 122 are cross-sectional views showing the respective portions thereof.

This embodiment is the same as that in FIG. 113 except that a second MOS transistor is formed in the side portion of a gate electrode 347.

More specifically, an $N^+$ type diffusion layer 355 and a $P^+$ type diffusion layer 354 are formed in a P type base layer 344, and the second MOS transistor is constituted by the above layers, and a gate insulation film 346 and a gate electrode 347. The plurality of second MOS transistors are formed between trenches. The respective second MOS transistors are connected to a common gate electrode.

The second MOS transistor is under the OFF-state upon turn-on operation not to electrically connect the P type base layer 344 and a cathode electrode 349, thereby obtaining the same effect as that using a trench having a large width.

In the embodiments shown in FIGS. 113 and 119, a monocrystalline silicon film may be used instead of a polysilicon film, or a semiconductor other than silicon may also be used.

Figure 123A:
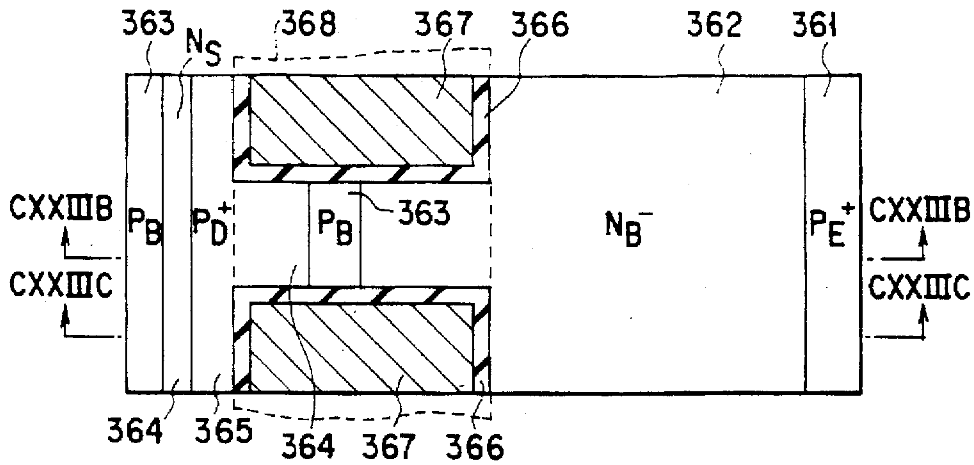
FIG. 123A is a plan view showing an insulated-gate semiconductor device in accordance with still another embodiment of the present invention.
Figure 123B:
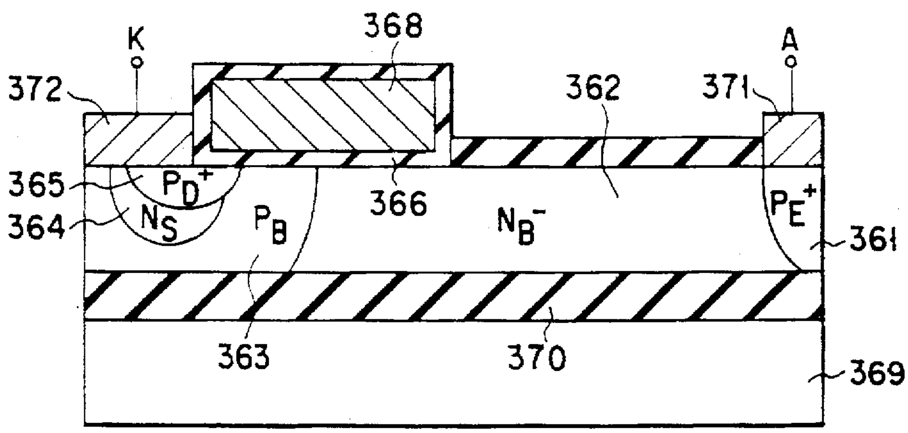
FIGS. 123B and 123C are cross-sectional views along lines CXXIIIB—CXXIIIB, and CXXIIIC—CXXIIIC of FIG. 123A, respectively.
Figure 123C:
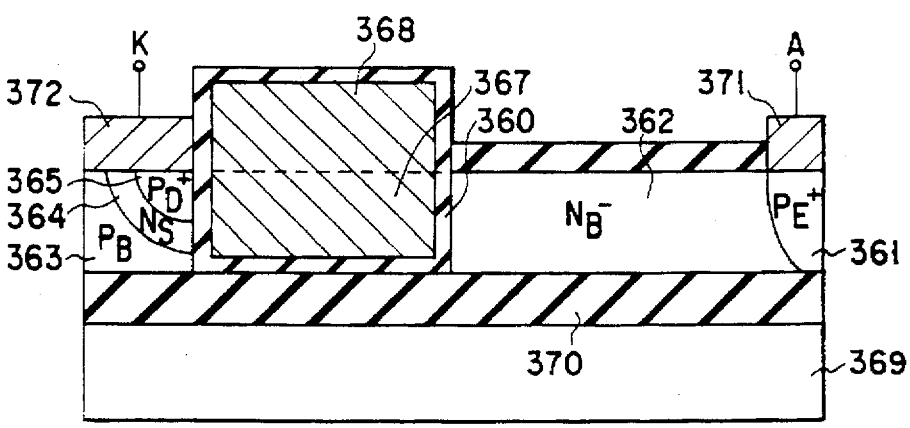

FIG. 123A is a plan view showing an insulated-gate semiconductor device in accordance with still another embodiment of the present invention, and FIGS. 123B and 123C are cross-sectional views showing each portion thereof.

This embodiment uses an SOI substrate. Referring to FIGS. 123A to 123C, reference numeral 369 denotes a silicon substrate. An insulated-gate semiconductor device to be described below is formed on the silicon substrate 369 through an insulation film 370.

A $P^+$ type emitter layer 361 and a P type base layer 363, both of which reach the insulation film 370, are selectively formed from the surface of an $N^-$ type base layer 362. A plurality of trench-like grooves having a depth to reach the insulation film 370 are formed in the P type base layer 363, and a first gate electrode 367 is buried in each groove through a first gate insulation film 360.

An N type source layer 364 is selectively formed in the surface of the P type base layer 363 so as to contact the side surface of the groove. The N type source layer 364 constitutes a first MOS transistor, together with the P type base layer 363, the $N^-$ type base layer 362, the first gate insulation film 360, and the first gate electrode 367.

A $P^+$ type drain layer 365 is selectively formed from the surface of the P type base layer 363 to the surface of the N type source layer 364. A cathode electrode 372 is provided so as to contact the $P^+$ type drain layer 365, the N type source layer 364, and the P type base layer 363, and an anode electrode 371 is provided on the $P^+$ type emitter layer 361.

A second gate electrode 368 is formed on the P type base layer 363 and the $N^-$ type base layer 362 through a second gate insulation film 366. The second gate electrode 368 is electrically isolated from the anode electrode 371 and the cathode electrode 372, and also from the first gate electrode 367. In addition, the second gate electrode 368 constitutes a MOS gate for discharging the holes outside the device, together with the P type base layer 363, the $N^-$ type base layer 362, and the second gate insulation film 366.

In accordance with this embodiment, upon turn-off operation, a P channel can be formed in the surface of the $N^-$ type base layer 362 below the second gate electrode 368. Since the holes can be discharged outside the device by a path through the P channel, the P type base layer 363, the $P^+$ type drain layer 365, and the cathode electrode 372, i.e., not through the N type source layer 364, latch-up of a parasitic element constituted by the N type source layer 364 can be prevented and the breakdown voltage is increased. On the contrary, upon turn-on operation, an N channel can be formed in the surface of the p type base layer 363 and $P^+$ type drain layer 365.

FIG. 124A is a plan view showing an insulated-gate semiconductor device in accordance with still another embodiment of the present invention, and FIGS. 124B and 124C are cross-sectional views showing the respective portions thereof.

The insulated-gate semiconductor device of this embodiment is a modification of that in the previous embodiment, and is different therefrom in that the region of an N type source layer 364 is larger.

Figure 125A:
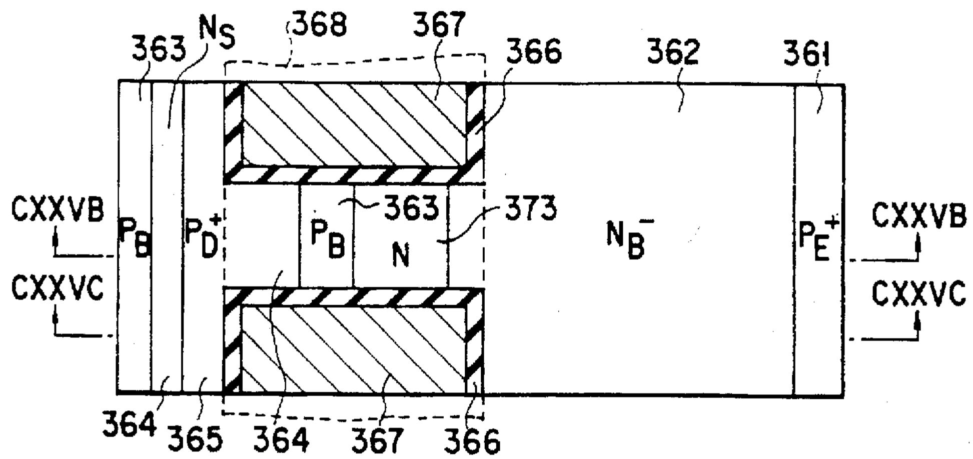
FIG. 125A is a plan view showing an insulated-gate semiconductor device in accordance with still another embodiment of the present invention.
Figure 125B:
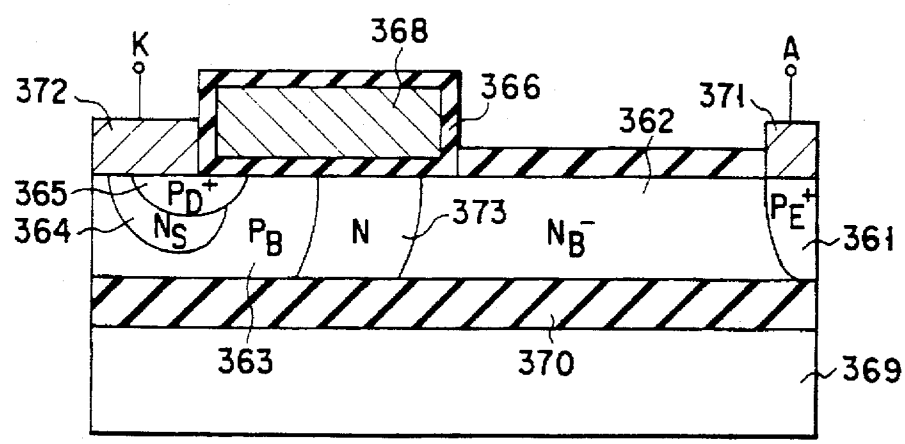
FIGS. 125B and 125C are cross-sectional views along lines CXXVB—CXXVB and CXXVC—CXXVC of FIG. 125A, respectively.
Figure 125C:
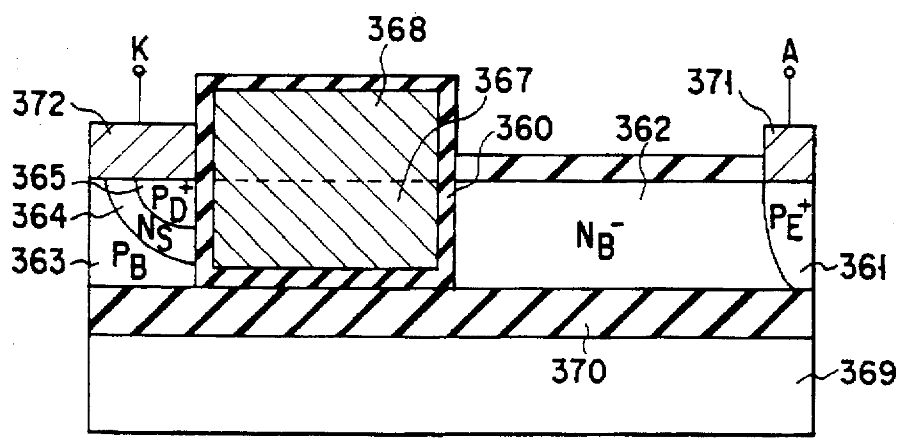

FIG. 125A is a plan view showing an insulated-gate semiconductor device in accordance with still another embodiment of the present invention, and FIGS. 125B and 125C are cross-sectional views showing the respective portions thereof.

The insulated-gate semiconductor device of this embodiment is the same as that in FIGS. 123A to 123C except that an N type diffusion layer 373 is provided in an $N^-$ type base layer 362.

In accordance with this embodiment, since a larger number of holes can be stored in the device, the turn-on characteristics can be improved.

Figure 126A:
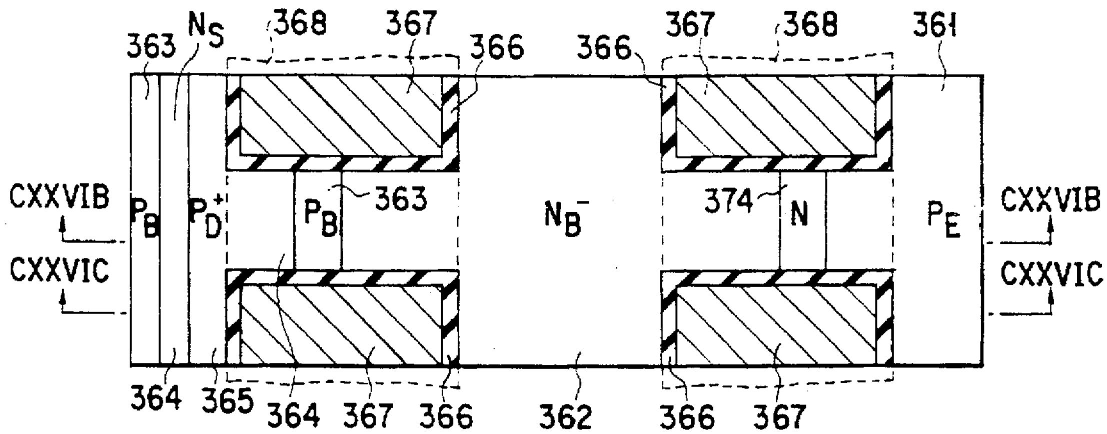
FIG. 126A is a plan view showing an insulated-gate semiconductor device in accordance with still another embodiment of the present invention.
Figure 126B:
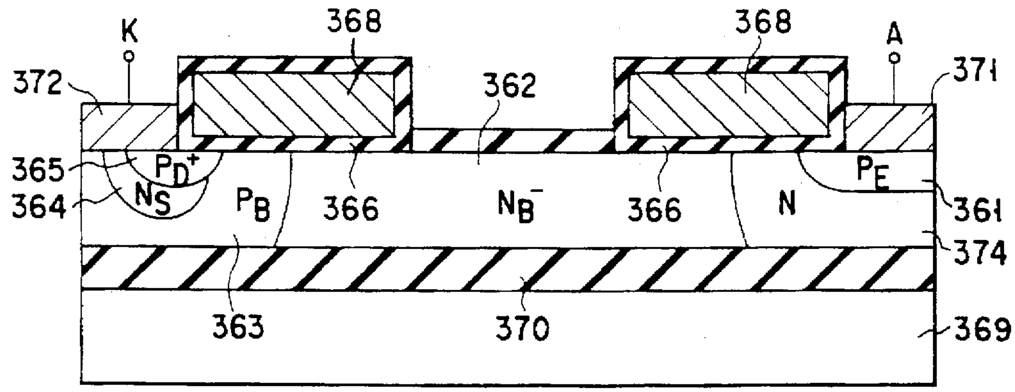
FIGS. 126B and 126C are cross-sectional views along lines CXXVIB—CXXVIB and CXXVIC—CXXVIC of FIG. 126A, respectively.
Figure 126C:
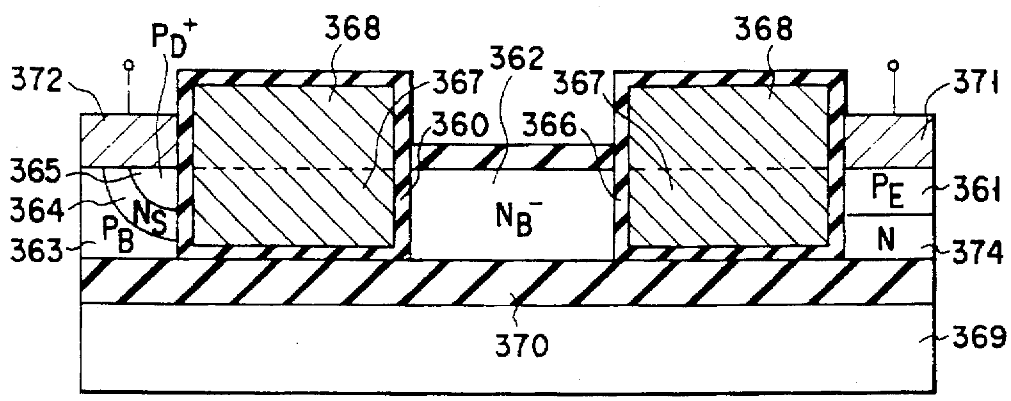

FIG. 126A is a plan view showing an insulated-gate semiconductor device in accordance with still another embodiment of the present invention, and FIGS. 126B and 126C are cross-sectional views showing the respective portions thereof.

The insulated-gate semiconductor device of this embodiment is the same as that in FIGS. 123A to 123C except that a plurality of trench-like grooves and MOS transistors similar to those on a cathode side are also provided on an anode side. Referring to FIGS. 126A to 126C, reference numeral 374 denotes an N type diffusion layer. Note that a P type base layer 363 may not reach an insulation film 370.

In accordance with this embodiment, upon turn-on operation, a P channel can be formed in the surface of the N type diffusion layer 374 and $N^-$ type base layer 362 below the gate electrode 368 on the anode side. On the contrary, upon turn-off operation, an N channel can be formed in the surface of the P type emitter layer 361.

In the embodiments shown in FIGS. 126A to 126AC, since the trench-like grooves are formed on both of the cathode and anode sides, the breakdown voltages of the device are increased in both of the forward and backward directions. Conventionally, a so-called PIN structure is adopted to increase the breakdown voltages in both the directions, where the distance between the anode and cathode sides is small.

Figure 127A:
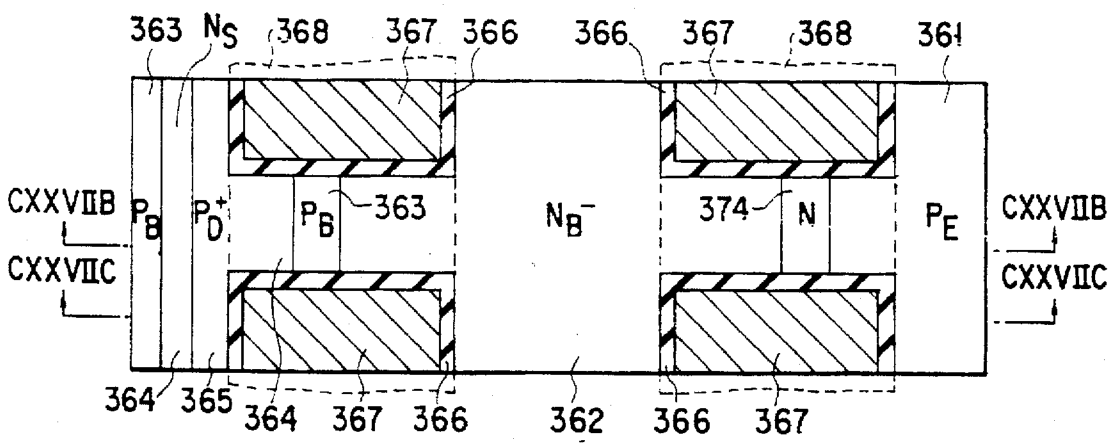
FIG. 127A is a plan view showing an insulated-gate semiconductor device in accordance with still another embodiment of the present invention.
Figure 127B:
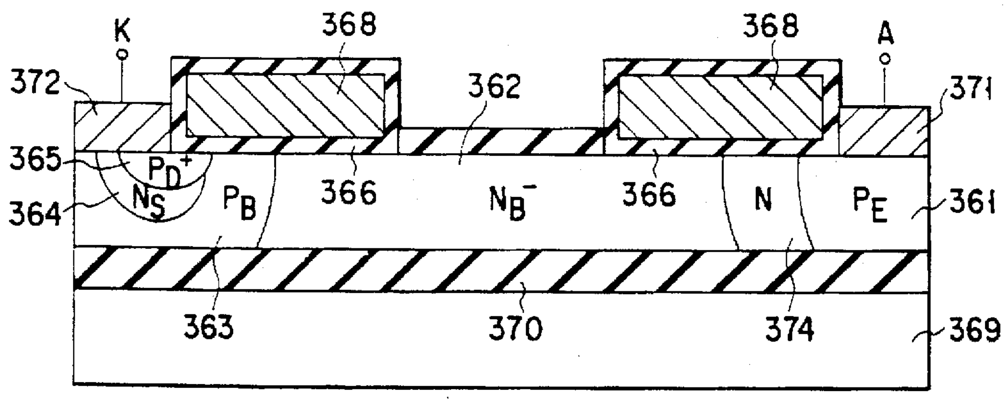
FIGS. 127B and 127C are cross-sectional views along lines CXXVIIB—CXXVIIB and CXXVIIC—CXXVIIC of FIG. 127A, respectively.
Figure 127C:
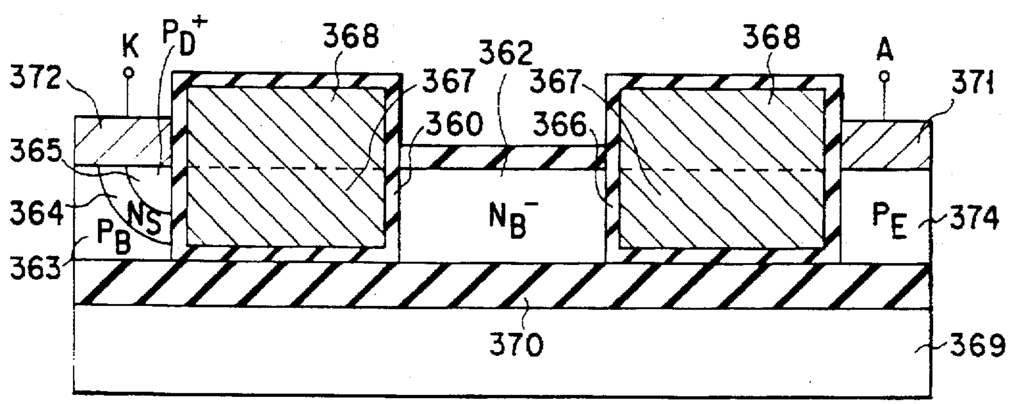

FIG. 127A is a plan view showing an insulated-gate semiconductor device in accordance with still another embodiment of the present invention, and FIGS. 127B and 127C are cross-sectional views showing each portion thereof.

The insulated-gate semiconductor device is a modification of that in the embodiment shown in FIGS. 126A to 126C, and is different therefrom in that a P type emitter layer 361 reaches an insulation film 370. That is, this embodiment exemplifies a case that an $N^-$ type base layer 362 is thin (0.01 to 100 μm). Note that a P type base layer 363 may not reach the insulation film 370.

Figure 128A:
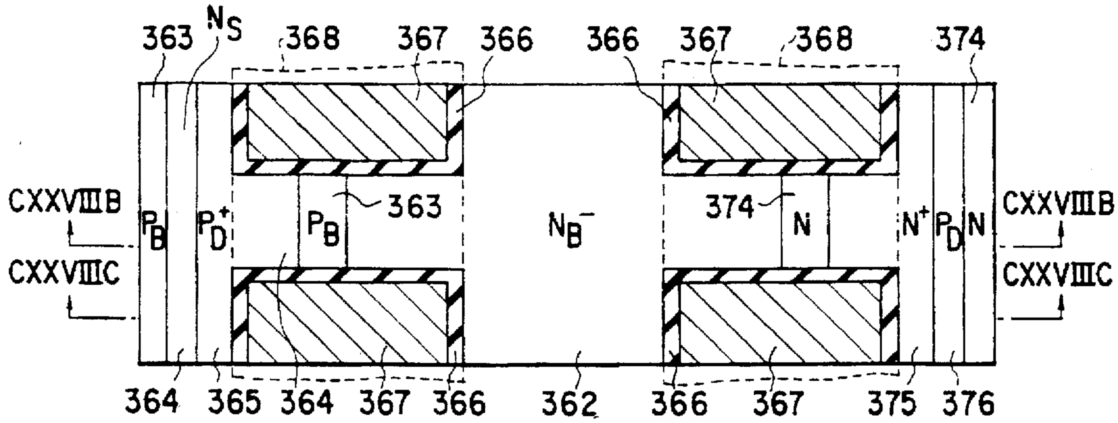
FIG. 128A is a plan view showing an insulated-gate semiconductor device in accordance with still another embodiment of the present invention.
Figure 128B:
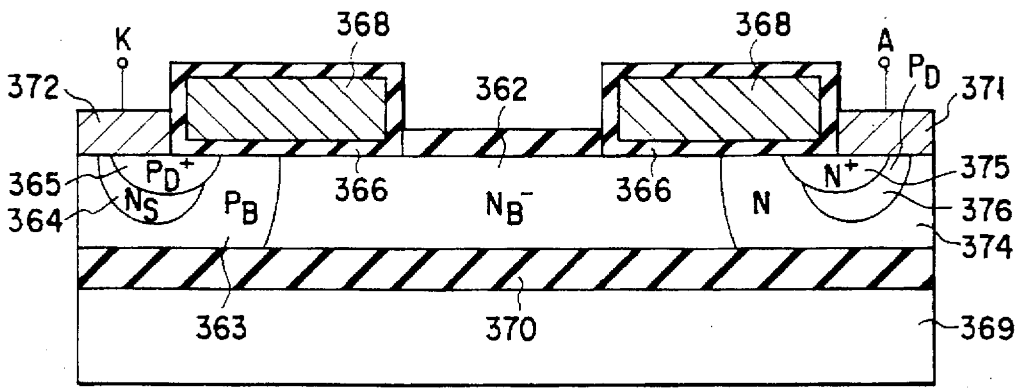
FIGS. 128B and 128C are cross-sectional views along lines CXXVIIIB—CXXVIIIB and CXXVIIIC—CXXVIIIC of FIG. 128A, respectively.
Figure 128C:
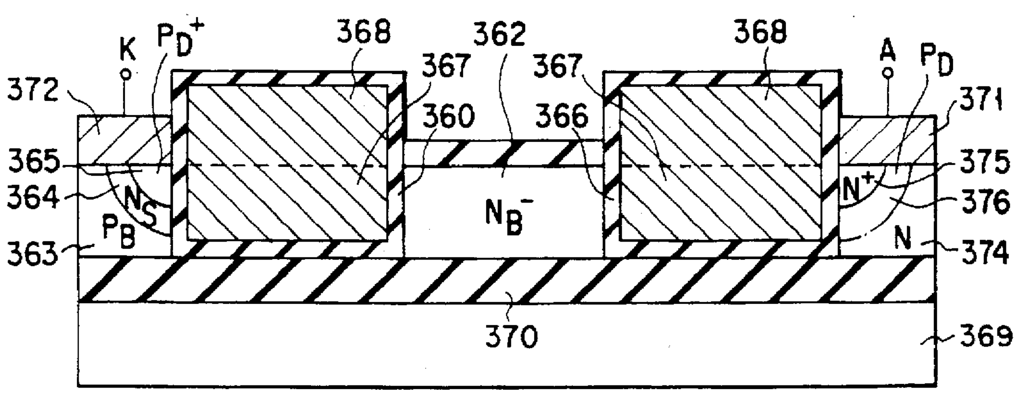

FIG. 128A is a plan view showing an insulated-gate semiconductor device in accordance with still another embodiment of the present invention, and FIGS. 128B and 128C are cross-sectional views showing the respective portions thereof.

The insulated-gate semiconductor device of this embodiment is the same as that in FIGS. 126A to 126C except that an $N^+$ type diffusion layer 375 and a P type drain layer 376 are provided in an N type diffusion layer 374. That is, a mechanism similar to the hole discharge mechanism at the cathode side is also provided to an anode side.

Figure 129A:
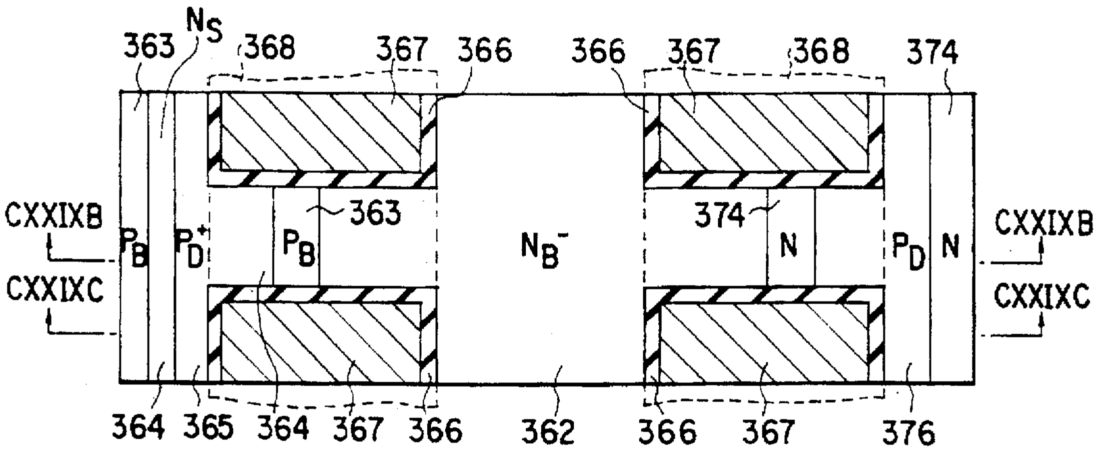
FIG. 129A is a plan view showing an insulated-gate semiconductor device in accordance with still another embodiment of the present invention.
Figure 129B:
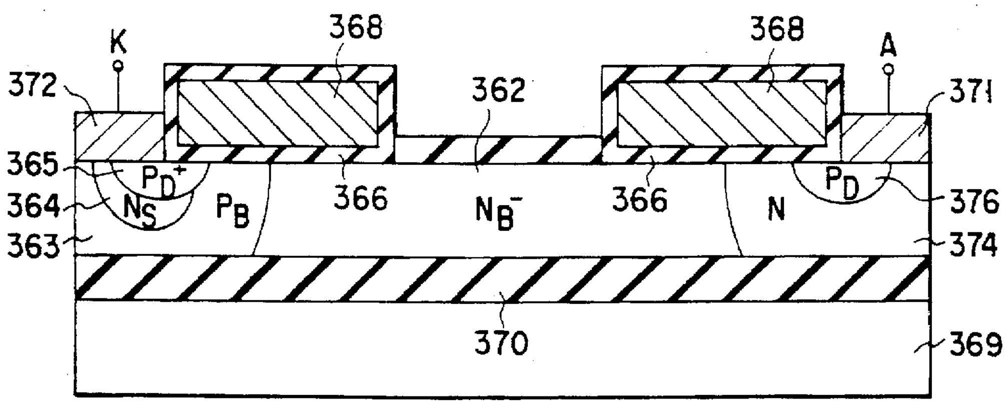
FIGS. 129B and 129C are cross-sectional views along lines CXXIXB—CXXIXB and CXXIXC—CXXIXC of FIG. 129A, respectively.
Figure 129C:
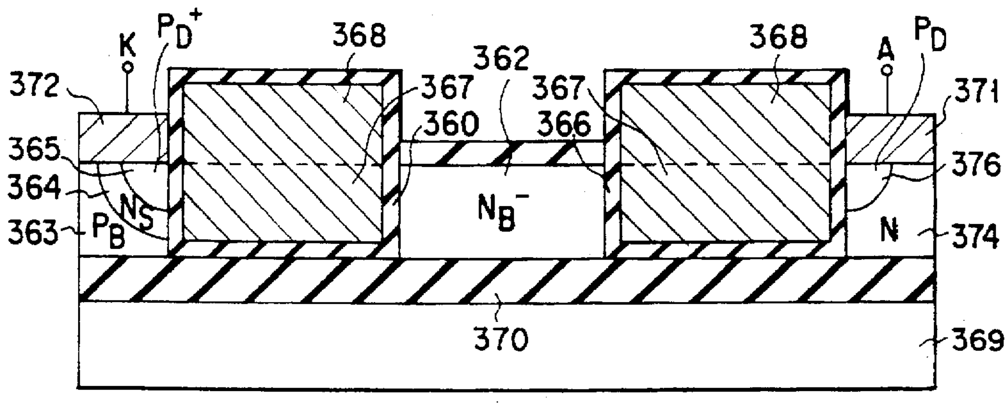

FIG. 129A is a plan view showing an insulated-gate semiconductor device in accordance with still another embodiment of the present invention, and FIGS. 129B and 129C are cross-sectional views showing the respective portions thereof.

The insulated-gate semiconductor device of this embodiment is a modification of that in FIGS. 128A to 128C, and is different therefrom in structure wherein an $N^+$ type diffusion layer 375 is omitted.

Figure 130A:
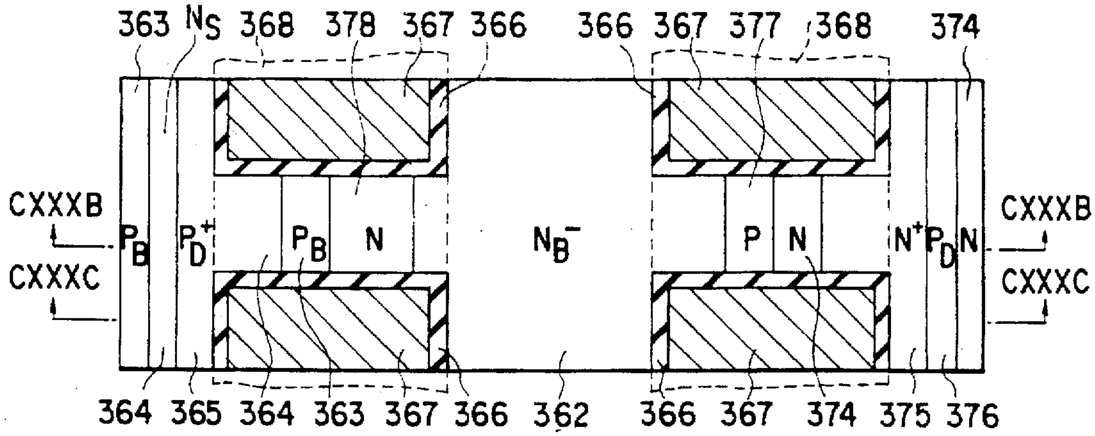
FIG. 130A is a plan view showing an insulated-gate semiconductor device in accordance with still another embodiment of the present invention.
Figure 130B:
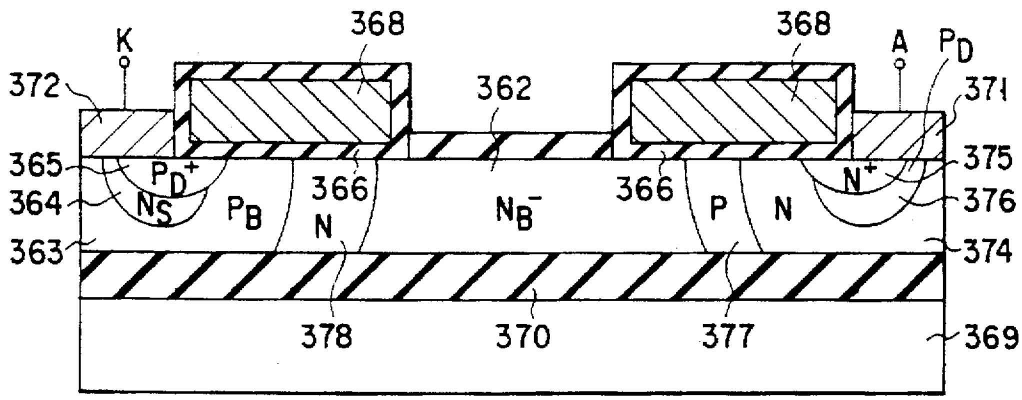
FIGS. 130B and 130C are cross-sectional views along lines CXXXB—CXXXB and CXXXC—CXXXC of FIG. 130A, respectively.
Figure 130C:
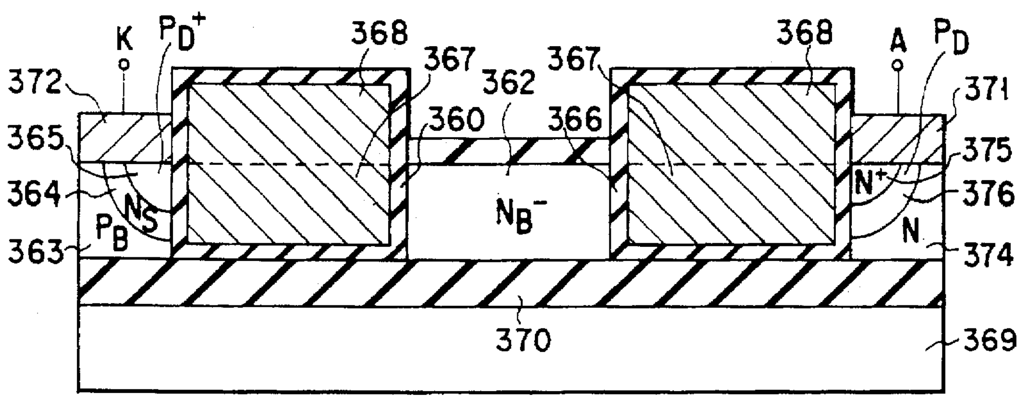

FIG. 130A is a plan view showing an insulated-gate semiconductor device in accordance with still another embodiment of the present invention, and FIGS. 130B and 130C are cross-sectional views showing the respective portions thereof.

The insulated-gate semiconductor device of this embodiment is the same as that in FIGS. 128A to 128C except that a P type diffusion layer 377 is provided in an $N^-$ type base layer 362 at an anode side, and an N type diffusion layer 378 is provided in the $N^-$ type base layer 362 at a cathode side.

In accordance with this embodiment, since the storage amount of carriers (holes and electrons) can be increased upon turn-on operation, the turn-on characteristics can be improved. Note that any one of the P type diffusion layer 377 and the N type diffusion layer 378 may be provided.

Figure 131A:
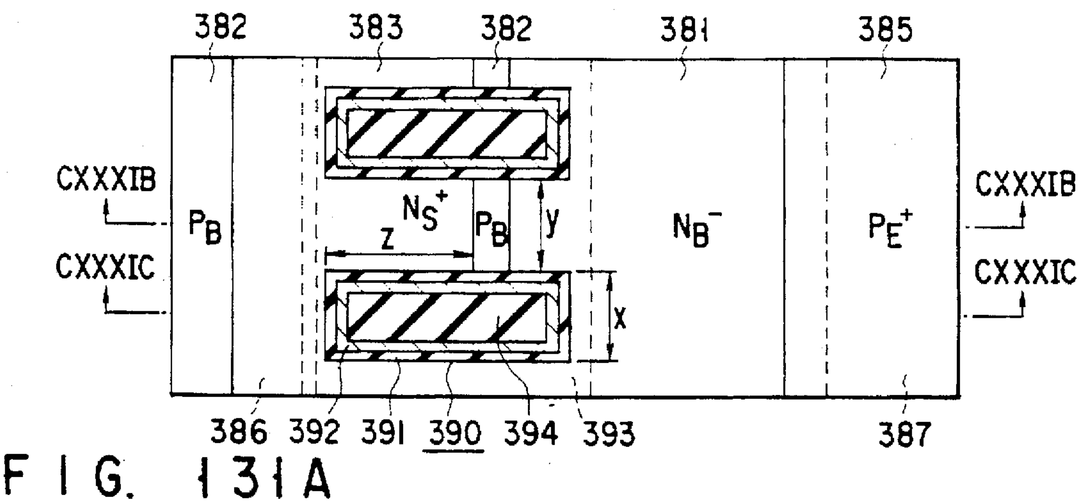
FIG. 131A is a plan view showing an insulated-gate semiconductor device in accordance with still another embodiment of the present invention.
Figure 131B:
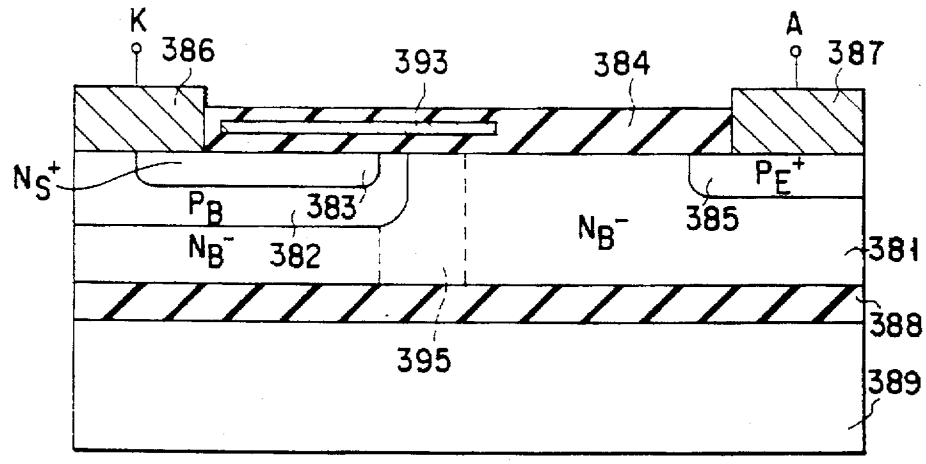
FIGS. 131B and 131C are cross-sectional views along lines CXXXIB—CXXXIB and CXXXIC—CXXXIC of FIG. 131A, respectively.
Figure 131C:
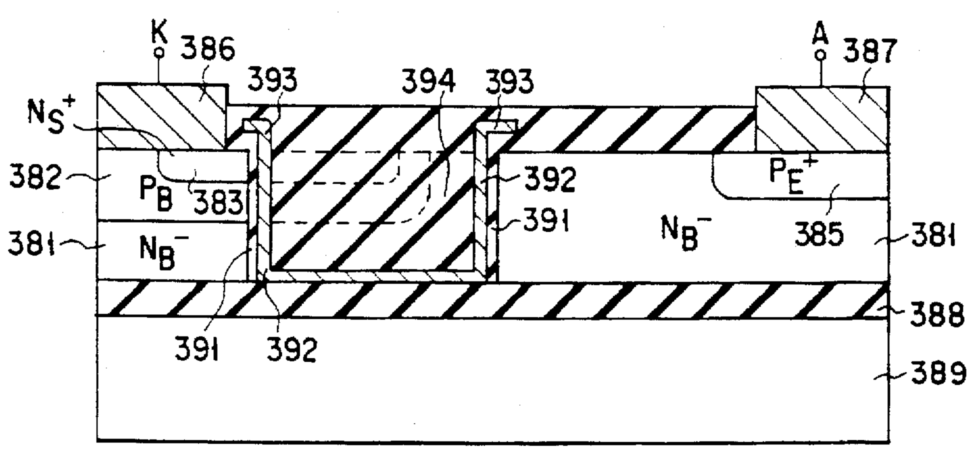

FIG. 131A is a plan view showing an insulated-gate semiconductor device in accordance with still another embodiment of the present invention, and FIGS. 131B and 131C are cross-sectional views showing the respective portions thereof.

This embodiment uses an SOI substrate. Referring to FIGS. 131A to 131C, reference numeral 389 denotes a silicon substrate. An insulated-gate semiconductor device to be described below is formed on the silicon substrate 389 through an insulation film 388.

An $N^-$ type base layer 381 is formed on the insulation film 388, and a P type base layer 382 and a $P^+$ type emitter layer 385 are selectively formed in the surface of the $N^-$ type base layer 381. An N type source layer 383 is selectively formed in the surface of the P type base layer 382. A plurality of trenches 390 reaching the insulation film 388 and having a width x are formed in the N type source layer 383, the P type base layer 382, and the $N^-$ type base layer 381 at intervals y.

A gate electrode 392 is formed in each trench 390 through a gate insulation film 391. An electrode 393 contacting the gate electrode 392 is provided outside the trench 390. The electrode 393 is insulated from a cathode electrode 386 and an anode electrode 387 through an insulation film 384.

The electrode 393 is formed integrally with the gate electrode 392 using, e.g., polysilicon having a low resistance by being doped with an impurity. Alternately, the gate electrode 392 and the electrode 393 are independently formed to be connected with each other using a metal, e.g., Al, or a silicide. An empty region 394 of the trench 390 is filled with, e.g., an insulator.

In the insulated-gate semiconductor device with such a structure, when a positive voltage is applied to the gate electrode 392 to turn on the device, the holes flow by diffusion in a portion 395 sandwiched between the trenches 390 of the $N^-$ type base layer 381 so that the discharge rate of holes becomes lowered, as in other insulated-gate semiconductor devices. In addition, the path of the hole current becomes narrow by the trenches 390, which causes a decrease in discharge rate of holes. In this manner, the storage number of holes in the device increases.

Furthermore, in this embodiment, since the trench 390 is formed to include the N type source layer 383, the N type source layer 383 extends into a region sandwiched between the trenches by a length z. As a result, an N type channel is formed at the long side of the trench 390 to increase a channel width. In other words, the channel width, which is 2x in a conventional structure, increases to 2x+2z. Still further, the channel width per unit area can increase in comparison with that of a conventional IGBT by properly selecting the values x, y, and z. Therefore, the injection of electrons from the N type source layer 383 to the $N^-$ type base layer 381 can be increased, thereby further decreasing the on-resistance.

In accordance with this embodiment, the carrier storage amount in the device under the $ON^-$ state can be as large as in a thyristor even if a PNPN thyristor is not latched up. In addition, since the PNPN thyristor of the device is not latched up under the $ON^-$state, the maximum cutoff current density can be increased.

Note that, in this embodiment, the $N^-$ type base layer 381 has a high resistance. When the $N^-$ type base layer 381 is thin, however, the resistance may not be high. In this embodiment, the shape of the trench 390 is rectangular, but it may be any other shape.

Figure 132A:
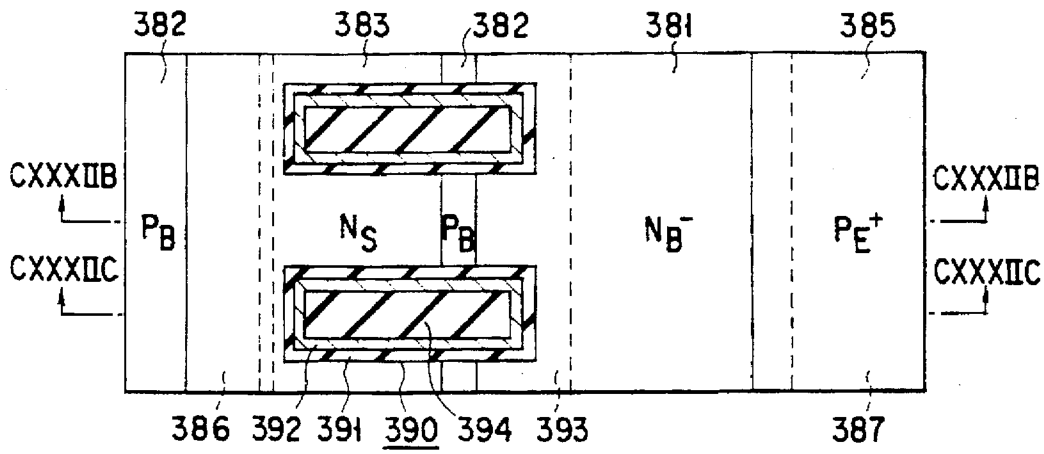
FIG. 132A is a plan view showing an insulated-gate semiconductor device in accordance with still another embodiment of the present invention.
Figure 132B:
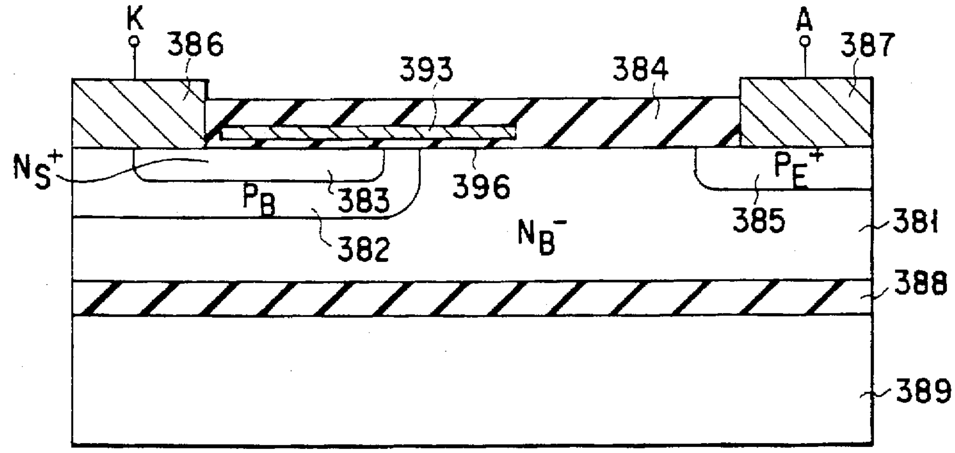
FIGS. 132B and 132C are cross-sectional views along lines CXXXIIB—CXXXIIB and CXXXIIC—CXXXIIC of FIG. 132A, respectively.
Figure 132C:
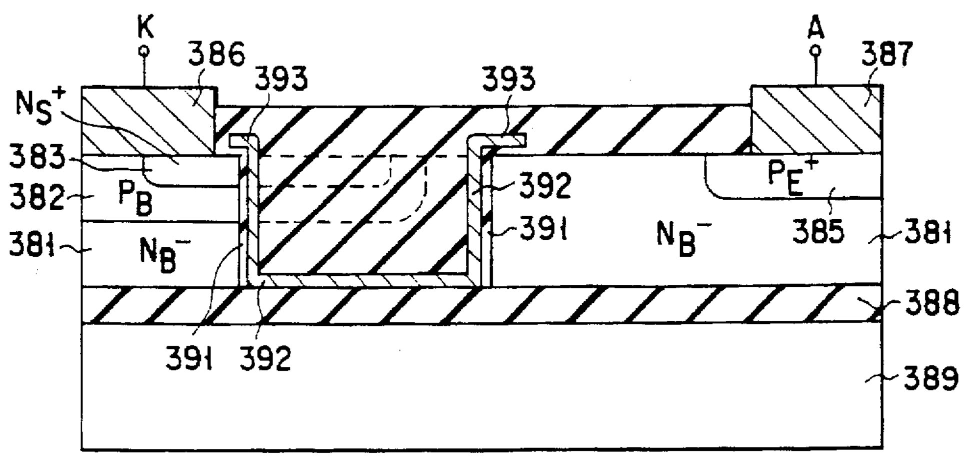

FIG. 132A is a plan view showing an insulated-gate semiconductor device in accordance with still another embodiment of the present invention, and FIGS. 132B and 132C are cross-sectional views showing the respective portions thereof.

The insulated-gate semiconductor device of this embodiment is the same as that in FIGS. 131A to 131C except that an insulation film 384 under an electrode 393 is thin. For this reason, a portion, of the electrode 393, which contacts a gate insulation film 391 on the surface of a P type base layer 382 functions as a gate electrode so that the gate width becomes larger. Therefore, a higher electron injection efficiency and a larger carrier storage amount can be obtained to decrease the on-resistance.

Figure 133A:
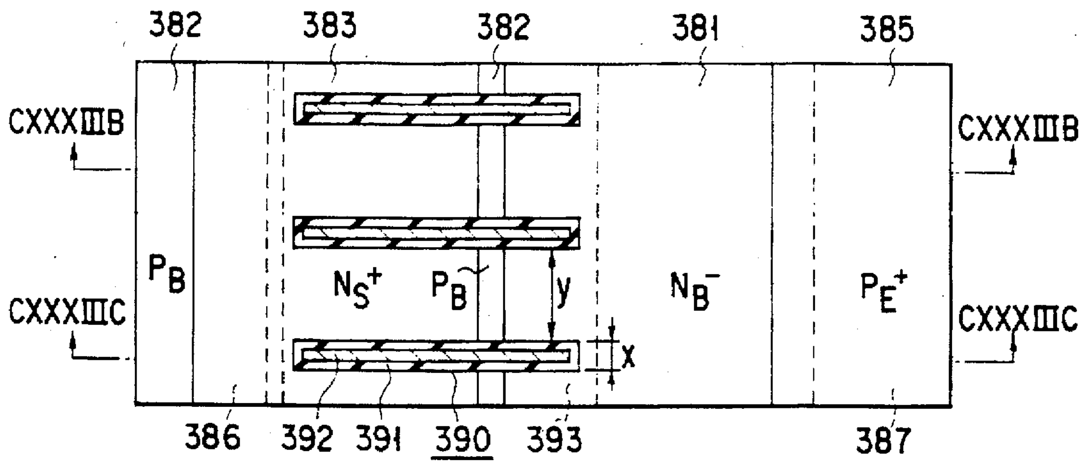
FIG. 133A is a plan view showing an insulated-gate semiconductor device in accordance with still another embodiment of the present invention.
Figure 133B:
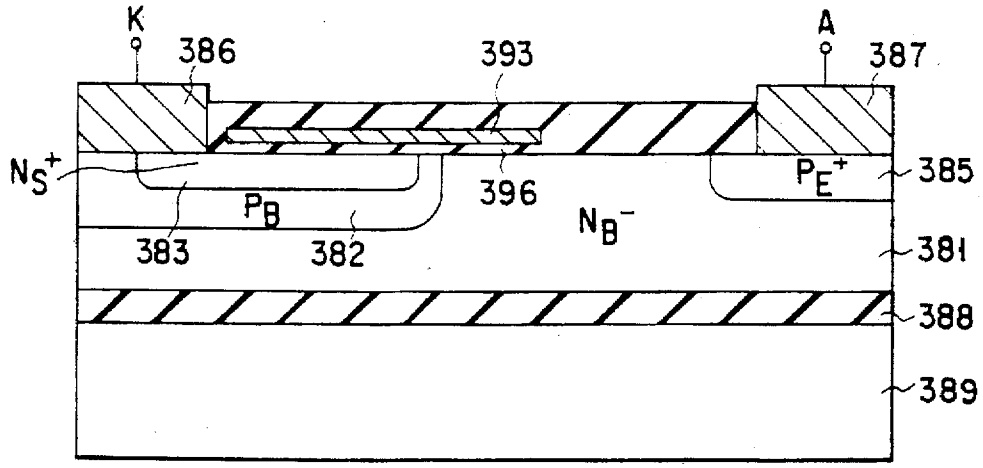
FIGS. 133B and 133C are cross-sectional views along lines CXXXIIIB—CXXXIIIB and CXXXIIIC—CXXXIIIC of FIG. 133A, respectively.
Figure 133C:
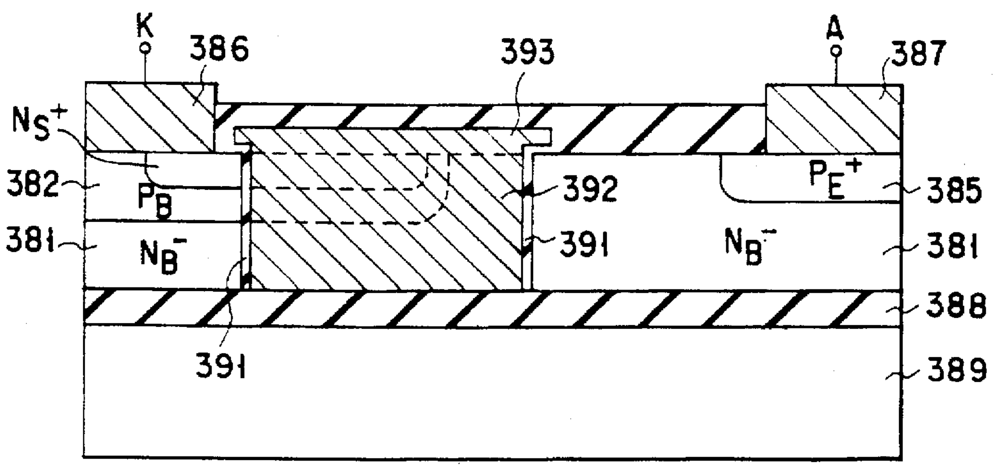

FIG. 133A is a plan view showing an insulated-gate semiconductor device in accordance with still another embodiment of the present invention, and FIGS. 133B and 133C are cross-sectional views showing the respective portions thereof.

The insulated-gate semiconductor device of this embodiment is the same as that in FIGS. 132A to 132C except that the width x of a trench 390 is made small, and an empty region of the trench 390 is left empty without burying an insulator. That is, only a gate electrode 392 is buried inside a gate insulation film 391.

In accordance with this embodiment, since the number of trenches per unit area can be increased, the total channel width per unit area becomes larger. Therefore, a higher electron injection efficiency and a larger carrier storage amount can be obtained to decrease the on-resistance.

Figure 134A:
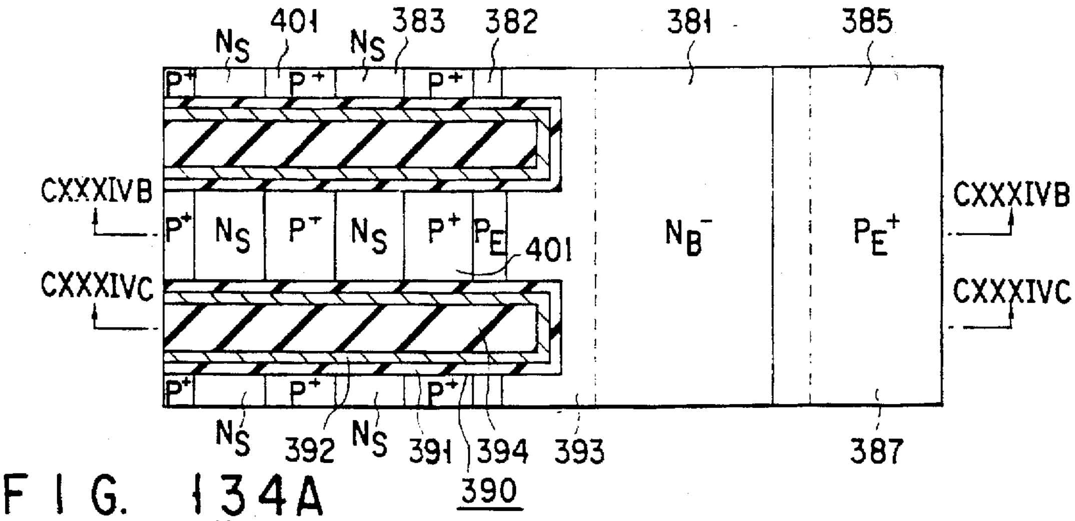
FIG. 134A is a plan view showing an insulated-gate semiconductor device in accordance with still another embodiment of the present invention.
Figure 134B:
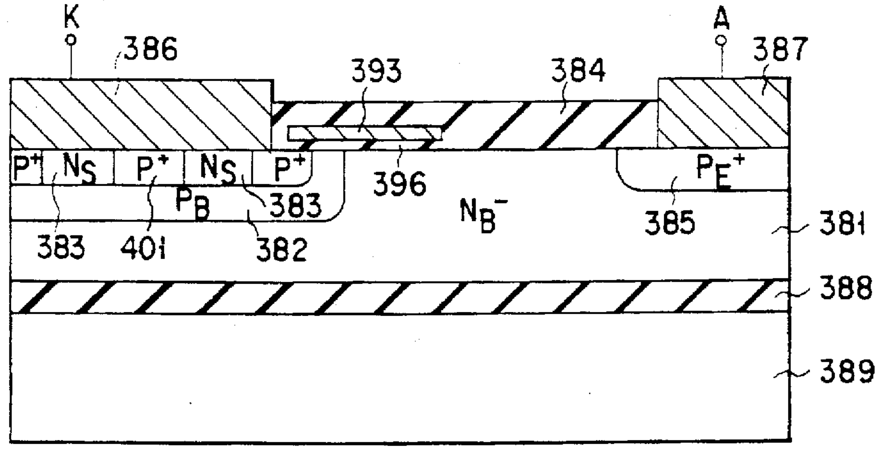
FIGS. 134B and 134C are cross-sectional views along lines CXXXIVB—CXXXIVB, and CXXXIVC—CXXXIVC of FIG. 134A, respectively.
Figure 134C:
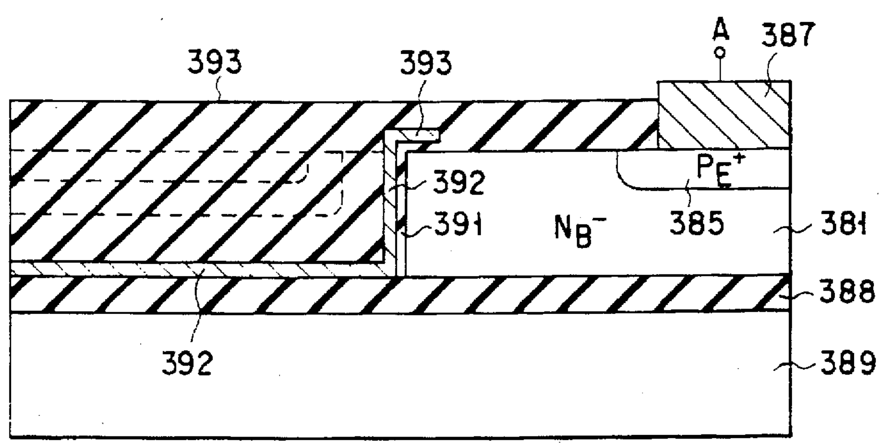

FIG. 134A is a plan view showing an insulated-gate semiconductor device in accordance with still another embodiment of the present invention, and FIGS. 134B and 134C are cross-sectional views showing the respective portions thereof.

The feature of this embodiment lies in that a trench 390 is elongated in a lateral direction in the FIGS. 134A to 134C to obtain a larger injection amount from the side wall of a trench gate to a channel. Therefore, the electron injection efficiency can be decreased. In addition, a $P^+$ type diffusion layer 401 is provided in an N type source layer 383 to form a PN structure, thereby increasing a latch-up breakdown voltage.

Figure 135A:
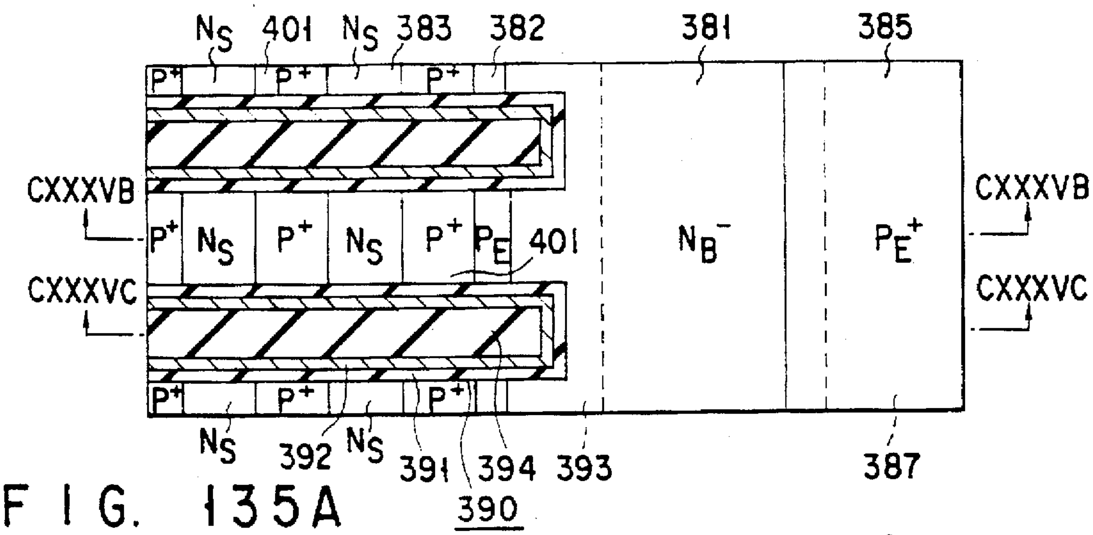
FIG. 135A is a plan view showing an insulated-gate semiconductor device in accordance with still another embodiment of the present invention.
Figure 135B:
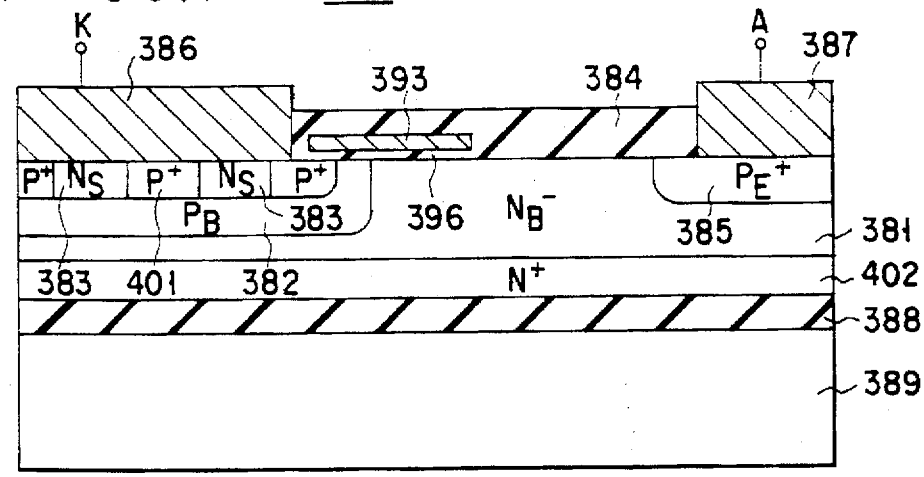
FIGS. 135B and 135C are cross-sectional views along lines CXXXVB—CXXXVB and CXXXVC—CXXXVC of FIG. 135A, respectively.
Figure 135C:
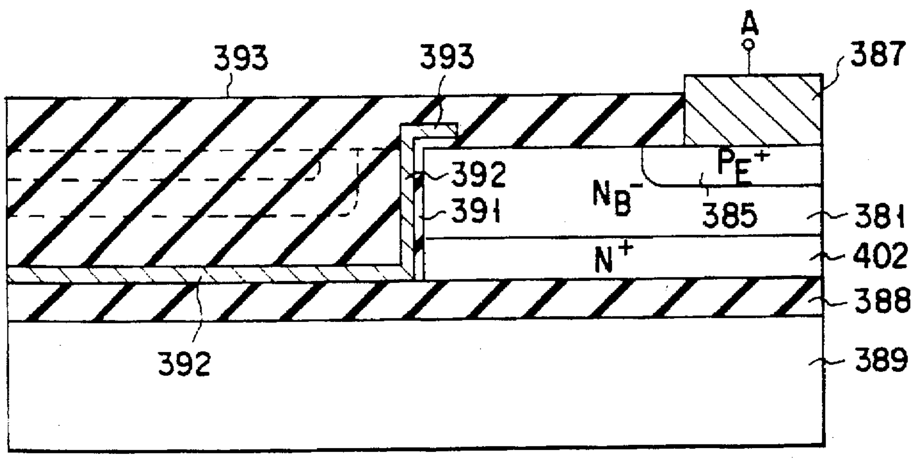

FIG. 135A is a plan view showing an insulated-gate semiconductor device in accordance with still another embodiment of the present invention, and FIGS. 135B and 135C are cross-sectional views showing the respective portions thereof.

The insulated-gate semiconductor device of this embodiment is the same as that in FIGS. 134A to 134C except that an $N^-$ type buffer layer 402 is provided between an insulation film 388 and an $N^-$ type base layer 381. The electrons injected from an N type source layer 383 can easily diffuse to the $N^+$ type base layer 381 due to the $N^+$ type buffer layer 402, thereby further decreasing the on-resistance of the device.

Figure 136A:
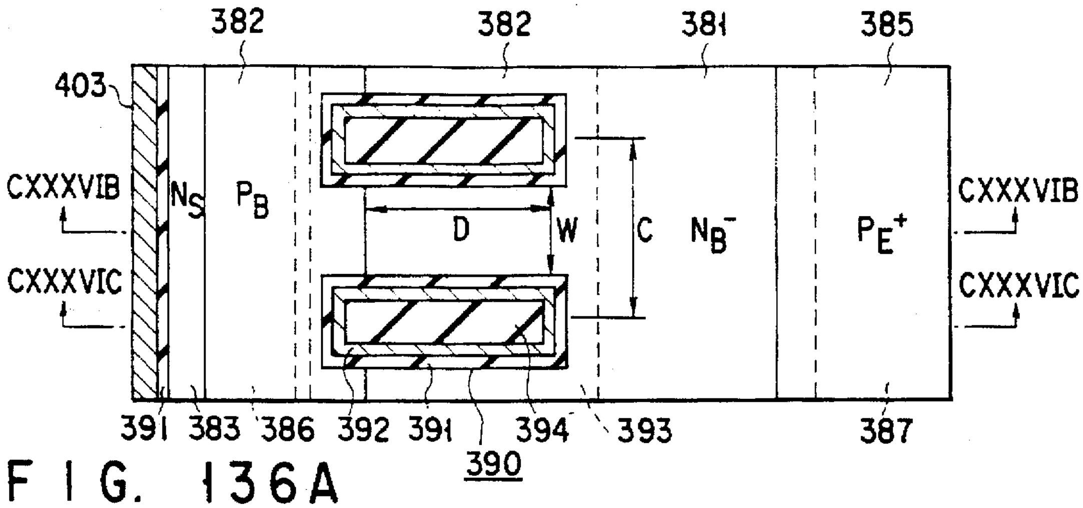
FIG. 136A is a plan view showing an insulated-gate semiconductor device in accordance with still another embodiment of the present invention.
Figure 136B:
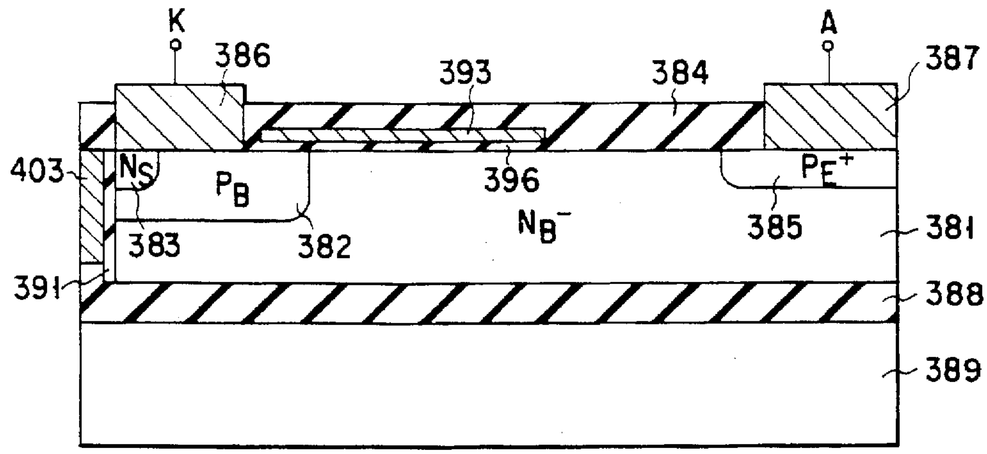
FIGS. 136B and 136C are cross-sectional views along lines CXXXVIB—CXXXVIB and CXXXVIC—CXXXVIC of FIG. 136A, respectively.
Figure 136C:
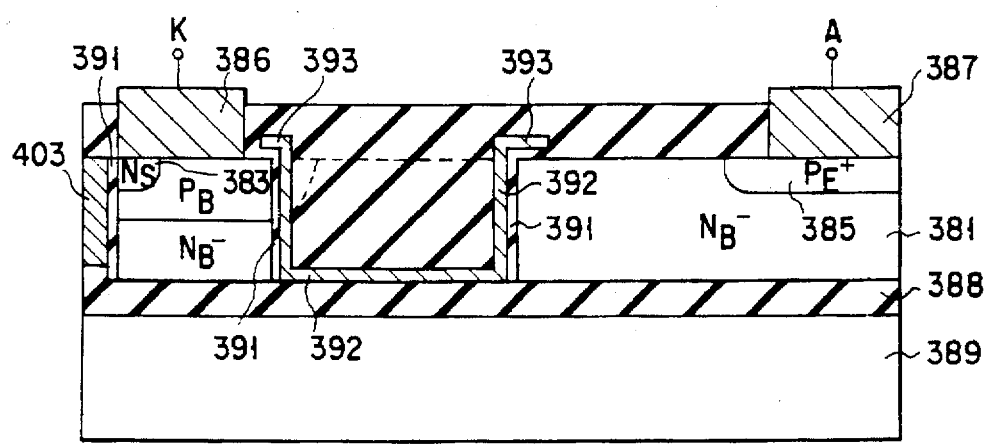

FIG. 136A is a plan view showing an insulated-gate semiconductor device in accordance with still another embodiment of the present invention, and FIGS. 136B and 136C are cross-sectional views showing the respective portions thereof.

The feature of this embodiment lies in that a MOS channel for electron injection is provided at a place different from a trench, serving as the resistance to holes which are discharged from an $N^-$ type base layer 381 to a cathode electrode 386, for improving the injection efficiency. The MOS channel is constituted by a vertical-type MOSFET constituted by a gate electrode 403.

Figure 137A:
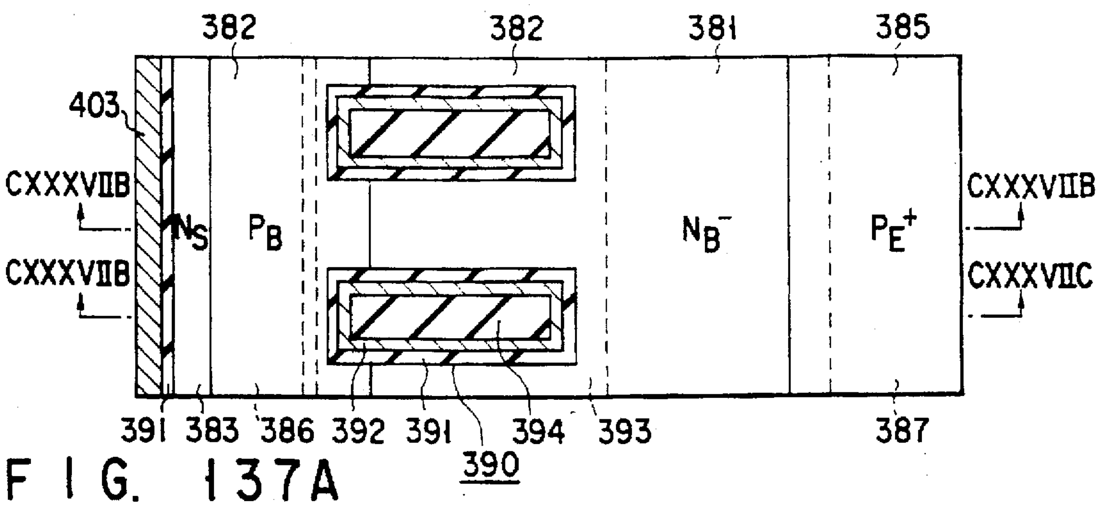
FIG. 137A is a plan view showing an insulated-gate semiconductor device in accordance with still another embodiment of the present invention.
Figure 137B:
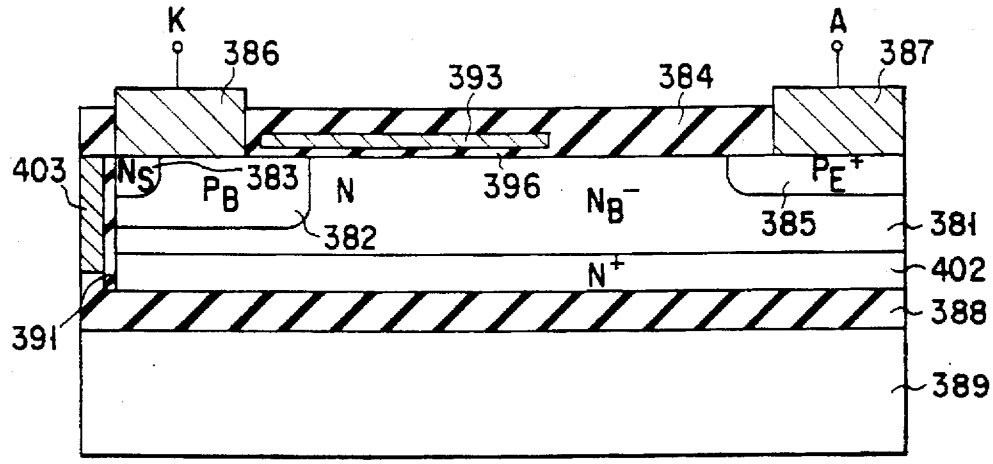
FIGS. 137B and 137C are cross-sectional views along lines CXXXVIIB—CXXXVIIB and CXXXVIIC—CXXXVIIC of FIG. 137A, respectively.
Figure 137C:
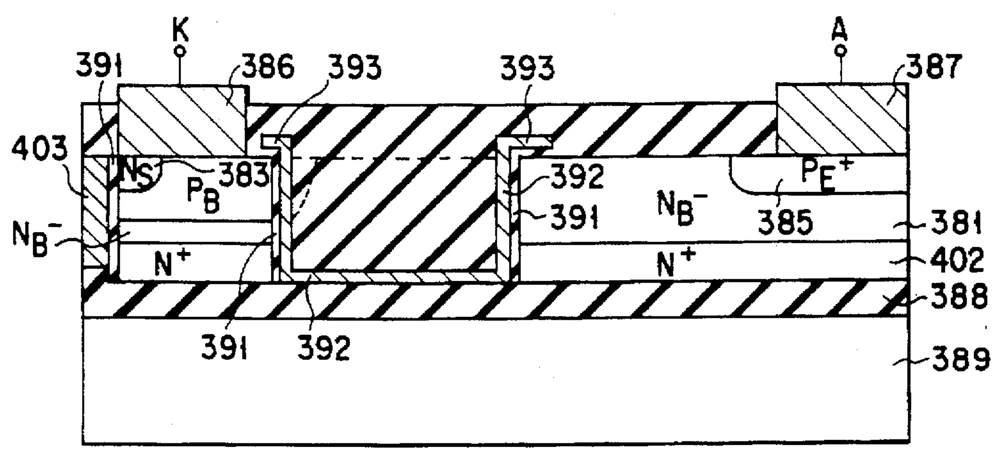

FIG. 137A is a plan view showing an insulated-gate semiconductor device in accordance with still another embodiment of the present invention, and FIGS. 137B and 137C are cross-sectional views showing the respective portions thereof.

The insulated-gate semiconductor device of this embodiment is the same as that in FIGS. 136A to 136C except that an $N^+$ type buffer layer 402 is provided between an insulation film 388 and an $N^-$ type base layer 381. The electrons injected from an N type source layer 383 can easily diffuse to the $N^-$ type base layer 381 due to the $N^+$ type buffer layer 402, thereby further decreasing the on-resistance of the device.

Figure 138A:
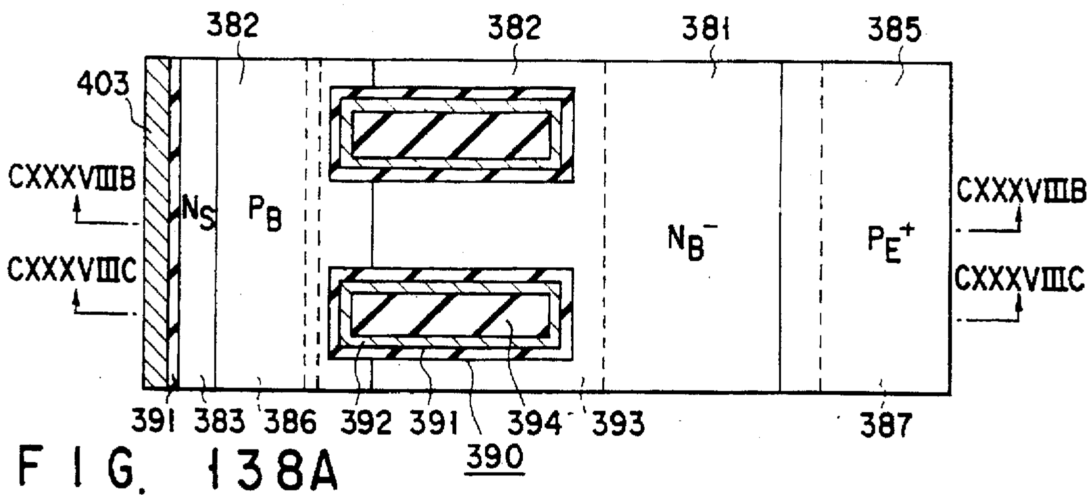
FIGS. 138B and 138C are cross-sectional views along lines CXXXVIIIB—CXXXVIIIB and CXXXVIIIC—CXXXVIIIC of FIG. 138A, respectively.
Figure 138B:
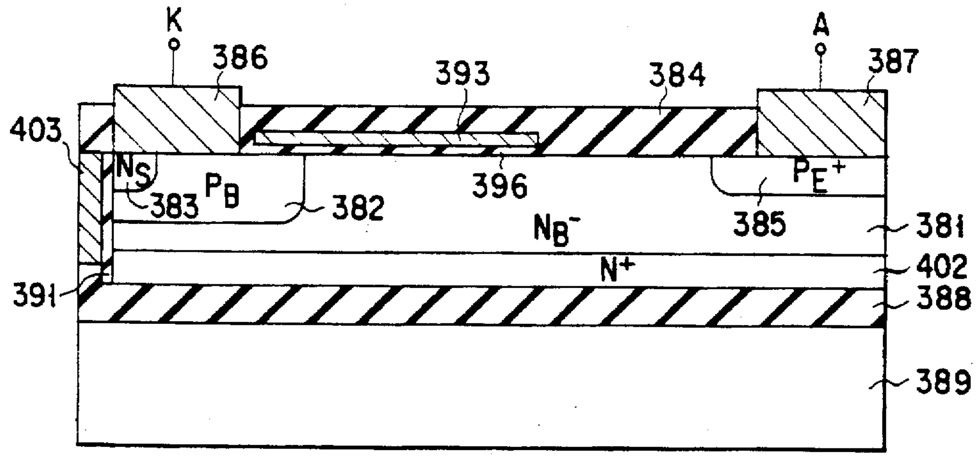
Figure 138C:
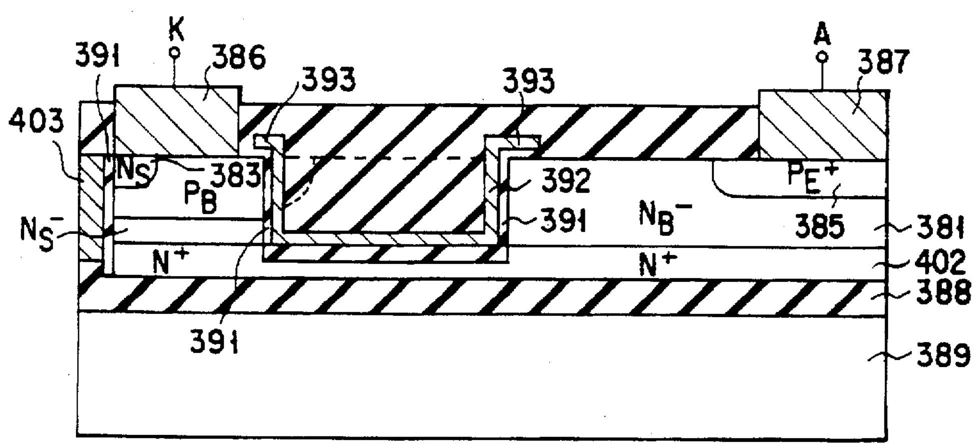

FIG. 138A is a plan view showing an insulated-gate semiconductor device in accordance with still another embodiment of the present invention, and FIGS. 138B and 138C are cross-sectional views showing the respective portions thereof.

The insulated-gate semiconductor device of this embodiment is the same as that in FIGS. 137A to 137C except that a trench does not reach an insulation film 388 of an SOI substrate. With this arrangement, interference of the carrier diffusion caused by the trench can be reduced. Therefore, the electrons injected from an N type source layer 383 can easily diffuse to an $N^-$ type base layer 381, thereby further decreasing the on-resistance of the device.

Figure 139A:
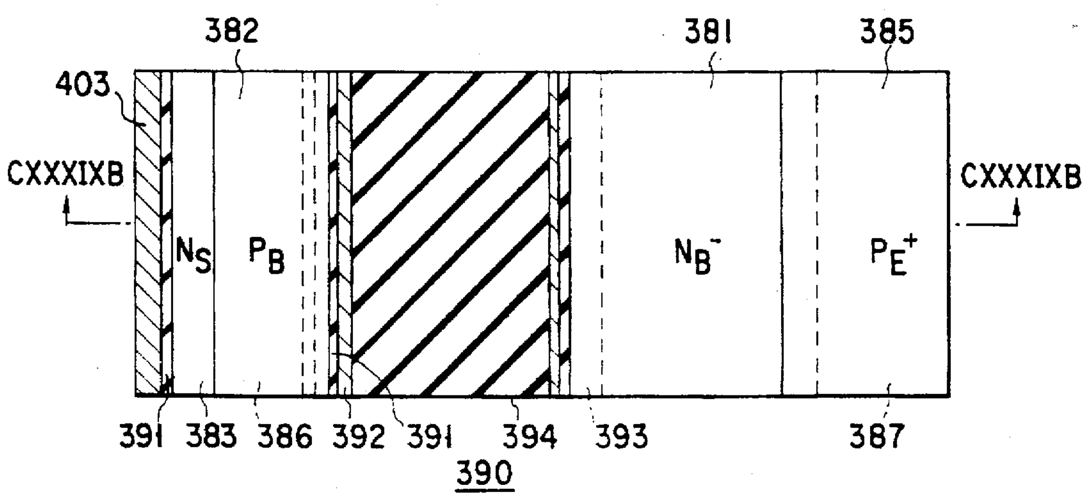
FIG. 139A is a plan view showing an insulated-gate semiconductor device in accordance with still another embodiment of the present invention.
Figure 139B:
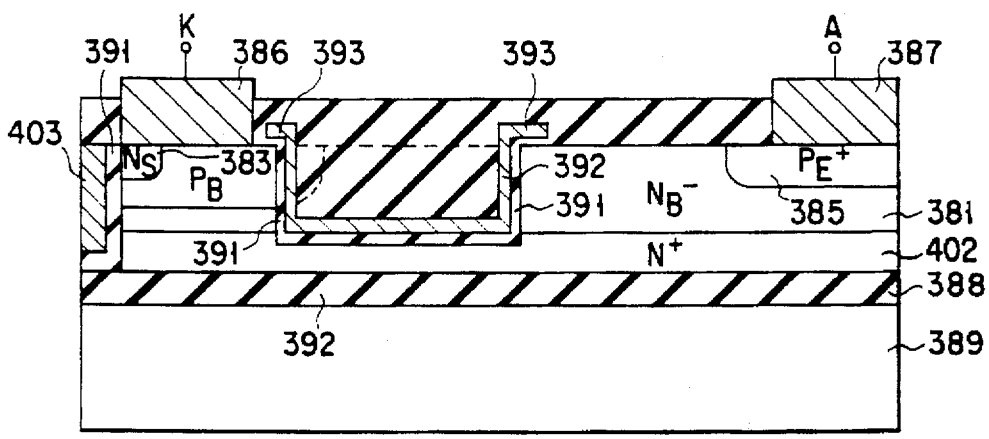
FIG. 139B is a cross-sectional view along a line CXXXIXB—CXXXIXB of FIG. 139A.

FIG. 139A is a plan view showing an insulated-gate semiconductor device in accordance with still another embodiment of the present invention, and FIG. 139B is a cross-sectional view thereof.

The insulated-gate semiconductor device of this embodiment is the same as that in FIGS. 138A to 138C except that the pattern of a trench is in stripe shape running in a vertical direction. Using such a stripe-shaped trench, the holes are not discharged from an $N^-$ type base layer 381 to a cathode electrode 386 under the ON-state of the device. In this case, when a voltage is applied to an electrode 393 upon turn-off operation, the N type impurity concentration of an $N^+$ type buffer layer 402 desirably has a value by which a MOS channel for hole bypass is formed. The N type impurity concentration is set in this manner, thereby further decreasing the on-resistance of the device.

Figure 140:
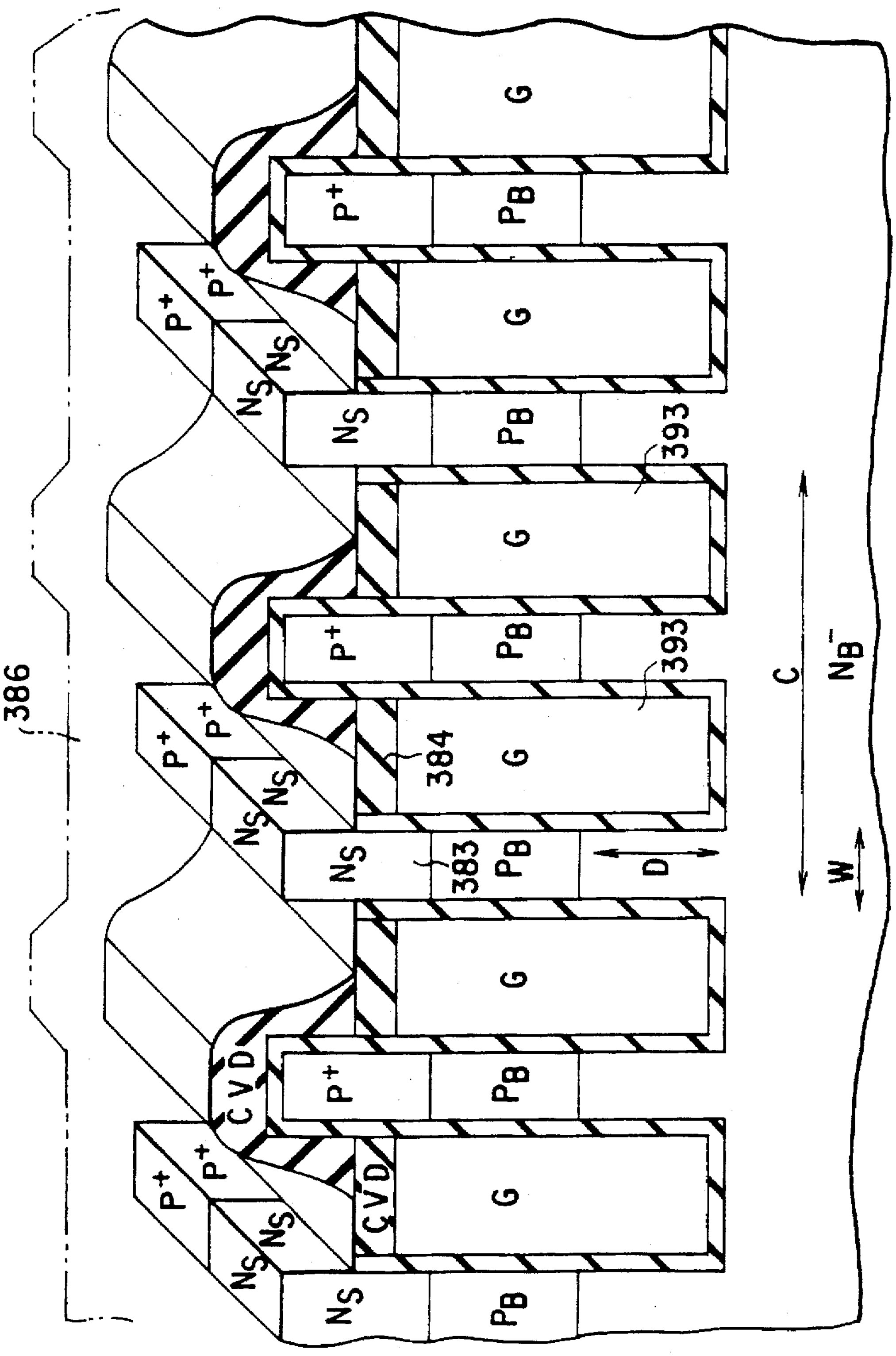
FIG. 140 is a perspective cross-sectional view showing an insulated-gate semiconductor device in accordance with still another embodiment of the present invention.

FIG. 140 is a perspective cross-sectional view showing an insulated-gate semiconductor device in accordance with still another embodiment of the present invention.

The feature of this embodiment lies in that an emitter width W as a design parameter is set as small as possible, and N type source layers 383 protrude upward in order to assure contact between the N type source layers 383 and the cathode electrode 386. An insulation film 384 between a gate electrode 393 and a cathode electrode 386 is set lower than an N type source layer 383.

Figure 141A:
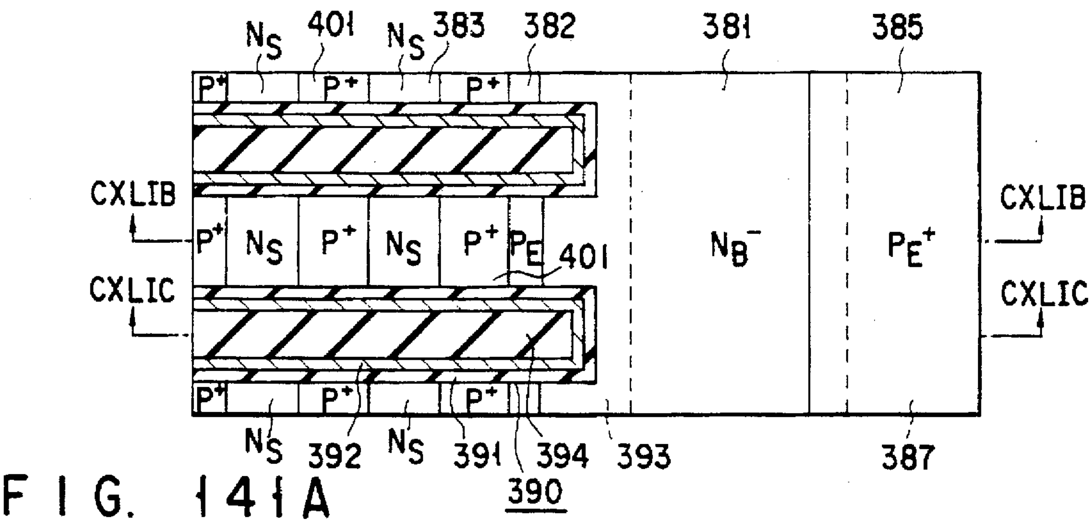
FIG. 141A is a plan view showing an insulated-gate semiconductor device in accordance with still another embodiment of the present invention.
Figure 141B:
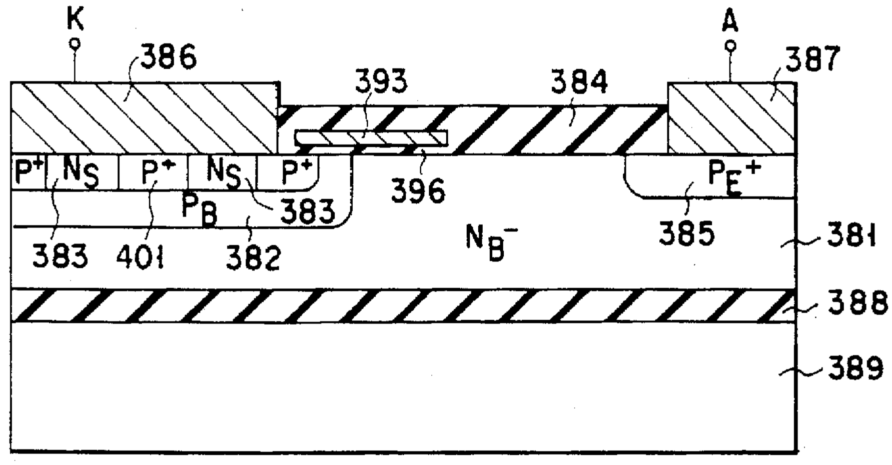
FIGS. 141B and 141C are cross-sectional views along lines CXLIB—CXLIB and CXLIC—CXLIC of FIG. 141A, respectively.
Figure 141C:
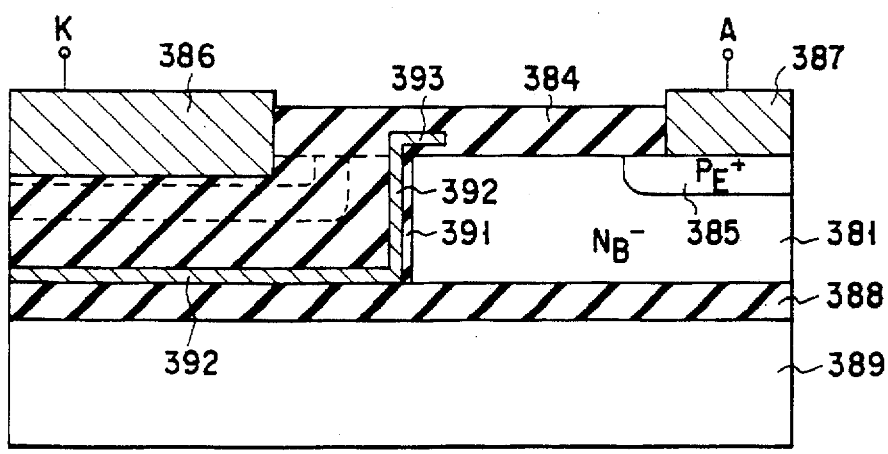

FIG. 141A is a plan view showing an insulated-gate semiconductor device in accordance with still another embodiment of the present invention, and FIGS. 141B and 141C are cross-sectional views showing the respective portions thereof.

This embodiment is a combination of the embodiments described previously. That is, in this embodiment, the vertical-type insulated-gate semiconductor device of the embodiment shown in FIG. 140 is replaced with a lateral-type one, and the embodiment shown in FIGS. 134A to 134C is applied to the device.

Figure 142:
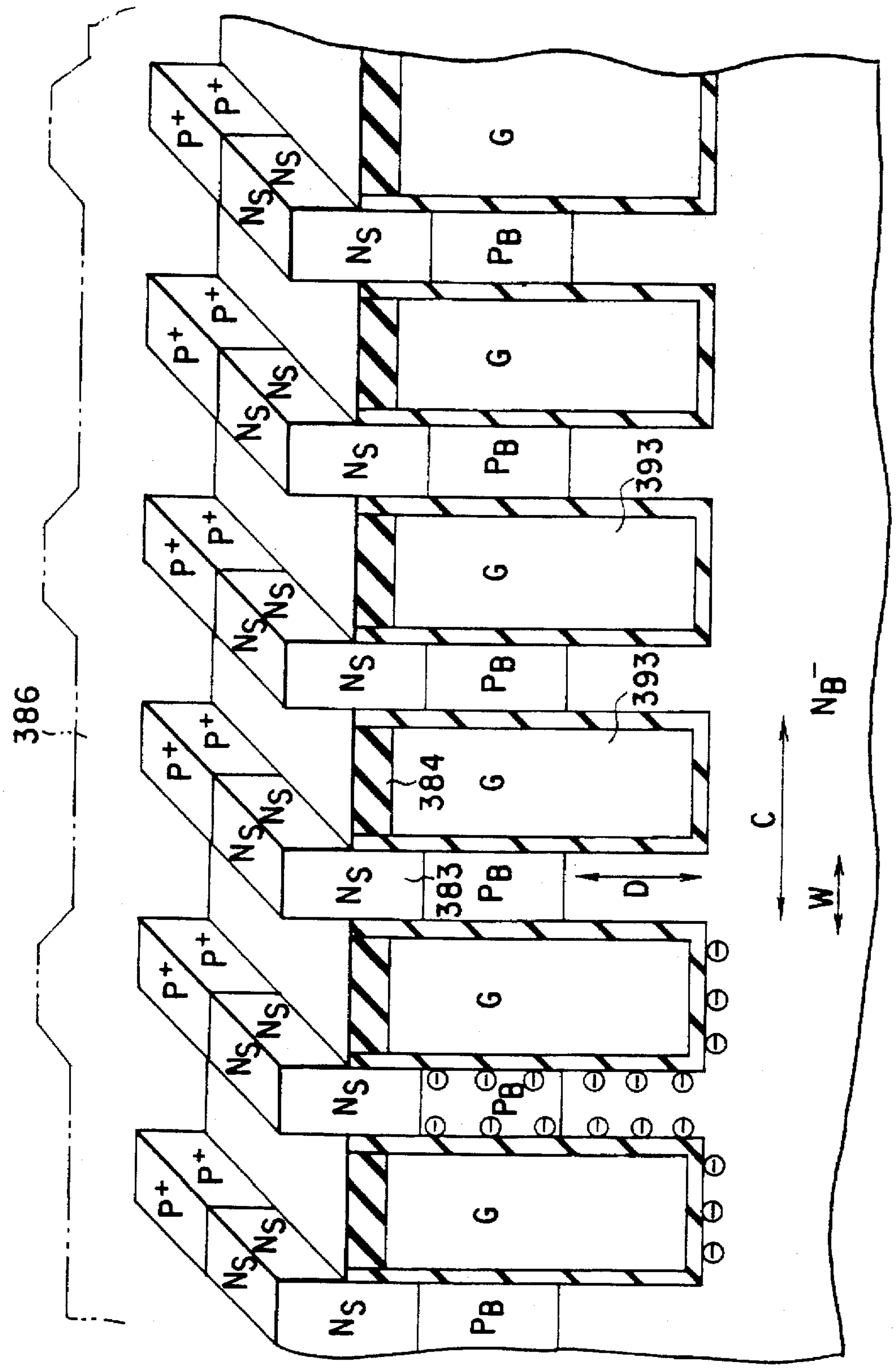
FIG. 142 is a perspective cross-sectional view showing an insulated-gate semiconductor device in accordance with still another embodiment of the present invention.

FIG. 142 is a perspective cross-sectional view showing an insulated-gate semiconductor device in accordance with still another embodiment of the present invention.

This embodiment is a modification of the embodiment shown in FIG. 140. In this embodiment, contact between an N type source layer 383 and a cathode electrode 386 is set not every other trench, but every trench. As in the embodiments shown in FIGS. 140 and 42 the N type source layer 383 in contact with the cathode electrode 386 has a pillar shape to project from a gate electrode. This allows easy contact between the N type source layer 383 and the cathode electrode 386. As a result, the width of a trench, i.e., an emitter width W can be narrower.

As shown in FIG. 142, negative charge is generated along the insulation film of the trenches when a positive voltage, such as +15V, is applied to the gate electrodes 393, while positive charge is similarly generated when a negative voltage, such as −15V, is applied to the gate electrodes 393. Where the width W of the portions between two adjacent trenches is set smaller than that of a region or expansion of MOS channels in which the charge is generated by the gate electrodes 393 applied with a voltage, some of the characteristics of the device are improved. More specifically, where the width W of the portions between two adjacent trenches is designed to be small, e.g. W=1 nm to 100 nm, such that two adjacent MOS channels induced by two adjacent gate electrode 393 are overlapped, the turn-on characteristic and trade-off between the turn-on characteristic and the switching characteristic of an IEGT according to the present invention are greatly improved.

Although the advantages of the width W to be small is described with reference to FIG. 142, the advantages do not directly relates to the protrusion of the N type source layers 383, which is one of the features of the embodiment of FIG. 142. Even in any other embodiments, as long as the width W is set smaller as stated above in consideration of the other factors, the advantages of the smaller width can be obtained.

Figure 143A:
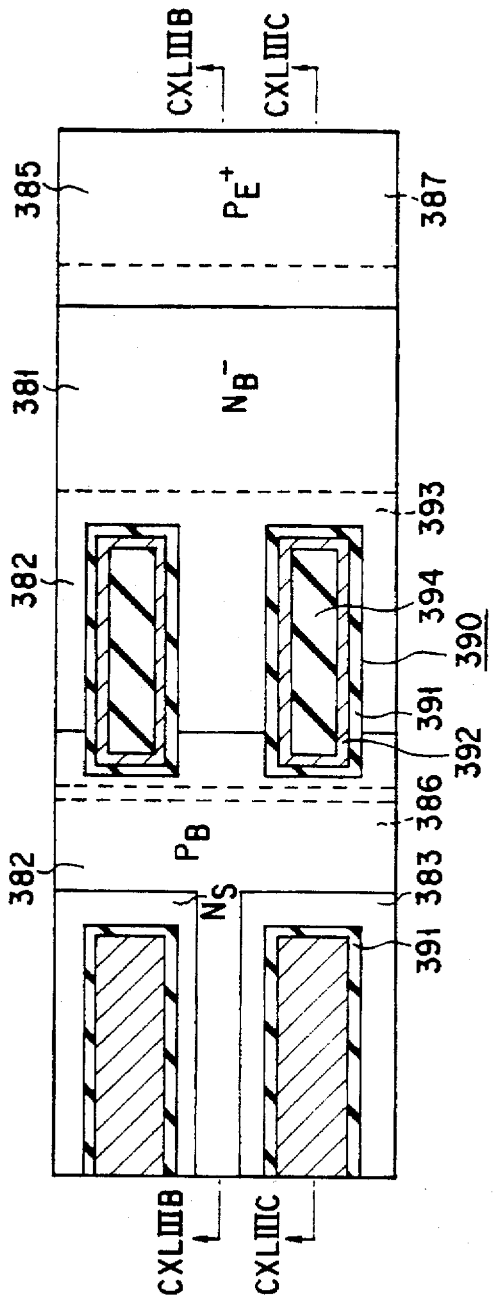
FIG. 143A is a plan view showing an insulated-gate semiconductor device in accordance with still another embodiment of the present invention.
Figure 143B:
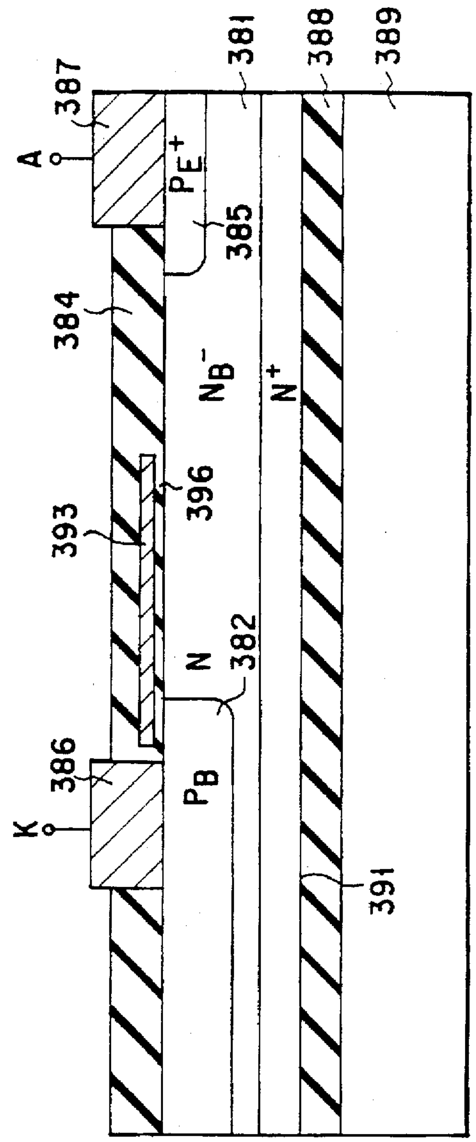
FIGS. 143B and 143C are cross-sectional views along lines CXLIIIB—CXLIIIB and CXLIIIC—CXLIIIC of FIG. 43A, respectively.
Figure 143C:
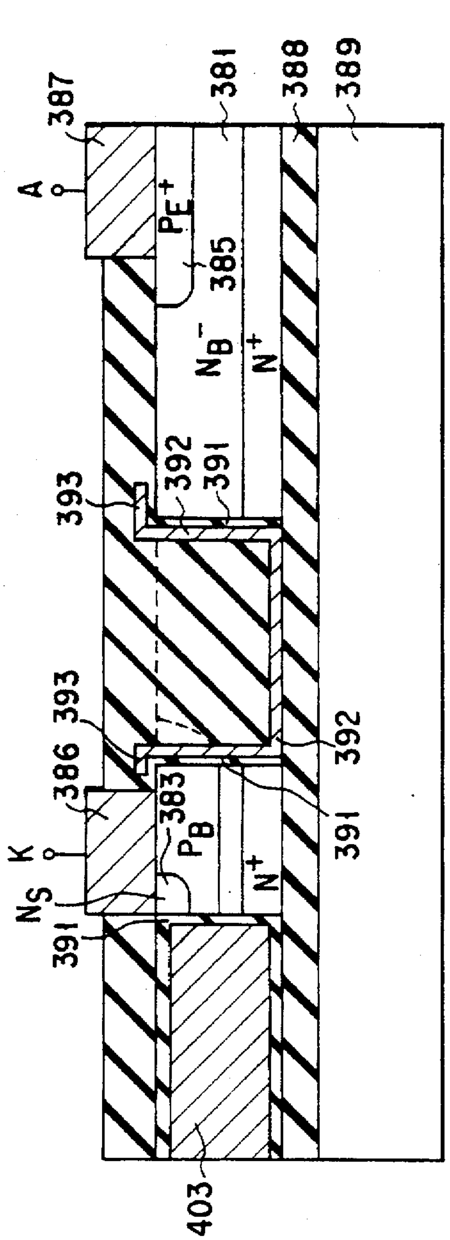

FIG. 143A is a plan view showing an insulated-gate semiconductor device in accordance with still another embodiment of the present invention, and FIGS. 143B and 143C are cross-sectional views showing the respective portions thereof.

This embodiment has the same structure as that in FIGS. 137A to 37C except that a MOSFET for electron injection is provided at a place different from trenchs 390 functioning as an injection enhancer. A gate electrode 403 of the MOSFET for electron injection is divided into a plurality of portions, each arranged in an oblong trench covered with an gate insulation film 391. An N type source layer 383 is formed in the surface of a P type base layer 382 so as to surround the upper portion of the trench. With this structure, the channel density of the MOSFET for electron injection is high, and drop of a voltage in a channel of the MOSFET for electron injection becomes small during energization, i.e., under the $ON^{-}$state of the device.

Figure 144A:
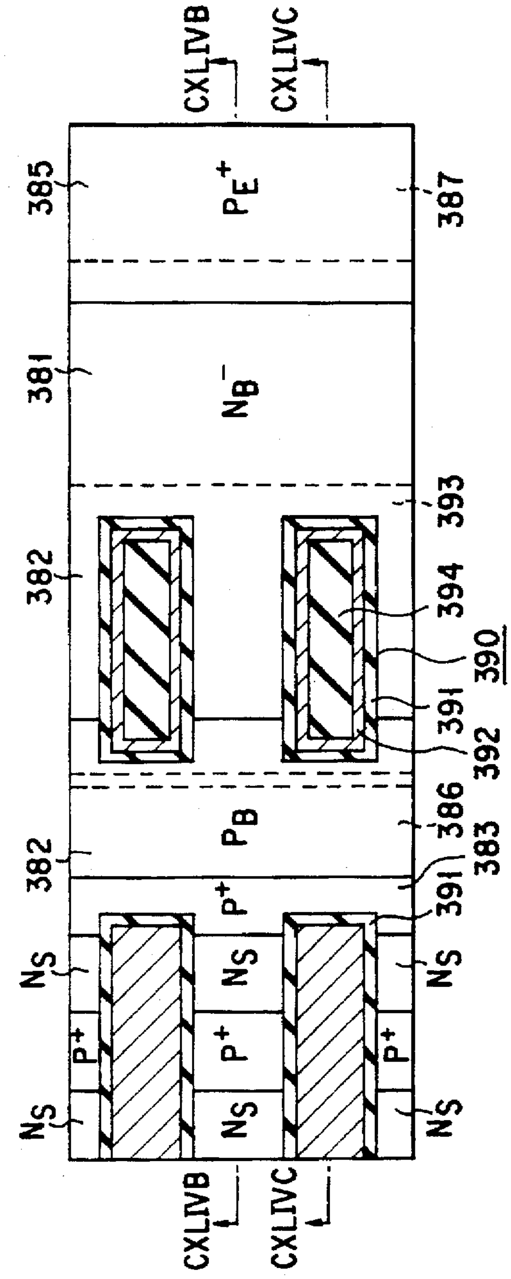
FIG. 144A is a plan view showing an insulated-gate semiconductor device in accordance with still another embodiment of the present invention.
Figure 144B:
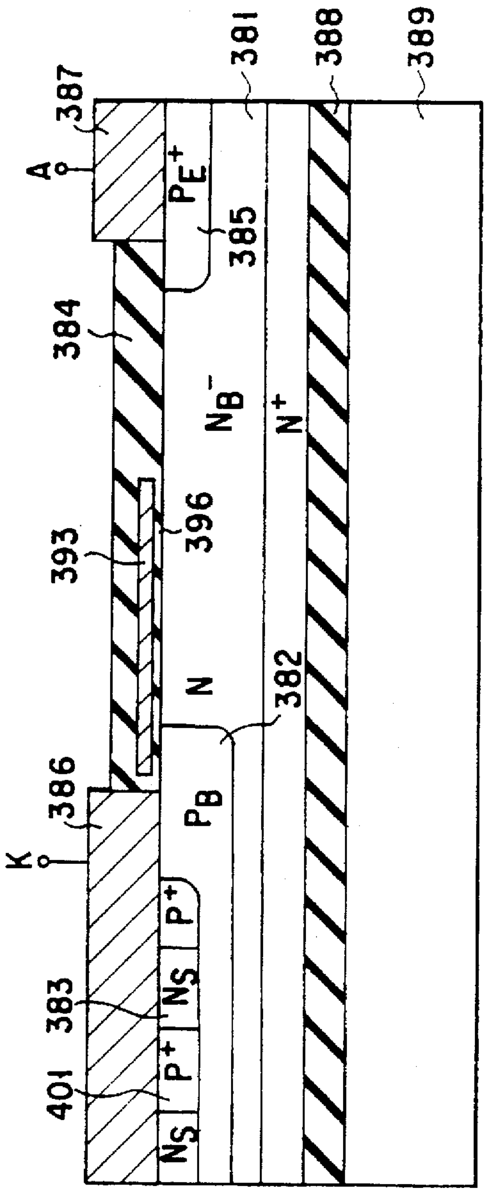
FIGS. 144B and 144C are cross-sectional views along lines CXLIVB—CXLIVB and CXLIVC—CXLIVC of FIG. 144A, respectively.
Figure 144C:
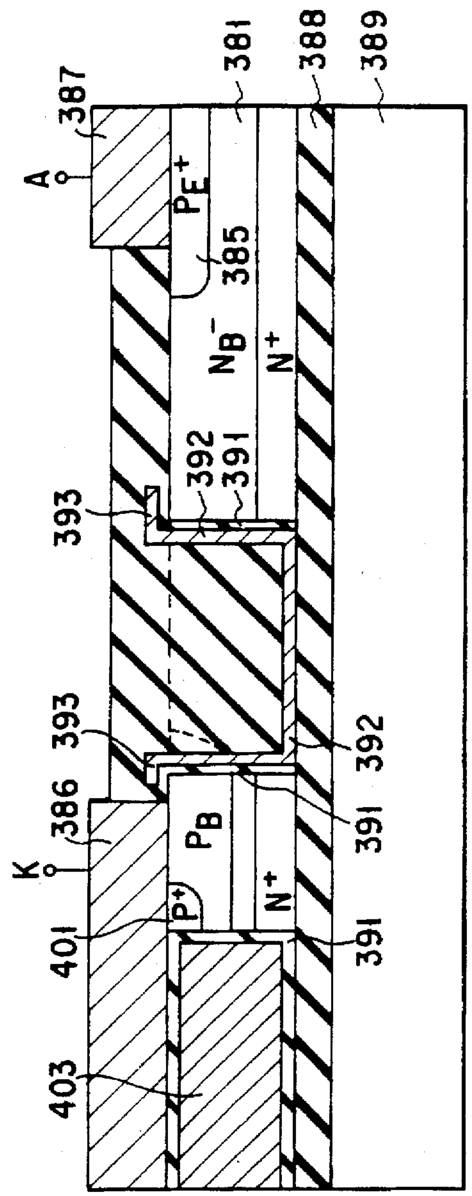

FIG. 144A is a plan view showing an insulated-gate semiconductor device in accordance with still another embodiment of the present invention, and FIGS. 144B and 144C are cross-sectional views showing the respective portions thereof.

This embodiment is a modification of the embodiment shown in FIGS. 143A to 143C. In this embodiment, in order to set the channel density of a MOSFET for electron injection high, a gate electrode 403 is divided into a plurality of portions, each arranged in an oblong trench covered with an gate insulation film 391. In addition, a $P^+$ type diffusion layer 401 is provided in an N type source layer 383 to form a PN structure, thereby increasing a latch-up breakdown voltage of the N type source layer 383.

FIG. 145 is a graph showing the voltage-current characteristic (forward direction) of an IEGT in accordance with the present invention in comparison with those of a conventional Bi-MOS transistor.

The current saturation characteristic (current saturation region) of the IEGT can be freely designed depending on design parameters C, W, and D. For example, when the parameters W and D are kept unchanged and the parameter C is increased, the saturation current value can be lowered as shown in FIG. 145.

Figure 146:
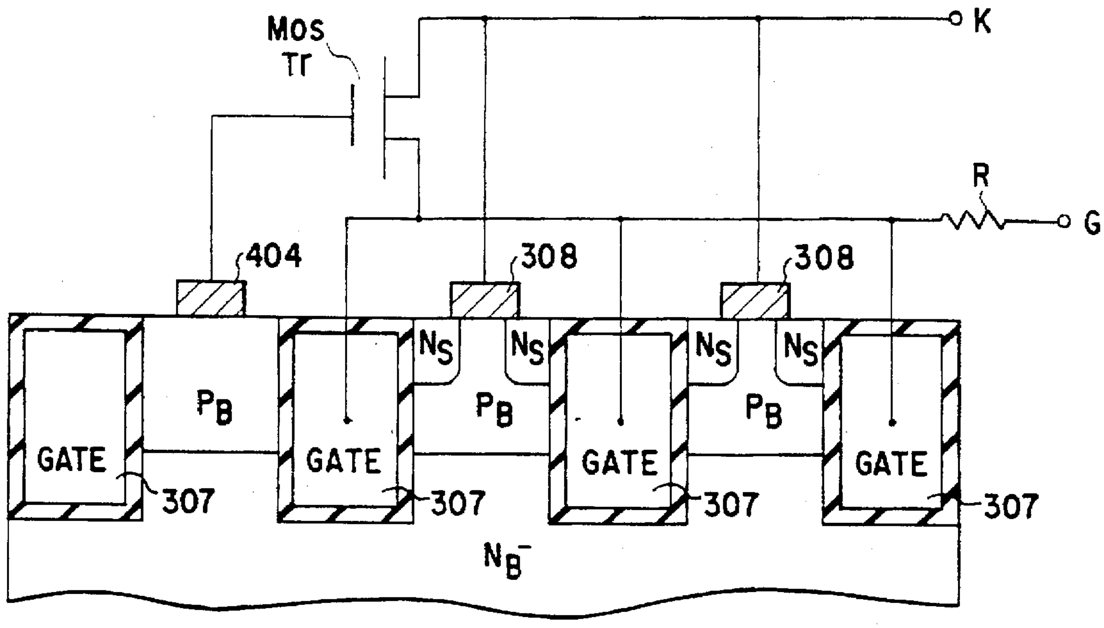
FIG. 146 is a schematic diagram showing the arrangement of an insulated-gate semiconductor device at a cathode side in accordance with still another embodiment of the present invention.

FIG. 146 is a schematic diagram showing the arrangement of an insulated-gate semiconductor device at a cathode side in accordance with still another embodiment of the present invention. The feature of this embodiment lies in that the device has an overcurrent protective function.

As has been described above, in the device in accordance with the present invention, the current saturation region can be freely designed depending on the design parameters C, W, and D, and the breakdown voltage of the device can also be freely designed depending on the design parameters C, W, and D.

When a power element is actually used, an element must be designed to withstand an overvoltage and an overcurrent. The feature of the device in accordance with the present invention lies in that forward direction voltage drop in the current saturation region mainly occurs between trenches (a MOS channel to which the electrons are injected).

This embodiment utilizes this feature to realize overcurrent protective function. More specifically, as shown in FIG. 146, an electrode 404 detects the overcurrent (voltage drop occurring at a trench MOS gate portion in the current saturation region), and a MOS transistor MOSTr is turned on by the detected overcurrent. As a result, the potential of a gate electrode 307 of the main device is at the same level as a cathode potential, and then the main device is turned off to be protected from the overcurrent. Note that, in FIG. 146, reference symbol R denotes a resistor.

Figure 147:
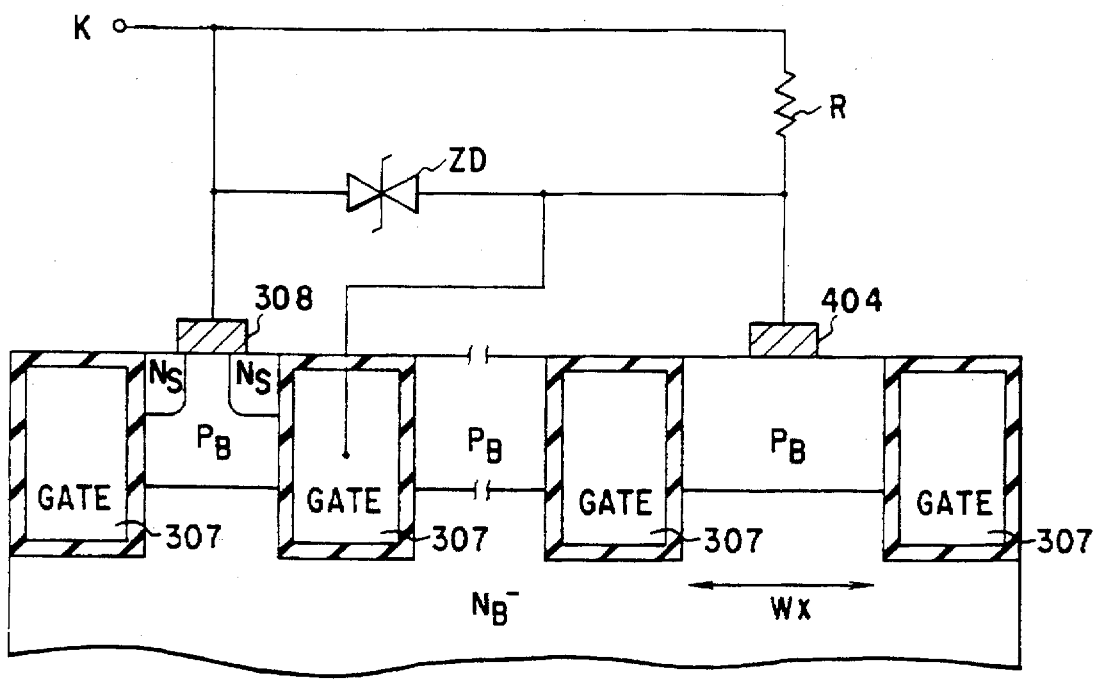
FIG. 147 is a schematic diagram showing the arrangement of an insulated-gate semiconductor device at a cathode side in accordance with still another embodiment of the present invention.

FIG. 147 is a schematic diagram showing the arrangement of an insulated-gate semiconductor device at a cathode side in accordance with still another embodiment of the present invention.

This embodiment realizes an overcurrent protective function as follow. More specifically, a place wherein breakdown occurs at a forward-direction voltage lower than the breakdown voltage of a main element is formed in a region wherein the width between trenches is $W_x$. An electrode 404 detects a current which flows upon breakdown, and a Zener diode ZD is turned on by the detected current. As a result, the potential of a gate electrode 307 of the main device is at the same level as a cathode potential, and then the main device is turned off to be protected from the overcurrent.

In accordance with the structure of the present invention, the injection efficiency of the emitter layer, the depth of the trench and the like are suitably designed to obtain the on-resistance as low as that of a thyristor without latching up a PNPN thyristor. In addition, since the PNPN thyristor does not latch up, the maximum cutoff current density becomes large.

In a structure comprising a first MOS transistor for turn-on operation, and a second MOS transistor or a MOS gate for turn-off operation, when the first MOS transistor is turned on for turn-on operation to inject electrons from an N type source layer to an N type base layer, the channel of the second NOS transistor or the MOS gate disappears. Therefore, the holes in the device are prevented from being discharged outside the device to realize a low on-resistance.

Since the holes can be discharged outside the device not through a channel induced by the first MOS transistor and the N type source layer due to the second MOS transistor or the MOS gate, latch-up of a parasitic element including the N type source layer can be prevented, thereby increasing a breakdown voltage.

If the first and second MOS transistors share a common gate electrode, the structure can be simplified.

What is claimed is:

1. A semiconductor device comprising:
   a first semiconductor layer of a second conductivity type;
   a second semiconductor layer of a first conductivity type formed in a surface of said first semiconductor layer, for allowing first type charge carriers to be injected into said first semiconductor layer;
   a third semiconductor layer of said second conductivity type formed in a surface of said first semiconductor layer, for allowing second type charge carriers to be injected into said first semiconductor layer to cause a conductivity modulation to occur therein;
   a fourth semiconductor layer of the said conductivity type formed in said first semiconductor layer, for allowing said first type charge carriers contained in said first semiconductor layer to move externally out of said first semiconductor layer;
   a MOS channel for selectively connecting said first semiconductor layer and said third semiconductor layer in order to thereby turn on and turn off said device;
   a gate electrode facing said MOS channel;
   first injection enhancer means for locally controlling a flow capability of the first type charge carriers in order to thereby increase an ability to inject the second type charge carriers into said first semiconductor layer, said first injection enhancer means comprising a first narrow current path connecting said first semiconductor layer and said fourth semiconductor layer such that a resistance to a flow of the first type charge carriers is locally increased in said first narrow current path;

a first main electrode connected to said second semiconductor layer; and a second main electrode connected to said third and fourth semiconductor layers, said first and second main electrodes being arranged on one side of said device.

2. The device according to claim 1, wherein said first injection enhancer means comprises a pair of trenches formed in said first semiconductor layer, each having a depth, a width and a length, said trenches respectively having insulating side walls spaced apart in a direction along said width such that said first narrow current path comprises a region defined between said insulating side walls.

3. The device according to claim 2, wherein said first semiconductor layer is and said second to fourth semiconductor layers are formed in a semiconductor active layer, and said device further comprising a semiconductor back side layer facing said active layer via an insulating support layer.

4. The device according to claim 3, wherein each of said trenches has an insulating bottom wall facing and spaced apart from said insulating support layer such that said first narrow current path further comprises a region defined between said insulating support layer and insulating bottom wall.

5. The device according to claim 3, wherein said insulating side walls of said trenches reach said insulating support layer.

6. The device according to claim 2, wherein each of said third and fourth semiconductor layers has a plurality of spaced-apart surface areas contacting said second main electrode such that said third and fourth semiconductor layers alternately contact said second main electrode in a direction along said length of the trenches.

7. The device according to claim 1, wherein said base layer and said second to fourth semiconductor layers are formed in a semiconductor active layer, and said device further comprising a semiconductor back side layer facing said active layer via an insulating support layer.

8. The device according to claim 7, wherein said first injection enhancer means comprises an insulating opposite layer formed in said first semiconductor layer facing and spaced apart from said insulating support layer such that said first narrow current path comprises a region defined between said insulating support layer and insulating opposite layer.

9. The device according to claim 8, wherein said insulating opposite layer comprises an insulating bottom wall of a trench formed in said first semiconductor layer.

10. The device according to claim 1, wherein said third semiconductor layer connected to said first semiconductor layer via said fourth semiconductor layer such that said MOS channel is formed through said fourth semiconductor type.

11. The device according to claim 10, wherein said gate electrode is buried in a trench formed in said first semiconductor layer and surrounded by an insulating wall.

12. The device according to claim 11, further comprising an inner trench arranged in said gate electrode and surrounded by an insulating wall.

13. The device according to claim 1, further comprising a semiconductor layer, formed in said first narrow current path, having a conductivity type the same as that of said first semiconductor layer and containing impurities higher in concentration than said first semiconductor layer, for increasing resistance to said first type charge carriers.

14. The device according to claim 1, further comprising a second MOS channel for connecting said fourth semiconductor layer and said second main electrode when said device is turned off, and a second gate electrode facing said second MOS channel.

15. The device according to claim 14, further comprising a fifth semiconductor layer connected to said fourth semiconductor layer via said third semiconductor layer, contacting said second main electrode, and having a conductivity type the same as that of said fourth semiconductor layer such that said second MOS channel is formed through said third semiconductor layer.

16. The device according to claim 15, wherein said second gate electrode is buried in a trench formed in said first semiconductor layer and surrounded by an insulating wall.

17. The device according to claim 1, further comprising second injection enhancer means for locally controlling a flow capability of the second type charge carriers in order to thereby increase an ability to inject the first type charge carriers into said first semiconductor layer, said first injection enhancer means comprising a second narrow current path connecting said first semiconductor layer and said first main electrode such that a resistance to a flow of the second type charge carriers is locally increased in said second narrow current path.

18. The device according to claim 17, said second injection enhancer means comprises a reverse side trench formed in said first semiconductor layer and having an insulating wall to define said second narrow current path.

19. The device according to claim 18, further comprising a MOS channel along said second narrow current path for substantially expanding said second semiconductor layer toward said first semiconductor layer when said device is turned on, and for substantially expanding said first semiconductor layer toward said second semiconductor layer when said device is turned off.

* * * * *